(12) United States Patent
Hosaka et al.

(10) Patent No.: US 11,942,554 B2
(45) Date of Patent: Mar. 26, 2024

(54) SEMICONDUCTOR DEVICE, DISPLAY DEVICE INCLUDING THE SEMICONDUCTOR DEVICE, AND AN ELECTRONIC DEVICE INCLUDING THE SEMICONDUCTOR DEVICE

(71) Applicant: SEMICONDUCTOR ENERGY LABORATORY CO., LTD., Atsugi (JP)

(72) Inventors: Yasuharu Hosaka, Tochigi (JP); Yukinori Shima, Gunma (JP); Masataka Nakada, Tochigi (JP); Masami Jintyou, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/585,645

(22) Filed: Jan. 27, 2022

(65) Prior Publication Data

US 2022/0149205 A1    May 12, 2022

Related U.S. Application Data

(63) Continuation of application No. 15/774,930, filed as application No. PCT/IB2016/056731 on Nov. 9, 2016, now Pat. No. 11,329,166.

(30) Foreign Application Priority Data

Nov. 20, 2015 (JP) .................................. 2015-227617
Dec. 4, 2015 (JP) .................................. 2015-237207

(51) Int. Cl.
*H01L 29/12* (2006.01)
*H01L 21/426* (2006.01)
(Continued)

(52) U.S. Cl.
CPC .......... *H01L 29/7869* (2013.01); *H01L 29/04* (2013.01); *H01L 29/423* (2013.01);
(Continued)

(58) Field of Classification Search
CPC ... H01L 29/7869; H01L 29/04; H01L 29/423; H01L 29/42384; H01L 29/49;
(Continued)

(56) References Cited

U.S. PATENT DOCUMENTS 6,072,193 A    6/2000  Ohnuma et al.
6,294,799 B1   9/2001  Yamazaki et al.
(Continued)

FOREIGN PATENT DOCUMENTS

CN    103681874 A    3/2014
JP    09-146118 A    6/1997
(Continued)

OTHER PUBLICATIONS

International Search Report (Application No. PCT/IB2016/056731) dated Feb. 14, 2017.
(Continued)

*Primary Examiner* — Caleb E Henry
*Assistant Examiner* — Dilinh P Nguyen
(74) *Attorney, Agent, or Firm* — Fish & Richardson P.C.

(57) ABSTRACT

In a transistor that includes an oxide semiconductor, a change in electrical characteristics is suppressed and the reliability is improved.
A semiconductor device that includes a transistor is provided. The transistor includes a first conductive film that functions as a first gate electrode, a first gate insulating film, a first oxide semiconductor film that includes a channel region, a second gate insulating film, and a second oxide semiconductor film and a second conductive film that function as a second gate electrode. The second oxide semicon-
(Continued)

ductor film includes a region higher in carrier density than the first oxide semiconductor film. The second conductive film includes a region in contact with the first conductive film.

3 Claims, 67 Drawing Sheets

(51) Int. Cl.
| | | |
|---|---|---|
| H01L 27/12 | (2006.01) | |
| H01L 29/04 | (2006.01) | |
| H01L 29/423 | (2006.01) | |
| H01L 29/49 | (2006.01) | |
| H01L 29/66 | (2006.01) | |
| H01L 29/786 | (2006.01) | |
| G02F 1/1368 | (2006.01) | |
| H10K 50/115 | (2023.01) | |
| H10K 59/12 | (2023.01) | |
| H10K 59/40 | (2023.01) | |

(52) U.S. Cl.
CPC ........ *H01L 29/42384* (2013.01); *H01L 29/49* (2013.01); *H01L 29/4908* (2013.01); *H01L 29/66969* (2013.01); *H01L 29/78633* (2013.01); *H01L 29/78648* (2013.01); *G02F 1/1368* (2013.01); *H01L 21/426* (2013.01); *H01L 27/1225* (2013.01); *H10K 50/115* (2023.02); *H10K 59/12* (2023.02); *H10K 59/40* (2023.02)

(58) Field of Classification Search
CPC ........... H01L 29/4908; H01L 29/66969; H01L 29/78633; H01L 29/78648; H01L 21/426; H01L 27/1225; H01L 27/323; H01L 27/3244; H01L 51/502
USPC ........................................................ 257/43
See application file for complete search history.

(56) References Cited

U.S. PATENT DOCUMENTS

| | | | |
|---|---|---|---|
| 6,310,363 B1 | 10/2001 | Ohnuma et al. | |
| 6,541,793 B2 | 4/2003 | Ohnuma et al. | |
| 6,740,599 B2 | 5/2004 | Yamazaki et al. | |
| 6,960,786 B2 | 11/2005 | Yamazaki et al. | |
| 6,972,263 B2 | 12/2005 | Yamazaki et al. | |
| 7,038,239 B2 | 5/2006 | Murakami et al. | |
| 7,554,116 B2 | 6/2009 | Yamazaki et al. | |
| 7,671,369 B2 | 3/2010 | Yamazaki et al. | |
| 7,727,898 B2 | 6/2010 | Yamazaki et al. | |
| 7,955,975 B2 | 6/2011 | Murakami et al. | |
| 7,989,808 B2 | 8/2011 | Yamazaki et al. | |
| 7,994,504 B2 | 8/2011 | Murakami et al. | |
| 7,999,263 B2 | 8/2011 | Murakami et al. | |
| 8,008,666 B2 | 8/2011 | Yamazaki et al. | |
| 8,120,033 B2 | 2/2012 | Murakami et al. | |
| 8,164,933 B2 | 4/2012 | Fujita et al. | |
| 8,207,537 B2 | 6/2012 | Yamazaki et al. | |
| 8,415,669 B2 | 4/2013 | Yamazaki et al. | |
| 8,471,259 B2 | 6/2013 | Yamazaki et al. | |
| 8,502,215 B2 | 8/2013 | Murakami et al. | |
| 8,748,895 B2 | 6/2014 | Yamazaki et al. | |
| 8,772,130 B2 | 7/2014 | Ohki | |
| 8,835,271 B2 | 9/2014 | Yamazaki et al. | |
| 8,927,994 B2 | 1/2015 | Yamazaki et al. | |
| 8,936,952 B2 | 1/2015 | Chida | |
| 8,941,113 B2* | 1/2015 | Takeuchi | H01L 29/78618 438/149 |
| 8,946,717 B2 | 2/2015 | Murakami et al. | |
| 8,946,718 B2 | 2/2015 | Murakami et al. | |
| 8,981,372 B2 | 3/2015 | Yamazaki | |
| 9,105,727 B2 | 8/2015 | Murakami et al. | |
| 9,165,991 B2 | 10/2015 | Yamazaki et al. | |
| 9,252,287 B2 | 2/2016 | Yamazaki | |
| 9,406,806 B2 | 8/2016 | Murakami et al. | |
| 9,472,678 B2 | 10/2016 | Yamazaki et al. | |
| 9,508,756 B2 | 11/2016 | Yamazaki et al. | |
| 9,640,669 B2 | 5/2017 | Yamazaki et al. | |
| 9,666,614 B2 | 5/2017 | Yamazaki et al. | |
| 9,748,403 B2 | 8/2017 | Koezuka et al. | |
| 9,773,815 B2 | 9/2017 | Yamazaki et al. | |
| 9,799,682 B2 | 10/2017 | Chida | |
| 9,837,547 B2 | 12/2017 | Koezuka et al. | |
| 9,882,059 B2 | 1/2018 | Yamazaki et al. | |
| 9,899,535 B2 | 2/2018 | Yamazaki et al. | |
| 9,929,279 B2 | 3/2018 | Yamazaki et al. | |
| 9,966,390 B2 | 5/2018 | Yamazaki et al. | |
| 10,032,929 B2 | 7/2018 | Koezuka et al. | |
| 10,050,065 B2 | 8/2018 | Murakami et al. | |
| 10,083,995 B2 | 9/2018 | Yamazaki et al. | |
| 10,374,097 B2 | 8/2019 | Yamazaki et al. | |
| 10,700,106 B2 | 6/2020 | Murakami et al. | |
| 10,854,642 B2 | 12/2020 | Murakami et al. | |
| 10,944,014 B2 | 3/2021 | Yamazaki et al. | |
| 2006/0108636 A1 | 5/2006 | Sano et al. | |
| 2009/0283763 A1 | 11/2009 | Park et al. | |
| 2010/0006834 A1 | 1/2010 | Kim et al. | |
| 2010/0200999 A1 | 8/2010 | Yamazaki et al. | |
| 2011/0284844 A1 | 11/2011 | Endo et al. | |
| 2013/0221345 A1 | 8/2013 | Ohno et al. | |
| 2015/0187953 A1 | 7/2015 | Koezuka et al. | |
| 2015/0221678 A1* | 8/2015 | Yamazaki | H01L 27/1225 257/43 |
| 2015/0221774 A1 | 8/2015 | Yamazaki et al. | |
| 2015/0263141 A1 | 9/2015 | Yamazaki et al. | |
| 2015/0263174 A1 | 9/2015 | Yamazaki et al. | |
| 2016/0005873 A1* | 1/2016 | Jintyou | H01L 29/78621 257/43 |
| 2016/0163880 A1 | 6/2016 | Ohno et al. | |
| 2017/0025544 A1 | 1/2017 | Yamazaki et al. | |
| 2018/0076333 A1 | 3/2018 | Koezuka et al. | |
| 2019/0067336 A1 | 2/2019 | Yamazaki et al. | |
| 2021/0098508 A1 | 4/2021 | Murakami et al. | |

FOREIGN PATENT DOCUMENTS

| | | |
|---|---|---|
| JP | 09-219453 A | 8/1997 |
| JP | 10-335672 A | 12/1998 |
| JP | 11-097660 A | 4/1999 |
| JP | 2003-043950 A | 2/2003 |
| JP | 2003-302917 A | 10/2003 |
| JP | 2004-006796 A | 1/2004 |
| JP | 2004-046110 A | 2/2004 |
| JP | 2006-165529 A | 6/2006 |
| JP | 2007-096055 A | 4/2007 |
| JP | 2007-293155 A | 11/2007 |
| JP | 2008-277804 A | 11/2008 |
| JP | 2009-036947 A | 2/2009 |
| JP | 2009-278115 A | 11/2009 |
| JP | 2012-009836 A | 1/2012 |
| JP | 2012-028761 A | 2/2012 |
| JP | 2013-062499 A | 4/2013 |
| JP | 2013-211543 A | 10/2013 |
| JP | 2013-229588 A | 11/2013 |
| JP | 2015-111662 A | 6/2015 |
| JP | 2015-135961 A | 7/2015 |
| JP | 2015-144265 A | 8/2015 |
| JP | 2015-181151 A | 10/2015 |
| JP | 2015-188079 A | 10/2015 |
| JP | 2015-188080 A | 10/2015 |
| KR | 2015-0107622 A | 9/2015 |

OTHER PUBLICATIONS

Written Opinion (Application No. PCT/IB2016/056731) dated Feb. 14, 2017.

(56) References Cited

OTHER PUBLICATIONS

Chinese Office Action (Application No. 201680066525.2) dated Dec. 2, 2020.

* cited by examiner

700

903

905

9100

9200

9101

9201

9102

9201

9201

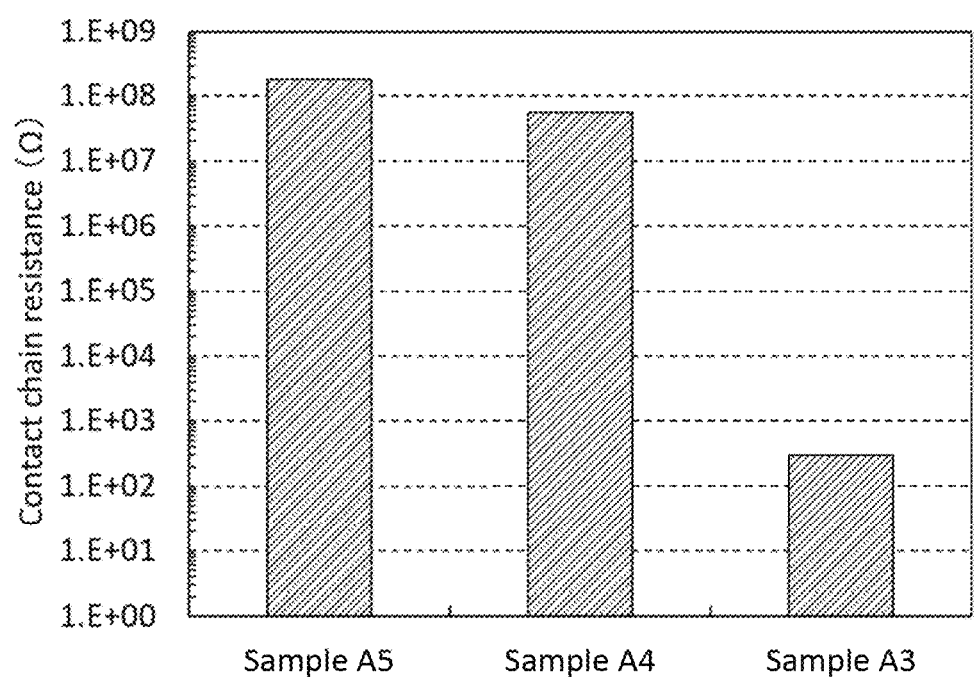

Sample F2 (under light irradiation)

Sample F2 (without light irradiation)

SEMICONDUCTOR DEVICE, DISPLAY DEVICE INCLUDING THE SEMICONDUCTOR DEVICE, AND AN ELECTRONIC DEVICE INCLUDING THE SEMICONDUCTOR DEVICE

CROSS REFERENCE TO RELATED APPLICATIONS

This application is a continuation of U.S. application Ser. No. 15/774,930, filed May 9, 2018, now allowed, which is incorporated by reference and is a U.S. National Phase Application under 35 U.S.C. § 371 of International Application PCT/IB2016/056731, filed on Nov. 9, 2016, which is incorporated by reference and claims the benefit of foreign priority applications filed in Japan as Application No. 2015-227617 on Nov. 20, 2015, and Application No. 2015-237207 on Dec. 4, 2015, all of which are incorporated by reference.

TECHNICAL FIELD

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. One embodiment of the present invention also relates to a process, a machine, manufacture, or a composition of matter. More specifically, it relates to a semiconductor device, a display device, a light-emitting device, a lighting device, a power storage device, a memory device, an imaging device, a method for driving them, or a method for manufacturing them.

Note that, in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). The transistor is applied to a wide range of electronic devices such as an integrated circuit (IC) or an image device (display device). Although a semiconductor material typified by silicon is widely known as a semiconductor thin film that can be used in a transistor, an oxide semiconductor has been attracting attention as another material.

For example, a technique in which a transistor is fabricated using an In—Ga—Zn-based oxide as an oxide semiconductor is disclosed (see Patent Document 1). In addition, a technique in which an oxide thin film transistor with a self-aligned top-gate structure is disclosed (see Patent Document 2).

Furthermore, a semiconductor device including, as a base insulating layer of an oxide semiconductor layer in which a channel is formed, an insulating layer that releases oxygen by heating to reduce oxygen vacancies in the oxide semiconductor layer is disclosed (see Patent Document 3).

PRIOR ART DOCUMENTS

Patent Documents

[Patent Document 1] Japanese Published Patent Application No. 2007-96055
[Patent Document 2] Japanese Published Patent Application No. 2009-278115
[Patent Document 3] Japanese Published Patent Application No. 2012-009836

SUMMARY OF THE INVENTION

Problems to be Solved by the Invention

Examples of a transistor that includes an oxide semiconductor film include an inverted staggered type (also referred to as a bottom-gate structure) or a staggered type (also referred to as a top-gate structure). When a transistor that includes an oxide semiconductor film is used for a display device, an inverted staggered type transistor is used more often than a staggered type transistor, because its fabrication process is relatively simple and its manufacturing cost is low. However, as the screen size of a display device is increased or the image quality of a display device is increased in resolution, signal delay or the like is increased by parasitic capacitance between a gate electrode and source and drain electrodes, which leads to a problem in that the image quality of the display device deteriorates. Thus, for a staggered type transistor that includes an oxide semiconductor film, the development of a structure with stable electrical characteristics and high reliability is desired.

Furthermore, in the case where a transistor is fabricated using an oxide semiconductor film for a channel region, an oxygen vacancy which is formed in the channel region of the oxide semiconductor film becomes problematic because it adversely affects the transistor characteristics. For example, when oxygen vacancies are formed in a channel region of an oxide semiconductor film, carriers are generated because of the oxygen vacancies. The carrier generation in the channel region of the oxide semiconductor film causes a change in the electrical characteristics, e.g., a shift of the threshold voltage, of the transistor that includes the oxide semiconductor film in the channel region. In addition, there arises a problem in that electrical characteristics fluctuate among the transistors. Therefore, it is preferable that the amount of oxygen vacancies in the channel region of the oxide semiconductor film be as small as possible. On the other hand, in a transistor that includes an oxide semiconductor film in the channel region, the oxide semiconductor film which is in contact with source and drain electrodes preferably has a larger amount of oxygen vacancies to reduce the contact resistance between the oxide semiconductor film and the source and drain electrodes, and has lower resistance.

In view of the foregoing problems, an object of one embodiment of the present invention is to suppress a change in electrical characteristics of a transistor that includes an oxide semiconductor. Another object of one embodiment of the present invention is to improve the reliability of a transistor that includes an oxide semiconductor. Another object of one embodiment of the present invention is to provide a transistor that includes an oxide semiconductor and has high on-state current. Another object of one embodiment of the present invention is to provide a transistor that includes an oxide semiconductor and has low off-state current. Another object of one embodiment of the present invention is to provide a semiconductor device with low power consumption. Another object of one embodiment of the present invention is to provide a novel semiconductor device. Another object of one embodiment of the present invention is to provide a method for manufacturing the novel semiconductor device.

Note that the description of the above objects does not preclude the existence of other objects. Note that one embodiment of the present invention need not necessarily achieve all of the objects. Other objects are apparent from and can be derived from the description of the specification and the like.

Means for Solving the Problems

One embodiment of the present invention is a semiconductor device including a transistor, and the transistor includes a first conductive film, a first insulating film over the first conductive film, a first oxide semiconductor film including a region overlapping with the first conductive film with the first insulating film positioned therebetween, a second insulating film over the first oxide semiconductor film, a second oxide semiconductor film including a region overlapping with the first oxide semiconductor film with the second insulating film positioned therebetween, a second conductive film over the second oxide semiconductor film, and a third insulating film over the first oxide semiconductor film, over the second oxide semiconductor film, and over the second conductive film. The first oxide semiconductor film includes a channel region in contact with the second insulating film, a source region in contact with the third insulating film, and a drain region in contact with the third insulating film. The second oxide semiconductor film includes a region higher in carrier density than the channel region. The second conductive film includes a region in contact with the first conductive film.

Another embodiment of the present invention is a semiconductor device including a transistor, and the transistor includes a first conductive film, a first insulating film over the first conductive film, a first oxide semiconductor film including a region overlapping with the first conductive film with the first insulating film positioned therebetween, a second insulating film over the first oxide semiconductor film, a second oxide semiconductor film including a region overlapping with the first oxide semiconductor film with the second insulating film positioned therebetween, a second conductive film over the second oxide semiconductor film, and a third insulating film over the first oxide semiconductor film, over the second oxide semiconductor film, and over the second conductive film. The first oxide semiconductor film includes a channel region in contact with the second insulating film, a source region in contact with the third insulating film, and a drain region in contact with the third insulating film. The second oxide semiconductor film includes a region higher in carrier density than the channel region. The first insulating film, the second insulating film, and the second oxide semiconductor film include a first opening. The second conductive film includes a region in contact with the first conductive film in the first opening.

In each of the above structures, the second conductive film preferably has a light-shielding property. Furthermore, sheet resistance of the second conductive film is preferably lower than or equal to 10 Ω/square (Ω/sq.).

Furthermore, in each of the above structures, the transistor preferably further includes a third conductive film and a fourth conductive film, the third conductive film preferably includes a region electrically connected to the first oxide semiconductor film in the source region through a second opening provided in the third insulating film, and the fourth conductive film preferably includes a region electrically connected to the first oxide semiconductor film in the drain region through a third opening provided in the third insulating film.

Furthermore, in each of the above structures, at least one of the first oxide semiconductor film and the second oxide semiconductor film contains In, Zn, and M (M is Al, Ga, Y, or Sn).

Furthermore, in each of the above structures, in the case where the second oxide semiconductor film contains In, Zn, and M, the second oxide semiconductor film preferably includes a region where a content of In is higher than a content of M. Furthermore, in the case where the first oxide semiconductor film contains In, Zn, and M, the first oxide semiconductor film preferably includes a region where a content of In is higher than a content of M.

Furthermore, in each of the above structures, the third insulating film preferably contains at least one of nitrogen and hydrogen.

In each of the above structures, the first oxide semiconductor film preferably includes a crystal part, and the crystal part preferably has c-axis alignment.

Furthermore, another embodiment of the present invention is a display device including the semiconductor device of any of the above embodiments and a display element. Furthermore, another embodiment of the present invention is an electronic device including the semiconductor device of the above embodiments and a sensor. A display device in this specification refers to an image display device. One embodiment of the present invention also includes all the following modules in its category: a module in which a connector such as an FPC (Flexible Printed Circuit) or a TCP (Tape Carrier Package) is attached to a display device; a module having a TCP provided with a printed wiring board at the end thereof; or a module having an IC (integrated circuit) directly mounted over a display device by a COG (chip on glass) method.

Effects of the Invention

According to one embodiment of the present invention, a change in electrical characteristics of a transistor including an oxide semiconductor can be suppressed. According to one embodiment of the present invention, the reliability of a transistor including an oxide semiconductor can also be improved. According to another embodiment of the present invention, a transistor including an oxide semiconductor and having high on-state current can be provided. According to one embodiment of the present invention, a transistor including an oxide semiconductor and having low off-state current can also be provided. According to one embodiment of the present invention, a semiconductor device with lower power consumption can also be provided. According to one embodiment of the present invention, a novel semiconductor device can also be provided. According to one embodiment of the present invention, a method for manufacturing a novel semiconductor device can also be provided.

Note that the description of these effects does not preclude the existence of other effects. One embodiment of the present invention need not necessarily achieve all the effects listed above. Other effects will be apparent from and can be derived from the description of the specification, the drawings, the claims, and the like.

BRIEF DESCRIPTION OF THE DRAWINGS

FIG. 42 illustrates contact chain resistance measurement results of an example.

EMBODIMENT FOR CARRYING OUT THE INVENTION

Figure 1A:
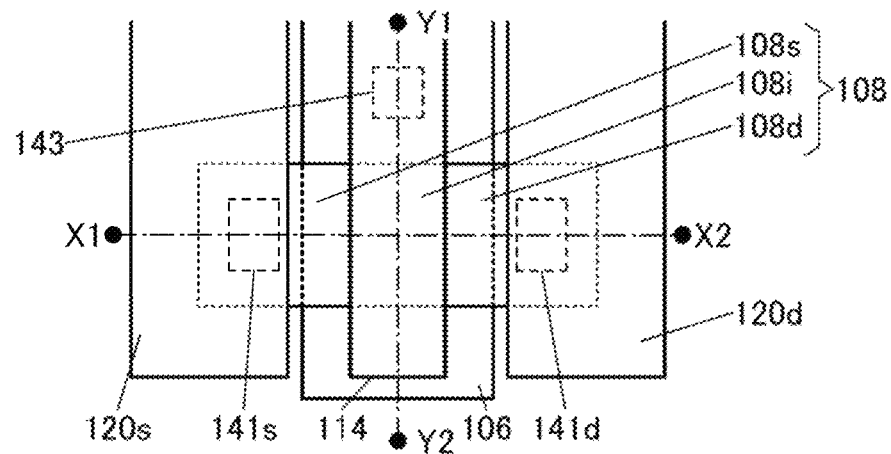
FIGS. 1A-1C illustrate top surface and cross sections of a semiconductor device.

Embodiments of the present invention will be described in detail below with reference to the drawings. However, the present invention is not limited to the following description, and the mode and details can be variously changed unless departing from the spirit and scope of the present invention. Accordingly, the present invention should not be interpreted as being limited to the content of the embodiments described below.

Note that the position, size, range, or the like of each structure illustrated in the drawings and the like do not represent the actual position, size, and range in some cases for easy understanding. Therefore, the disclosed invention is not necessarily limited to the position, size, range, or the like as disclosed in the drawings and the like.

In addition, the ordinal numbers such as "first", "second", and the like in this specification and the like are used for convenience and do not denote the order of steps or the stacking order of layers in some cases. Therefore, for example, description can be made even when "first" is replaced with "second" or "third", as appropriate. In addition, the ordinal numbers in this specification and the like are not necessarily the same as those which specify one embodiment of the present invention.

Furthermore, in this specification, terms for describing placement, such as "over" and "under" are used for convenience in describing a positional relation between components with reference to drawings. In addition, the positional relation between components is changed as appropriate in accordance with a direction in which each component is described. Thus, description of the positional relation can be rephrased appropriately according to the situation, without being limited by the terms used in this specification.

Furthermore, in describing the structure of the invention with reference to the drawings in this specification and the like, the same reference numerals denoting the same components are commonly used in different diagrams.

Furthermore, in this specification and the like, a "semiconductor" includes characteristics of an "insulator" in some cases when the conductivity is sufficiently low, for example Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Also, an "insulator" in this specification and the like can be called a "semi-insulator" in some cases.

Furthermore, in this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Also, an "insulator" in this specification and the like can be called a "semi-insulator" in some cases.

Furthermore, in this specification and the like, a transistor is an element having at least three terminals including a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms "source" and "drain" can be interchanged with each other in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. Note that, in one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. Note that, in one transistor, channel widths in all regions are not necessarily the same. In other words, the channel width of one transistor is not fixed to one value in some cases. Therefore, in this specification and the like, the channel width is any one of values, the maximum value, the minimum value, or the average value in a region where a channel is formed.

Furthermore, in this specification and the like, the term "electrically connected" includes the case where components are connected through "an object having any electric function". Here, there is no particular limitation on "an object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Furthermore, a voltage usually refers to a potential difference between a given potential and a reference potential (e.g., a ground potential (GND) or a source potential). Therefore, a voltage can also be referred to as potential.

Furthermore, in this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Furthermore, unless otherwise specified, off-state current in this specification and the like refers to drain current of a transistor in an off state (also referred to as a non-conducting state and a cutoff state). Unless otherwise specified, the off state of an n-channel transistor means that the voltage Vgs between its gate and source is lower than the threshold voltage Vth, and the off state of a p-channel transistor means that the voltage Vgs between its gate and source is higher than the threshold voltage Vth. For example, the off-state current of an n-channel transistor sometimes refers to a drain current at the time when the voltage Vgs between the gate and source is lower than the threshold voltage Vth.

The off-state current of a transistor depends on Vgs in some cases. Thus, "the off-state current of a transistor is lower than or equal to I" may mean "there is a Vgs value with which the off-state current of the transistor becomes lower than or equal to I". The off-state current of a transistor may refer to the off-state current in an off state at predetermined Vgs, in an off state at Vgs in a predetermined range, in an off state at Vgs with which sufficiently reduced off-state current is obtained, or the like.

As an example, the assumption is made of an n-channel transistor where the threshold voltage Vth is 0.5 V and the drain current is $1\times10^{-9}$ A at a voltage Vgs of 0.5 V, $1\times10^{-13}$ A at a voltage Vgs of 0.1 V, $1\times10^{-19}$ A at a voltage Vgs of −0.5 V, and $1\times10^{-22}$ A at a voltage Vgs of −0.8 V. The drain current of the transistor is $1\times10^{-19}$ A or lower at Vgs of −0.5 V or at Vgs in the range of −0.5 V to −0.8 V; therefore, it can be said that the off-state current of the transistor is $1\times10^{-19}$ A or lower. Since there is Vgs at which the drain current of the transistor is $1\times10^{-22}$ A or lower, it can be said that the off-state current of the transistor is $1\times10^{-22}$ A or lower.

In this specification and the like, the off-state current of a transistor with a channel width W is sometimes represented by a flowing current value per channel width W or by a flowing current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., a temperature higher than or equal to 5° C. and lower than or equal to 35° C.). The description "an off-state current of a transistor is lower than or equal to I" may refer to a situation where there is a value Vgs at which the off-state current of the transistor is lower than or equal to I at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature higher than or equal to 5° C. and lower than or equal to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the reliability of a semiconductor device or the like including the transistor is ensured or Vds at which the semiconductor device or the like including the transistor is used. The description "an off-state current of a transistor is lower than or equal to I" may mean that there is a Vgs value at which the off-state current of the transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, at Vds at which the reliability of a semiconductor device or the like including the transistor is ensured, or at Vds at which the semiconductor device or the like including the transistor is used.

In the above description of off-state current, a drain may be replaced with a source. That is, the off-state current sometimes refers to a current that flows through a source of a transistor in the off state.

Furthermore, in this specification and the like, the term "leakage current" may be used for the same meaning as "off-state current". In addition, in this specification and the like, the off-state current sometimes refers to current that flows between a source and a drain of a transistor in the off state, for example.

Furthermore, in this specification, "parallel" refers to a state in which two straight lines are placed at an angle of greater than or equal to −10° and less than or equal to 10°. Thus, the case where the angle is greater than or equal to −5° and less than or equal to 5° is also included. In addition, "substantially parallel" refers to a state in which two straight lines are placed at an angle of greater than or equal to −30° and less than or equal to 30°. In addition, "perpendicular" refers to a state in which two straight lines are placed at an angle of greater than or equal to 80° and less than or equal to 100°. Thus, the case where the angle is greater than or equal to 85° and less than or equal to 95° is also included. In addition, "substantially perpendicular" refers to a state in which two straight lines are placed at an angle of greater than or equal to 60° and less than or equal to 120°.

Furthermore, in this specification, when a crystal is of trigonal or rhombohedral, it is expressed as a hexagonal system.

Embodiment 1

In this embodiment, an example of a semiconductor device of one embodiment of the present invention and a manufacturing method of the semiconductor device will be described with reference to FIG. 1 to FIG. 16.

Structure Example 1 of Semiconductor Device

Figure 1B:
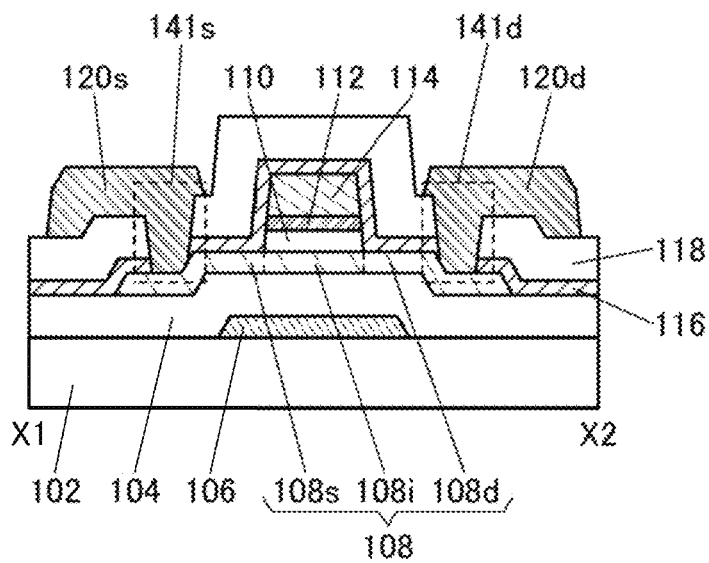
Figure 1C:
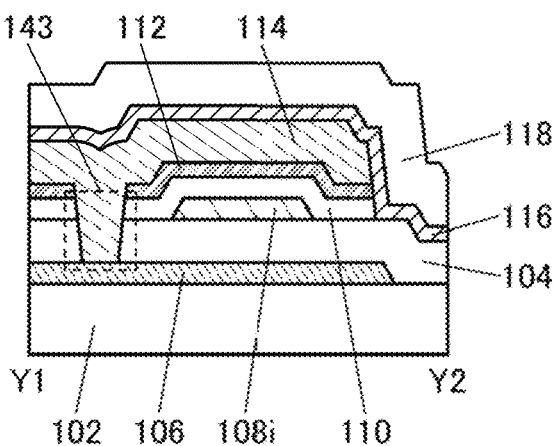

FIG. 1(A) is a top view of a transistor 100 included in a semiconductor device of one embodiment of the present invention. In addition, FIG. 1(B) is a cross-sectional view taken along a dashed-dotted line X1-X2 shown in FIG. 1(A), and FIG. 1(C) is a cross-sectional view taken along a dashed-dotted line Y1-Y2 shown in FIG. 1(A). Note that some components (e.g., a substrate 102 and an insulating film) of the transistor 100 are not illustrated in FIG. 1(A) for simplicity.

In some cases, the direction of the dashed-dotted line X1-X2 in FIG. 1(A) is referred to as the channel length (L) direction of the transistor 100, and the direction of the dashed-dotted line Y1-Y2 is referred to as the channel width (W) direction of the transistor 100.

The transistor 100 includes a conductive film 106 functioning as a first gate electrode (also referred to as bottom gate electrode) over a substrate 102, an insulating film 104 over the substrate 102 and the conductive film 110, an oxide semiconductor film 108 over the insulating film 104, an insulating film 110 over the oxide semiconductor film 108, an oxide semiconductor film 112 and a conductive film 114 functioning as a second gate electrode (also referred to as top gate electrode) over the insulating film 110, and an insulating film 116 over the insulating film 104, the oxide semiconductor film 108, the oxide semiconductor film 112, and the conductive film 114. The oxide semiconductor film 108 includes a channel region 108i overlapping with the oxide semiconductor film 112 and the conductive film 114 and in contact with the insulating film 110, a source region 108s in contact with the insulating film 116, and a drain region 108d in contact with the insulating film 116.

Furthermore, the transistor 100 includes an insulating film 118 over the insulating film 116, a conductive film 120s electrically connected to the oxide semiconductor film 108 in the source region 108s through an opening 141s provided in the insulating films 116 and 118, and a conductive film 120d electrically connected to the oxide semiconductor film 108 in the drain region 108d through an opening 141d provided in the insulating films 116 and 118.

Note that in this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. Furthermore, in the transistor 100, the insulating film 104 functions as a first gate insulating film, and the insulating film 110 functions as a second gate insulating film. Thus, in this specification and the like, the insulating film 104 may be referred to as a first gate insulating film, and the insulating film 110 may be referred to as a second gate insulating film. In addition, the conductive film 120s functions as a source electrode, and the conductive film 120d functions as a drain electrode. Thus, in this specification and the like, the conductive film 120s may be referred to as a source electrode, and the conductive film 120d may be referred to as a drain electrode.

The oxide semiconductor film 112 has a function of supplying oxygen to the insulating film 110. The oxide semiconductor film 112 having a function of supplying oxygen to the insulating film 110 enables the insulating film 110 to contain excess oxygen. When the insulating film 110 includes an excess oxygen region, the excess oxygen can be supplied to the oxide semiconductor film 108, more specifically, the channel region 108i. Thus, a semiconductor device with high reliability can be provided.

Note that, in order to supply excess oxygen to the oxide semiconductor film 108, excess oxygen may be supplied to the insulating film 104 that is formed under the oxide semiconductor film 108. However, in that case, oxygen contained in the insulating film 104 can also be supplied to the source region 108s and the drain region 108d of the oxide semiconductor film 108. When excess oxygen is supplied to the source region 108s and the drain region 108d, the resistance of the source region 108s and the drain region 108d might be increased.

By contrast, the structure in which the insulating film 110 formed over the oxide semiconductor film 108 contains excess oxygen enables excess oxygen to be selectively supplied only to the channel region 108i. Alternatively, after excess oxygen is supplied to the channel region 108i, the source region 108s, and the drain region 108d, the carrier density in the source region 108s and the drain region 108d may be selectively increased.

The insulating film 116 contains at least one of nitrogen and hydrogen. When the insulating film 116 contains at least one of nitrogen and hydrogen, at least one of nitrogen and hydrogen can be supplied to the oxide semiconductor film 108 and the oxide semiconductor film 112. As a result, the source region 108s and the drain region 108d can be formed in the oxide semiconductor film 108.

In addition, after supplying oxygen to the insulating film 110, the oxide semiconductor film 112 is supplied with at least one of nitrogen and hydrogen from the insulating film 116 or the conductive film 114, whereby a donor level is formed in the vicinity of the conduction band and the carrier density is increased. In other words, the oxide semiconductor film 112 also functions as an oxide conductor (OC). Thus, the oxide semiconductor film 112 has a higher carrier density than at least the channel region 108i of the oxide semiconductor film 108.

An oxide semiconductor generally transmits visible light because of its large energy gap. An oxide conductor is an oxide semiconductor having a donor level in the vicinity of the conduction band. Thus, the influence of absorption due to the donor level is small in an oxide conductor, and the oxide conductor has a visible light transmitting property comparable to that of an oxide semiconductor. Accordingly, it is preferable that the conductive film 114 be provided over the oxide semiconductor film 112 in order to prevent light from entering the oxide semiconductor film 112.

The conductive film 114 is preferably a material having a light-shielding property. In addition, a material with high conductivity is preferable, in other words, its sheet resistance is preferably low. Specifically, the sheet resistance of the conductive film 114 is preferably lower than or equal to 100 Ω/sq., and more preferably lower than or equal to 10 Ω/sq. Thus, the conductive film 114 preferably contains a metal.

Furthermore, when the conductive film 114 has a function of excessively supplying at least one of nitrogen and hydrogen, there may be a case where at least one of nitrogen and hydrogen is supplied to the channel region 108i of the oxide semiconductor film 108. Thus, the function of supplying at least one of nitrogen and hydrogen of the conductive film 114 is preferably low. In addition, the function of allowing the passage of at least one of nitrogen and hydrogen of the conductive film 114 is preferably low.

Furthermore, the source region 108s and the drain region 108d of the oxide semiconductor film 108 and the oxide semiconductor film 112 may each contain an element that forms an oxygen vacancy. Typical examples of the element that forms an oxygen vacancy include hydrogen, boron, carbon, nitrogen, fluorine, phosphorus, sulfur, chlorine, and a rare gas. Typical examples of the rare gas element are helium, neon, argon, krypton, and xenon.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element, and the oxygen is released from the metal element, whereby an oxygen vacancy is formed. As a result, the oxide semiconductor film has a higher carrier density and thus the conductivity becomes higher.

In addition, the transistor 100 preferably includes a region where a side end portion of the insulating film 110, a side end portion of the oxide semiconductor film 112, and a side end portion of the conductive film 114 are aligned. In other words, the transistor 100 has a structure in which an upper end portion of the insulating film 110 and an upper end portion of the oxide semiconductor film 112 are substantially aligned, and a structure in which the upper end portion of the oxide semiconductor film 112 and a lower end portion of the conductive film 114 are substantially aligned. The above structure can be obtained by processing the insulating film 110 with the use of the conductive film 114 as a mask, for example.

In addition, the transistor 100 includes a region where the conductive film 106 and the conductive film 114 are in contact with each other through an opening 143 provided in the insulating film 104, the insulating film 110, and the oxide semiconductor film 112, and the conductive film 106 and the conductive film 114 are electrically connected. Accordingly, the same potential is applied to the conductive film 106 and the conductive film 114.

In order to reduce power consumed by the transistor 100 or to stabilize the electrical characteristics of the transistor 100, the contact resistance (contact resistance) or contact chain resistance between the conductive film 106 and the conductive film 114 is preferably low.

As described above, the transistor 100 has a structure in which a conductive film functioning as a gate electrode is provided over and under the oxide semiconductor film 108.

«S-Channel Structure»

As illustrated in FIG. 1(C), the oxide semiconductor film 108 is sandwiched, with the first gate insulating film and the second gate insulating film positioned therebetween, between the conductive film 106 that functions as the first gate electrode and the oxide semiconductor film 112 and the conductive film 114 that function as the second gate electrode. The length of the conductive film 106 in the channel width direction is greater than the length of the oxide semiconductor film 108 in the channel width direction. Furthermore, the length of the oxide semiconductor film 112 in the channel width direction is greater than the length of the oxide semiconductor film 108 in the channel width direction. Furthermore, the length of the conductive film 114 in the channel width direction is greater than the length of the oxide semiconductor film 108 in the channel width direction. In addition, since the conductive film 106 and the conductive film 114 have regions where they are in contact with each other to be electrically connected through the opening 143 provided in the insulating film 104, the insulating film 110, and the oxide semiconductor film 112, at least one of the side surfaces of the oxide semiconductor film 108 in the channel width direction faces the conductive film 114 with the insulating film 110 positioned therebetween. That is, the oxide semiconductor film 108 as a whole in the channel width direction is covered with the conductive film 106 and the conductive film 114 with the first gate insulating film and the second gate insulating film positioned therebetween.

In other words, in the channel width direction of the transistor 100, the conductive film 106 and the conductive film 114 surround the oxide semiconductor film 108 with the first gate insulating film and the second gate insulating film positioned therebetween.

With such a structure, electric fields of the conductive film 106 functioning as the first gate electrode and the conductive film 114 functioning as the second gate electrode can electrically surround the oxide semiconductor film 108 included in the transistor 100. A device structure of a transistor, like that of the transistor 100, in which electric fields of a first gate electrode and a second gate electrode electrically surround an oxide semiconductor film where a channel region is formed can be referred to as a Surrounded channel (abbreviation: S-channel) structure.

Since the transistor 100 has the S-channel structure, an electric field for inducing a channel can be effectively applied to the oxide semiconductor film 108 by the conductive film 106 and the conductive film 114. Accordingly, the current drive capability of the transistor 100 is increased, so that high on-state current characteristics can be obtained. Furthermore, since the on-state current can be increased, the size of the transistor 100 can be reduced. Furthermore, since the transistor 100 has a structure enveloped by the conductive film 106 and the conductive film 114, the mechanical strength of the transistor 100 can be increased.

In addition, with the above structure, the region where carriers flow in the oxide semiconductor film 108 is increased to include the insulating film 104 side of the oxide semiconductor film 108, the insulating film 110 side of the oxide semiconductor film 108, and inside the oxide semiconductor film 108; thus, the amount of carrier transfer in the transistor 100 is increased. As a result, the on-state current of the transistor 100 is increased, and the field-effect mobility is also increased to, for example, higher than or equal to 10 cm$^2$/V·s. Note that here, the field-effect mobility is not an approximate value of the mobility as the physical property of the oxide semiconductor film but is an index of the current drive capability of the transistor in a saturation region and the apparent field-effect mobility.

Note that, in the channel width direction of the transistor 100, an opening different from the opening 143 may be formed on the opposite side of the portion where the opening 143 is formed across the oxide semiconductor film 108.

<Components of the Semiconductor Device>

Components included in the semiconductor device of this embodiment will be described in detail below.

«Oxide Semiconductor Film»

An oxide semiconductor can be used for the oxide semiconductor film 108 in the transistor 100 of one embodiment of the present invention. An oxide semiconductor will be described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. Note that the element M is aluminum, gallium, yttrium, tin, or the like. Examples of other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to one embodiment of the present invention will be described with reference to FIG. 14(A), FIG. 14(B), and FIG. 14(C). Note that the atomic proportion of oxygen is not illustrated in FIG. 14. Furthermore, the terms of the atomic ratio of indium to the element M and zinc in the oxide semiconductor are denoted by [In], [M], and [Zn], respectively.

Figure 14A:
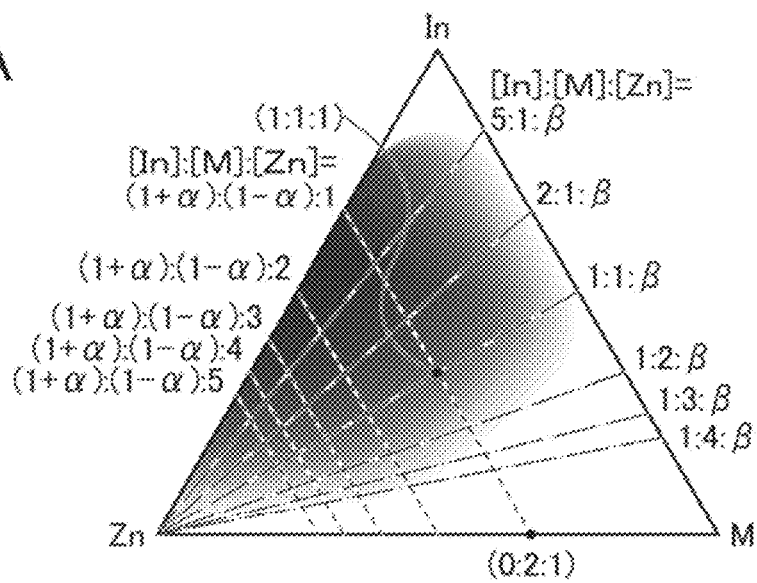
FIGS. 14A-14C illustrate the range of atomic ratios of an oxide semiconductor of one embodiment of the present invention.
Figure 14B:
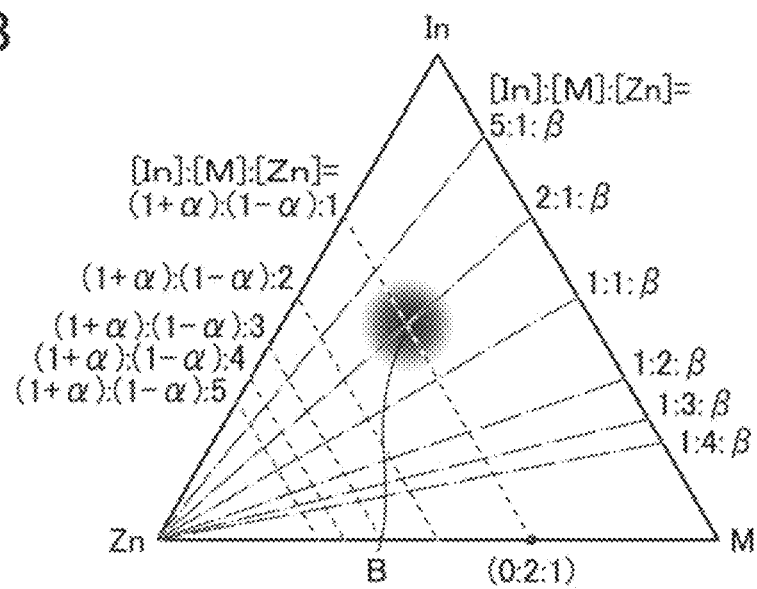
Figure 14C:
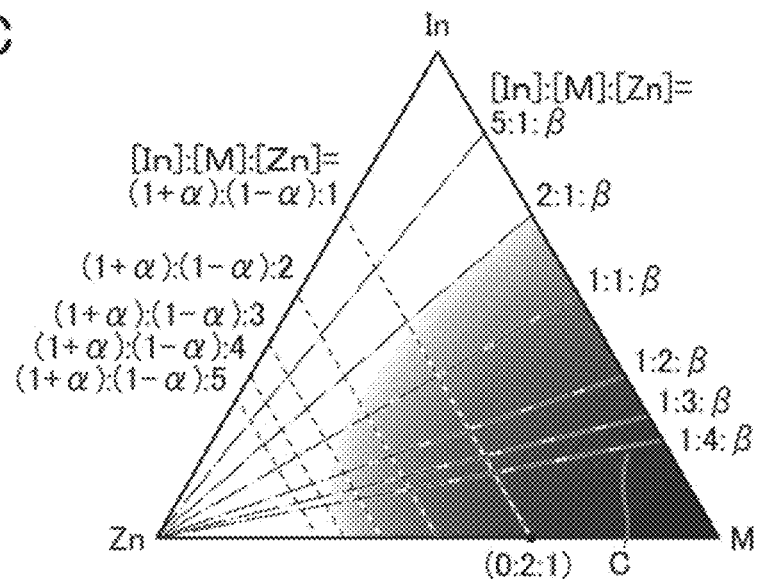

In FIG. 14(A), FIG. 14(B), and FIG. 14(C), broken lines indicate a line where the atomic ratio [In]:[M]:[Zn] is (1+a):(1−a):1(−1≤a≤1, a is greater than or equal to −1 and less than or equal to 1), a line where the atomic ratio [In]:[M]:[Zn] is (1+a):(1−a):2, a line where the atomic ratio [In]:[M]:[Zn] is (1+a):(1−a):3, a line where the atomic ratio [In]:[M]:[Zn] is (1+a):(1−a):4, and a line where the atomic ratio [In]:[M]:[Zn] is (1+a):(1−a):5.

Dashed-dotted lines indicate a line where the atomic ratio [In]:[M]:[Zn] is 1:1:β, (β≥0, beta is greater than or equal to 0), a line where the atomic ratio [In]:[M]:[Zn] is 1:2:β, a line where the atomic ratio [In]:[M]:[Zn] is 1:3:β a line where the atomic ratio [In]:[M]:[Zn] is 1:4:β, a line where the atomic ratio [In]:[M]:[Zn] is 2:1:β and a line where the atomic ratio [In]:[M]:[Zn] is 5:1:β.

The oxide semiconductor illustrated in FIG. 14 with an atomic ratio of [In]:[M]:[Zn]=0:2:1 or in the neighborhood thereof is likely to have a spinel crystal structure.

FIG. 14(A) and FIG. 14(B) illustrate examples of the preferred ranges of the atomic ratio of indium, the element M, and zinc contained in an oxide semiconductor according to one embodiment of the present invention.

Figure 15:
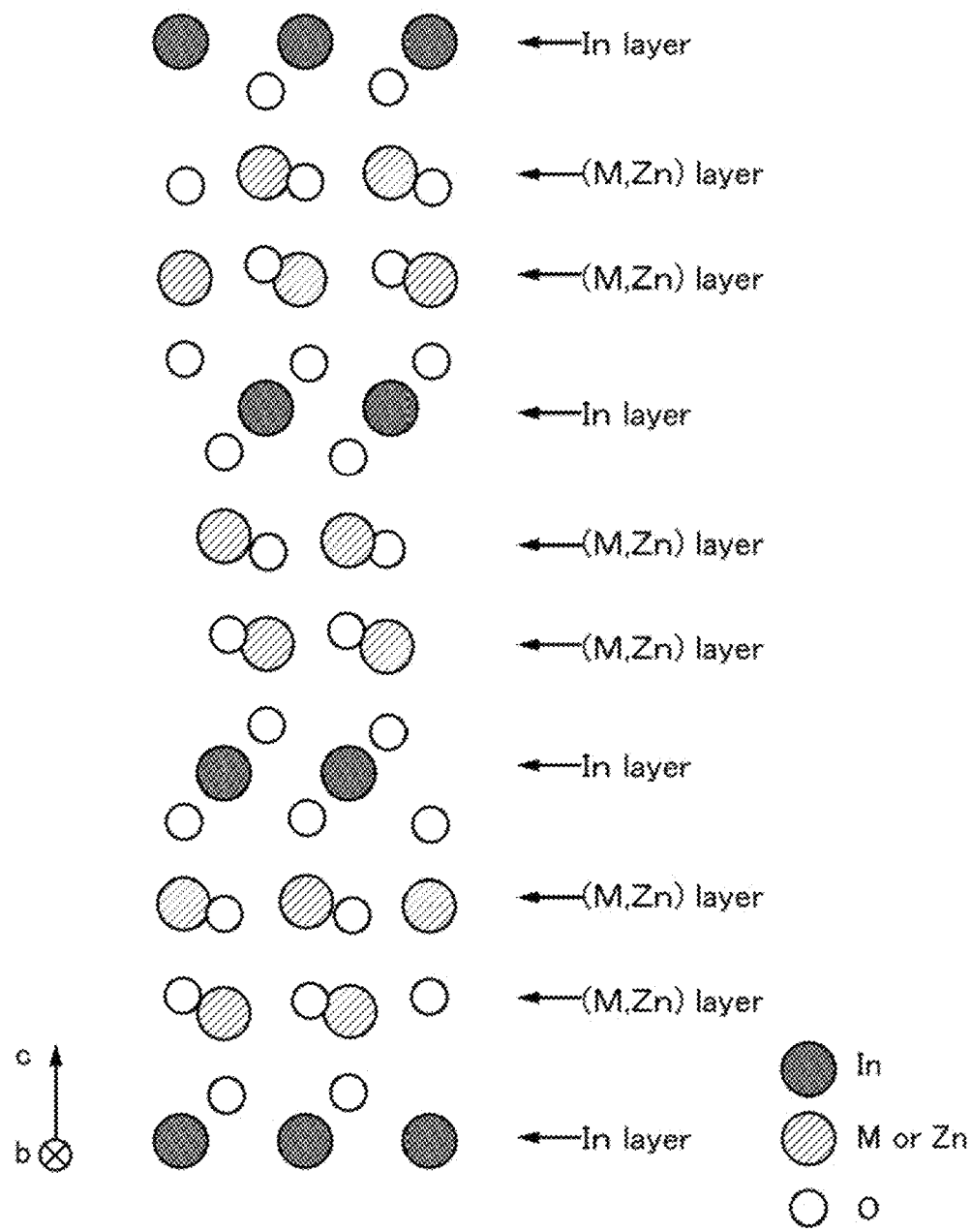
FIG. 15 illustrates a crystal of $InMZnO_4$.

As an example, FIG. 15 illustrates the crystal structure of InMZnO$_4$ in which [In]:[M]:[Zn] is 1:1:1. The crystal structure in FIG. 15 is InMZnO$_4$ observed from a direction parallel to the b-axis. Note that a metal element in a layer that contains the element M, zinc, and oxygen (hereinafter referred to as "(M,Zn) layer") in FIG. 15 represents the element M or zinc. In that case, the proportion of the element M is equal to the proportion of zinc. The element M and zinc can be replaced with each other, and their arrangement is random.

Note that InMZnO$_4$ has a layered crystal structure (also referred to as layered structure) and includes two (M,Zn) layers with respect to one layer that contains indium and oxygen (hereinafter referred to as In layer), as illustrated in FIG. 15.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. That is, as [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have more than one kind of layered structures where the number of (M,Zn) layers with respect to one In layer is an integer. For example, in the case where [In]:[M]:[Zn] is 1:1:1.5, the oxide semiconductor may have a mix of a layered structure including one In layer for every two (M,Zn) layers and a layered structure including one In layer for every three (M,Zn) layers.

For example, in the case where the oxide semiconductor is deposited by a sputtering apparatus, a film having an atomic ratio deviating from the atomic ratio of a target is formed. In particular, [Zn] in the film might be smaller than [Zn] in the target depending on the substrate temperature in deposition.

Furthermore, more than one phase (e.g., two phases or three phases) might exist in the oxide semiconductor. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where more than one phase exists in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap; therefore, an oxide semiconductor with a high indium content has higher carrier mobility than an oxide semiconductor with a low indium content.

By contrast, when the indium content and the zinc content in an oxide semiconductor become lower, carrier mobility becomes lower. Thus, with an atomic ratio of [In]:[M]:[Zn]=0:1:0 and in the neighborhood thereof (e.g., a region C in FIG. 14(C)), the insulation performance becomes better.

Accordingly, an oxide semiconductor according to one embodiment of the present invention preferably has an atomic ratio represented by a region A in FIG. 14(A) with which carrier mobility is high and the layered structure tends to have fewer grain boundaries.

A region B in FIG. 14(B) represents an atomic ratio of [In]:[M]:[Zn]=4:2:3 to 4.1 and the neighborhood thereof. The neighborhood includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. There is a difference in the degree of difficulty in forming a layered structure among atomic ratios. Even with the same atomic ratio, on the other hand, a layered structure might be or might not be formed depending on a formation condition. Therefore, the illustrated regions each represent an atomic ratio with which an oxide semiconductor has a layered structure, and boundaries of the regions A to C are not clear.

Next, a structure in which the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for a channel region of the transistor. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

Note that a highly purified intrinsic or substantially highly purified intrinsic oxide semiconductor has few carrier generation sources and thus can have a low carrier density. In addition, a highly purified intrinsic or substantially highly purified intrinsic oxide semiconductor has a low density of defect states and accordingly has a low density of trap states in some cases.

Charge trapped by the trap states in the oxide semiconductor takes a long time to disappear and may behave like fixed charge. Thus, the transistor whose channel region is formed in the oxide semiconductor having a high density of trap states has unstable electrical characteristics in some cases.

Accordingly, in order to obtain stable electrical characteristics of the transistor, it is effective to reduce the concentration of impurities in the oxide semiconductor in channel formation region. In addition, in order to reduce the concentration of impurities in the oxide semiconductor, the concentration of impurities in a film that is adjacent to the oxide semiconductor is preferably reduced. As examples of the impurities, hydrogen, nitrogen, alkali metal, alkaline earth metal, iron, nickel, silicon, and the like are given.

Here, the influence of impurities in the oxide semiconductor is described.

When silicon or carbon that is one of Group 14 elements is contained in the oxide semiconductor, defect states are formed in the oxide semiconductor. Thus, the concentration of silicon or carbon in the oxide semiconductor and the concentration of silicon and carbon around an interface with the oxide semiconductor (the concentration measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal in a channel region is likely to be normally-on. Therefore, it is preferable to reduce the concentration of alkali metal or alkaline earth metal in the oxide semiconductor in the channel region. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons functioning as carriers and an increase of carrier density. Thus, a transistor including an oxide semiconductor that contains nitrogen for a channel region is likely to have normally-on characteristics. Accordingly, nitrogen in the oxide semiconductor in the channel region is preferably reduced as much as possible; for example, the concentration of nitrogen in the oxide semiconductor measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

In addition, hydrogen contained in an oxide semiconductor reacts with oxygen bonded to a metal atom to be water, and thus causes formation of an oxygen vacancy, in some cases. Entry of hydrogen into the oxygen vacancy generates an electron functioning as a carrier in some cases. Furthermore, in some cases, bonding of part of hydrogen to oxygen bonded to a metal atom causes generation of an electron functioning as a carrier. Thus, a transistor including an oxide semiconductor that contains hydrogen for a channel region is likely to have normally-on characteristics. Accordingly, hydrogen in the oxide semiconductor is preferably reduced as much as possible. Specifically, in the oxide semiconductor of the channel region, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity is used for a channel region in a transistor, the transistor can have stable electrical characteristics.

The energy gap of the oxide semiconductor film is preferably 2 eV or more, 2.5 eV or more, or 3 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

When the oxide semiconductor film is an In-M-Zn oxide, as the atomic ratio of metal elements in a sputtering target used for formation of the In-M-Zn oxide, In:M:Zn=1:1:0.5, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable.

Note that the atomic ratios of metal elements in the formed oxide semiconductor films may each vary from the above atomic ratio of metal elements in the sputtering target within a range of approximately ±40%. For example, in the case where a sputtering target with an atomic ratio of In to Ga and Zn is 4:2:4.1, the atomic ratio of In to Ga and Zn in the formed oxide semiconductor film may be around 4:2:3. In the case where a sputtering target with an atomic ratio of In to Ga and Zn is 5:1:7 is used, the atomic ratio of In to Ga and Zn in the formed oxide semiconductor film may be around 5:1:6.

On the other hand, the source region 108*s* and the drain region 108*d* are in contact with the insulating film 116. Since the source region 108*s* and the drain region 108*d* are in contact with the insulating film 116, at least one of hydrogen and nitrogen are added from the insulating film 116 to the source region 108*s* and the drain region 108*d*, so that the carrier densities are increased.

Note that, without limitation to the above structure, a material with an appropriate composition is used for the oxide semiconductor film 108 in accordance with required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio of a metal element to oxygen, the interatomic distance, the density, and the like of the oxide semiconductor film be set appropriately.

Furthermore, the oxide semiconductor film 108 may have a non-single-crystal structure. The non-single-crystal structure includes a c axis aligned crystalline oxide semiconductor (CAAC-OS), which will be described later, a polycrystalline structure, a microcrystalline structure, which will be described later, and an amorphous structure, for example. Among the non-single-crystal structure, the amorphous structure has the highest density of defect states, whereas CAAC-OS has the lowest density of defect states.

Note that the oxide semiconductor film 108 may be a single-layer film or have a stacked-layer structure, including two or more of the following: a region having an amorphous structure, a region having a microcrystalline structure, a region having a polycrystalline structure, a CAAC-OS region, and a region having a single-crystal structure.

In the oxide semiconductor film 108, the crystallinity of the channel region 108*i* may be different from that of the source region 108*s* and the drain region 108*d*. Specifically, in the oxide semiconductor film 108, the source region 108*s* and the drain region 108*d* may have lower crystallinity than the channel region 108*i*. This is because the source region 108*s* and the drain region 108*d* are damaged when an impurity element is added to the source region 108*s* and the drain region 108*d*, which results in a decrease in the crystallinity.

The oxide semiconductor film 112 may be formed using materials and a manufacturing method similar to those of the oxide semiconductor film 108 described above. For example, an In oxide, an In—Sn oxide, an In—Zn oxide, an In—Ga oxide, a Zn oxide, an Al—Zn oxide, an In—Ga—Zn oxide, or the like can be used for the oxide semiconductor film 112. It is particularly preferable to use an In—Sn oxide or an In—Ga—Zn oxide. Furthermore, for the oxide semiconductor film 112, a material such as indium tin oxide (abbreviation: ITO) or indium tin oxide containing silicon (abbreviation: ITSO) can be used. Furthermore, when the oxide semiconductor film 112 and the oxide semiconductor film 108 include the same metal element, the manufacturing cost can be reduced.

For example, in the case where an In-M-Zn oxide is used as the oxide semiconductor film 112, a sputtering target used for forming the In-M-Zn oxide preferably includes a region where In is higher than or equal to M in the atomic ratio of metal elements. The atomic ratio of metal elements in such a sputtering target is In:M:Zn=2:1:3, In:M:Zn=3:1:2, InM:Zn=4:2:4.1, In:M:Zn=5:1:7, or the neighborhood thereof. Note that as the oxide semiconductor film 112, the composition of the sputtering target is not limited to that described above. In addition, as the oxide semiconductor film 112, a single-layer structure or a stacked-layer structure of two or more layers can be used.

Note that an oxide semiconductor typified by an In—Ga—Zn oxide can be used as the oxide semiconductor film 112. The oxide semiconductor can have a high carrier density when at least one of nitrogen and hydrogen are supplied from the insulating film 116. In other words, the oxide semiconductor included in the oxide semiconductor film 112 functions as an oxide conductor (OC). Accordingly, the oxide semiconductor can be used as a gate electrode.

In the case where the second gate electrode is a structure including the oxide semiconductor film 112 and the conductive film 114, for example, a stacked-layer structure using the above-described oxide conductor (OC) for the oxide semiconductor film 112 and using a metal film as the conductive film 114 is preferable.

In the case where a stacked-layer structure including an oxide semiconductor and a metal film with a light-shielding property is used as the second gate electrode, the channel region 108i formed under the oxide semiconductor film 112 can be shielded from light, which is preferable. Furthermore, in the case a stacked-layer structure including an oxide semiconductor or an oxide conductor (OC) and a metal film with a light-shielding property is used as the oxide semiconductor film 112, formation of a metal film (e.g., a titanium film or a tungsten film) over the oxide semiconductor or the oxide conductor (OC) causes any of the following: reduction in resistance due to the diffusion of constituent elements of the metal film to the oxide semiconductor or oxide conductor (OC) side; reduction in resistance due to damage (e.g., sputtering damage) during the formation of the metal film; and reduction in resistance due to the formation of an oxygen vacancy following the diffusion of oxygen in the oxide semiconductor or the oxide conductor (OC) into the metal film.

«Insulating Film Functioning as First Gate Insulating Film»

The insulating film 104 can be formed by appropriately using a sputtering method, a CVD method, an evaporation method, a pulsed laser deposition (PLD) method, a printing method, a coating method, or the like. In addition, the insulating film 104 can be formed as a single layer or a stacked-layer of an oxide insulating film and a nitride insulating film, for example. Note that, in order to improve the properties of the interface with the oxide semiconductor film 108, at least a region of the insulating film 104 which is in contact with the oxide semiconductor film 108 is preferably formed of an oxide insulating film. When an oxide insulating film that releases oxygen by being heated is used as the insulating film 104, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

The insulating film 104 can be formed as a single layer or a stacked layer using silicon oxide, silicon oxynitride, silicon nitride oxide, silicon nitride, aluminum oxide, hafnium oxide, gallium oxide, a Ga—Zn oxide, or the like, for example. In this embodiment, the insulating film 104 has a stacked-layer structure including a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

Note that in this specification and the like, a silicon oxynitride refers to a material in which, as its composition, the proportion of oxygen is higher than that of nitrogen, preferably containing oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. Silicon nitride oxide refers to a material in which, as its composition, the proportion of nitrogen is higher than that of oxygen, preferably containing nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

Note that at least a region of the insulating film 104 in contact with the oxide semiconductor film 108 is preferably an oxide insulating film and preferably includes a region (oxygen-excess region) that contains oxygen in excess of that in the stoichiometric composition. In other words, the insulating film 104 is an insulating film that is capable of releasing oxygen. Note that, in order to provide the oxygen-excess region in the insulating film 104, the insulating film 104 is formed in an oxygen atmosphere, for example. Alternatively, oxygen may be added to the insulating film 104 after the formation. A method for adding oxygen to the insulating film 104 after the formation will be described later.

For the insulating film 104, a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide can be suitably used. The material containing hafnium or yttrium has higher dielectric constant than silicon oxide and silicon oxynitride. Accordingly, the use of the above high-k materials for the insulating film 104 allows the film thickness to be increased as compared with a case where a silicon oxide film is used; therefore, leakage current due to tunnel current can be reduced. That is, it is possible to provide a transistor with low off-state current. Moreover, hafnium oxide with a crystal structure has a higher dielectric constant than hafnium oxide with an amorphous structure. Thus, it is preferable to use hafnium oxide with a crystal structure in order to provide a transistor with low off-state current. Examples of the crystal structure include a monoclinic crystal structure and a cubic crystal structure. However, one embodiment of the present invention is not limited to the above examples.

Note that, in this embodiment, the insulating film 104 is formed by stacking a silicon nitride film on the conductive film 106 side and a silicon oxide film on the oxide semiconductor film 108 side. A silicon nitride film has a higher dielectric constant than a silicon oxide film and needs a larger thickness for a capacitance equivalent to that of the silicon oxide film. Therefore, when the first gate insulating film of the transistor 100 includes a silicon nitride film, the physical thickness of the first gate insulating film can be large. This makes it possible to reduce a decrease in withstand voltage of the transistor 100 and furthermore to increase the withstand voltage, thereby reducing electrostatic discharge damage to the transistor 100.

«Insulating Film Functioning as Second Gate Insulating Film»

The insulating film 110 functions as a gate insulating film of the transistor 100. In addition, the insulating film 110 has a function of supplying oxygen to the oxide semiconductor film 108, particularly to the channel region 108$i$. The insulating film 110 can be formed as a single layer or a stacked layer of an oxide insulating film or a nitride insulating film, for example Note that, in order to improve the properties of the interface with the oxide semiconductor film 108, a region of the insulating film 110 in contact with the oxide semiconductor film 108 is preferably formed using at least an oxide insulating film. Silicon oxide, silicon oxynitride, silicon nitride oxide, or silicon nitride may be used for the insulating film 110, for example.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. As the above-mentioned signal, an E' center observed at a g-factor of 2.001 can be given, for example. Note that the E' center is due to the dangling bond of silicon. As the insulating film 110, a silicon oxide film or a silicon oxynitride film whose spin density due to the E' center is lower than or equal to $3\times10^{17}$ spins/cm³ and preferably lower than or equal to $5\times10^{16}$ spins/cm³ may be used.

In addition to the above-described signal, a signal due to nitrogen dioxide ($NO_2$) might be observed in the insulating film 110. The signal is divided into three signals according to the N nuclear spin: one observed at a g-factor of greater than or equal to 2.037 and less than or equal to 2.039 (which is a first signal), one observed at a g-factor of greater than or equal to 2.001 and less than or equal to 2.003 (which is a second signal), and one observed at a g-factor of greater than or equal to 1.964 and less than or equal to 1.966 (which a third signal).

It is suitable to use an insulating film whose spin density due to nitrogen dioxide ($NO_2$) is higher than or equal to $1\times10^{17}$ spins/cm³ and lower than $1\times10^{18}$ spins/cm³ as the insulating film 110, for example.

Note that a nitrogen oxide ($NO_x$) including a nitrogen dioxide ($NO_2$) forms a level in the insulating film 110. The level is positioned in the energy gap of the oxide semiconductor film 108. Thus, when nitrogen oxide ($NO_x$) is diffused to the interface between the insulating film 110 and the oxide semiconductor film 108, an electron might be trapped by the level on the insulating film 110 side. As a result, the trapped electron remains in the vicinity of the interface between the insulating film 110 and the oxide semiconductor film 108; thus, the threshold voltage of the transistor is shifted in the positive direction. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS); the typical released amount of ammonia is greater than or equal to $1\times10^{18}$ cm⁻³ and less than or equal to $5\times10^{19}$ cm⁻³. Note that the released amount of ammonia is the total amount at the temperature of heat treatment ranging from 50° C. to 650° C. inclusive or 50° C. to 550° C. inclusive in TDS.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, nitrogen concentration in the film is preferably lower than or equal to $6\times10^{20}$ atoms/cm³.

As the insulating film 110, a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), or hafnium oxide may be used. The use of such a high-k material can reduce gate leakage current of a transistor.

The insulating film 110 may be formed by a CVD method using an organosilane gas. As the organosilane gas, any of the following silicon-containing compound can be used: tetraethyl orthosilicate (TEOS: chemical formula $Si(OC_2H_5)_4$); tetramethylsilane (TMS: chemical formula $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. The insulating film 110 having high coverage can be formed by a CVD method using an organosilane gas.

«Third Insulating Film»

The insulating film 116 contains at least one of nitrogen and hydrogen. The insulating film 116 is a nitride insulating film, for example. The nitride insulating film can be formed using silicon nitride, silicon nitride oxide, aluminum nitride, aluminum nitride oxide, or the like. The hydrogen concentration in the insulating film 116 is preferably higher than or equal to $1\times10^{22}$ atoms/cm³. Furthermore, the insulating film 116 is in contact with the source region 108$s$ and the drain region 108$d$ of the oxide semiconductor film 108. In addition, the insulating film 116 has a region in contact with the oxide semiconductor film 112. Therefore, the hydrogen concentrations in the source region 108$s$, the drain region 108$d$, and the oxide semiconductor film 112 in contact with the insulating film 116 are increased; thus, the carrier densities in the source region 108$s$, the drain region 108$d$, and the oxide semiconductor film 112 can be increased. Note that, since the source region 108$s$, the drain region 108$d$, and the oxide semiconductor film 112 are each in contact with the insulating film 116, they have regions with the same hydrogen concentration in some cases.

«Fourth Insulating Film»

The insulating film 118 can be formed as a single layer or a stacked layer of an oxide insulating film or a nitride insulating film. The insulating film 118 can be formed as a single layer or a stacked layer using silicon oxide, silicon oxynitride, silicon nitride oxide, silicon nitride, aluminum oxide, hafnium oxide, gallium oxide, a Ga—Zn oxide, or the like, for example.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

«Conductive Films Functioning as First Gate Electrode and a Pair of Electrodes»

The conductive film 106 and the conductive films 120s and 120d can be formed by a sputtering method, a vacuum evaporation method, a pulsed laser deposition (PLD) method, a thermal CVD method, or the like. Each of the conductive film 106 and the conductive films 120s and 120d can be formed using, for example, a metal element selected from aluminum, chromium, copper, tantalum, titanium, molybdenum, nickel, iron, cobalt, and tungsten; an alloy containing any of these metal elements as a component; an alloy containing these metal elements in combination; or the like. Metal elements selected from one or more of manganese and zirconium may also be used. The conductive film 106 and the conductive films 120s and 120d may each have a single-layer structure or a stacked-layer structure of two or more layers. The examples include: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a two-layer structure in which a copper film is stacked over a titanium film; a three-layer structure in which a titanium film, an aluminum film, and a titanium film are stacked in this order; or a three-layer structure in which a copper film containing manganese, a copper film, and a copper film containing manganese are stacked in this order. Alternatively, an alloy film or a nitride film in which aluminum and one or more elements selected from titanium, tantalum, tungsten, molybdenum, chromium, neodymium, and scandium are combined may be used.

It is particularly suitable to use a material containing copper for the conductive film 106 and the conductive films 120s and 120d. The use of a material containing copper for the conductive films 106, 120s, and 120d can reduce the resistance. A signal delay or the like can be suppressed even in the case where a large-sized substrate is used as the substrate 102, for example.

It is also possible to use, for the conductive film 106 and the conductive films 120s and 120d, a conductive material having a light-transmitting property such as: an oxide containing indium and tin (abbreviation: ITO); an oxide containing tungsten and indium; an oxide containing tungsten, indium, and zinc; an oxide containing titanium and indium; an oxide containing titanium, indium, and tin; an oxide containing indium and zinc; an oxide containing indium, gallium, and zinc; and an oxide containing silicon, indium, and tin (abbreviation: ITSO). A stacked-layer structure including the above conductive material having a light-transmitting property and the above metal element can also be employed.

The thicknesses of the conductive film 106 and the conductive films 120s and 120d can each be greater than or equal to 30 nm and less than or equal to 500 nm, or greater than or equal to 100 nm and less than or equal to 400 nm.

«Conductive Film 114 Functioning as Second Gate Electrode»

The conductive film 114 functioning as the second gate electrode can be formed using materials and a manufacturing method similar to those of the conductive film 106 functioning as the first gate electrode and the conductive films 120s and 120d functioning as a pair of electrodes described above. Alternatively, a stacked-layer structure of these may be used.

The function of supplying at least one of nitrogen and hydrogen of the conductive film 114 is preferably low. In addition, the function of allowing the passage of at least one of nitrogen and hydrogen of the conductive film 114 is preferably low. Specifically, copper, molybdenum, tungsten, titanium, and tantalum, or a nitride of these are preferable, for example. A nitride containing nitrogen and a metal, such as molybdenum nitride, tantalum nitride, or titanium nitride is preferable since it has high conductivity, has a high barrier property against copper or hydrogen, and is stable.

«Substrate»

As the substrate 102, any of a variety of substrates can be used without particular limitation. Examples of the substrate include a semiconductor substrate (e.g., a single crystal substrate or a silicon substrate), an SOI substrate, a glass substrate, a quartz substrate, a ceramic substrate, a sapphire substrate, a plastic substrate, a metal substrate, a stainless steel substrate, a substrate including stainless steel foil, a tungsten substrate, a substrate including tungsten foil, a flexible substrate, a laminate film, paper including a fibrous material, or a base film. Examples of the glass substrate include a barium borosilicate glass, an aluminoborosilicate glass, or soda lime glass. Examples of the flexible substrate, the laminate film, and the base film include the following. For example, plastic typified by polyethylene terephthalate (PET), polyethylene naphthalate (PEN), and polyether sulfone (PES). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, and paper. Specifically, when a transistor is formed using a semiconductor substrate, a single crystal substrate, an SOI substrate, or the like, it is possible to form a transistor with few variations in characteristics, size, shape, or the like and with high current capability and a small size. By forming a circuit with use of such a transistor, power consumption of the circuit can be reduced or the circuit can be highly integrated.

Note that, in the case where a glass substrate is used as the substrate 102, use of a large-sized substrate such as the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) enables a large-sized display device to be fabricated.

A flexible substrate may also be used as the substrate 102, and the transistor may be formed directly on the flexible substrate. Alternatively, a separation layer may be provided between the substrate 102 and the transistor. The separation layer can be used when part or the whole of a semiconductor device formed over the separation layer is then separated from the substrate 102 and transferred onto another substrate. In such a case, the transistor can be transferred to even a substrate having low heat resistance or a flexible substrate. Note that, for the above separation layer, a stacked-layer structure including inorganic films, which are a tungsten film and a silicon oxide film, or a structure in which a resin film of polyimide or the like is formed over a substrate can be used, for example.

Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), and the like), a leather substrate, and a rubber substrate. By using such a substrate, a transistor with excellent properties or a transistor with low power consumption can be formed, a device with high durability can be manufactured, heat resistance can be provided, or reduction in weight or thickness can be achieved.

Structure Examples 2 to 6 Of Semiconductor Device

Next, structures different from that of the semiconductor device illustrated in FIGS. 1(A), (B), and (C) will be described with reference to FIG. 2 to FIG. 7.

Structure Example 2 of Semiconductor Device

Figure 2A:
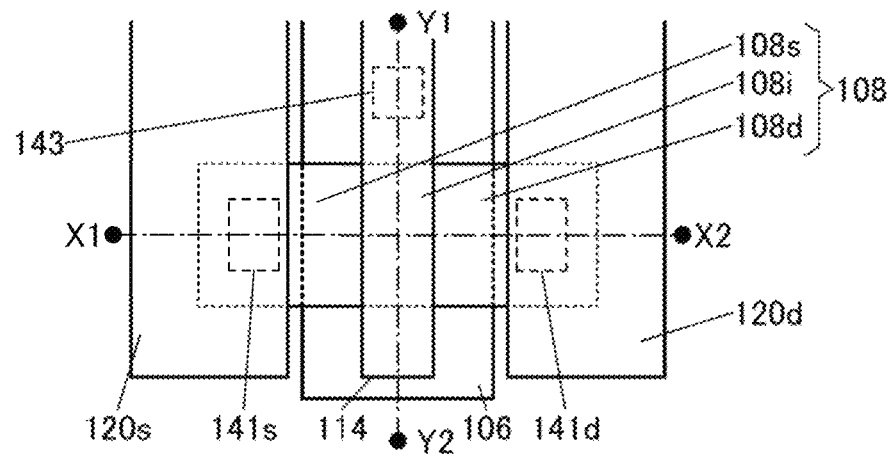
FIGS. 2A-2C illustrate top surface and cross sections of a semiconductor device.
Figure 2B:
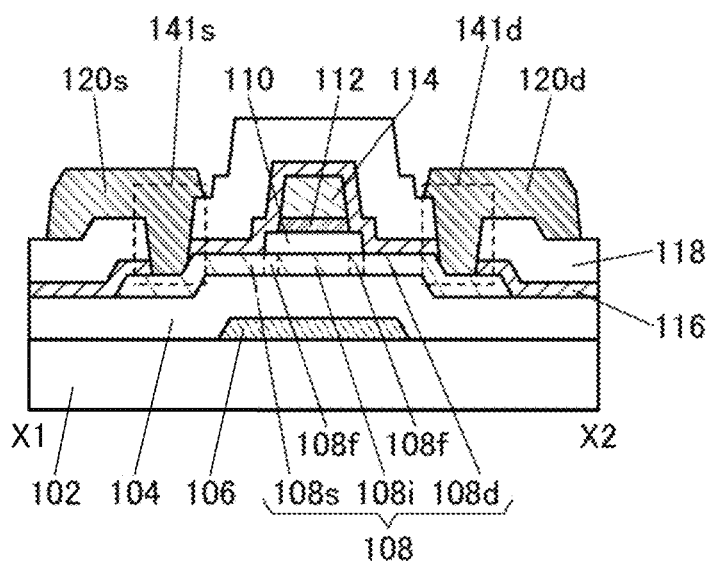
Figure 2C:
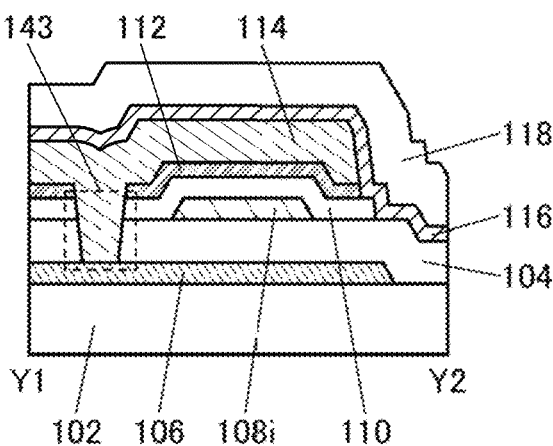

FIG. 2(A) is a top view of a transistor 100A, FIG. 2(B) is a cross-sectional view taken along dashed-dotted line X1-X2 in FIG. 2(A), and FIG. 2(C) is a cross-sectional view taken along dashed-dotted line Y1-Y2 in FIG. 2(A).

The transistor 100A illustrated in FIGS. 2(A), (B), and (C) is different from the transistor 100 described above in the shape of the oxide semiconductor film 112 and the conductive film 114. Specifically, lower end portions of the oxide semiconductor film 112 included in the transistor 100A are positioned more on the inside than upper end portions of the insulating film 110. In other words, side end portions of the insulating film 110 are positioned more on the outside than side end portions of the oxide semiconductor film 112.

The above structure can be obtained by processing the oxide semiconductor film 112, the conductive film 114, and the insulating film 110 with the use of the same mask, and processing the oxide semiconductor film 112 and the conductive film 114 by a wet etching method and the insulating film 110 by a dry etching method, for example.

When the oxide semiconductor film 112 and the conductive film 114 have the above structure, regions 108$f$ are formed in the oxide semiconductor film 108 in some cases. The regions 108$f$ are formed between the channel region 108$i$ and the source region 108$s$ and between the channel region 108$i$ and the drain region 108$d$.

The regions 108$f$ function as either one of high-resistance regions or low-resistance regions. The high-resistance regions have the same level of resistance as the channel region 108$i$ and do not overlap with the oxide semiconductor film 112 and the conductive film 114 functioning as the gate electrode. In the case where the regions 108$f$ are high-resistance regions, the regions 108$f$ function as what we call offset regions. In the case where the regions 108$f$ function as the offset regions, in order to suppress a decrease in the on-state current of the transistor 100A, the regions 108$f$ may each be 1 μm or less in the channel length (L) direction.

The low-resistance regions have a resistance lower than that of the channel region 108$i$ and higher than that of the source region 108$s$ and the drain region 108$d$. In the case where the regions 108$f$ are low-resistance regions, the regions 108$f$ function as what we call lightly doped drain (LDD) regions. In the case where the regions 108$f$ function as the LDD regions, an electric field in the drain region can be relieved, thereby reducing a change in the threshold voltage of the transistor due to the electric field in the drain region.

Note that, in the case where the regions 108$f$ are low resistance regions, the regions 108$f$ are formed by supplying at least one of hydrogen and nitrogen to the regions 108$f$ from the insulating film 116, for example, or by adding an impurity element from above the conductive film 114 with the use of the insulating film 110, the oxide semiconductor film 112, and the conductive film 114 as masks so that the impurity element is added to the oxide semiconductor film 108 through the insulating film 110.

Structure Example 3 of Semiconductor Device

Next, a modification example of the semiconductor device illustrated in FIGS. 2(A), (B), and (C) will be described with reference to FIGS. 3(A) and (B).

Figure 3A:
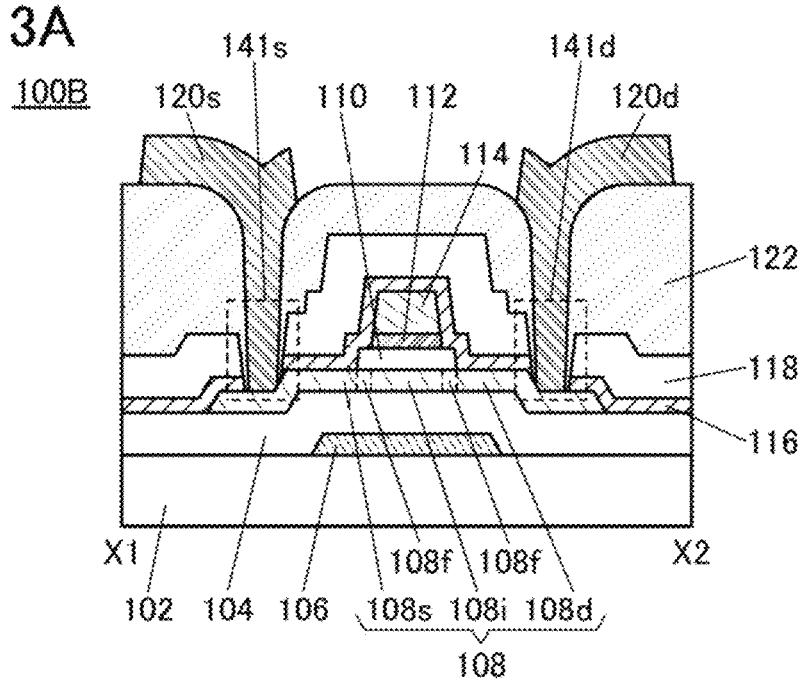
FIGS. 3A and 3B illustrate cross sections of a semiconductor device.
Figure 3B:
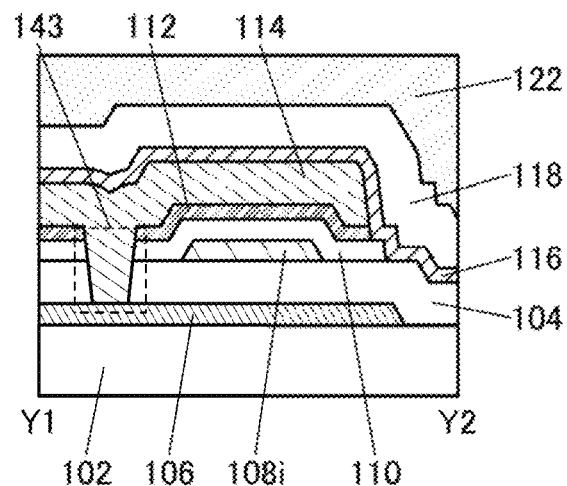

FIGS. 3(A) and (B) are cross-sectional views of a transistor 100B. A top view of the transistor 100B is similar to that of the transistor 100A illustrated in FIG. 2(A) and will be described with reference to FIG. 2(A). The cross-sectional view in FIG. 3(A) is taken along dashed-dotted line X1-X2 in FIG. 2(A), and the cross-sectional view in FIG. 3(B) is taken along dashed-dotted line Y1-Y2 in FIG. 2(A).

The transistor 100B is different from the above-described transistor 100A in that an insulating film 122 functioning as a planarization insulating film is provided. The other components are similar to those of the transistor 100A described above, and similar effects can be obtained.

The insulating film 122 has a function of covering unevenness and the like caused by the transistor or the like. The insulating film 122 has an insulating property and is formed using an inorganic material or an organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin or a polyimide resin.

Note that although the shapes of openings in the insulating film 122 are smaller than those of the openings 141$s$ and 141$d$ in FIGS. 3(A) and (B), the shapes are not limited thereto and may be the same as or larger than those of the openings 141$s$ and 141$d$, for example.

In addition, although FIGS. 3(A) and (B) illustrate an example in which the conductive films 120$s$ and 120$d$ are provided over the insulating film 122, the structure is not limited thereto and may be that in which the conductive films 120$s$ and 120$d$ are formed over the insulating film 118 and the insulating film 122 is provided over the conductive films 120$s$ and 120$d$.

Structure Example 4 of Semiconductor Device

Next, modification examples of the semiconductor device illustrated in FIGS. 1(A), (B), and (C) will be described with reference to FIG. 4 and FIG. 5.

Figure 4A:
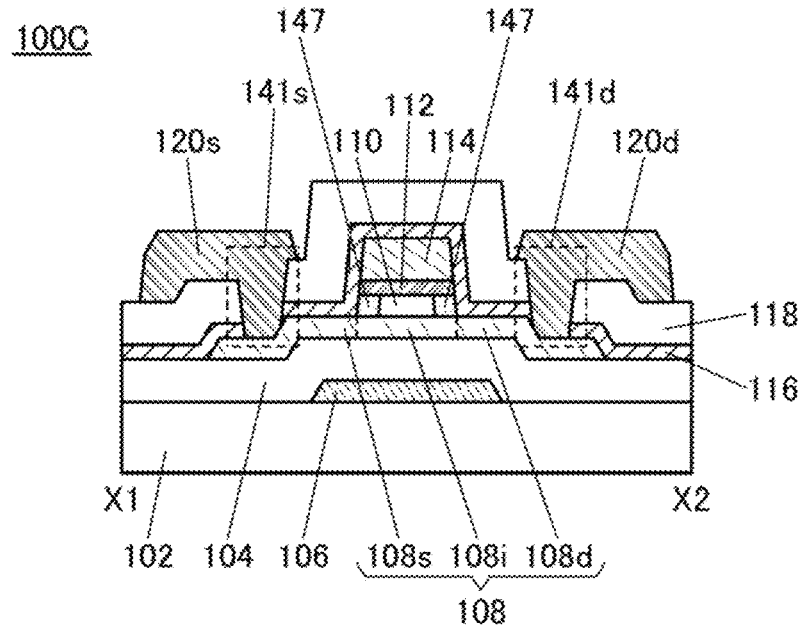
FIGS. 4A and 4B illustrate cross sections of a semiconductor device.
Figure 4B:
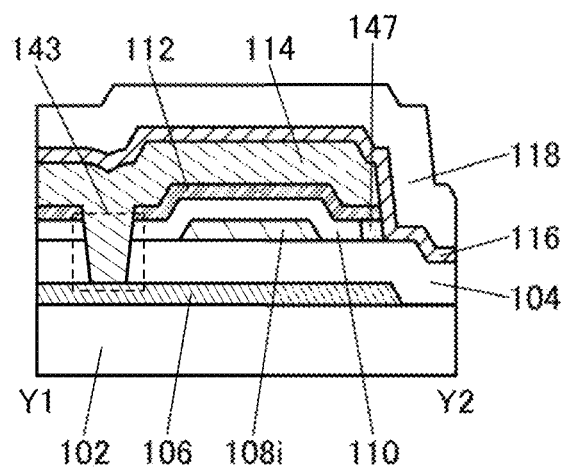

FIGS. 4(A) and (B) are cross-sectional views of a transistor 100C. A top view of the transistor 100C is similar to that of the transistor 100 in FIG. 1(A) and will be described with reference to FIG. 1(A). The cross-sectional view in FIG. 4(A) is taken along dashed-dotted line X1-X2 in FIG. 1(A), and the cross-sectional view in FIG. 4(B) is taken along dashed-dotted line Y1-Y2 in FIG. 1(A).

The transistor 100C is different from the transistor 100 described above in the shape of the insulating film 110. The other components are similar to those of the transistor 100 described above, and similar effects can be obtained.

The insulating film 110 included in the transistor 100C is positioned more on the inside than the oxide semiconductor film 112. In other words, side surfaces of the insulating film 110 are positioned more on the inside than lower end portions of the oxide semiconductor film 112. The structure in FIGS. 4(A) and (B) can be obtained by processing the oxide semiconductor film 112 and the conductive film 114 and then side-etching the insulating film 110 by wet etching with an etchant or the like, for example. Note that, when the insulating film 110 has the above structure, hollow regions 147 are formed under the oxide semiconductor film 112.

The hollow regions 147 contain air and function as part of a gate insulating film. Note that the dielectric constant of the hollow regions 147 is approximately one, like that of the air. Accordingly, in the case where a voltage is applied to the oxide semiconductor film 112 functioning as a gate electrode in the structure of the transistor 100C, the voltage applied to the channel region 108$i$ under the hollow regions 147 is lower than the voltage applied to the channel region 108$i$ under the insulating film 110. Thus, the channel region 108$i$ under the hollow regions 147 effectively functions as overlap regions (also referred to as Lov regions). Note that the Lov regions overlap with the oxide semiconductor film 112 functioning as a gate electrode and have lower resistance than the channel region 108$i$.

Figure 5A:
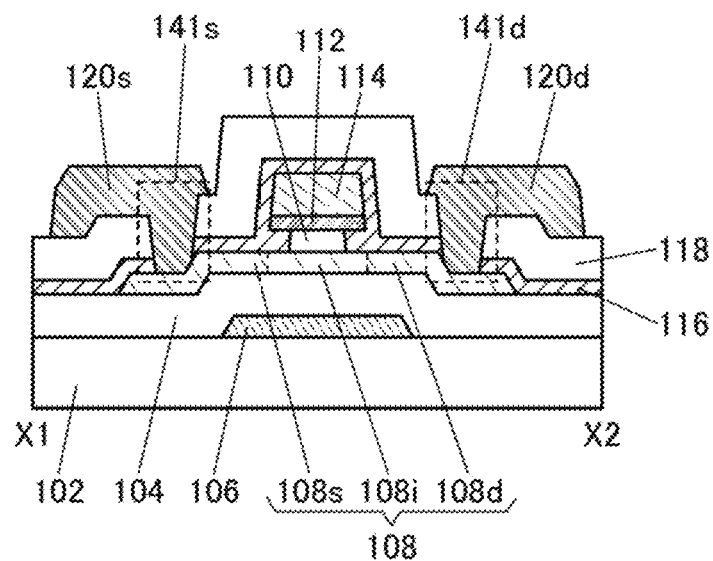
FIGS. 5A and 5B illustrate cross sections of a semiconductor device.
Figure 5B:
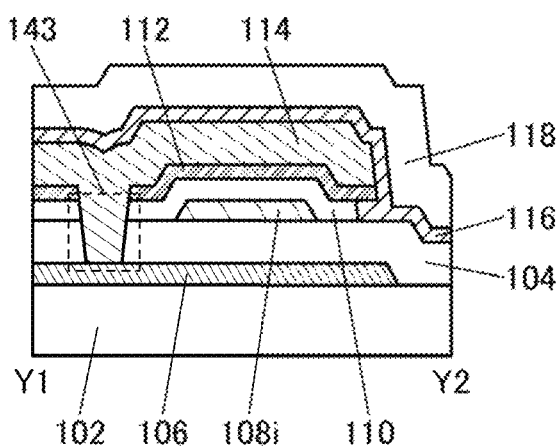

FIGS. 5(A) and (B) are cross-sectional views of a transistor 100D. A top view of the transistor 100D is similar to that of the transistor 100 in FIG. 1(A) and will be described with reference to FIG. 1(A). The cross-sectional view in FIG. 5(A) is taken along dashed-dotted line X1-X2 in FIG. 1(A), and the cross-sectional view in FIG. 5(B) is taken along dashed-dotted line Y1-Y2 in FIG. 1(A).

The transistor 100D is different from the transistor 100 described above in the shapes of the insulating film 110 and the insulating film 116. The other components are similar to those of the transistor 100 described above, and similar effects can be obtained.

The insulating film 110 included in the transistor 100D is positioned more on the inside than the oxide semiconductor film 112 and the conductive film 114. In other words, side surfaces of the insulating film 110 are positioned more on the inside than lower end portions of the oxide semiconductor film 112. The structure illustrated in FIGS. 5(A) and (B) can be obtained by processing the oxide semiconductor film 112 and the conductive film 114 and then side-etching the insulating film 110 by wet etching with an etchant or the like, for example. Furthermore, when the insulating film 116 is formed after the formation of the insulating film 110 having the above structure, the insulating film 116 also enters a space under the oxide semiconductor film 112 and is in contact with the oxide semiconductor film 108 under the oxide semiconductor film 112.

With the above structure, the source region 108$s$ and the drain region 108$d$ are positioned more on the inside than the lower end portions of the oxide semiconductor film 112. Thus, the transistor 100D includes Lov regions.

With the structure including the Lov regions like the transistors 100C and 100D, no high-resistance region is formed between the channel region 108$i$ and the source and drain regions 108$s$ and 108$d$; accordingly, the on-state current of the transistor can be increased.

Structure Example 5 of Semiconductor Device

Next, modification examples of the semiconductor device illustrated in FIGS. 1(A), (B), and (C) will be described with reference to FIG. 6 and FIG. 7.

Figure 6A:
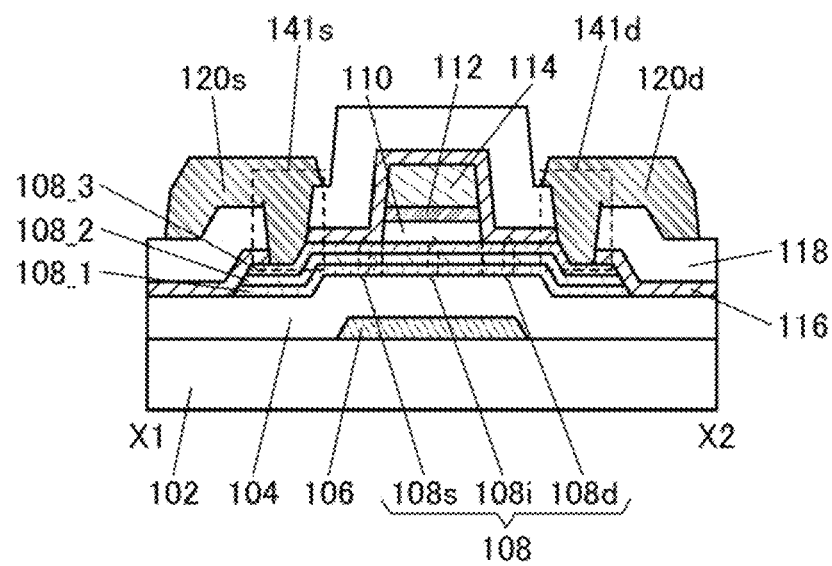
FIGS. 6A and 6B illustrate cross sections of a semiconductor device.
Figure 6B:
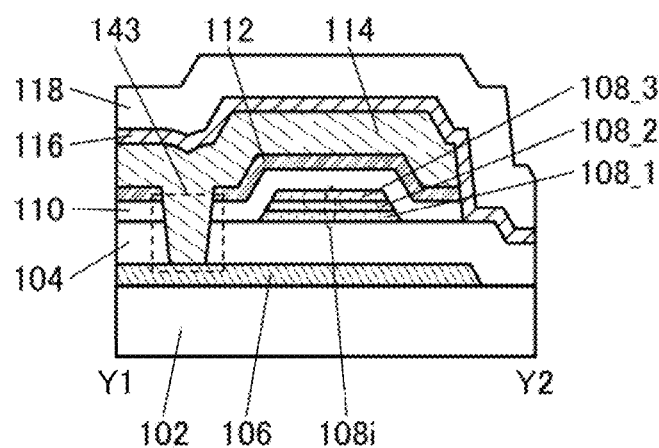

FIGS. 6(A) and 6(B) are cross-sectional views of a transistor 100E. A top view of the transistor 100E is similar to that of the transistor 100 illustrated in FIG. 1(A) and will be described with reference to FIG. 1(A). The cross-sectional view in FIG. 6(A) is taken along the dashed-dotted line X1-X2 in FIG. 1(A), and the cross-sectional view in FIG. 6(B) taken along the dashed-dotted line Y1-Y2 in FIG. 1(A).

The transistor 100E is different from the transistor 100 described above in the shape of the oxide semiconductor film 108. The other components are similar to those of the transistor 100 described above, and similar effects can be obtained.

The oxide semiconductor film 108 of the transistor 100E includes an oxide semiconductor film 108_1 over the insulating film 116, an oxide semiconductor film 108_2 over the oxide semiconductor film 108_1, and an oxide semiconductor film 108_3 over the oxide semiconductor film 108_2.

The channel region 108$i$, the source region 108$s$, and the drain region 108$d$ each have a stacked-layer structure of three layers: the oxide semiconductor films 108_1, the oxide semiconductor film 108_2, and the oxide semiconductor film 108_3.

Figure 7A:
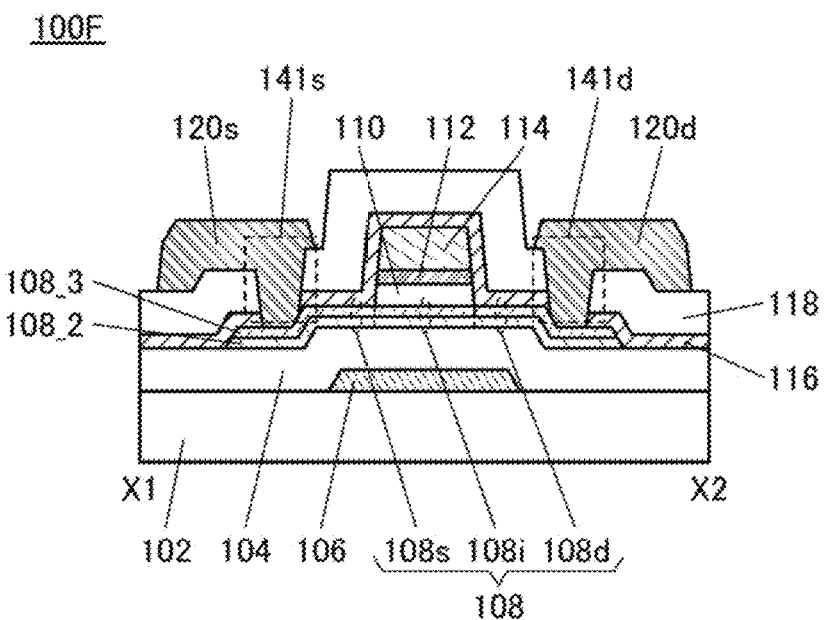
FIGS. 7A and 7B illustrate cross sections of a semiconductor device.
Figure 7B:
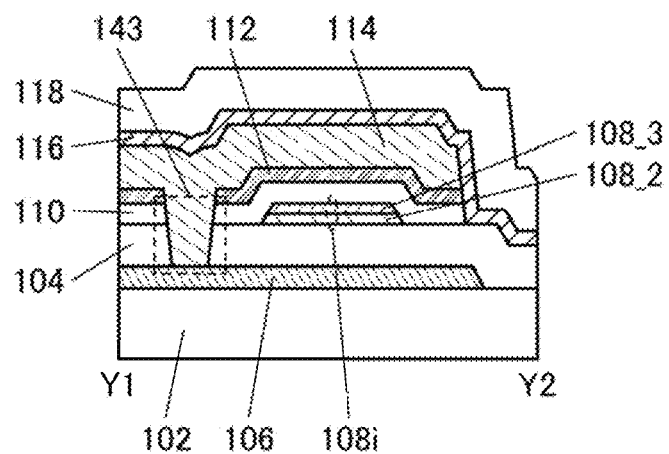

FIGS. 7(A) and (B) are cross-sectional views of a transistor 100F. A top view of the transistor 100F is similar to that of the transistor 100 illustrated in FIG. 1(A) and will be described with reference to FIG. 1(A). The cross-sectional view in FIG. 7(A) is taken along the dashed-dotted line X1-X2 in FIG. 1(A), and the cross-sectional view in FIG. 7(B) is taken along the dashed-dotted line Y1-Y2 in FIG. 1(A).

The transistor 100F is different from the transistor 100 described above in the structure of the oxide semiconductor film 108. The other components are similar to those of the transistor 100 described above, and similar effects can be obtained.

The oxide semiconductor film 108 of the transistor 100F includes an oxide semiconductor film 108_2 over the insulating film 116, and an oxide semiconductor film 108_3 over the oxide semiconductor film 108_2.

The channel region 108$i$, the source region 108$s$, and the drain region 108$d$ each have a stacked-layer structure of two layers: the oxide semiconductor film 108_2 and the oxide semiconductor film 108_3.

The transistor 100F has a stacked-layer structure of the oxide semiconductor film 108_2 and the oxide semiconductor film 108_3 in the channel region 108$i$.

«Band Structure»

Here, the case where the oxide semiconductor has a two-layer structure or a three-layer structure is described. A band diagram of insulators that are in contact with a stacked-layer structure of an oxide semiconductor S1, an oxide semiconductor S2, and an oxide semiconductor S3 and a band diagram of insulators that are in contact with a stacked-layer structure of the oxide semiconductor S2 and the oxide semiconductor S3 are described with reference to FIG. 16.

Note that in FIG. 16, oxide semiconductors included in the oxide semiconductor films 108_1, 108_2, and 108_3 are represented as the oxide semiconductors S1, S2, and S3, and insulators included in the insulating films 104 and 110 are represented as insulators I1 and I2.

Figure 16A:
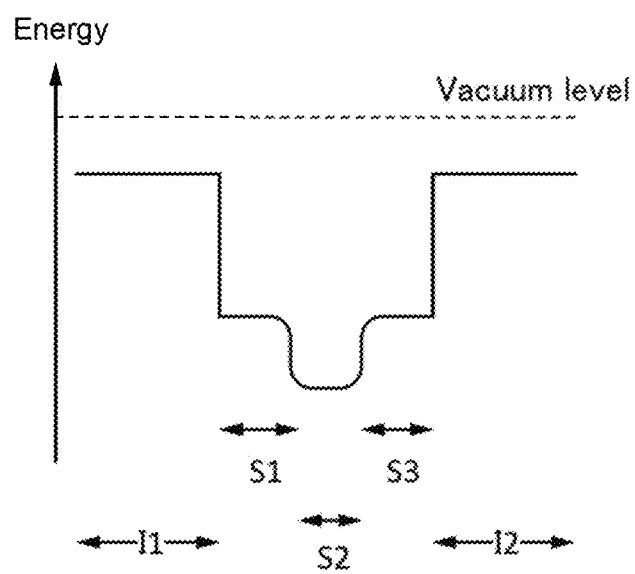
FIGS. 16A and 16B are band diagrams of stacked-layer structures of oxide semiconductors.
Figure 16B:
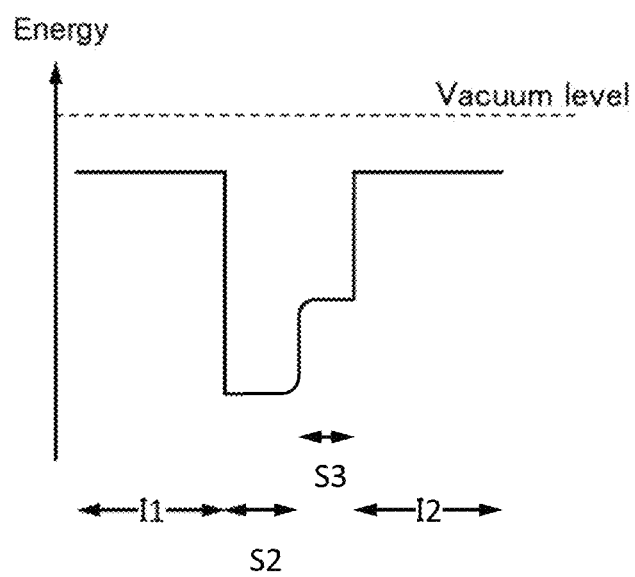

FIG. 16(A) is an example of a band diagram of a stacked-layer structure including the insulator I1, the oxide semiconductor S1, the oxide semiconductor S2, the oxide semiconductor S3, and the insulator I2 in a thickness direction. FIG. 16(B) is an example of a band diagram of a stacked-layer structure including the insulator I1, the oxide semiconductor S2, the oxide semiconductor S3, and the insulator I2 in the thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2, and typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As illustrated in FIG. 16(A) and FIG. 16(B), the energy level of the conduction band minimum of each of the oxide semiconductors S1, S2, and S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 functions as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The provision of the oxide semiconductors S1 and S3 can make the trap state apart from the oxide semiconductor S2. With this structure, the threshold voltage of the transistor can be prevented from shifting in a positive direction.

A material whose conductivity is sufficiently lower than that of the oxide semiconductor S2 is used for the oxide semiconductors S1 and S3. In that case, the oxide semiconductor S2, the interface between the oxide semiconductors S2 and S1, and the interface between the oxide semiconductors S2 and S3 mainly function as a channel region. An oxide semiconductor with the atomic ratio represented by the region C in FIG. 14(C), which has high insulation performance, can be used as the oxide semiconductors S1 and S3, for example. Note that the region C in FIG. 14(C) represents the atomic ratio of [In]:[M]:[Zn]=0:1:0 or the neighborhood thereof.

In particular, in the case where an oxide semiconductor with the atomic ratio represented by the region A is used as the oxide semiconductor S2, it is preferable to use an oxide semiconductor with [M]/[In] of greater than or equal to one, preferably greater than or equal to two, as each of the oxide semiconductors S1 and S3. In addition, it is suitable to use an oxide semiconductor with [M]/([Zn]+[In]) of greater than or equal to one, with which sufficiently high insulation performance can be obtained, as the oxide semiconductor S3.

<Method 1 for Manufacturing Semiconductor Device>

Next, an example of a method for manufacturing the transistor 100 illustrated in FIG. 1 will be described with reference to FIG. 8 to FIG. 11. Note that FIG. 8 to FIG. 11 are cross-sectional views in the channel length (L) direction and the channel width (W) direction, illustrating a method for manufacturing the transistor 100.

Figure 8A:
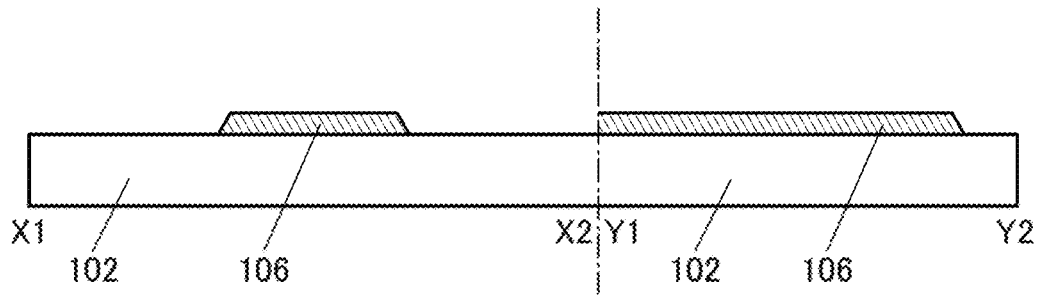
FIGS. 8A-8D are cross-sectional views illustrating a method for manufacturing a semiconductor device.
Figure 8B:
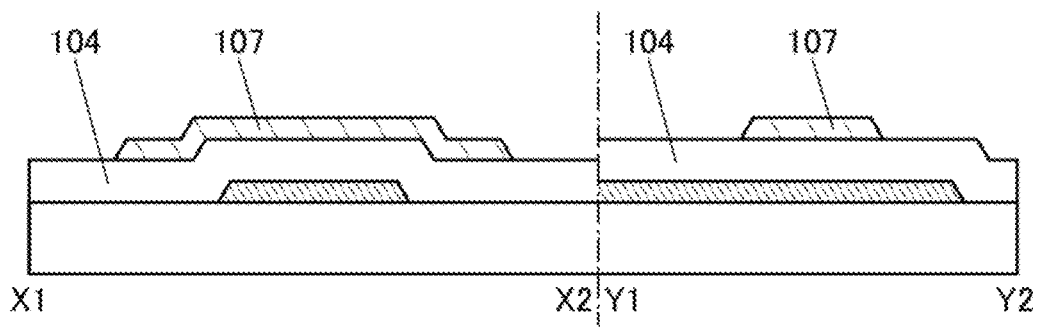

First, a conductive film to be the conductive film 106 is formed over the substrate 102, and then the conductive film is processed into an island shape, whereby the conductive film 106 is formed (see FIG. 8(A)).

The conductive film 106 can be formed by a sputtering method, a CVD method, an evaporation method, a pulsed laser deposition (PLD) method, a printing method, a coating method, or the like as appropriate. In this embodiment, as the conductive film 110, a 100-nm-thick tungsten film is formed by a sputtering method. Alternatively, a 10-nm-thick tantalum nitride film and a 100-nm-thick copper film are formed by a sputtering method. Then, the insulating film 104 is formed over the substrate 102 and the conductive film 110, and an oxide semiconductor film is formed over the insulating film 104. After that, the oxide semiconductor film is processed into an island shape, whereby the oxide semiconductor film 107 is formed (see FIG. 8(B)).

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with the use of a PECVD apparatus.

After the insulating film 104 is formed, oxygen may be added to the insulating film 104. As oxygen to be added to the insulating film 104, an oxygen radical, an oxygen atom, an oxygen atomic ion, an oxygen molecular ion, or the like may be used. As the method for adding oxygen, an ion doping method, an ion implantation method, a plasma treatment method, or the like may be used. Alternatively, a film that suppresses oxygen release may be formed over the insulating film, and then, oxygen may be added to the insulating film 104 through the film.

The above film that suppresses oxygen release can be formed using a material with conductivity such as: a metal element selected from indium, zinc, gallium, tin, aluminum, chromium, tantalum, titanium, molybdenum, nickel, iron, cobalt, and tungsten; an alloy containing the metal element as a component; an alloy containing any of the metal elements in combination; a metal nitride containing the metal element; a metal oxide containing the metal element; a metal nitride oxide containing the metal element; or the like.

In the case where oxygen is added by plasma treatment, exciting oxygen by a microwave to generate high-density oxygen plasma can increase the amount of oxygen added to the insulating film 104.

The oxide semiconductor film 107 can be formed by a sputtering method, a coating method, a pulsed laser deposition method, a laser ablation method, a thermal CVD method, or the like. Note that processing into the oxide semiconductor film 107 can be performed by forming a mask over the oxide semiconductor film through a lithography process and then by etching part of the oxide semiconductor film with the use of the mask. Alternatively, the isolated oxide semiconductor film 107 may be directly formed by a printing method.

In the case where the oxide semiconductor film is formed by a sputtering method, an RF power supply device, an AC power supply device, a DC power supply device, or the like can be used as appropriate as a power supply device for generating plasma. As a sputtering gas for forming the oxide semiconductor film, a rare gas (typically argon), oxygen, or a mixed gas of a rare gas and oxygen is used as appropriate. Note that, in the case where the mixed gas of a rare gas and oxygen is used, the proportion of oxygen to a rare gas is preferably increased.

Note that, in the case where the oxide semiconductor film is formed by a sputtering method, for example, the crystallinity can be improved by depositing the oxide semiconductor film at a substrate temperature higher than or equal to 150° C. and lower than or equal to 750° C., higher than or equal to 150° C. and lower than or equal to 450° C., or higher than or equal to 200° C. and lower than or equal to 350° C.

Note that in this embodiment, as the oxide semiconductor film 107, a 40-nm-thick oxide semiconductor film is deposited with the use of a sputtering apparatus using an In—Ga—Zn metal oxide (In:Ga:Zn=4:2:4.1 [atomic ratio]) as a sputtering target.

After the oxide semiconductor film 107 is formed, heat treatment may be performed so that the oxide semiconductor film 107 is subjected to dehydrogenation or dehydration. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing a rare gas such as helium, neon, argon, xenon, or krypton, or nitrogen. Furthermore, heating in an inert gas atmosphere may be followed by heating in an oxygen atmosphere. Note that it is preferable that the above inert gas atmosphere and oxygen atmosphere do not contain no hydrogen, water, or the like. The treatment time is longer than or equal to three minutes and shorter than or equal to 24 hours.

An electric furnace, an RTA apparatus, or the like can be used for the heat treatment. The use of an RTA apparatus allows the heat treatment to be performed at a temperature higher than or equal to the strain point of the substrate as long as the heating time is short. Thus, the heat treatment time can be shortened.

By forming the oxide semiconductor film while it is heated or performing heat treatment after the formation of the oxide semiconductor film, the hydrogen concentration in the oxide semiconductor film, which is measured by secondary ion mass spectrometry, can be $5 \times 10^{19}$ atoms/cm$^3$ or lower, $1 \times 10^{19}$ atoms/cm$^3$ or lower, $5 \times 10^{18}$ atoms/cm$^3$ or lower, $1 \times 10^{18}$ atoms/cm$^3$ or lower, $5 \times 10^{17}$ atoms/cm$^3$ or lower, or $1 \times 10^{16}$ atoms/cm$^3$ or lower.

Figure 8C:
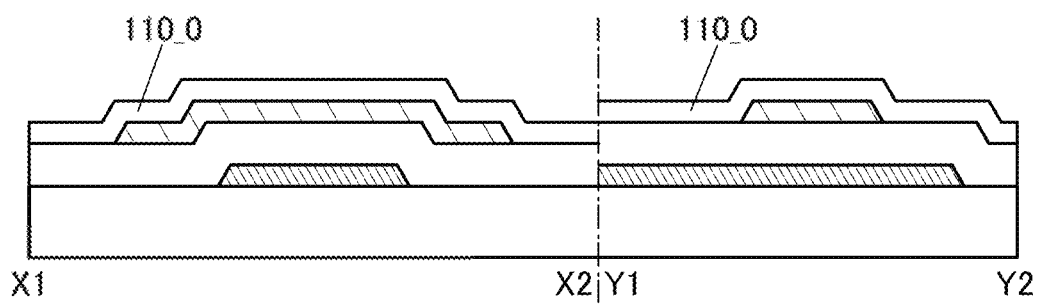

Next, an insulating film 110_0 is formed over the insulating film 104 and the oxide semiconductor film 107 (see FIG. 8(C)).

As the insulating film 110_0, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 110_0 by a PECVD method setting the flow rate of the oxidizing gas to more than 20 times and less than 100 times, or more than or equal to 40 times and less than or equal to 80 times the flow rate of the deposition gas and setting the pressure in a treatment chamber to lower than 100 Pa or lower than or equal to 50 Pa.

Furthermore, as the insulating film 110_0, a silicon oxide film or a silicon oxynitride film that is dense can be formed as the insulating film 110_0 under the conditions where the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a plasma CVD method using a microwave. A microwave refers to a wave in the frequency range of 300 MHz to 300 GHz. In a microwave, electron temperature is low and electron energy is low. Furthermore, in supplied power, the proportion of power used for acceleration of electrons is low, and therefore, power can be used for dissociation and ionization of more molecules; thus, plasma with high density (high-density plasma) can be excited. Accordingly, plasma damage to the deposition surface or a deposit is small, so that the insulating film 110_0 having few defects can be formed.

The insulating film 110_0 can also be formed by a CVD method using an organosilane gas. As the organosilane gas, silicon-containing compounds such as tetraethyl orthosilicate (TEOS: chemical formula Si(OC$_2$H$_5$)$_4$), tetramethylsilane (TMS: chemical formula Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), and trisdimethylaminosilane (SiH(N(CH$_3$)$_2$)$_3$) can be used. By a CVD method using an organosilane gas, the insulating film 110_0 having high coverage can be formed.

In this embodiment, as the insulating film 110_0, a 150-nm-thick silicon oxynitride film is formed with the use of a PECVD apparatus.

Next, an oxide semiconductor film 112_0 is formed over the insulating film 110_0. Note that in the formation of the oxide semiconductor film 112_0, oxygen is added from the oxide semiconductor film 112_0 to the insulating film 110_0 (see FIG. 8D).

The oxide semiconductor film 112_0 is preferably formed by a sputtering method as the formation method, in an atmosphere containing an oxygen gas at the time of the formation. When the oxide semiconductor film 112_0 is formed in an atmosphere that contains an oxygen gas, oxygen can be added to the insulating film 110_0 well.

Figure 8D:
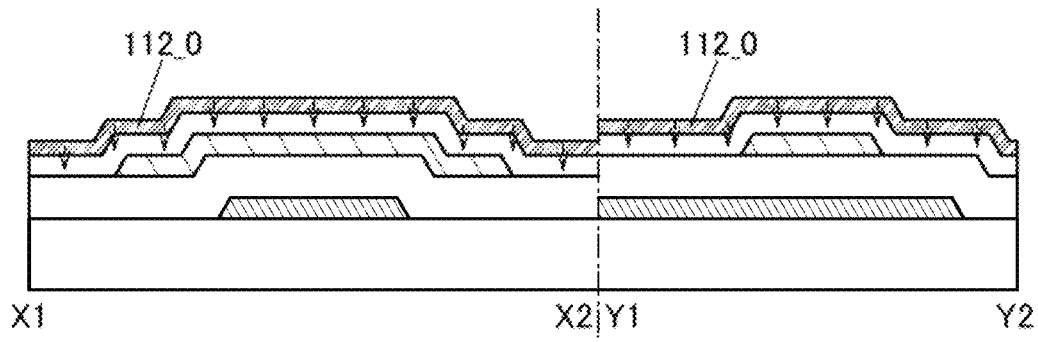

Note that in FIG. 8(D), oxygen added to the insulating film 110_0 is schematically depicted by arrows. Note that, for the oxide semiconductor film 112_0, a material similar to that of the oxide semiconductor film 107 described above can be used.

In this embodiment, as the oxide semiconductor film 112_0, a 20-nm-thick oxide semiconductor film is deposited with the use of a sputtering apparatus using an In—Ga—Zn metal oxide (In:Ga:Zn=5:1:7 [atomic ratio]) as a sputtering target.

Figure 9A:
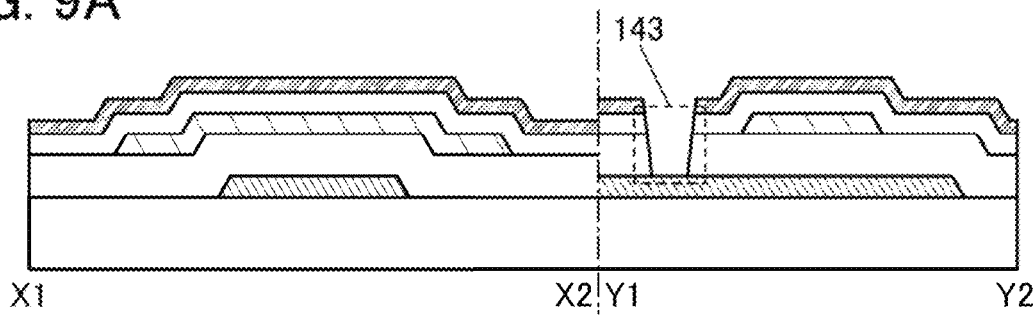
FIGS. 9A-9D are cross-sectional views illustrating a method for manufacturing a semiconductor device.
Figure 9B:
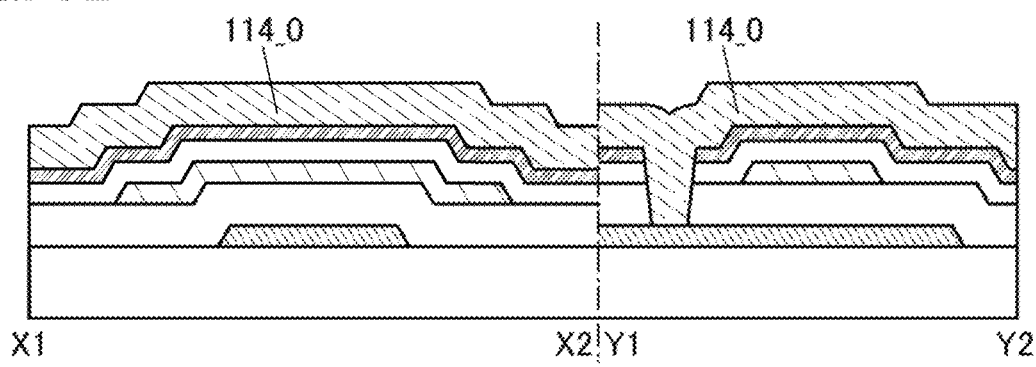

Next, a mask is formed by lithography in a desired position over the oxide semiconductor film 112_0, and then, the oxide semiconductor film 112_0, the insulating film 110_0, and the insulating film 104 are partly etched, so that the opening 143 reaching the conductive film 106 is formed (see FIG. 9A).

As a method for forming the opening 143, a wet etching method and/or a dry etching method can be used as appropriate. In this embodiment, the opening 143 is formed by using a dry etching method.

Next, a conductive film 114_0 is formed over the oxide semiconductor film 112_0 so as to cover the opening 143. When the conductive film 114_0 is formed so as to cover the opening 143, the conductive film 106 and the conductive film 114_0 are electrically connected to each other (see FIG. 9(B)).

Figure 9C:
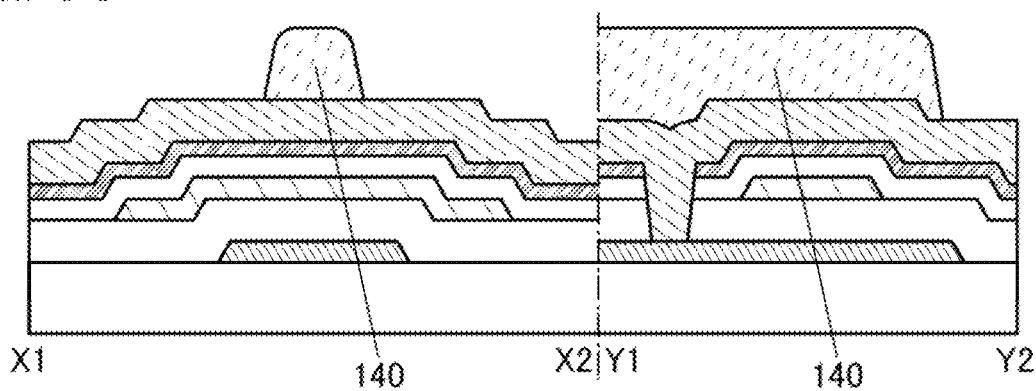

Next, a mask 140 is formed by a lithography process in a desired position over the conductive film 114_0 (see FIG. 9(C)).

Figure 9D:
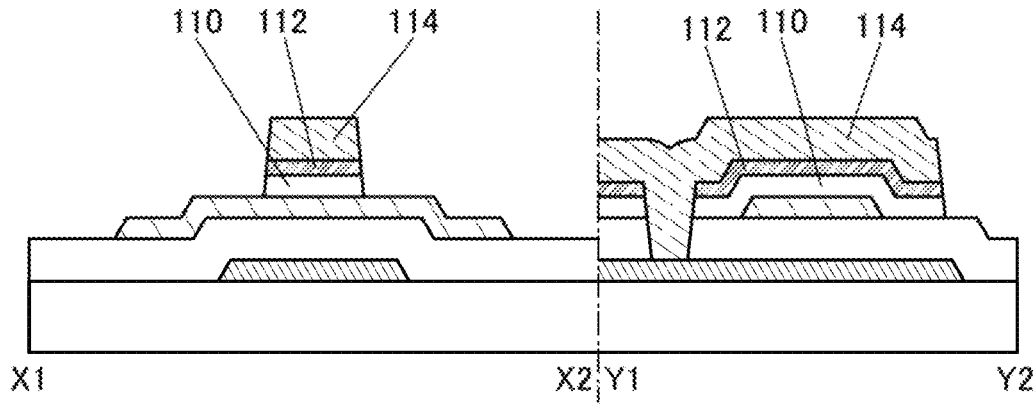

Next, the conductive film 114_0, the oxide semiconductor film 112_0, and the insulating film 110_0 are processed by performing etching from above the mask 140, and then, the mask 140 is removed, so that the island-shaped conductive film 114, the island-shaped oxide semiconductor film 112, and the island-shaped insulating film 110 are formed (see FIG. 9(D)).

In this embodiment, a dry etching method is used for processing the conductive film 114_0, the oxide semiconductor film 112_0, and the insulating film 110_0.

Note that, at the time of processing the conductive film 114, the oxide semiconductor film 112, and the insulating film 110, the thickness of the oxide semiconductor film 107 in a region not overlapping with the conductive film 114 is decreased in some cases. In some other cases, at the time of processing conductive film 114, the oxide semiconductor film 112, and the insulating film 110, the thickness of the insulating film 104 in a region not overlapping with the oxide semiconductor film 107 is decreased.

Figure 10A:
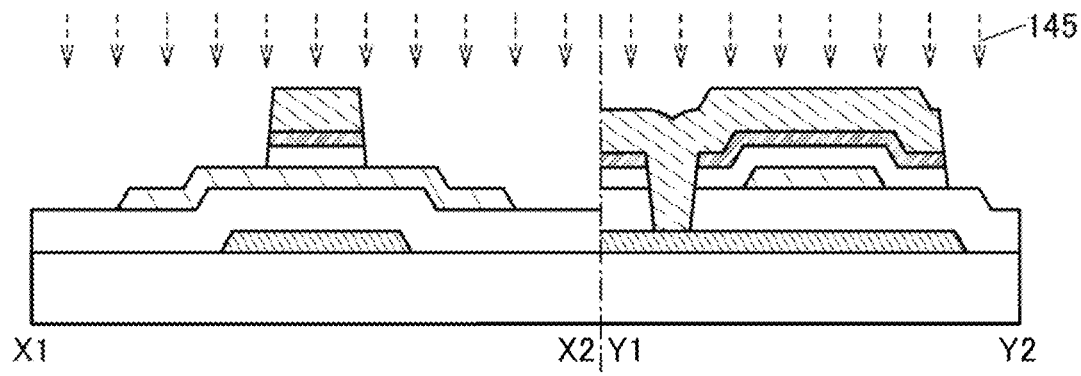
FIGS. 10A-10C are cross-sectional views illustrating a method for manufacturing a semiconductor device.
Figure 10B:
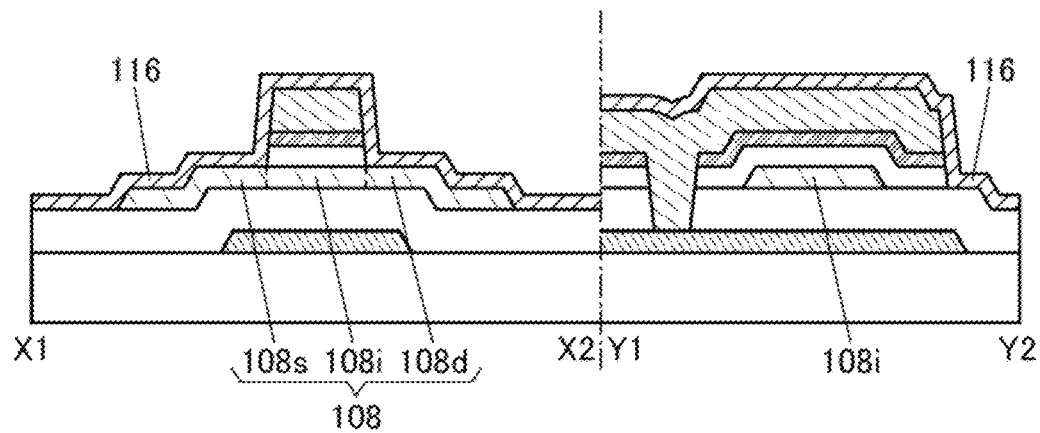

Next, an impurity element 145 is added from above the insulating film 104, the oxide semiconductor film 107, the oxide semiconductor film 112, and the conductive film 114 (see FIG. 10(A)).

Examples of the method for adding the impurity element 145 include an ion doping method, an ion implantation method, and a plasma treatment method. In a plasma treatment method, an impurity element can be added by performing plasma treatment by generating plasma in a gas atmosphere containing the impurity element to be added. A dry etching apparatus, an ashing apparatus, a plasma CVD apparatus, a high-density plasma CVD apparatus, or the like can be used as an apparatus for generating the plasma.

As a source gas of the impurity element 145, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$, which are diluted with a rare gas, can be used. When one or more of $B_2H_6$, $PH_3$, $N_2$, $NH_3$, $AlH_3$, $AlCl_3$, $F_2$, HF, and $H_2$, which are diluted with a rare gas, are used to add the impurity element 145 to the oxide semiconductor films 107 and 112, one or more of the rare gas, hydrogen, boron, carbon, nitrogen, fluorine, phosphorus, sulfur, and chlorine can be added to the oxide semiconductor films 107 and 112.

Alternatively, after a rare gas is added, one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor films 107 and 112.

Alternatively, after at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added, a rare gas may be added to the oxide semiconductor films 107 and 112.

The addition of the impurity element 145 is controlled by appropriately setting the implantation conditions such as the accelerating voltage and the dose. For example, in the case where argon is added by an ion implantation method, the accelerating voltage is set higher than or equal to 10 kV and lower than or equal to 100 kV and the dose is set greater than or equal to $1 \times 10^{13}$ ions/cm$^2$ and less than or equal to $1 \times 10^{16}$ ions/cm$^2$, for example, $1 \times 10^{14}$ ions/cm$^2$. In the case where phosphorus ions are added by an ion implantation method, the accelerating voltage is set 30 kV and the dose is set greater than or equal to $1 \times 10^{13}$ ions/cm$^2$ and less than or equal to $5 \times 10^{16}$ ions/cm$^2$, for example, $1 \times 10^{15}$ ions/cm$^2$.

Although in this embodiment an example in which the impurity element 145 is added after the mask 140 is removed is described, the impurity element 145 may be added with the mask 140 left, for example, without being limited to this embodiment.

Furthermore, in this embodiment, argon is added as the impurity element 145 to the oxide semiconductor films 107 and 112 with the use of a doping apparatus. Note that in this embodiment an example in which argon is added as the impurity element 145 is described, nitrogen may be added, for example, without being limited to this embodiment. In addition, the step of adding the impurity element 145 need not necessarily be performed, for example.

Next, the insulating film 116 is formed over the insulating film 104, the oxide semiconductor film 107, the oxide semiconductor film 112, and the conductive film 114. Note that the formation of the insulating film 116 causes the oxide semiconductor film 107 in contact with the insulating film 116 to become the source region 108s and the drain region 108d. In addition, the oxide semiconductor film 107 not in contact with the insulating film 116, i.e., the oxide semiconductor film 107 in contact with the insulating film 110 becomes the channel region 108i. In this manner, the oxide semiconductor film 108 including the channel region 108i, the source region 108s, and the drain region 108d is formed (see FIG. 10(B)).

The insulating film 116 can be formed using the material that can be used for the insulating film 116. In this embodiment, as the insulating film 116, a 100-nm-thick silicon nitride film is formed with the use of a PECVD apparatus.

When a silicon nitride film is used as the insulating film 116, hydrogen in the silicon nitride film enters the oxide semiconductor film 112, the source region 108s, and the drain region 108d in contact with the insulating film 116, whereby the carrier densities in the oxide semiconductor film 112, the source region 108s, and the drain region 108d can be increased.

Figure 10C:
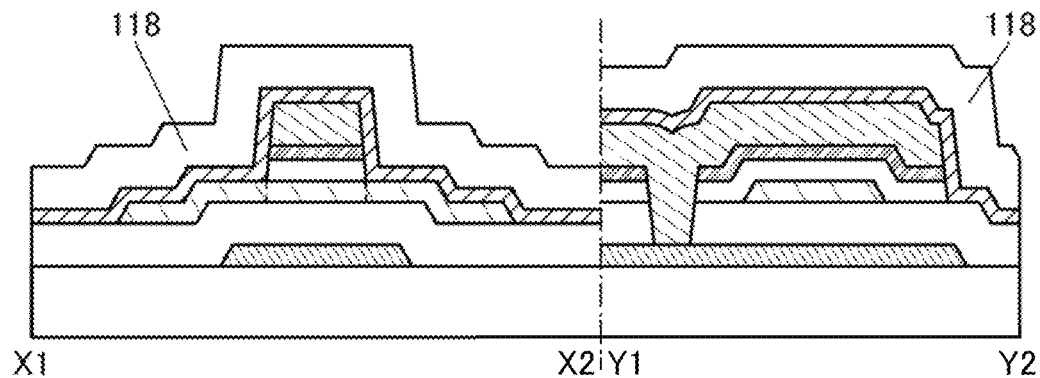

Next, the insulating film 118 is formed over the insulating film 116 (see FIG. 10(C)).

The insulating film 118 can be formed using the material that can be used for the insulating film 118. In this embodiment, as the insulating film 118, a 300-nm-thick silicon oxynitride film is formed with the use of a PECVD apparatus.

Figure 11A:
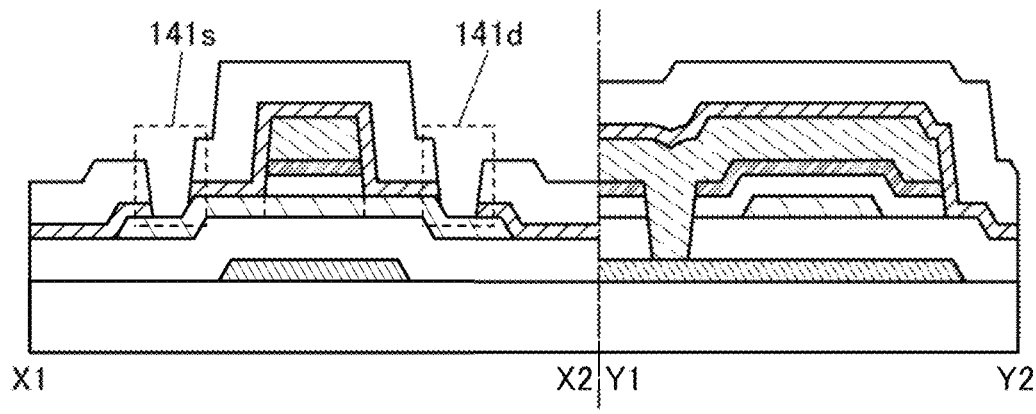
FIGS. 11A-11C are cross-sectional views illustrating a method for manufacturing a semiconductor device.

Next, a mask is formed by lithography in a desired position of the insulating film 118, and then, the insulating film 118 and the insulating film 116 are partly etched, so that the opening 141s reaching the source region 108s and the opening 141d reaching the drain region 108d are formed (see FIG. 11(A)).

As a method for etching the insulating film 118 and the insulating film 116, a wet etching method and/or a dry etching method can be used as appropriate. In this embodiment, the insulating film 118 and the insulating film 116 are processed by using a dry etching method.

Figure 11B:
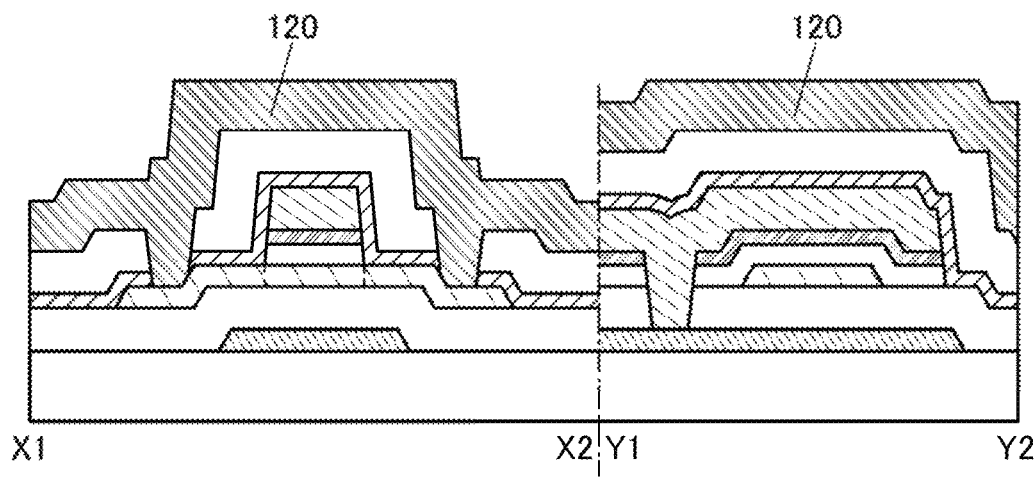

Next, the conductive film 120 is formed over the insulating film 118 so as to cover the openings 141s and 141d (see FIG. 11(B)).

The conductive film 120 can be formed using the material that can be used for the conductive films 120s and 120d. In this embodiment, as the conductive film 120, a stacked-layer film including a 50-nm-thick titanium film, a 400-nm-thick aluminum film, and a 100-nm-thick titanium film is formed with the use of a sputtering apparatus.

Figure 11C:
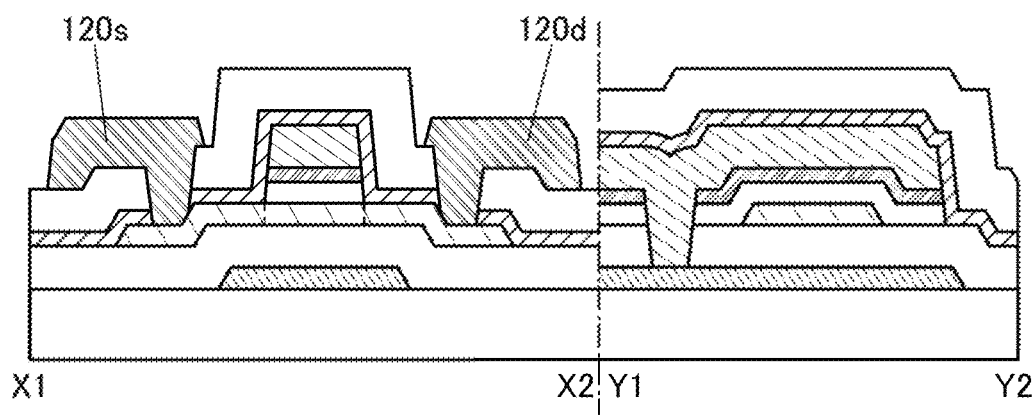

Next, a mask is formed by a lithography process in a desired position over the conductive film 120, and then, the conductive film 120 is partly etched, so that the conductive films 120s and 120d are formed (see FIG. 11(C)).

As a method for processing the conductive film 120, a wet etching method and/or a dry etching method can be used as appropriate. In this embodiment, the conductive film 120 is processed by using a dry etching method to form the conductive films 120s and 120d.

Through the above process, the transistor 100 in FIG. 1 can be manufactured.

Note that the films that constitute the transistor 100 (the insulating film, the oxide semiconductor film, the conductive film, and the like) can be formed by a sputtering method, a chemical vapor deposition (CVD) method, a vacuum evaporation method, a pulsed laser deposition (PLD) method, or an atomic layer deposition (ALD) method. They can also be formed by a coating method or a printing method. Although a sputtering method and a plasma-enhanced chemical vapor deposition (PECVD) method are typical examples of the film formation method, a thermal CVD method may also be used. As an example of a thermal CVD method, a metal organic chemical vapor deposition (MOCVD) method can be given.

In a thermal CVD method, the pressure in a chamber is set to an atmospheric pressure or a reduced pressure, and a source gas and an oxidizer are supplied to the chamber at a time to react with each other in the vicinity of the substrate or over the substrate, whereby a film is deposited over the substrate. Thus, the thermal CVD method, which is a film formation method without plasma generation, has an advantage that no defect due to plasma damage is caused.

In an ALD method, the pressure in a chamber is set to an atmospheric pressure or a reduced pressure, and source gases for reaction are introduced into the chamber and reacted, which is repeated to perform the film formation. An inert gas (argon, nitrogen, or the like) may be introduced as a carrier gas with the source gases. Two or more kinds of source gases may be sequentially supplied to the chamber, for example. In that case, an inert gas is introduced after the reaction of a first source gas, and then a second source gas is introduced, so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and the second source gas introduced after that is adsorbed and reacted, whereby a second layer is stacked over the first layer, so that a thin film is formed. The sequence of the gas introduction is controlled and repeated a plurality of times until a desired thickness is obtained, whereby a thin film with excellent step coverage can be formed. Since the thickness of the thin film can be adjusted by the number of repetition times of the gas introduction, accurate adjustment of the film thickness is possible and thus it is suitable for manufacturing a minute FET.

A thermal CVD method such as an MOCVD method can form the films such as the conductive films, the insulating films, the oxide semiconductor films, and the metal oxide films which are described above; for example, in the case where an In—Ga—Zn—O film is formed, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium and diethylzinc ($Zn(C_2H_5)_2$) can be used instead of dimethylzinc.

In the case where a hafnium oxide film is formed by a deposition apparatus using ALD, for example, two kinds of gases, i.e., ozone ($O_3$) as an oxidizer and a source gas which is obtained by vaporizing liquid containing a solvent and a hafnium precursor (hafnium alkoxide or a hafnium amide such as tetrakis(dimethylamide)hafnium (TDMAH, $Hf[N(CH_3)_2]_4$) and tetrakis(ethylmethylamide)hafnium) are used.

In the case where an aluminum oxide film is formed by a deposition apparatus using ALD, for example, two kinds of gases, i.e., $H_2O$ as an oxidizer and a source gas which is obtained by vaporizing liquid containing a solvent and an aluminum precursor (trimethylaluminum (TMA, $Al(CH_3)_3$) or the like) are used. Examples of another material include tris(dimethylamide)aluminum, triisobutylaluminum, and aluminum tris(2,2,6,6-tetramethyl-3,5-heptanedionate).

In the case where a silicon oxide film is formed by a deposition apparatus using ALD, for example, hexachlorodisilane is adsorbed on a surface where a film is to be formed, and radicals of an oxidizing gas ($O_2$, dinitrogen monoxide) are supplied to react with an adsorbate.

In the case where a tungsten film is formed by a deposition apparatus using ALD, for example, a $WF_6$ gas and a $B_2H_6$ gas are sequentially introduced to form an initial tungsten film, and then a tungsten film is formed using a $WF_6$ gas and an $H_2$ gas. Note that an $SiH_4$ gas may be used instead of a $B_2H_6$ gas.

In the case where an oxide semiconductor film such as an In—Ga—Zn—O film is formed by a deposition apparatus using ALD, for example, an $In(CH_3)_3$ gas and an $O_3$ gas are used to form an In—O layer, a $Ga(CH_3)_3$ gas and an $O_3$ gas are used to form a GaO layer, and then, a $Zn(CH_3)_2$ gas and an $O_3$ gas are used to form a ZnO layer. Note that the order of these layers is not limited to this example. Furthermore, a mixed compound layer such as an In—Ga—O layer, an In—Zn—O layer, or a Ga—Zn—O layer may be formed by using these gases. Note that although an $H_2O$ gas which is obtained by bubbling water with an inert gas such as Ar may be used instead of an $O_3$ gas, it is preferable to use an $O_3$ gas, which does not contain H.

<Method 2 for Manufacturing Semiconductor Device>

Next, an example of a method for manufacturing the transistor 100B illustrated in FIG. 3 will be described with reference to FIG. 12 and FIG. 13. Note that FIG. 12 and FIG. 13 are cross-sectional views in the channel length (L) direction and the channel width (W) direction describing a method for manufacturing the transistor 100B.

First, in a manner similar to the manufacturing method of the transistor 100 described above, the conductive film 110, the insulating film 104, the oxide semiconductor film 107, the oxide semiconductor film 112_0, and the conductive film 114_0 are formed over the substrate 102 (see FIG. 8, and FIGS. 9(A) and (B)).

Next, the mask 140 is formed by a lithography process in a desired position over the conductive film 114_0 (see FIG. 9(C)).

Figure 12A:
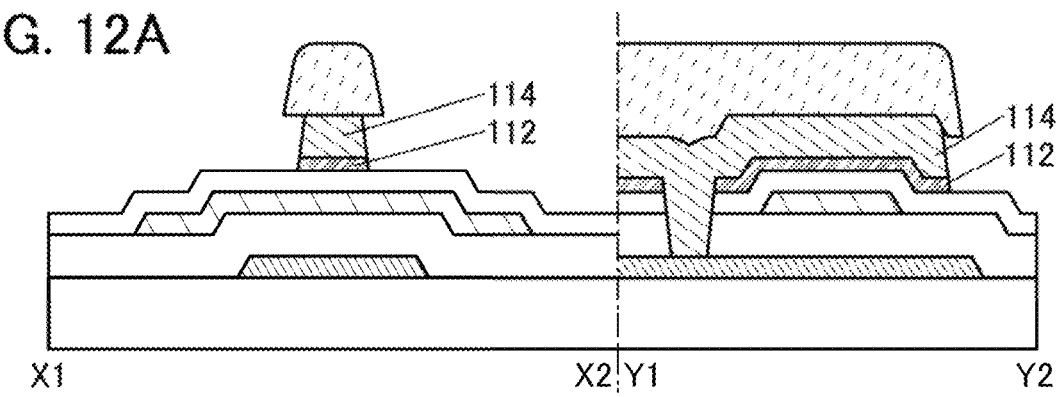
FIGS. 12A-12D are cross-sectional views illustrating a method for manufacturing a semiconductor device.

Next, the conductive film 114_0 and the oxide semiconductor film 112_0 are processed by performing etching from above the mask 140, so that the island-shaped conductive film 114 and the island-shaped oxide semiconductor film 112 are formed (see FIG. 12(A)).

In this embodiment, the conductive film 114_0 and the oxide semiconductor film 112_0 are processed by using a wet etching method.

Figure 12B:
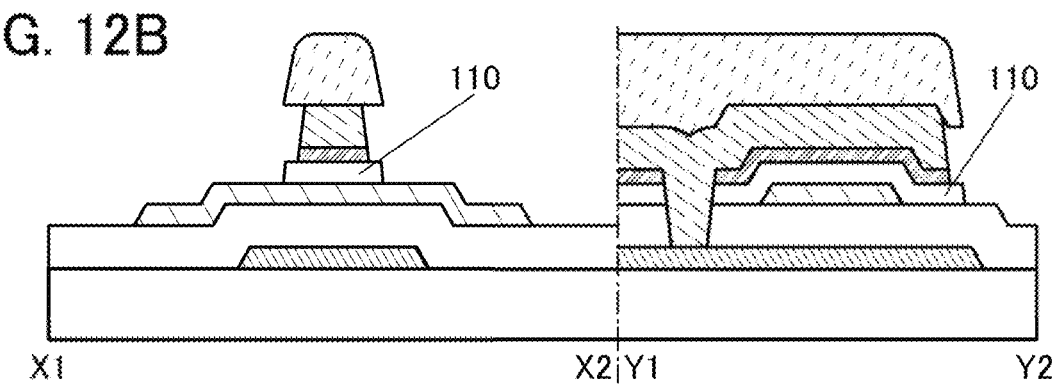

The etching is continuously performed from above the mask 140 to process the insulating film 110_0, so that the island-shaped insulating film 110 is formed (see FIG. 12(B)).

In this embodiment, the insulating film 110_0 is processed by using a dry etching method.

Figure 12C:
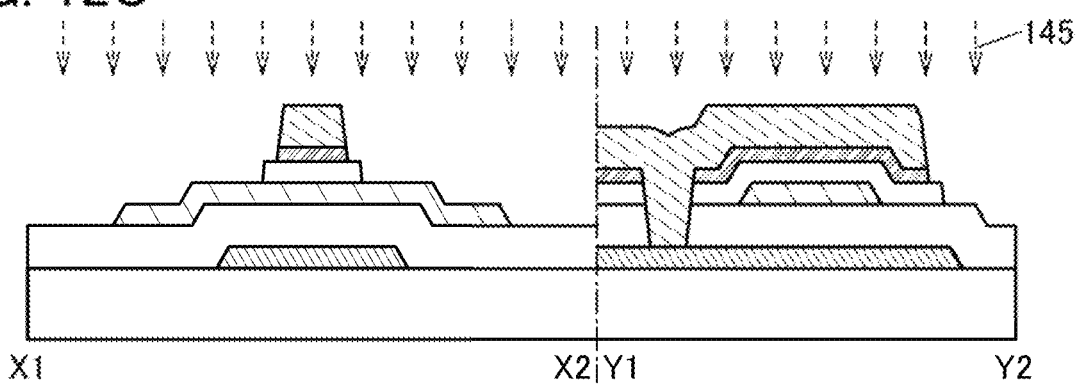
Figure 12D:
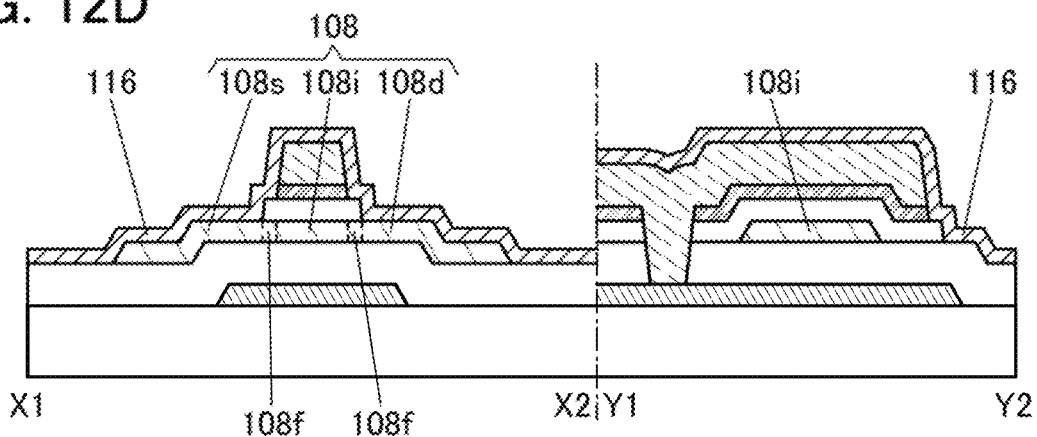

Next, the mask 140 is removed, and then, the impurity element 145 is added from above the insulating film 104, the oxide semiconductor film 107, the oxide semiconductor film 112, and the conductive film 114 (see FIG. 12(C)).

Note that at the time of adding the impurity element 145, a large number of impurities are added to the regions in which the surface of the oxide semiconductor film 107 is exposed (regions to be the source region 108s and the drain region 108d later). In contrast, the impurity element 145 is added to regions of the oxide semiconductor film 107 which do not overlap with the oxide semiconductor film 112 but overlap with the insulating film 110 (regions to be the regions 108f later) through the insulating film 110, so that the amount of the impurity element 145 added thereto is smaller than that in the source region 108s and the drain region 108d.

In this embodiment, argon is added as the impurity element 145 to the oxide semiconductor films 107 and 112 with the use of a doping apparatus.

Note that although an example in which argon is added as the impurity element 145 is described in this embodiment, nitrogen may be added, for example, without being limited to this embodiment. In addition, the step of adding the impurity element 145 need not necessarily be performed, for example. In the case where the step of adding the impurity element 145 is not performed, the regions 108f have the same level of impurity concentration as the channel region 108i.

Next, the insulating film 116 is formed over the insulating film 104, the oxide semiconductor film 107, the insulating film 110, the oxide semiconductor film 112, and the conductive film 114. Note that the formation of the insulating film 116 causes the oxide semiconductor film 107 in contact with the insulating film 116 to become the source region 108s and the drain region 108d. The oxide semiconductor film 107 not in contact with the insulating film 116, i.e., the oxide semiconductor film 107 in contact with the insulating film 110 becomes the channel region 108i. In this manner, the oxide semiconductor film 108 including the channel region 108i, the source region 108s, and the drain region 108d is formed (see FIG. 12(D)).

Note that the regions 108f are formed between the channel region 108i and the source region 108s and between the channel region 108i and the drain region 108d.

Figure 13A:
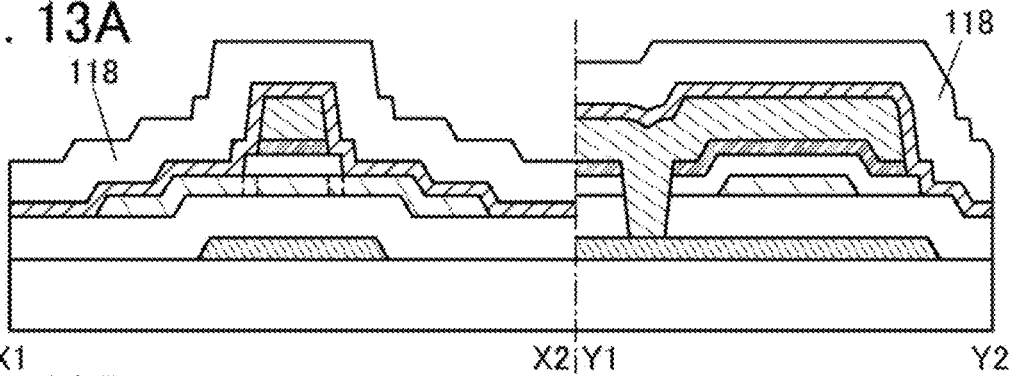
FIGS. 13A-13D are cross-sectional views illustrating a method for manufacturing a semiconductor device.

Next, the insulating film 118 is formed over the insulating film 116 (see FIG. 13(A)).

Figure 13B:
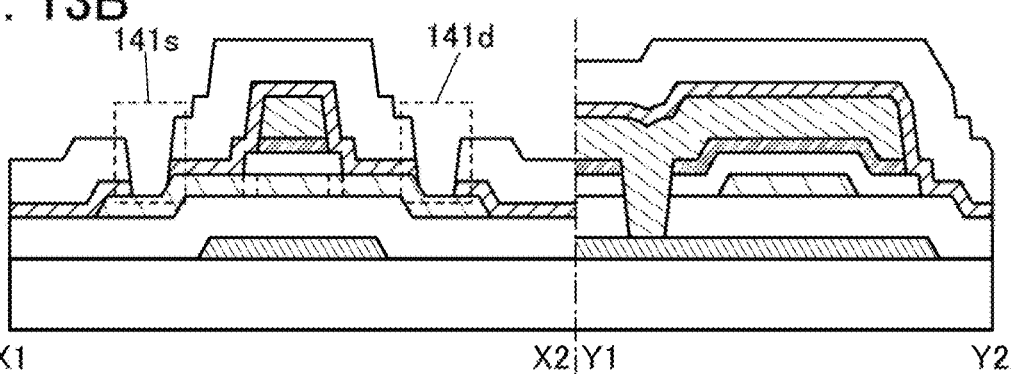

Next, a mask is formed by lithography in a desired position over the insulating film 118, and then, the insulating film 118 and the insulating film 116 are partly etched, so that the opening 141s reaching the source region 108s and the opening 141d reaching the drain region 108d are formed (see FIG. 13(B)).

Figure 13C:
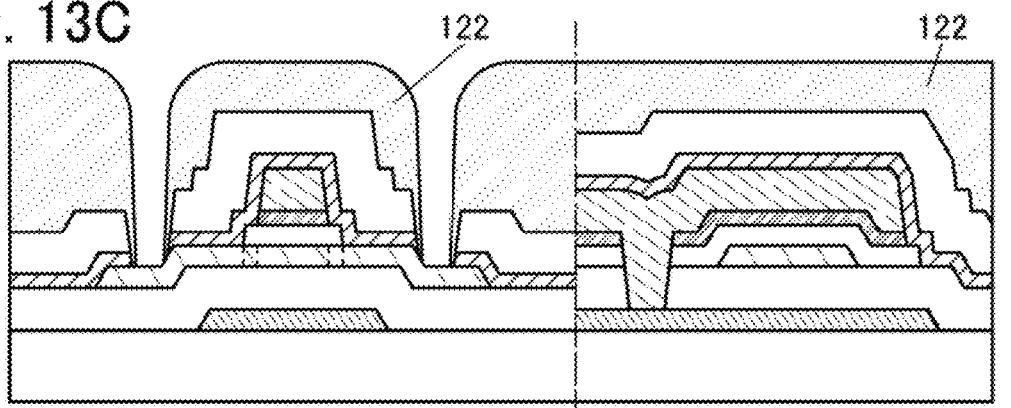

Next, the insulating film 122 is formed over the insulating film 118 (see FIG. 13(C)).

Note that the insulating film 122 has a function of a planarization insulating film. Furthermore, the insulating film 122 has openings in positions overlapping with the opening 141s and the opening 141d.

In this embodiment, as the insulating film 122, a photosensitive acrylic-based resin is applied with the use of a spin coater apparatus, and then, desired regions of the acrylic-based resin are exposed to light, whereby the insulating film 122 having the openings is formed.

Figure 13D:
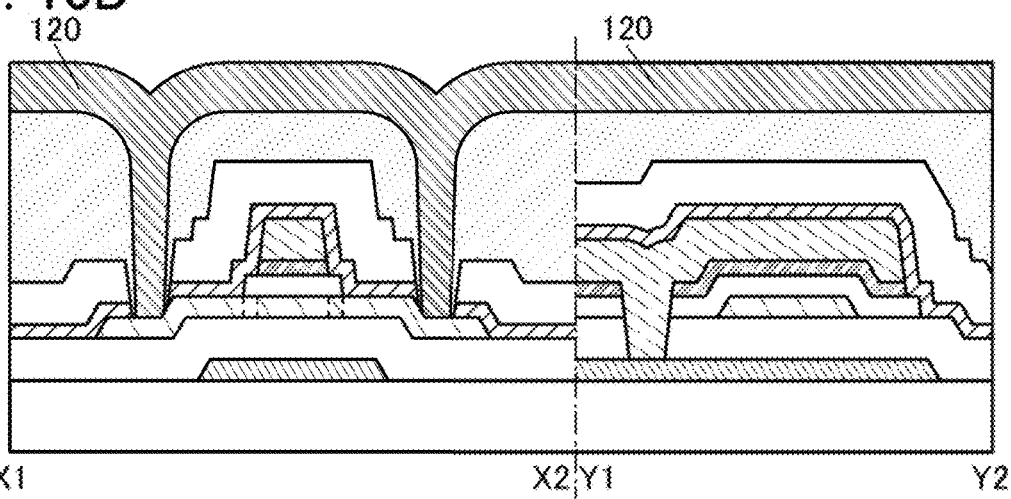

Next, the conductive film 120 is formed over the insulating film 122 to cover the openings 141s and 141d (see FIG. 13(D)).

Next, a mask is formed by a lithography process in a desired position over the conductive film 120, and then, the conductive film 120 is partly etched, so that the conductive films 120s and 120d are formed.

In this embodiment, the conductive film 120 is processed by a dry etching method. At the time of processing the conductive film 120, an upper portion of the insulating film 122 is partly removed is some cases.

Through the above steps, the transistor 100B illustrated in FIG. 3 can be manufactured.

Note that, in the manufacture of the above-described transistor 100B, the insulating film 104, the oxide semiconductor film 107, the insulating film 110_0, the oxide semiconductor film 112_0, the conductive film 114, the impurity element 145, the insulating film 116, the insulating film 118, the openings 141s and 141d, and the conductive film 120 can be formed by referring to the description in <1-4. Method 1 for manufacturing semiconductor device>.

Furthermore, although an example in which the transistor includes an oxide semiconductor film is described in this embodiment, one embodiment of the present invention is not limited to this example. In one embodiment of the present invention, the transistor need not necessarily include an oxide semiconductor film. For example, a channel region, the vicinity of the channel region, a source region, or a drain region of the transistor may be formed using a material containing Sl (silicon), Ge (germanium), SiGe (silicon germanium), GaAs (gallium arsenide), or the like.

The structures and methods described in this embodiment above can be used in appropriate combination with the structures and methods described in the other embodiments.

Embodiment 2

In this embodiment, the structure and the like of an oxide semiconductor will be described with reference to FIG. 17 to FIG. 21.

<Structure of Oxide Semiconductor>

Oxide semiconductors can be classified into a single crystal oxide semiconductor and other non-single-crystal oxide semiconductors. Examples of non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

From another perspective, oxide semiconductors can be classified into an amorphous oxide semiconductor and other crystalline oxide semiconductors. Examples of crystalline oxide semiconductors include a single crystal oxide semiconductor, a CAAC-OS, a polycrystalline oxide semiconductor, and an nc-OS.

An amorphous structure is generally said to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. By contrast, an a-like OS, which is not isotropic, has an unstable structure that contains a pore (also referred to as a void). In point of being unstable, an a-like OS is close to an amorphous oxide semiconductor in terms of physical properties.

<CAAC-OS>

First, a CAAC-OS will be described.

A CAAC-OS is a type of oxide semiconductors which has a plurality of c-axis aligned crystal parts (also referred to as pellets).

Figure 17A:
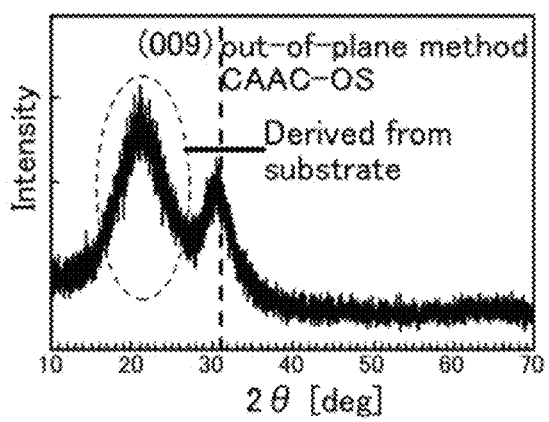
FIGS. 17A-17E are diagrams illustrating structural analysis of a CAAC-OS and a single crystal oxide semiconductor by XRD and selected-area electron diffraction patterns of a CAAC-OS.

A case where a CAAC-OS is analyzed by X-ray diffraction (XRD: X-Ray Diffraction) is described. For example, when the structure of a CAAC-OS including an $InGaZnO_4$ crystal, which is classified into the space group R-3m, is analyzed by an out-of-plane method, a peak appears at a diffraction angle (2θ) of around 31° as shown in FIG. 17(A). This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak.

Figure 17B:
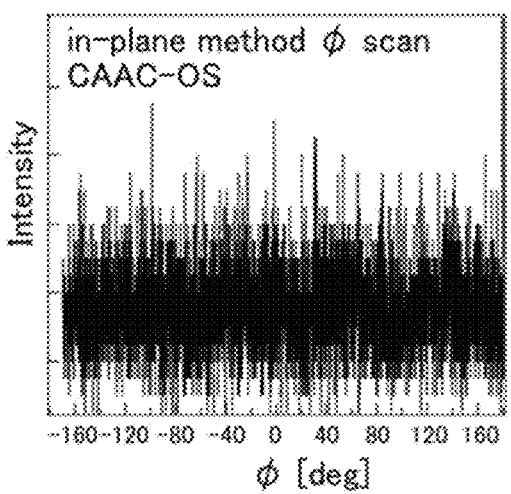
Figure 17C:
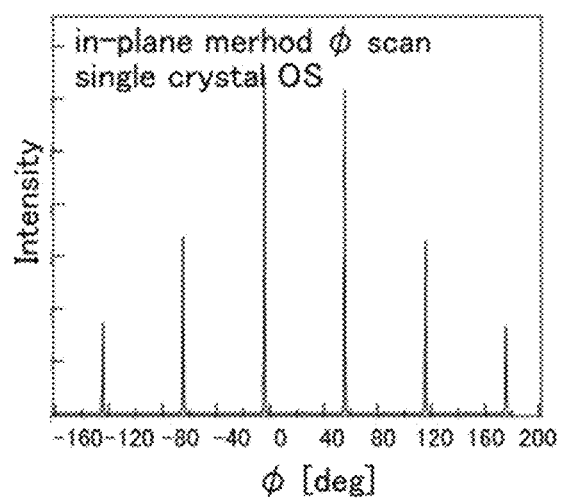
Figure 17D:
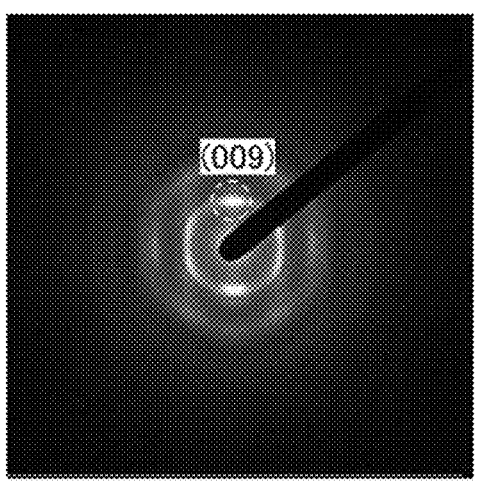

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° while the sample is rotated around a normal vector to the sample surface as an axis (φ axis), as shown in FIG. 17(B), a peak is not clearly observed. By contrast, in the case where single-crystal $InGaZnO_4$ is subjected to φ scan with 2θ fixed at around 56°, as shown in FIG. 17(C), six peaks that are derived from crystal planes equivalent to the (110) plane are observed. Accordingly, the structural analysis using XRD shows that the directions of a-axes and b-axes are irregularly oriented in the CAAC-OS.

Figure 17E:
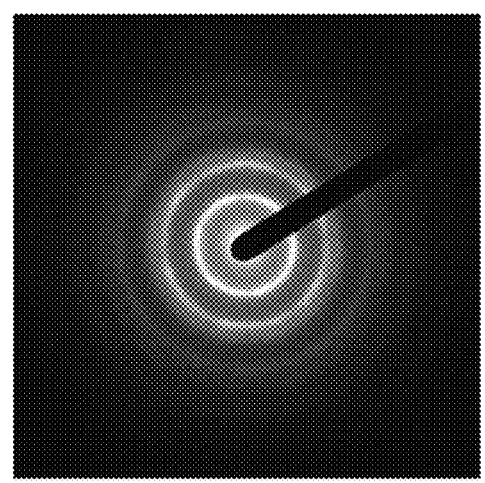

Next, a CAAC-OS analyzed by electron diffraction will be described. For example, when an electron beam with a probe diameter of 300 nm is incident on a CAAC-OS including an $InGaZnO_4$ crystal in the direction parallel to the formation surface of the CAAC-OS, a diffraction pattern (also referred to as a selected-area electron diffraction pattern) in FIG. 17(D) appears in some cases. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 17(E) shows a diffraction pattern obtained in such a manner that an electron beam with a probe diameter of 300 nm is incident on the same sample in the direction perpendicular to the sample surface. In FIG. 17(E), a ring-like diffraction pattern is observed. Thus, the electron diffraction using an electron beam with a probe diameter of 300 nm also indicates that the a-axes and b-axes of the pellets included in the CAAC-OS do not have orientation. The first ring in FIG. 17(E) is considered to be derived from the (010) plane, the (100) plane, and the like of the $InGaZnO_4$ crystal. In addition, the second ring in FIG. 17(E) is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the crystal grain boundary is less likely to occur.

Figure 18A:
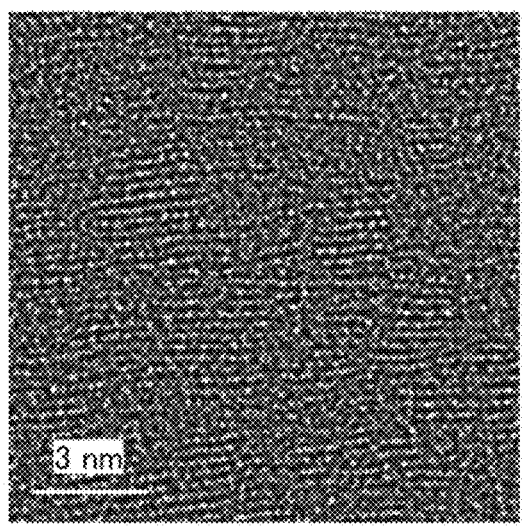
FIGS. 18A-18E are cross-sectional TEM image and plan-view TEM images of a CAAC-OS, and images obtained through analysis thereof.

A high-resolution TEM image of a cross section of the CAAC-OS layer which is observed from a direction substantially parallel to the sample surface is shown in FIG. 18(A). For observation of the high-resolution TEM image, a spherical aberration corrector (Spherical Aberration Corrector) function was used. The high-resolution TEM image using a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

From FIG. 18(A), pellets in which metal atoms are arranged in a layered manner can be seen. It can be seen that the size of a pellet is greater than or equal to 1 nm, or greater than or equal to 3 nm. Accordingly, the pellet can also be referred to as a nanocrystal (nc). Furthermore, the CAAC-OS can also be referred to as an oxide semiconductor including CANC (C-Axis Aligned nanocrystals). A pellet reflects unevenness of a formation surface or a top surface of the CAAC-OS, and is parallel to the formation surface or the top surface of the CAAC-OS.

Figure 18B:
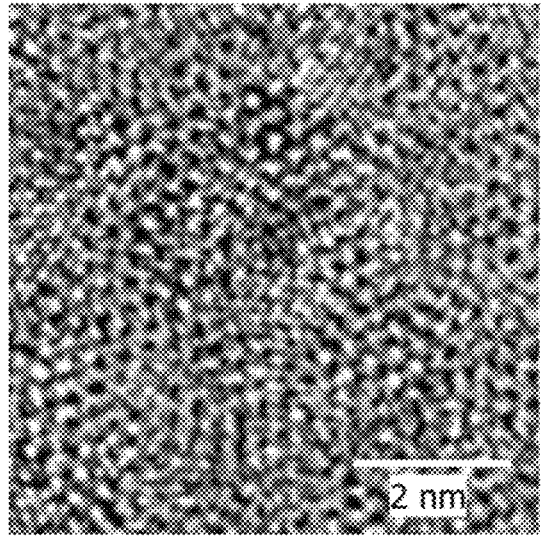
Figure 18C:
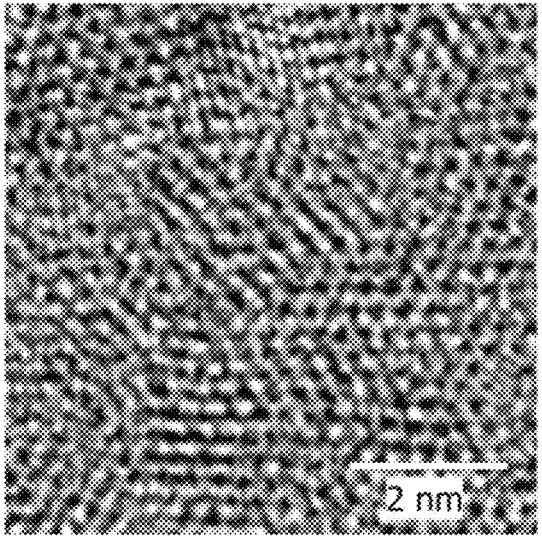
Figure 18D:
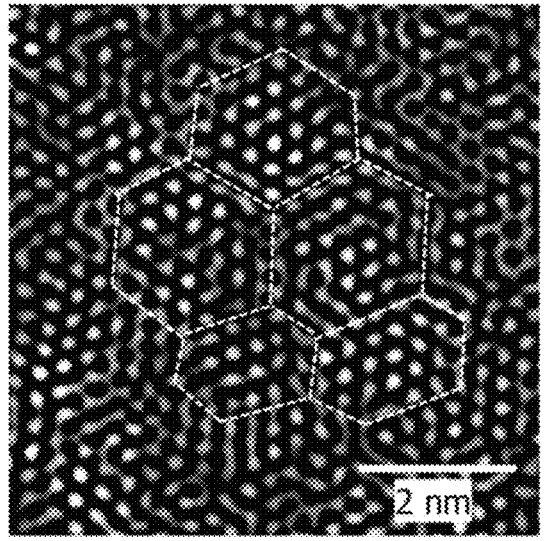
Figure 18E:
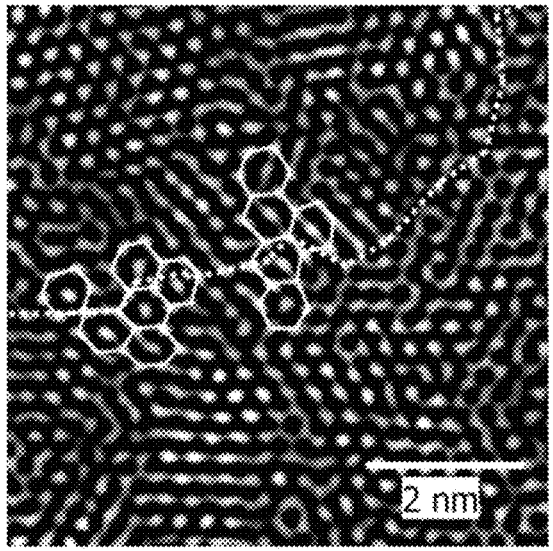

In addition, FIG. 18(B) and FIG. 18(C) show Cs-corrected high-resolution TEM images of a plane of the CAAC-OS observed from a direction substantially perpendicular to the sample surface. FIG. 18(D) and FIG. 18(E) are images obtained by processing images of FIG. 18(B) and FIG. 18(C), respectively. The method of image processing is as follows. First, the image in FIG. 18(B) is subjected to fast Fourier transform (FFT) to obtain an FFT image. Then, mask processing is performed such that a range of from 2.8 $nm^{-1}$ to 5.0 $nm^{-1}$ from the origin in the obtained FFT image remains. Next, the FFT image after the mask processing is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 18(D), portions in which the lattice arrangement is broken are shown by dashed lines. A region surrounded by a dashed line corresponds to one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 18(E), a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a CAA crystal (c-axis-aligned a-b-plane-anchored crystal).

The CAAC-OS is an oxide semiconductor with high crystallinity. Entry of impurities, formation of defects, or the like might decrease the crystallinity of an oxide semiconductor; thus, it can be said that the CAAC-OS is an oxide semiconductor with small amounts of impurities and defects (e.g., oxygen vacancies).

Note that the impurity means an element other than the main components of the oxide semiconductor, such as hydrogen, carbon, silicon, or a transition metal element. For example, an element having higher strength of bonding to oxygen than a metal element that constitutes an oxide semiconductor, such as silicon, extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

A case where an nc-OS is analyzed by XRD is described. When the structure of an nc-OS is analyzed by an out-of-plane method, for example, a peak indicating orientation does not appear. That is, a crystal of an nc-OS does not have orientation.

Figure 19A:
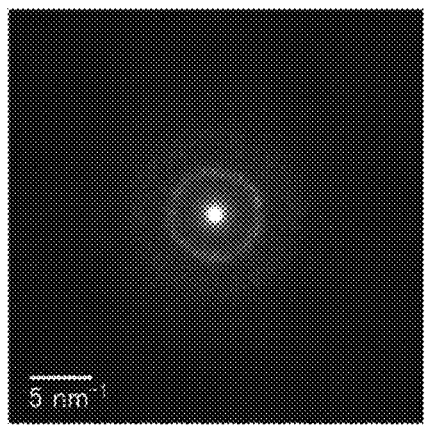
FIGS. 19A-19D are diagrams showing electron diffraction patterns of an nc-OS and a cross-sectional TEM image of an nc-OS.
Figure 19B:
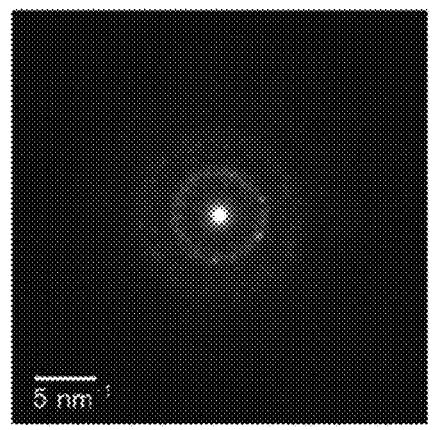

Furthermore, when an electron beam with a probe diameter of 50 nm is incident on a 34-nm-thick region of a thinned nc-OS including an InGaZnO$_4$ crystal in the direction parallel to the formation surface, for example, a ring-like diffraction pattern (nanobeam electron diffraction pattern) shown in FIG. 19(A) is observed. In addition, FIG. 19(B) shows a diffraction pattern (nanobeam electron diffraction pattern) obtained when an electron beam with a probe diameter of 1 nm is incident on the same sample. From FIG. 19(B), a plurality of spots are observed in a ring-like region. Accordingly, ordering in an nc-OS is not observed with an electron beam with a probe diameter of 50 nm but is observed with an electron beam with a probe diameter of 1 nm.

Figure 19C:
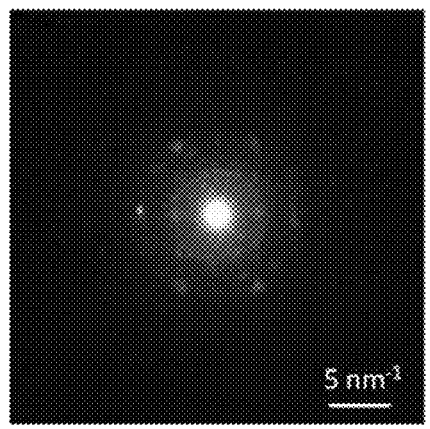

When an electron beam with a probe diameter of 1 nm is incident on a region with a thickness less than 10 nm, an electron diffraction pattern in which spots are arranged in an approximately regular hexagonal shape as shown in FIG. 19(C) is observed in some cases. This means that an nc-OS has a well-ordered region, i.e., a crystal, in the range of less than 10 nm in thickness. Note that an electron diffraction pattern having regularity is not observed in some regions because crystals are aligned in various directions.

Figure 19D:
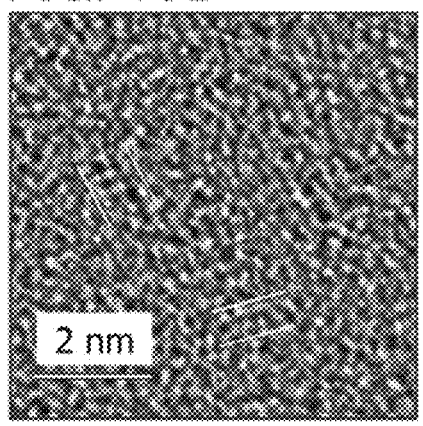

FIG. 19(D) shows a Cs-corrected high-resolution TEM image of a cross section of an nc-OS observed in the direction substantially parallel to the formation surface. In a high-resolution TEM image, an nc-OS has a region in which a crystal part is observed, such as the part indicated by additional lines, and a region in which a crystal part is not clearly observed. In many cases, the size of a crystal part included in the nc-OS is greater than or equal to 1 nm and less than or equal to 10 nm, or specifically, greater than or equal to 1 nm and less than or equal to 3 nm. Note that an oxide semiconductor in which the size of a crystal part is greater than 10 nm and less than or equal to 100 nm is sometimes referred to as a microcrystalline oxide semiconductor (microcrystalline oxide semiconductor). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region greater than or equal to 1 nm and less than or equal to 10 nm, in particular, a region greater than or equal to 1 nm and less than or equal to 3 nm) has a periodic atomic arrangement. Furthermore, there is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Note that, since there is no regularity of crystal orientation between the pellets (nanocrystals), the nc-OS can also be referred to as an oxide semiconductor including RANC (random aligned nanocrystals) or an oxide semiconductor including NANC (non-aligned nanocrystals).

The nc-OS is an oxide semiconductor that has higher regularity than an amorphous oxide semiconductor. Therefore, the nc-OS has a lower density of defect states than an a-like OS and an amorphous oxide semiconductor. However, there is no regularity of crystal orientation between different pellets in the nc-OS. Thus, the nc-OS has a higher density of defect states than the CAAC-OS.

<a-like OS>

An a-like OS has a structure intermediate between those of the nc-OS and the amorphous oxide semiconductor.

Figure 20A:
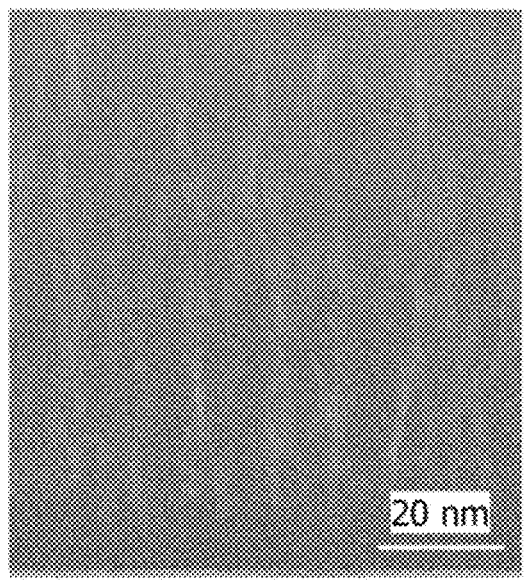
FIGS. 20A and 20B are cross-sectional TEM images of an a-like OS.
Figure 20B:
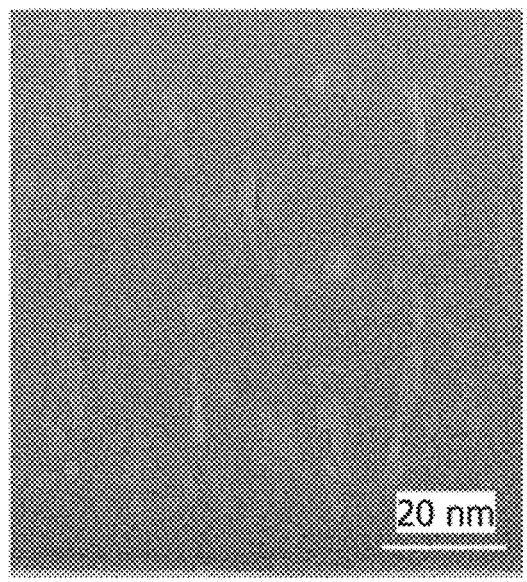

FIG. 20 shows high-resolution cross-sectional TEM images of an a-like OS. Here, FIG. 20(A) is the high-resolution cross-sectional TEM image of the a-like OS at the start of the electron irradiation. FIG. 20(B) is the high-resolution cross-sectional TEM image of the a-like OS after the irradiation with electrons (e) at $4.3 \times 10^8$ e$^-$/nm$^2$. FIG. 20(A) and FIG. 20(B) show that stripe-like bright regions extending longitudinally are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value), and the value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Note that each of lattice fringes corresponds to the a-b plane of the $InGaZnO_4$ crystal.

Figure 21:
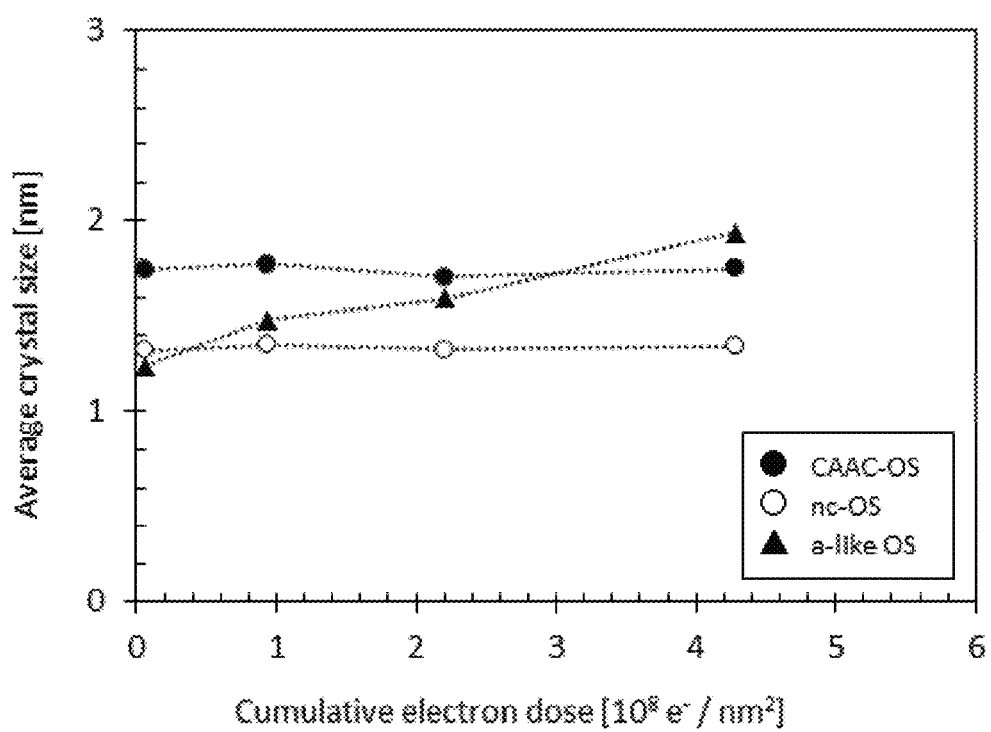
FIG. 21 is a diagram showing a change of crystal parts of an In—Ga—Zn oxide owing to electron irradiation.

FIG. 21 is an example of examining the average size (average crystal size) of crystal parts (at 22 points to 30 points) in each sample. Note that the crystal part size corresponds to the length of a lattice fringe. FIG. 21 indicates that the crystal part size in the a-like OS increases with an increase in the cumulative electron dose (Cumulative electron dose) in obtaining TEM images, for example. As shown in FIG. 21, a crystal part with a size of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. By contrast, the crystal part size in the nc-OS and the CAAC-OS shows little change from the start of electron irradiation to a cumulative electron dose of $4.2 \times 10^8$ e$^-$/nm$^2$. As shown in FIG. 21, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of the irradiation region was 230 nm.

In this manner, growth of the crystal part in the a-like OS is induced by electron irradiation in some cases. By contrast, in the nc-OS and the CAAC-OS, growth of the crystal part is hardly induced by electron irradiation. That is, the a-like OS has an unstable structure as compared with the nc-OS and the CAAC-OS.

Furthermore, the a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. An oxide semiconductor having a density of lower than 78% of the density of the single crystal oxide semiconductor is difficult to be deposited as a film.

For an oxide semiconductor satisfying In:Ga:Zn=1:1:1 [atomic ratio], for example, the density of single crystal $InGaZnO_4$ with a rhombohedral crystal structure is 6.357 g/cm$^3$. Accordingly, for the oxide semiconductor satisfying In:Ga:Zn=1:1:1 [atomic ratio], for example, the density of the a-like OS is higher than or equal to 5.0 g/cm$^3$ and lower than 5.9 g/cm$^3$. In addition, for the oxide semiconductor satisfying In:Ga:Zn=1:1:1 [atomic ratio], for example, the density of each of the nc-OS and the CAAC-OS is higher than or equal to 5.9 g/cm$^3$ and lower than 6.3 g/cm$^3$.

Note that in the case where a single crystal oxide semiconductor having the same composition does not exist, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked-layer film including two or more kinds selected from an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancies ($V_O$) in the oxide semiconductor or impurities in the oxide semiconductor.

As the number of oxygen vacancies in the oxide semiconductor increases, the density of defect states increases when hydrogen is bonded to the oxygen vacancies (this state is also referred to as $V_O$H). The density of defect states also increases with an increase in the number of impurities in the oxide semiconductor. Hence, the carrier density of an oxide semiconductor can be controlled by controlling the density of defect states in the oxide semiconductor.

A transistor using the oxide semiconductor in a channel region is considered below.

The carrier density of the oxide semiconductor is preferably reduced in the case where suppression of the negative shift of the threshold voltage of the transistor or reduction in the off-state current of the transistor is intended. In the case where the carrier density of the oxide semiconductor is reduced, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

By contrast, the carrier density of the oxide semiconductor is preferably increased in the case where improvement in the on-state current of the transistor or improvement in the field-effect mobility of the transistor is intended. In the case where the carrier density of the oxide semiconductor is increased, the impurity concentration or the density of defect states in the oxide semiconductor is slightly increased. Alternatively, the bandgap of the oxide semiconductor is narrowed. For example, an oxide semiconductor that has a slightly high impurity concentration or a slightly high density of defect states in the range where an on/off ratio is obtained in the Id-Vg characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that when an oxide semiconductor with higher electron affinity is used, the transistor has lower threshold voltage.

The oxide semiconductor with an increased carrier density has somewhat n-type conductivity; thus, it can be referred to as a "Slightly-n" oxide semiconductor.

The carrier density of a substantially intrinsic oxide semiconductor is preferably higher than or equal to $1\times10^5$ $cm^{-3}$ and lower than $1\times10^{18}$ $cm^{-3}$, further preferably higher than or equal to $1\times10^7$ $cm^{-3}$ and lower than or equal to $1\times10^{17}$ $cm^{-3}$, still further preferably higher than or equal to $1\times10^9$ $cm^{-3}$ and lower than or equal to $5\times10^{16}$ $cm^{-3}$, yet further preferably higher than or equal to $1\times10^{10}$ $cm^{-3}$ and lower than or equal to $1\times10^{16}$ $cm^3$, and yet still preferably higher than or equal to $1\times10^{11}$ $cm^3$ and lower than or equal to $1\times10^{15}$ $cm^{-3}$.

The structure described in this embodiment can be used in appropriate combination with the structure described in any of the other embodiments.

Embodiment 3

In this embodiment, an example of a display device that includes any of the transistors described in the above embodiments will be described below with reference to FIG. 22 to FIG. 32.

Figure 22:
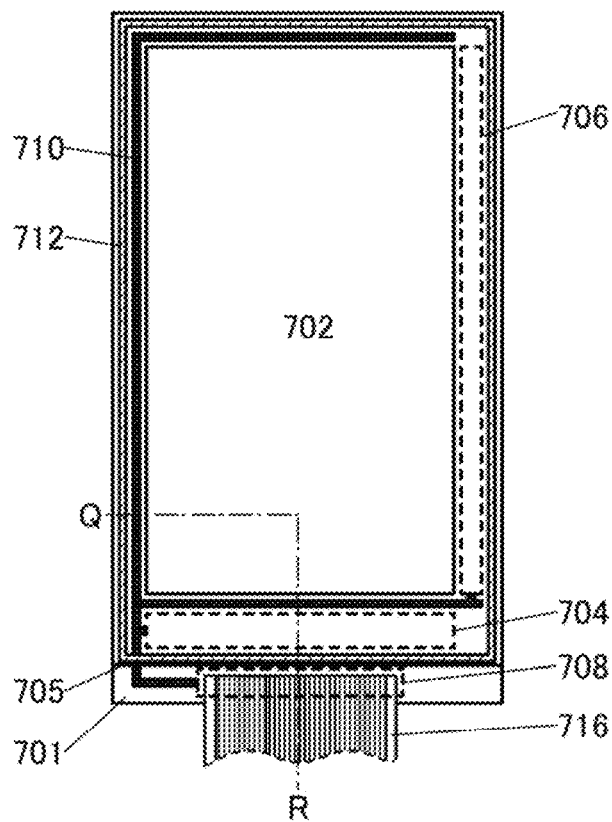
FIG. 22 is a top view illustrating one embodiment of a display device.

FIG. 22 is a top view showing an example of a display device. A display device 700 shown in FIG. 22 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. Note that the first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 22, a display element is provided between the first substrate 701 and the second substrate 705.

In the display device 700, an FPC terminal portion 708 (FPC: flexible printed circuit) electrically connected to each of the pixel portion 702, the source driver circuit portion 704, and the gate driver circuit portion 706 is provided in a region different from the region which is surrounded by the sealant 712 over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to each of the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately prepared driver circuit board, and a COG (chip on glass) method, a wire bonding method, or the like can be used.

The pixel portion 702, the source driver circuit portion 704, and the gate driver circuit portion 706 included in the display device 700 include a plurality of transistors, and any of the transistors that are the semiconductor devices of embodiments of the present invention can be used.

The display device 700 can include any of a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink element, an electrophoretic element, an electrowetting element, a plasma display panel (PDP), a MEMS (micro electro mechanical systems) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display or the like. An example of a display device including an electron emitter is a field emission display (FED), an SED-type flat panel display (SED: Surface-conduction Electron-emitter Display), or the like. An example of a display device including a liquid crystal element is a liquid crystal display (e.g., a transmissive liquid crystal display, a transflective liquid crystal display, a reflective liquid crystal display, a direct-view liquid crystal display, or a projection liquid crystal display) or the like. An example of a display device having electronic ink or an electrophoretic element is electronic paper or the like. In the case of making a transflective liquid crystal display or a reflective liquid crystal display, some of or all of pixel electrodes function as reflective electrodes. For example, some or all of pixel electrodes are formed to contain aluminum, silver, or the like. Furthermore, in such a case, a memory circuit such as an SRAM can be provided under the reflective electrodes. In this manner, the power consumption can be further reduced.

As a display method in the display device 700, a progressive method, an interlace method, or the like can be employed. Furthermore, color elements controlled in a pixel at the time of color display are not limited to three colors: R, G, and B (R stands for red, G stands for green, and B stands for blue). For example, four pixels of the R pixel, the G pixel, the B pixel, and a W (white) pixel may be included. Alternatively, a color element may be composed of two colors among R, G, and B as in PenTile layout, and the two colors to be selected may differ depending on the color elements. Alternatively, one or more colors of yellow, cyan, magenta, and the like may be added to RGB. Note that the size of a display region may be different depending on respective dots of the color components. However, the disclosed invention can also be applied to a display device for monochrome display, unless being limited to a display device for color display.

Furthermore, in order for a display device to perform full-color display using white light emission (W) for a backlight (e.g., an organic EL element, an inorganic EL element, an LED, or a fluorescent lamp), a coloring layer (also referred to as a color filter) may be used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and approximately 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring system, any of the following systems may be used: the above-described system (color filter system) in which part of white light emission is converted into red light, green light, and blue light through color filters; a system (three-color system) in which red light, green light, and blue light are used; and a system (color conversion system or quantum dot system) in which part of blue light emission is converted into red light or green light.

Figure 23:
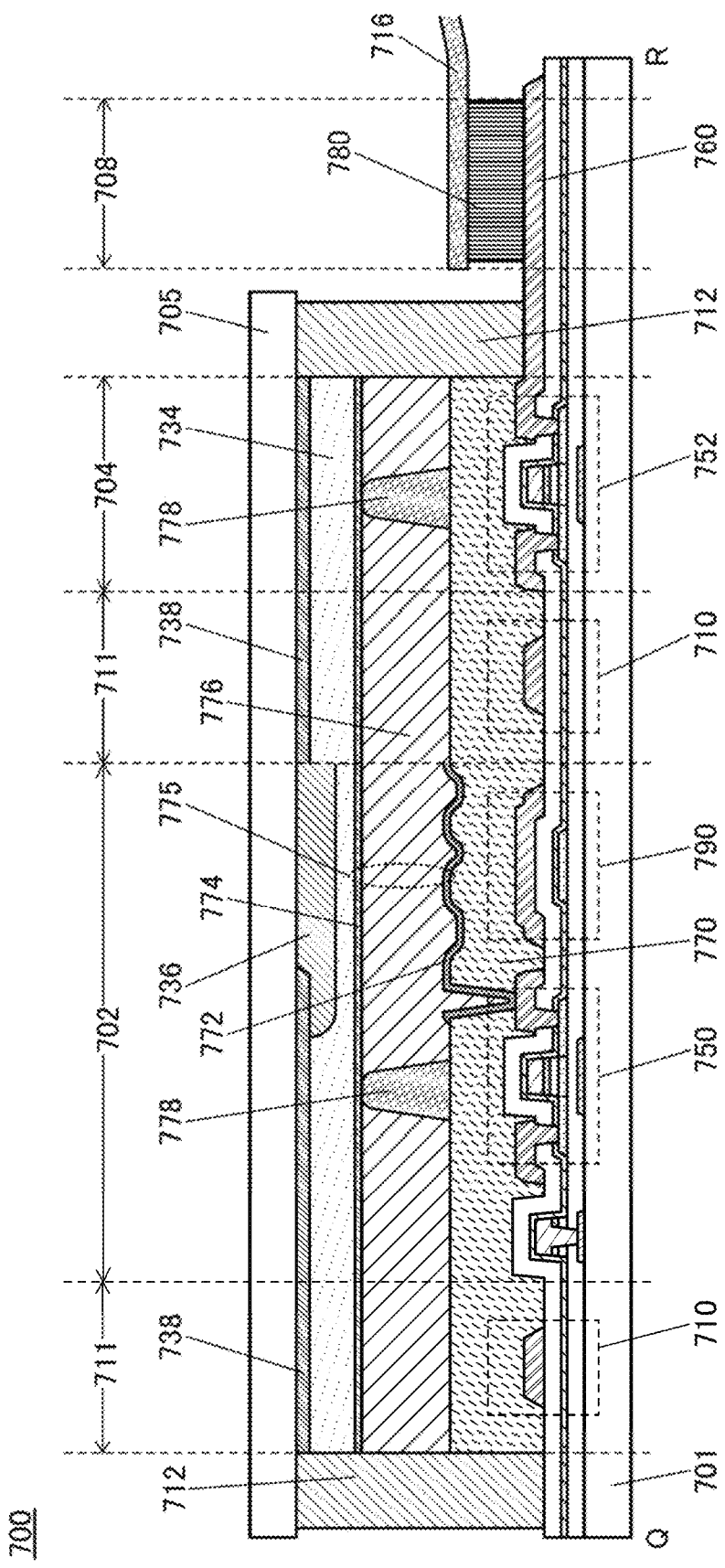
FIG. 23 is a cross-sectional view illustrating one embodiment of a display device.
Figure 24:
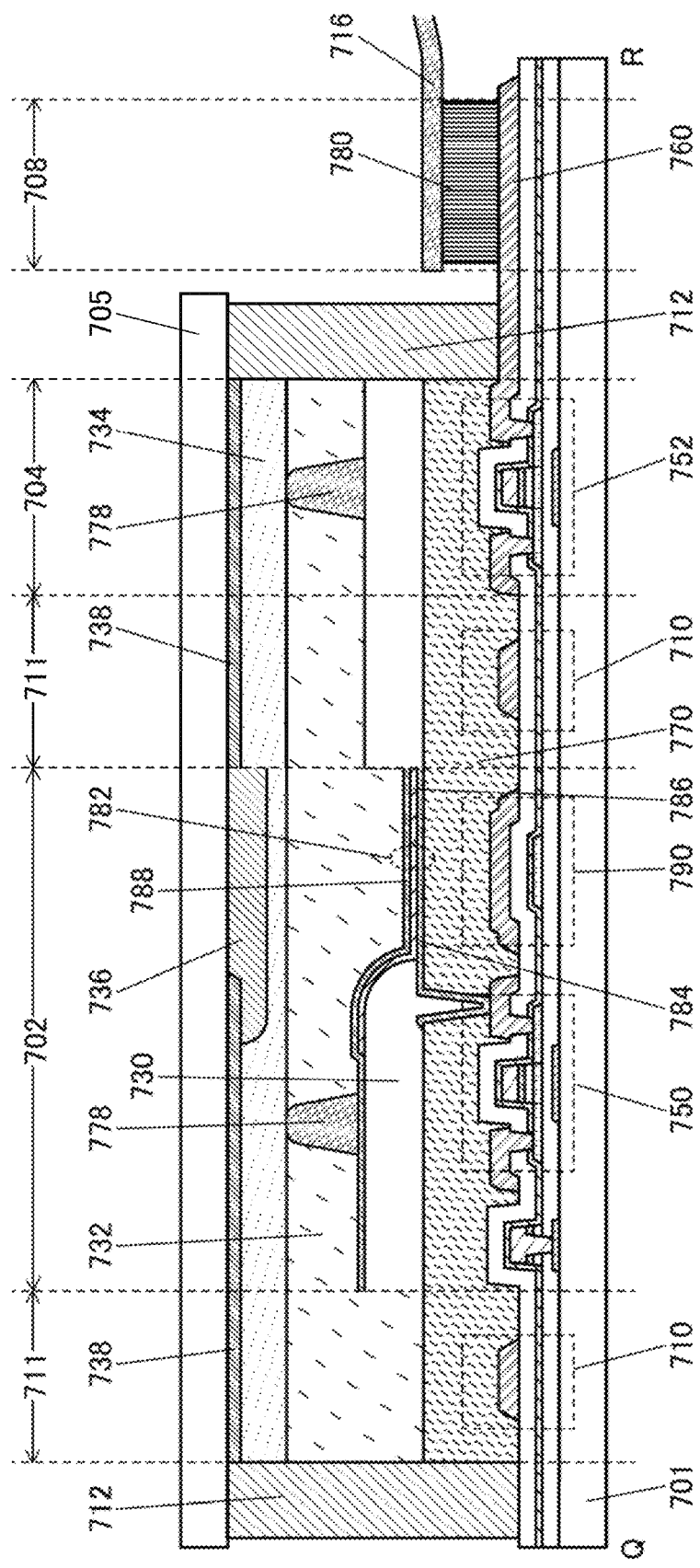
FIG. 24 is a cross-sectional view illustrating one embodiment of a display device.

In this embodiment, a structure including a liquid crystal element and an EL element as display elements is described with reference to FIG. 23 and FIG. 24. Note that FIG. 23 is a cross-sectional view taken along the dashed-dotted line Q-R in FIG. 22 and illustrates a structure including a liquid crystal element as a display element. FIG. 24 is a cross-sectional view taken along the dashed-dotted line Q-R in FIG. 22 and illustrates a structure including an EL element as a display element.

Common portions between FIG. 23 and FIG. 24 are described first, and then different portions are described below.

<Common Portions in Display Devices>

The display device 700 illustrated in FIG. 23 and FIG. 24 include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100 described above. Note that the transistor 750 and the transistor 752 may each have the structure of any of the other transistors described in the above embodiments.

The transistors used in this embodiment each include an oxide semiconductor film which is highly purified and in which formation of oxygen vacancies is suppressed. Such transistors can have low off-state current. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high speed operation. For example, with such a transistor that can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor that can operate at high speed can be used also in the pixel portion, whereby a high-quality image can be provided.

The capacitor 790 includes a lower electrode that is formed through a step of processing the same oxide semiconductor film as the oxide semiconductor film included in the transistor 750, and an upper electrode that is formed through a step of processing the same conductive film as a conductive film functioning as a source electrode and a drain electrode of the transistor 750. Between the lower electrode and the upper electrode, an insulating film formed through a step of forming the same insulating film as a third insulating film and a fourth insulating film included in the transistor 750 is provided. That is, the capacitor 790 has a stacked-layer structure in which the insulating films functioning as a dielectric are positioned between the pair of electrodes.

In FIG. 23 and FIG. 24, a planarization insulating film 770 is provided over the transistor 750, the transistor 752, and the capacitor 790.

The planarization insulating film 770 can be formed using an organic material having heat resistance, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIG. 23 and FIG. 24 each illustrate an example in which the transistor 750 included in the pixel portion 702 and the transistor 752 included in the source driver circuit portion 704 have the same structure, one embodiment is not limited thereto. For example, in the pixel portion 702 and the source driver circuit portion 704, different transistors may be used.

In the case where different transistors are used in the pixel portion 702 and the source driver circuit portion 704, any of the staggered transistors described in Embodiment 1 and an inverted staggered transistor may be used in combination. Specifically, a structure in which a staggered transistor is used in the pixel portion 702 and an inverted staggered transistor is used in the source driver circuit portion 704, or a structure in which an inverted staggered transistor is used in the pixel portion 702 and a staggered transistor is used in the source driver circuit portion 704 may be given. Note that the term "source driver circuit portion 704" can be replaced by the term "gate driver circuit portion". Furthermore, an inverted staggered transistor may have a channel-etched structure or a channel-protective structure. In addition, an inverted staggered transistor also preferably has a structure with the s-channel structure described above. Furthermore, these transistor structures may freely be combined and used.

The signal line 710 is formed through the same process as the conductive films functioning as source electrodes and drain electrodes of the transistors 750 and 752. Note that the signal line 710 may be formed using a conductive film that is formed through a process different from the process of forming the source electrodes and the drain electrodes of the transistors 750 and 752; for example, an oxide semiconductor film formed through the same process as an oxide semiconductor film functioning as a gate electrode may be used. In the case where the signal line 710 is formed using a material including a copper element, for example, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

As the first substrate 701 and the second substrate 705, glass substrates can be used, for example. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selectively etching an insulating film and provided to control the distance (cell gap) between the first substrate 701 and the second substrate 705. Note that a spherical spacer may also be used as the structure body 778.

Furthermore, a light-shielding film 738 functioning as a black matrix, a coloring film 736 functioning as a color filter, and an insulating film 734 in contact with the light-shielding film 738 and the coloring film 736 are provided on the second substrate 705 side.

<Structure Example of Display Device Using Liquid Crystal Element>

The display device 700 illustrated in FIG. 23 includes a liquid crystal element 775. The liquid crystal element 775 includes a conductive film 772, a conductive film 774, and a liquid crystal layer 776. The conductive film 774 is provided on the second substrate 705 side and has a function of a counter electrode. The display device 700 in FIG. 23 is capable of displaying an image in such a manner that light transmission or non-transmission is controlled by change in the alignment state of the liquid crystal layer 776 depending on a voltage applied to the conductive film 772 and the conductive film 774.

The conductive film 772 is connected to the conductive film that functions as a source electrode and a drain electrode included in the transistor 750. The conductive film 772 is formed over the planarization insulating film 770 and functions as a pixel electrode, i.e., one electrode of the display element. The conductive film 772 has a function of a reflective electrode. The display device 700 in FIG. 23 is what is called a reflective color liquid crystal display device in which external light is utilized and light is reflected by the conductive film 772 to display an image through the coloring film 736.

A conductive film that transmits visible light or a conductive film that reflects visible light can be used for the conductive film 772. As the conductive film that transmits visible light, for example, a material including one kind selected from indium (In), zinc (Zn), and tin (Sn) may be used. As the conductive film that reflects visible light, for example, a material including aluminum or silver may be used. In this embodiment, the conductive film that reflects visible light is used as the conductive film 772.

In the display device 700 in FIG. 23, projections and depressions are provided in part of the planarization insulating film 770 of the pixel portion 702. The projections and depressions can be formed in the following manner, for example the planarization insulating film 770 is formed using a resin film, and projections and depressions are formed on the surface of the resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that although the display device 700 in FIG. 23 is a reflective color liquid crystal display device, one embodiment is not limited thereto; it may be a transmissive color liquid crystal display device in which a conductive film that transmits visible light is used for the conductive film 772. For a transmissive color liquid crystal display device, a structure without projections and depressions provided on the planarization insulating film 770 may be employed.

Figure 25:
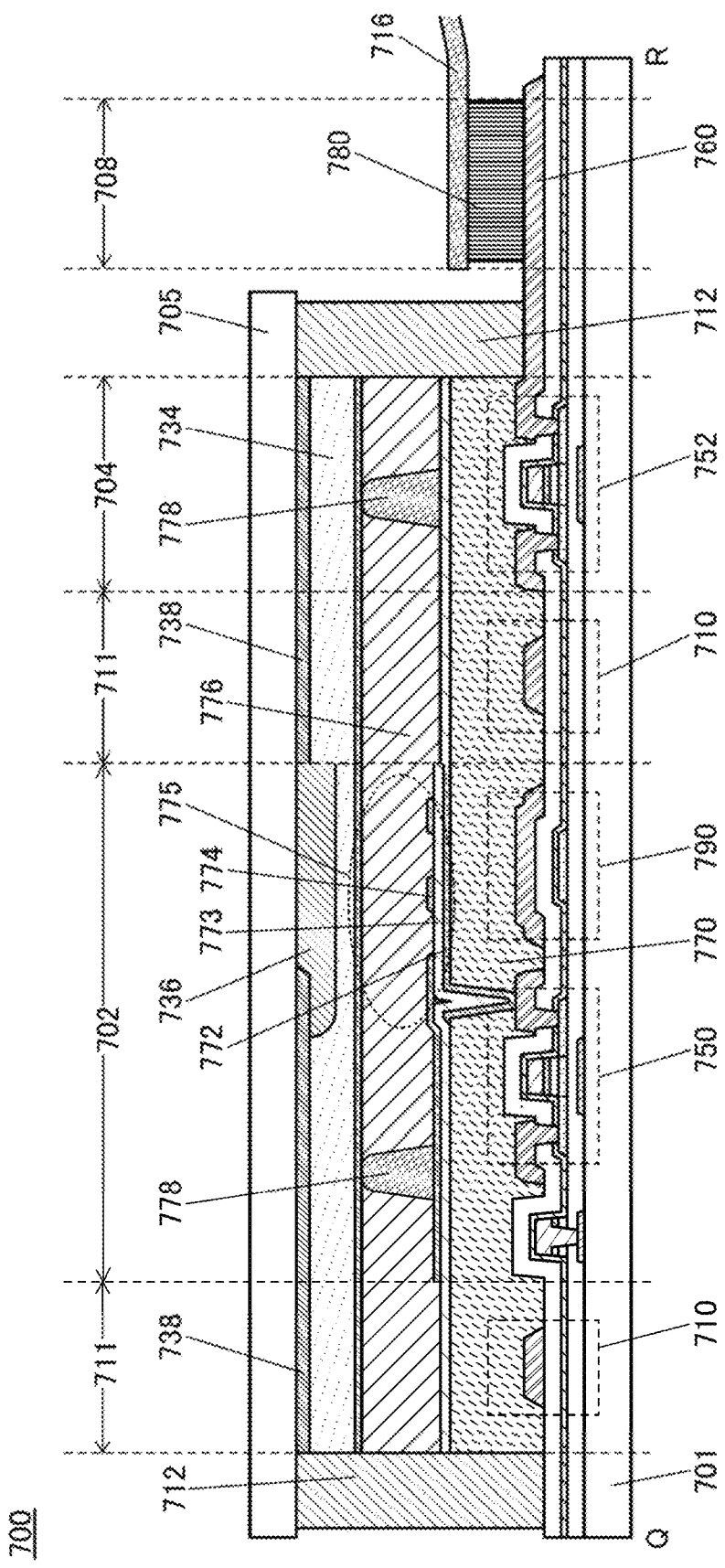
FIG. 25 is a cross-sectional view illustrating one embodiment of a display device.

Here, an example of a transmissive color liquid crystal display device is illustrated in FIG. 25. FIG. 25 is a cross-sectional view taken along dashed-dotted line Q-R in FIG. 22 and illustrates the structure using a liquid crystal element as a display element. The display device 700 illustrated in FIG. 25 is an example of the structure employing a horizontal electric field mode (e.g., an FFS mode) as a driving mode of the liquid crystal element. In the structure illustrated in FIG. 25, an insulating film 773 is provided over the conductive film 772 functioning as a pixel electrode, and the conductive film 774 is provided over the insulating film 773. In such a case, the conductive film 774 has a function of a common electrode, and an electric field generated between the conductive film 772 and the conductive film 774 through the insulating film 773 can control the alignment state in the liquid crystal layer 776.

Although not illustrated in FIG. 23 and FIG. 25, either one or each of the conductive film 772 or the conductive film 774 may be provided with an alignment film on a side in contact with the liquid crystal layer 776. In addition, although not illustrated in FIG. 23 and FIG. 25, an optical member (optical substrate) or the like, such as a polarizing member, a retardation member, or an anti-reflection member, may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several wt % or more is used for the liquid crystal layer in order to improve the temperature range. The liquid crystal composition that includes liquid crystal exhibiting a blue phase and a chiral material has a short response time, and is optically isotropic, so that the alignment process is unnecessary. Since an alignment film does not need to be provided and rubbing treatment is thus not necessary, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In the case where a liquid crystal element is used as the display element, a TN (Twisted Nematic) mode, an IPS (In-Plane-Switching) mode, an FFS (Fringe Field Switching) mode, an ASM (Axially Symmetric aligned Micro-cell) mode, an OCB (Optical Compensated Birefringence) mode, an FLC (Ferroelectric Liquid Crystal) mode, an AFLC (Antiferroelectric Liquid Crystal) mode, or the like can be used.

Furthermore, a normally black liquid crystal display device such as a transmissive liquid crystal display device utilizing a vertical alignment (VA) mode may also be used. There are some examples of a vertical alignment mode; for example, an MVA (multi-domain vertical alignment) mode, a PVA (patterned vertical alignment) mode, an ASV mode, or the like can be employed.

<Display Device Using Light-Emitting Element>

The display device 700 illustrated in FIG. 24 includes a light-emitting element 782. The light-emitting element 782 includes a conductive film 784, an EL layer 786, and a conductive film 788. The display device 700 illustrated in FIG. 24 is capable of displaying an image by light emission from the EL layer 786 of the light-emitting element 782. Note that the EL layer 786 contains an organic compound or an inorganic compound such as a quantum dot.

Examples of materials that can be used for an organic compound include a fluorescent material or a phosphorescent material. Examples of materials that can be used for a quantum dot include a colloidal quantum dot material, an alloyed quantum dot material, a core-shell quantum dot material, and a core quantum dot material. Furthermore, a material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The conductive film 784 is connected to the conductive film that functions as a source electrode and a drain electrode included in the transistor 750. The conductive film 784 is formed over the planarization insulating film 770 and functions as a pixel electrode, i.e., one electrode of the display element. As the conductive film 784, a conductive film that transmits visible light or a conductive film that reflects visible light can be used. As the conductive film that transmits visible light, for example, a material including one kind selected from indium (In), zinc (Zn), and tin (Sn) may be used. As the conductive film that reflects visible light, for example, a material including aluminum or silver may be used.

In the display device 700 in FIG. 24, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment is not limited thereto. A bottom-emission structure in which light is emitted to the conductive film 784 side, or a dual-emission structure in which light is emitted to both the conductive film 784 side and the conductive film 788 side may be employed, for example.

The coloring film 736 is provided in a position overlapping with the light-emitting element 782, and the light-shielding film 738 is provided in a position overlapping with the insulating film 730, in the lead wiring portion 711, and in the source driver circuit portion 704. The coloring film 736 and the light-shielding film 738 are covered with the insulating film 734. A space between the light-emitting element 782 and the insulating film 734 is filled with a sealing film 732. Although a structure with the coloring film 736 is described as the structure of the display device 700 in FIG. 24, the structure is not limited thereto. In the case where the EL layer 786 is formed by a separate coloring method, for example, a structure without the coloring film 736 provided may be employed.

<Structure Example of Display Device Provided with Input/Output Device>

An input/output device may be provided in the display device 700 illustrated in FIG. 24 and FIG. 25. As an example of the input/output device, a touch panel or the like can be given.

Figure 26:
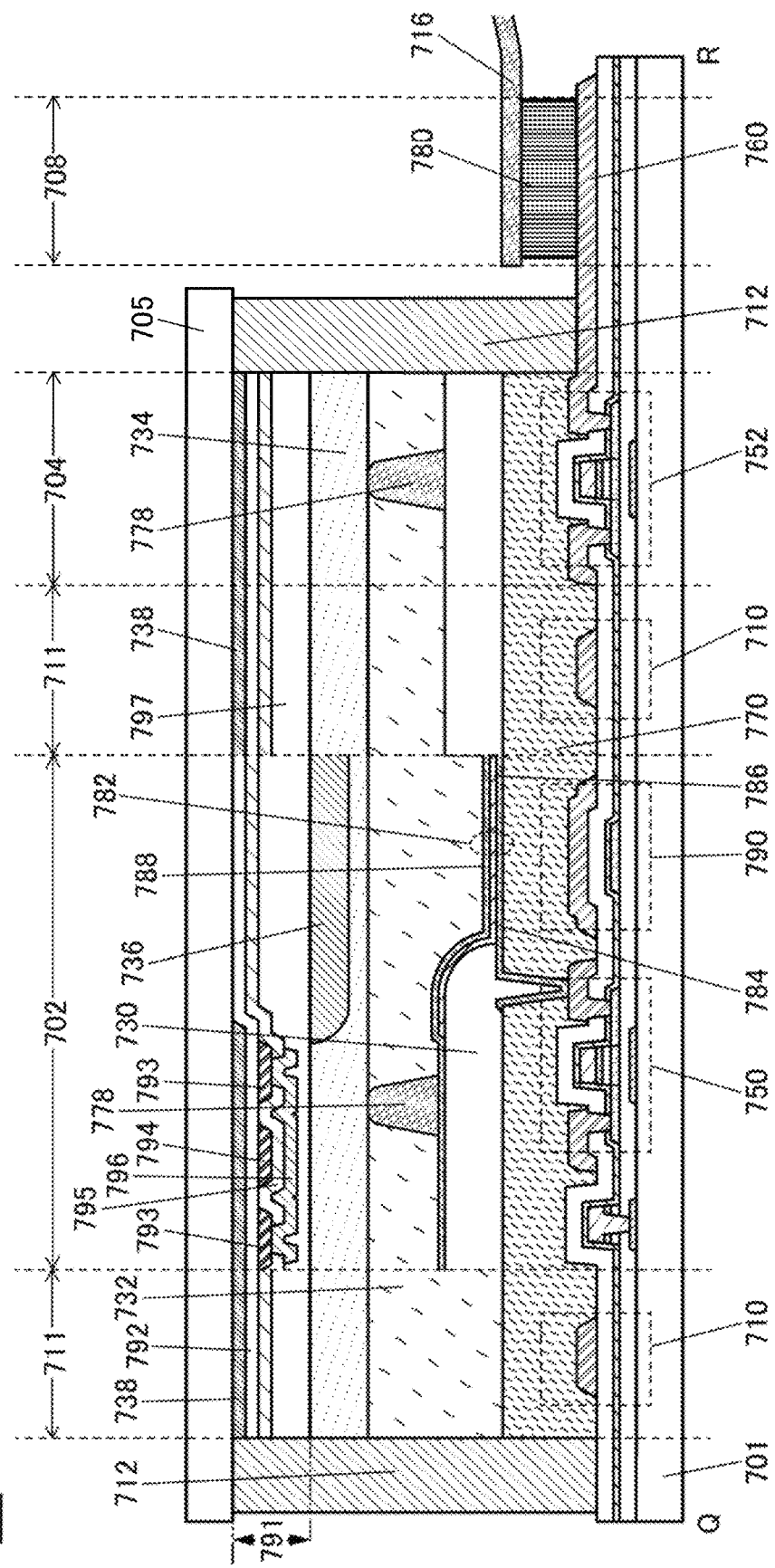
FIG. 26 is a cross-sectional view illustrating one embodiment of a display device.
Figure 27:
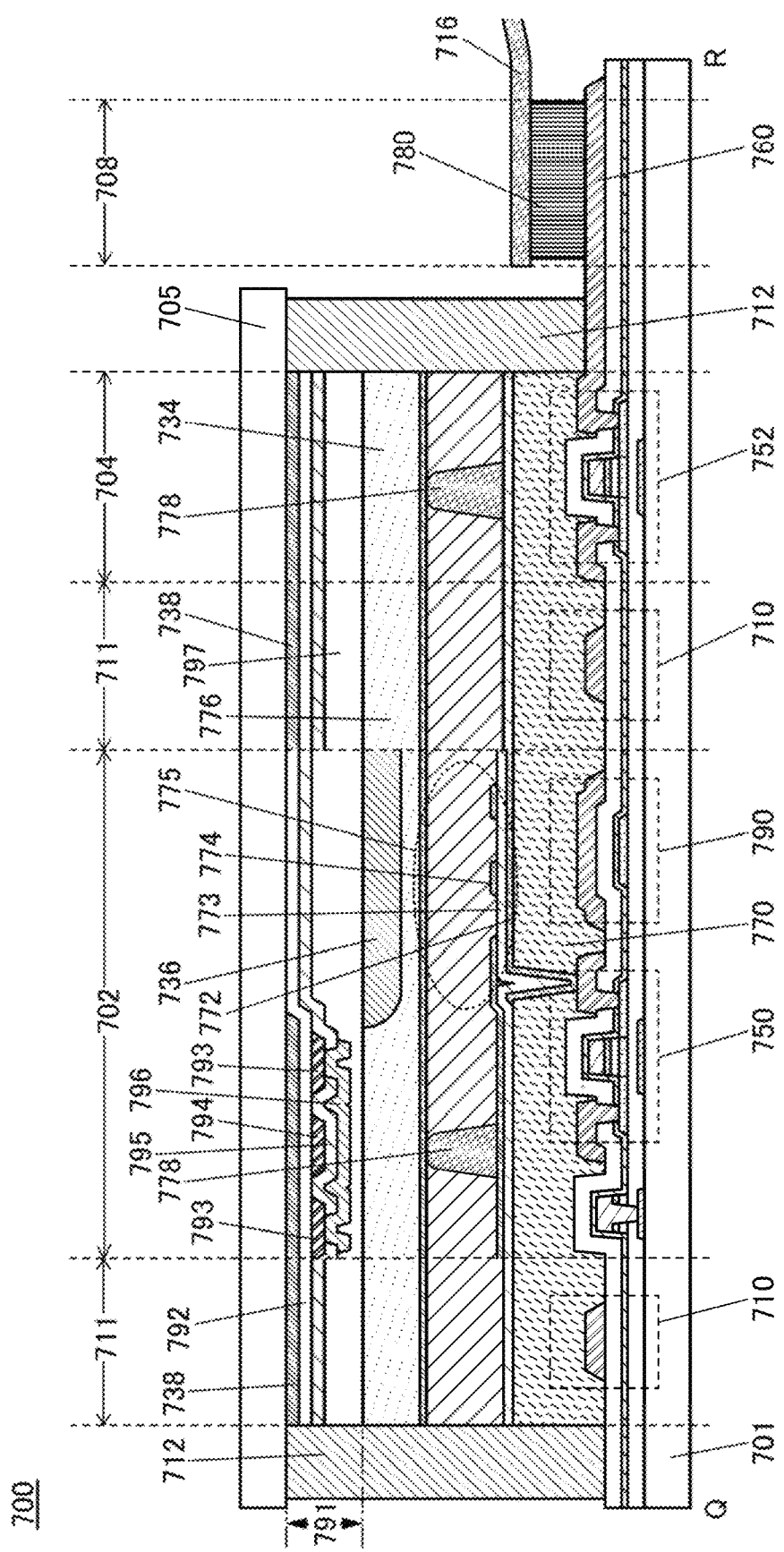
FIG. 27 is a cross-sectional view illustrating one embodiment of a display device.

FIG. 26 and FIG. 27 illustrate structures where a touch panel 791 is provided in the display device 700 in FIG. 24 and FIG. 25.

FIG. 26 is a cross-sectional view of the structure in which the touch panel 791 is provided in the display device 700 illustrated in FIG. 24, and FIG. 27 is a cross-sectional view of the structure in which the touch panel 791 is provided in the display device 700 illustrated in FIG. 25.

First, the touch panel 791 illustrated in FIG. 26 and FIG. 27 is described below.

The touch panel 791 illustrated in FIG. 26 and FIG. 27 is what is called an in-cell touch panel provided between the substrate 705 and the coloring film 736. The touch panel 791 is formed on the substrate 705 side before the light-shielding film 738 and the coloring film 736 are formed.

The touch panel 791 includes the light-shielding film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

A portion in which the electrode 793 intersects with the electrode 794 is illustrated in the upper portion of the transistor 750 illustrated in FIG. 26 and FIG. 27. Through openings in the insulating film 795, the electrode 796 is electrically connected to the two electrodes 793 between which the electrode 794 is positioned. Note that a structure in which a region where the electrode 796 is provided is provided in the pixel portion 702 is illustrated in FIG. 26 and FIG. 27 as an example; however, one embodiment is not limited thereto, and the region where the electrode 796 is provided may be provided in the source driver circuit portion 704.

The electrodes 793 and 794 are provided in a region overlapping with the light-shielding film 738. As illustrated in FIG. 26, it is preferable that the electrode 793 do not overlap with the light-emitting element 782. As illustrated in FIG. 27, it is preferable that the electrode 793 do not overlap with the liquid crystal element 775. In other words, the electrode 793 has an opening in a region overlapping with the light-emitting element 782 and the liquid crystal element 775. That is, the electrode 793 has a mesh shape. With this structure, the electrode 793 does not block light emitted from the light-emitting element 782 or light transmitted through the liquid crystal element 775. Thus, since reduction in luminance, which is caused by provision of the touch panel 791, is very small, a display device with high visibility and reduced power consumption can be achieved. Note that the electrode 794 can have a similar structure.

In addition, since the electrodes 793 and 794 do not overlap with the light-emitting element 782, a metal material with low visible light transmittance can be used for the electrodes 793 and 794. Furthermore, since the electrodes 793 and 794 do not overlap with the liquid crystal element 775, a metal material with low visible light transmittance can be used for the electrodes 793 and 794.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. In the case where an Ag nanowire is used for any one of or all of the electrodes 664, 665, and 667, for example, the transmittance of visible light can be greater than or equal to 89% and the sheet resistance value can be greater than or equal to 40 Ω/sq. and less than or equal to 100 Ω/sq.

Although the structure of the in-cell touch panel is illustrated in FIG. 26 and FIG. 27, one embodiment is not limited thereto. For example, what is called an on-cell touch panel, which is formed over the display device 700, or what is called an out-cell touch panel, which is attached to the display device 700, may be employed.

In this manner, the display device of one embodiment of the present invention can be combined with various types of touch panels and used.

The structure described in this embodiment can be used in appropriate combination with the structure described in any of the other embodiments.

Embodiment 4

In this embodiment, a display device including a semiconductor device of one embodiment of the present invention is described with reference to FIG. 28.

<Circuit Configuration of Display Device>

A display device illustrated in FIG. 28(A) includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or TAB (tape automated bonding).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for outputting a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. A signal for driving the shift register is input through the terminal portion 507 to the gate driver 504a, and the gate driver 504a outputs a signal. For example, a start pulse signal, a clock signal, or the like is input to the gate driver 504a, and the gate driver 504a outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided, and the scan lines GL_1 to GL_X may be controlled separately by the plurality of gate drivers 504a. The gate driver 504a also has a function of supplying an initialization signal. Without being limited thereto, the gate driver 504a can also supply another signal.

The source driver 504b includes a shift register or the like. A signal (image signal) from which a data signal is derived, as well as a signal for driving the shift register is input to the source driver 504b through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). The source driver 504b also has a function of supplying an initialization signal. Without being limited thereto, the source driver 504b can also supply another signal.

The source driver 504b is formed with use of a plurality of analog switches, for example. The source driver 504b can output, as the data signals, signals obtained by time-dividing the image signal by sequentially turning on the plurality of analog switches. The source driver 504b may be formed with use of a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of data of the data signal in each of the plurality of pixel circuits 501 are controlled by the gate driver 504a. For example, to the pixel circuit 501 in the m-th row and the n-th column, a pulse signal is input from the gate driver 504a through the scan line GL_m (in is a natural number of less than or equal to X), and a data signal is input from the source driver 504b through the data line DL_n (n is a natural number of less than or equal to Y) in accordance with the potential of the scan line GL_m.

Figure 28A:
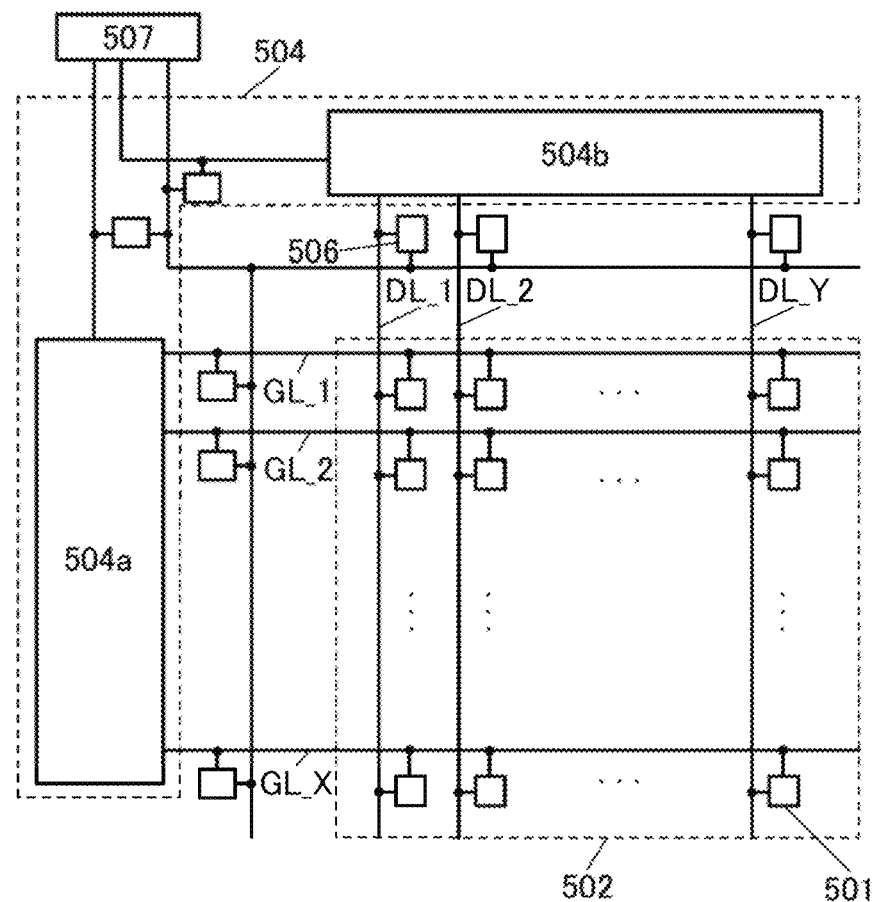
FIGS. 28A-28C are block diagram and circuit diagrams illustrating a display device.

The protection circuit 506 in FIG. 28(A) is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 28(A), the protection circuits 506 provided for each of the pixel portion 502 and the driver circuit portion 504 can improve the resistance of the display device to overcurrent generated by ESD (Electro Static Discharge: electrostatic discharge) or the like. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

Although in FIG. 28(A) an example in which the gate driver 504a and the source driver 504b constitute the driver circuit portion 504 is illustrated, one embodiment is not limited to this example. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 28B:
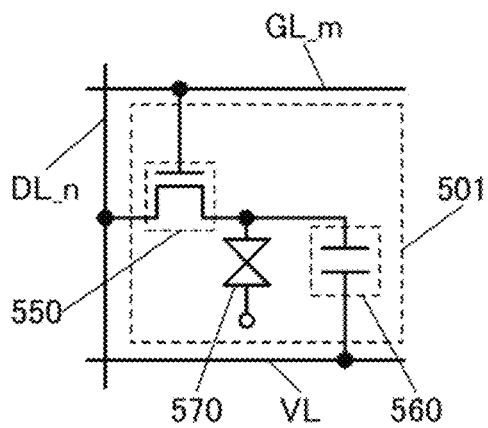

The plurality of pixel circuits 501 in FIG. 28(A) can each have the configuration illustrated in FIG. 28(B), for example.

The pixel circuit 501 in FIG. 28(B) includes a liquid crystal element 570, a transistor 550, and a capacitor 560. As the transistor 550, the transistors described in the above embodiments, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be applied to one of the pair of electrodes of the liquid crystal element 570 included in each of the plurality of pixel circuits 501. Furthermore, the potential applied to one of the pair of electrodes of the liquid crystal element 570 in the pixel circuit 501 may be different row by row.

As a driving method of the display device including the liquid crystal element 570, for example, a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA mode, a PVA (patterned vertical alignment) mode, an IPS mode, an FFS mode, a TBA (transverse bend alignment) mode, and the like may be used. Examples of a driving method of the display device include, in addition to the above driving methods, an ECB (electrically controlled birefringence) mode, a PDLC (polymer dispersed liquid crystal) mode, a PNLC (polymer network liquid crystal) mode, and a guest-host mode. However, not limited to the above, a variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling writing of data of a data signal.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential value of the potential supply line VL is set in accordance with the specifications of the pixel circuit 501 as appropriate. The capacitor 560 has a function of a storage capacitor for storing written data.

In the display device including the pixel circuits 501 in FIG. 28(B), for example, the gate driver 504a in FIG. 28(A) sequentially selects the pixel circuits 501 row by row to turn on the transistors 550, and data of data signals is written.

When the transistors 550 are turned off, the pixel circuits 501 in which the data has been written are brought into a holding state. This operation is sequentially performed row by row; thus, an image can be displayed.

Figure 28C:
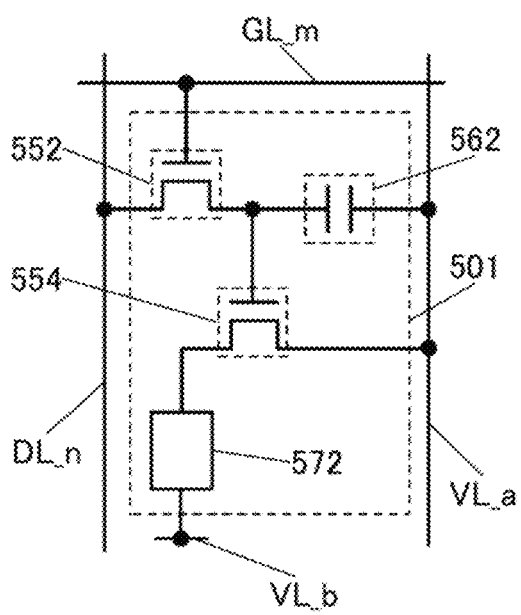

Each of the plurality of pixel circuits 501 in FIG. 28(A) can have the configuration illustrated in FIG. 28(C), for example.

The pixel circuit 501 in FIG. 28(C) includes transistors 552 and 554, a capacitor 562, and a light-emitting element 572. Transistors described in the above embodiments, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling writing of data of a data signal.

One of a pair of electrodes of the capacitor 562 is electrically connected to a wiring to which a potential is applied (hereinafter referred to as a potential supply line VL_a), and the other is electrically connected to the other of the source electrode and the drain electrode of the transistor 552.

The capacitor 562 has a function of a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. However, the light-emitting element 572 is not limited to this; an inorganic EL element formed of an inorganic material may be used.

Note that a high power supply potential VDD is applied to one of the potential supply line VL_a and the potential supply line VL_b, and a low power supply potential VSS is applied to the other.

In the display device that includes the pixel circuits 501 in FIG. 28(C), the gate driver 504*a* in FIG. 28(A) sequentially selects the pixel circuits 501 row by row to turn on the transistors 552, and data of data signals is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal, and the light-emitting element 572 emits light with luminance corresponding to the amount of flowing current. This operation is sequentially performed row by row; thus, an image is displayed.

The structure described in this embodiment can be used in appropriate combination with the structure described in any of the other embodiments.

Embodiment 5

In this embodiment, a circuit configuration example to which the transistors described in the above embodiments can be applied will be described with reference to FIG. 29 to FIG. 32.

Note that in this embodiment, the transistor that includes an oxide semiconductor described in the above embodiment will be referred to as an OS transistor in the following description.

<Configuration Example of Inverter Circuit>

Figure 29A:
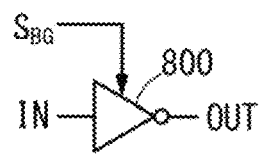
FIGS. 29A-29C are diagrams and a timing chart for illustrating one embodiment of the present invention.

In FIG. 29(A), a circuit diagram of an inverter that can be used for a shift register, a buffer, or the like included in the driver circuit is illustrated. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 29B:
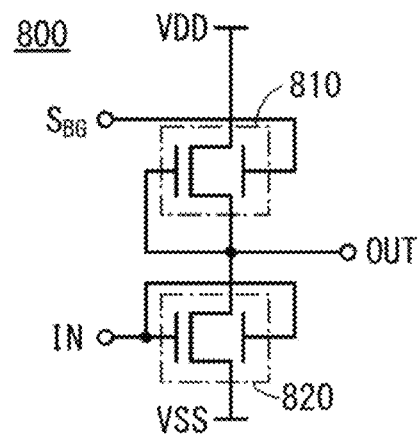

FIG. 29(B) illustrates an example of the inverter 800. The inverter 800 includes OS transistors 810 and 820. The inverter 800 can be formed using only n-channel transistors; thus, the inverter 800 can be formed at lower cost than an inverter formed using a CMOS (Complementary Metal Oxide Semiconductor) (i.e., a CMOS inverter).

Note that the inverter 800 that includes the OS transistors can be provided over a CMOS that is made up of Si transistors. Since the inverter 800 can be provided so as to overlap with the CMOS circuit, an increase in the circuit area for adding the inverter 800 can be suppressed.

The OS transistors 810 and 820 include a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring which applies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring which applies a voltage VSS.

Figure 29C:
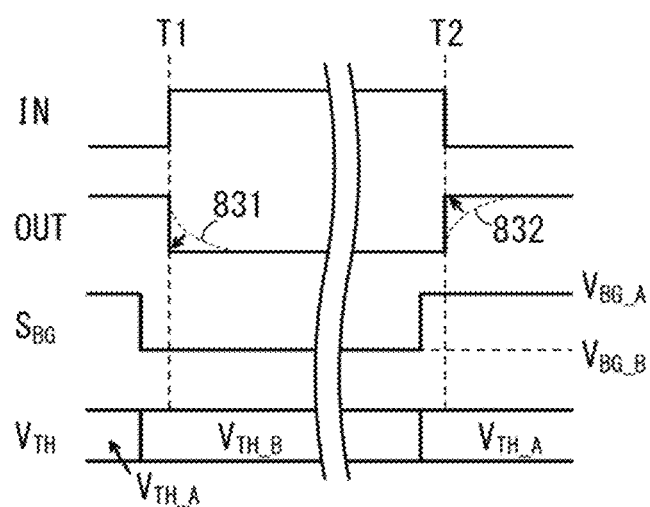

FIG. 29(C) is a timing chart for illustrating the operation of the inverter 800. The timing chart in FIG. 29(C) illustrates changes of a signal waveform of the input terminal IN, a signal waveform of the output terminal OUT, a signal waveform of the signal $S_{BG}$, and the threshold voltage of the OS transistor 810.

The signal $S_{BG}$ is supplied to the second gate of the OS transistor 810, whereby the threshold voltage of the OS transistor 810 can be controlled.

The signal $S_{BG}$ includes a voltage $B_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 30A:
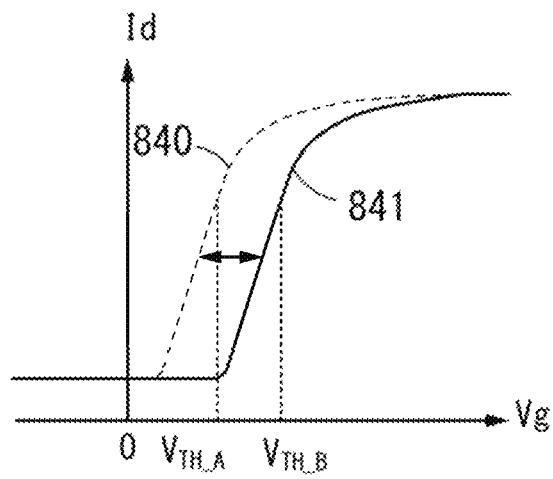
FIGS. 30A-30C are graph and circuit diagrams for illustrating one embodiment of the present invention.

To visualize the above description, FIG. 30(A) shows an Id-Vg curve, which is one of the electrical characteristics of a transistor.

When the voltage of the second gate is increased, like the voltage $V_{BG\_A}$, the electrical characteristics of the OS transistor 810 can be shifted to the curve shown by a dashed line 840 in FIG. 30(A). When the voltage of the second gate is decreased, like the voltage $V_{BG\_B}$, the electrical characteristics of the OS transistor 810 can be shifted to the curve shown by a solid line 841 in FIG. 30(A). As shown in FIG. 30(A), switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 30B:
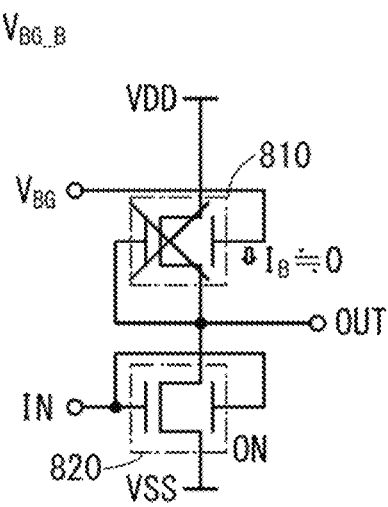

By shifting the threshold voltage in the positive direction toward the threshold voltage $V_{TH\_B}$, a state in which current is less likely to flow in the OS transistor 810 can be made. FIG. 30(B) visualizes this state.

As illustrated in FIG. 30B, a current Is that flows in the OS transistor 810 can be extremely low. Thus, when a signal supplied to the input terminal IN is at a high level and the OS transistor 820 is on (ON), the voltage of the output terminal OUT can drop sharply.

Since a state in which current is less likely to flow in the OS transistor 810 as illustrated in FIG. 30(B) can be obtained, a signal waveform 831 of the output terminal in the timing chart in FIG. 29(C) can be made steep. Since shoot-through current between the wiring that applies the voltage VDD and the wiring that applies the voltage VSS can be low, operation with lower power consumption can be carried out.

Figure 30C:
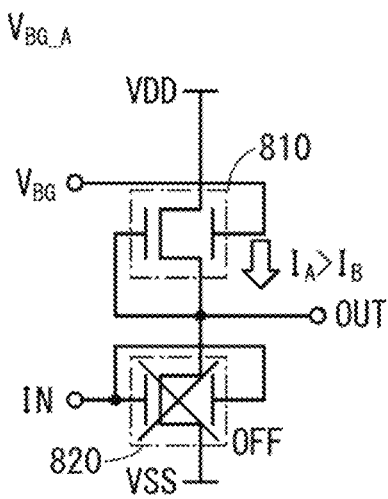

By shifting the threshold voltage in the negative direction toward the threshold voltage $V_{TH\_A}$, a state in which current easily flows in the OS transistor 810 can be made. FIG. 30(C) visualizes this state. As illustrated in FIG. 30(C), a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply. Since a state in which current easily flows in the OS transistor 810 as illustrated in FIG. 30(C) can be obtained, a signal waveform 832 of the output terminal in the timing chart in FIG. 29(C) can be made steep.

Note that the threshold voltage of the OS transistor 810 is preferably controlled by the signal $S_{BG}$ before the state of the OS transistor 820 is switched, i.e., before Time T1 or T2. For example, as in FIG. 29(C), it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 29(C), it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 31A:
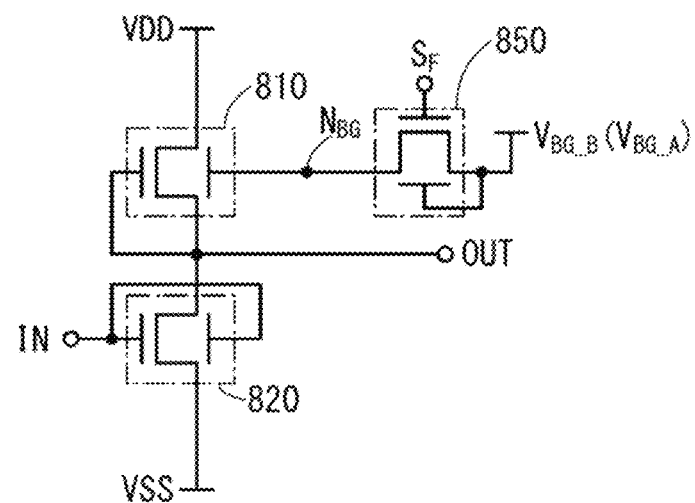
FIGS. 31A and 31B are a circuit diagram and a timing chart for illustrating one embodiment of the present invention.

Although the timing chart in FIG. 29(C) illustrates the configuration in which the signal $S_{BG}$ is switched in accordance with the signal supplied to the input terminal IN, a different configuration may be employed. For example, voltage for controlling the threshold voltage may be held by the second gate of the OS transistor 810 in a floating state. FIG. 31(A) illustrates an example of a circuit configuration that can achieve such a configuration.

In FIG. 31(A), an OS transistor 850 is included in addition to the circuit configuration in FIG. 29(B). A first terminal of the OS transistor 850 is connected to the second gate of the OS transistor 810. A second terminal of the OS transistor 850 is connected to a wiring which applies the voltage $V_{BG\_B}$ (or the voltage $V_{BG\_A}$). A first gate of the OS transistor 850 is connected to a wiring which supplies a signal SF. A second gate of the OS transistor 850 is connected to the wiring which applies the voltage $V_{BG\_B}$ (or the voltage $V_{BG\_A}$).

Figure 31B:
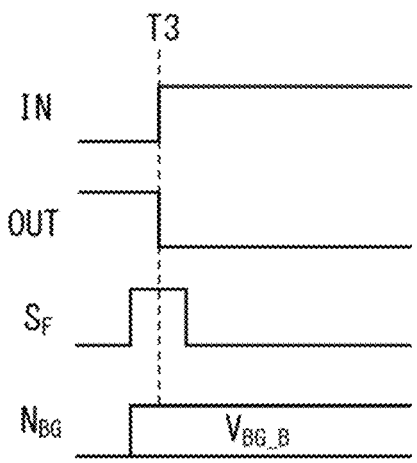

The operation of FIG. 31(A) is described with reference to a timing chart in FIG. 31(B).

The voltage for controlling the threshold voltage of the OS transistor 810 is applied to the second gate of the OS transistor 810 before Time T3 at which the level of the signal supplied to the input terminal IN is changed to a high level. The signal SF is set to a high level and the OS transistor 850 is turned on, so that the voltage $V_{BG\_B}$ for controlling the threshold voltage is applied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held once by the node $N_{BG}$ can be retained by keeping the off state of the OS transistor 850. Therefore, the number of times of operation of applying the voltage $V_{BG\_B}$ to the second gate of the OS transistor 850 can be reduced and accordingly the power consumed to rewrite the voltage $V_{BG\_B}$ can be reduced.

Figure 32A:
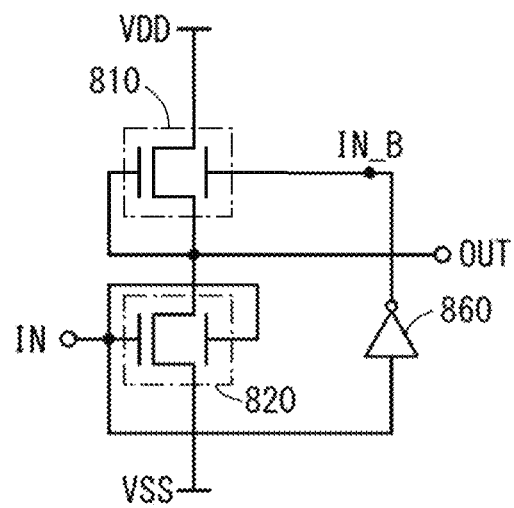
FIGS. 32A and 32B are a circuit diagram and a timing chart for illustrating one embodiment of the present invention.

Although FIG. 29(B) and FIG. 31(A) each illustrate the configuration where the voltage is applied to the second gate of the OS transistor 810 by control from the outside, a different configuration may be employed. For example, a configuration in which voltage for controlling the threshold voltage is generated on the basis of the signal supplied to the input terminal IN and applied to the second gate of the OS transistor 810 may be employed. FIG. 32(A) illustrates an example of a circuit configuration that can achieve such a configuration.

In FIG. 32(A), the circuit configuration in FIG. 29(B) also includes a CMOS inverter 860 between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation of FIG. 32(A) is described with reference to a timing chart in FIG. 32(B). The timing chart in FIG. 32(B) illustrates changes of a signal waveform of the input terminal IN, a signal waveform of the output terminal OUT, an output waveform IN_B of the CMOS inverter 860, and a threshold voltage of the OS transistor 810.

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIG. 30A to FIG. 30C. For example, the signal supplied to the input terminal IN is at a high level and the OS transistor 820 is turned on at time T4 in FIG. 32(B). At this time, the output waveform IN_B is at a low level. Accordingly, a state in which current is less likely to flow in the OS transistor 810 can be obtained; thus, the voltage increase of the output terminal OUT can be sharply decreased.

Figure 32B:
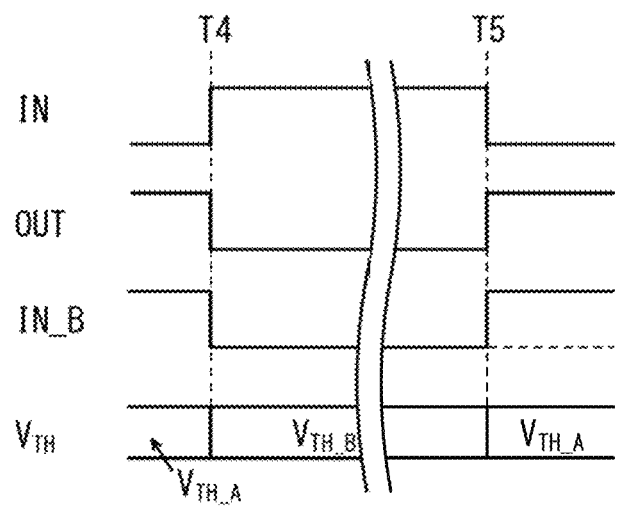

Moreover, the signal supplied to the input terminal IN is at a low level and the OS transistor 820 is turned off at time T5 in FIG. 32(B). At this time, the output waveform IN_B is at a high level. Accordingly, a state in which current easily flows in the OS transistor 810 can be obtained; thus, a rise in the voltage of the output terminal OUT can be made steep.

As described above, in the structure of this embodiment, the voltage of the back gate in the inverter that includes the OS transistor is switched in accordance with the logic of the signal of the input terminal IN. In such a structure, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that apply power supply voltages can be reduced. Thus, power consumption can be reduced.

The structure described in this embodiment can be used in appropriate combination with the structure described in any of the other embodiments.

Embodiment 6

In this embodiment, an example of a semiconductor device in which the transistor that includes an oxide semiconductor (OS transistor) described in the above embodiments is used in a plurality of circuits will be described with reference to FIG. 33 to FIG. 36.

<Circuit Configuration Example of Semiconductor Device>

Figure 33A:
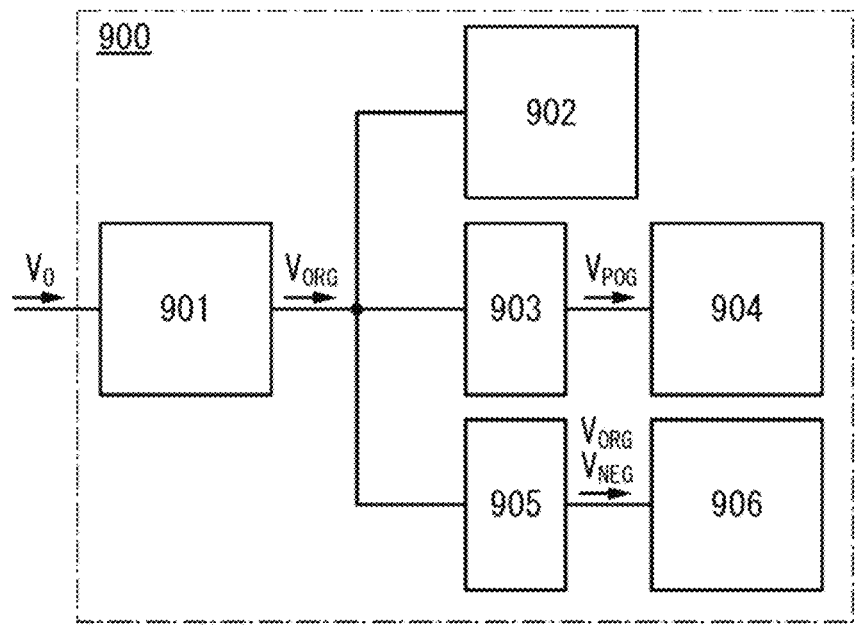
FIGS. 33A-33E are a block diagram, circuit diagrams, and waveform diagrams for illustrating one embodiment of the present invention.

FIG. 33(A) is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ which is a reference. The voltage $V_{ORG}$ is not necessarily one voltage and can be a plurality of voltages. The voltage $V_{ORG}$ can be generated on the basis of a voltage $V_0$ applied from the outside of the semiconductor device 900. The semiconductor device 900 can generate the voltage $V_{ORG}$ on the basis of one power supply voltage applied from the outside. Thus, the semiconductor device 900 can operate without application of a plurality of power supply voltages from the outside.

The circuits 902, 904, and 906 are circuits that operate with different power supply voltages. The power supply voltage of the circuit 902, for example, is a voltage applied by the voltage $V_{ORG}$ and the voltage $V_{SS}$ ($V_{ORG}>V_{SS}$). The power supply voltage of the circuit 904, for example, is a voltage applied by the voltage $V_{POG}$ and the voltage $V_{SS}$ ($V_{POG}>V_{ORG}$). The power supply voltage of the circuit 906, for example, is a voltage applied by the voltage $V_{ORG}$ and the voltage $V_{NEG}$ ($V_{ORG}>V_{SS}>V_{NEG}$). When the voltage $V_{SS}$ is equal to a ground (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ applied from the power supply circuit 901. Thus, the semiconductor device 900 including the circuit 904 can operate on the basis of one power supply voltage applied from the outside.

The voltage generation circuit 905 is a circuit that generates the voltage $V_{NEG}$. The voltage generation circuit 905 can generate the voltage $V_{NEG}$ on the basis of the voltage $V_{ORG}$ applied from the power supply circuit 901. Thus, the semiconductor device 900 including the circuit 906 can operate on the basis of one power supply voltage applied from the outside.

Figure 33B:
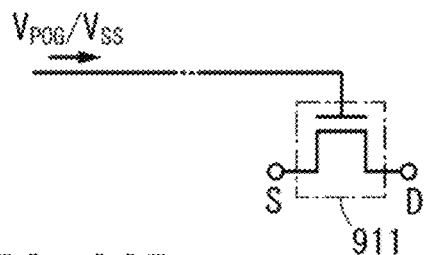
Figure 33C:
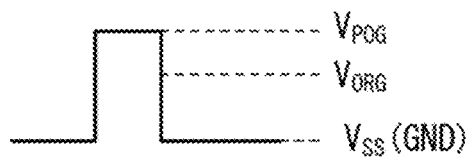

FIG. 33(B) illustrates an example of the circuit 904 that operates with the voltage $V_{POG}$ and FIG. 33(C) illustrates an example of a waveform of a signal for operating the circuit 904.

FIG. 33(B) illustrates a transistor 911. A signal supplied to a gate of the transistor 911 is generated on the basis of, for example, the voltage $V_{POG}$ and the voltage $V_{SS}$. The signal is the voltage $V_{POG}$ at the time when the transistor 911 is turned on and is the voltage $V_{SS}$ at the time when the transistor 911 is turned off. As illustrated in FIG. 33(C), the voltage $V_{POG}$ is higher than the voltage $V_{ORG}$. Therefore, the transistor 911 can perform more securely an operation for bringing a source (S) and a drain (D) into a conduction state. As a result, the frequency of malfunction of the circuit 904 can be reduced.

Figure 33D:
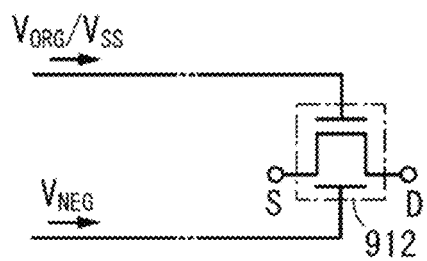
Figure 33E:
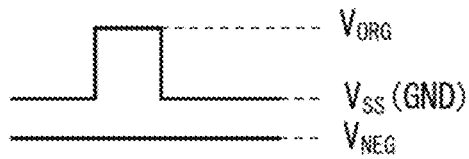

FIG. 33(D) illustrates an example of the circuit 906 that operates with the voltage $V_{NEG}$ and FIG. 33(E) illustrates an example of a waveform of a signal for operating the circuit 906.

FIG. 33(D) illustrates a transistor 912 having a back gate. A signal supplied to a gate of the transistor 912 is generated on the basis of, for example, the voltage $V_{ORG}$ and the voltage $V_{SS}$. The signal is the voltage $V_{ORG}$ at the time when the transistor 911 is turned on and is the voltage $V_{SS}$ at the time when the transistor 911 is turned off. A voltage applied to the back gate of the transistor 912 is generated on the basis of the voltage $V_{NEG}$. As illustrated in FIG. 33(E), the voltage $V_{NEG}$ is lower than the voltage $V_{SS}$ (GND). Therefore, the threshold voltage of the transistor 912 can be controlled so as to shift in the positive direction. Thus, the transistor 912 can more securely be turned off and the current flowing between the source (S) and the drain (D) can be small. As a result, the frequency of malfunction of the circuit 906 can be reduced and the power consumption thereof can be reduced.

Note that a structure in which the voltage $V_{NEG}$ is directly applied to the back gate of the transistor 912 may be employed. A structure in which a signal supplied to the gate of the transistor 912 is generated on the basis of the voltage $V_{ORG}$ and the voltage $V_{NEG}$ and the generated signal is supplied to the back gate of the transistor 912 may also be employed.

Figure 34A:
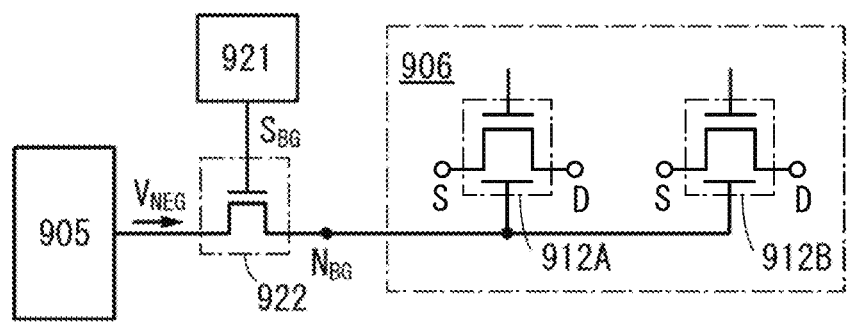
FIGS. 34A and 34B are a circuit diagram and a timing chart for illustrating one embodiment of the present invention.

FIGS. 34(A) and (B) illustrate a modification example of FIGS. 33(D) and (E).

In a circuit diagram illustrated in FIG. 34(A), a transistor 922 whose conduction state can be controlled by a control circuit 921 is provided between the voltage generation circuit 905 and the circuit 906. The transistor 922 is an n-channel type OS transistor. A control signal $S_{BG}$ output from the control circuit 921 is a signal for controlling the conduction state of the transistor 922. Transistors 912A and 912B included in the circuit 906 are OS transistors like the transistor 922.

Figure 34B:
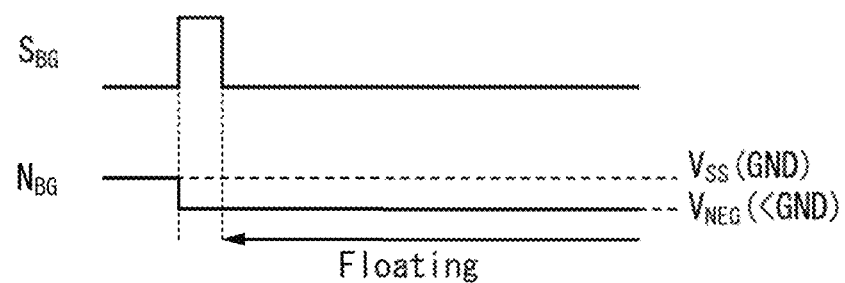

A timing chart in FIG. 34(B) shows the control signal $S_{BG}$, and changes in a potential of the node $N_{BG}$, which indicate the states of potentials of back gates of the transistors 912A and 912B. When the control signal $S_{BG}$ is at a high level, the transistor 922 is turned on and the node $N_{BG}$ becomes the voltage $V_{NEG}$. Then, when the control signal $S_{BG}$ is at a low level, the node $N_{BG}$ becomes electrically floating. Since the transistor 922 is an OS transistor, its off-state current is small. Accordingly, even when the node $N_{BG}$ is electrically floating, the voltage $V_{NEG}$ which has been applied once can be held.

Figure 35A:
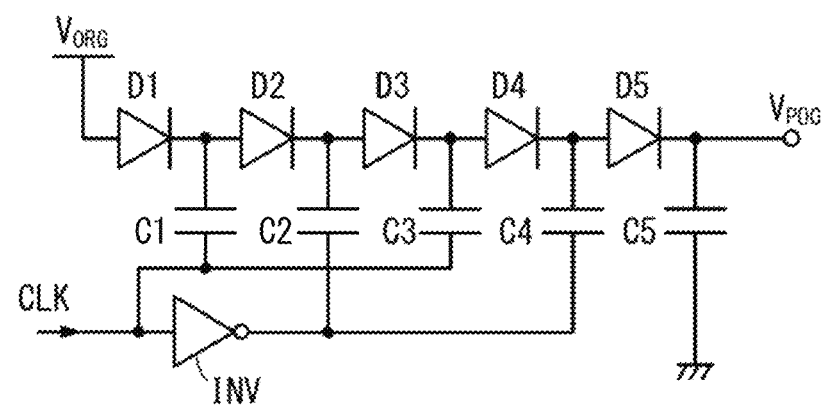
FIGS. 35A and 35B are circuit diagrams for illustrating one embodiment of the present invention.

FIG. 35(A) illustrates an example of a circuit configuration applicable to the above-described voltage generation circuit 903. The voltage generation circuit 903 illustrated in FIG. 35(A) is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied by the voltage $V_{ORG}$ and the voltage $V_{SS}$, the voltage $V_{POG}$, which has been increased to a positive voltage quintuple the voltage $V_{ORG}$ by the clock signal CLK, can be obtained. Note that a forward voltage of the diodes D1 to D5 is 0 V. Furthermore, a desired voltage $V_{POG}$ can be obtained when the number of stages of the charge pump is changed.

Figure 35B:
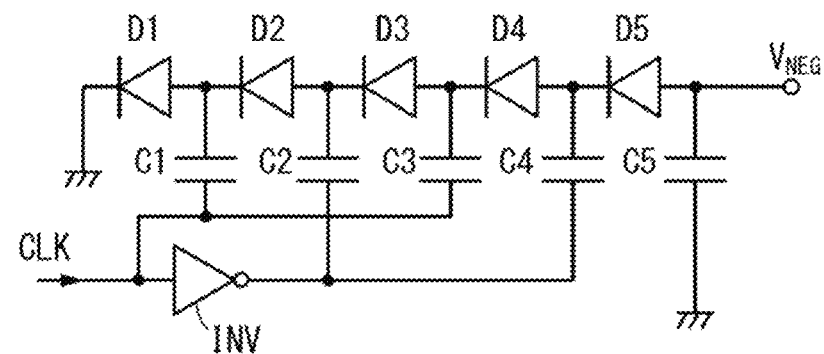

FIG. 35(B) illustrates an example of a circuit configuration applicable to the above-described voltage generation circuit 905. The voltage generation circuit 905 illustrated in FIG. 35(B) is a four-stage charge pump including the diodes D1 to D5, the capacitors C1 to C5, and the inverter INV. A clock signal CLK is supplied to the capacitors C1 to C5 directly or through the inverter INV. When a power supply voltage of the inverter INV is a voltage applied by the voltage $V_{ORG}$ and the voltage $V_{SS}$, the voltage $V_{NEG}$, which has been reduced from ground, i.e., the voltage $V_{SS}$, to a negative voltage quadruple the voltage $V_{ORG}$ by the clock signal CLK, can be obtained. Note that a forward voltage of the diodes D1 to D5 is 0 V. Furthermore, a desired voltage $V_{NEG}$ can be obtained when the number of stages of the charge pump is changed.

Figure 36A:
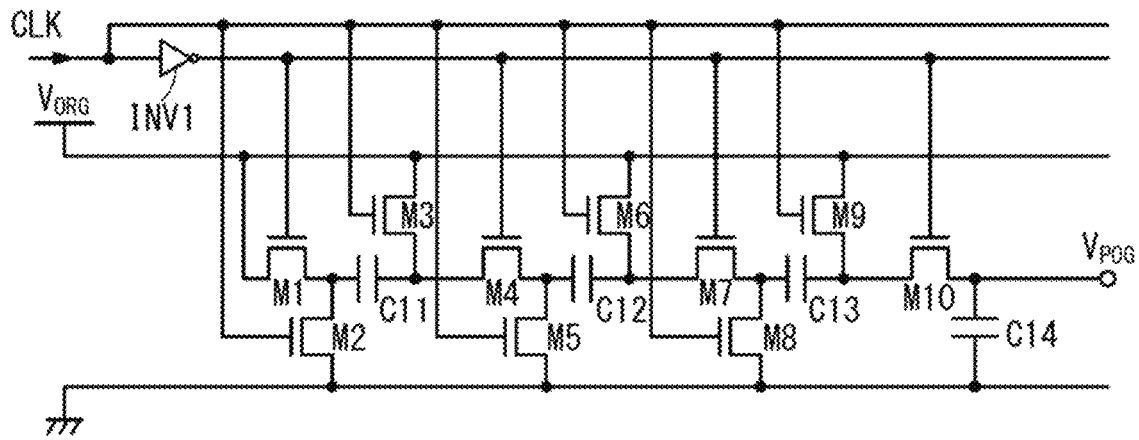
FIGS. 36A-36C are circuit diagrams for illustrating one embodiment of the present invention.
Figure 36B:
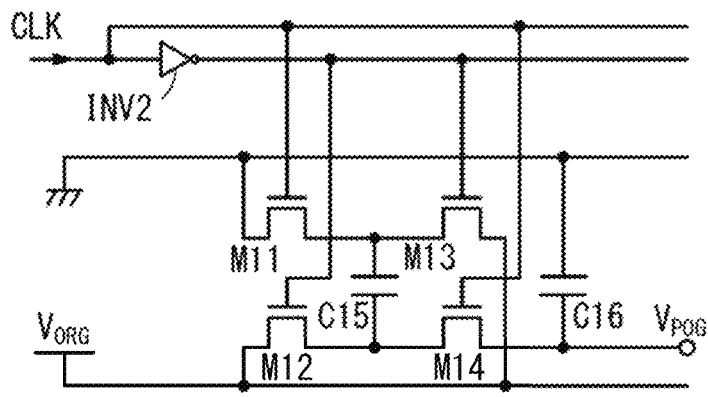
Figure 36C:
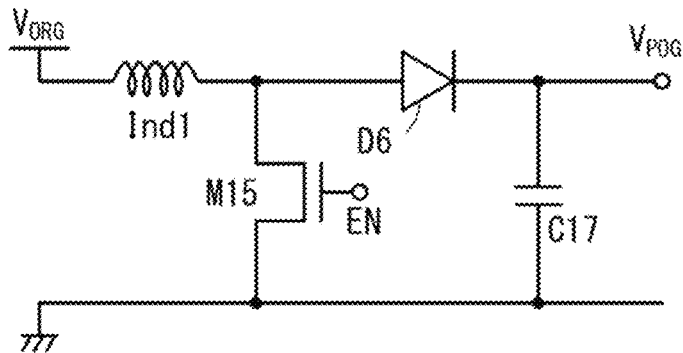

The circuit configuration of the voltage generation circuit 903 is not limited to the configuration of the circuit diagram illustrated in FIG. 35(A). For example, modification examples of the voltage generation circuit 903 are illustrated in FIG. 36(A) to FIG. 36(C). Note that modification examples of the voltage generation circuit 903 can be achieved by changing voltages applied to wirings or arrangement of elements in voltage generation circuits 903A to 903C illustrated in FIG. 36(A) to FIG. 36(C).

The voltage generation circuit 903A illustrated in FIG. 36(A) includes transistors M1 to M10, capacitors C11 to C14, and an inverter INV1. The clock signal CLK is supplied to gates of the transistors M1 to M10 directly or through the inverter INV1. By the clock signal CLK, the voltage $V_{POG}$, which has been increased to a positive voltage quadruple the voltage $V_{ORG}$, can be obtained. Note that a desired voltage $V_{POG}$ can be obtained when the number of stages is changed. In the voltage generation circuit 903A in FIG. 36(A), off-state current can be small when the transistors M1 to M10 are OS transistors, and leakage of charge held in the capacitors C11 to C14 can be suppressed. Accordingly, efficient voltage increase from the voltage $V_{ORG}$ to the voltage $V_{POG}$ is possible.

The voltage generation circuit 903B illustrated in FIG. 36(B) includes transistors M11 to M14, capacitors C15 and C16, and an inverter INV2. The clock signal CLK is supplied to gates of the transistors M11 to M14 directly or through the inverter INV2. By the clock signal CLK, the voltage $V_{POG}$, which has been increased to a positive voltage twice the voltage $V_{ORG}$ can be obtained. In the voltage generation circuit 903B in FIG. 36(B), off-state current can be small when the transistors M11 to M14 are OS transistors, and leakage of charge held in the capacitors C15 and C16 can be suppressed. Accordingly, efficient voltage increase from the voltage $V_{ORG}$ to the voltage $V_{POG}$ is possible.

A voltage generation circuit 903C illustrated in FIG. 36C includes an inductor Ind1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 36(C) increases the voltage using the inductor Ind1, the voltage can be increased with high conversion efficiency.

As described above, in the structures of this embodiment, a voltage required for circuits included in a semiconductor device can be internally generated. Thus, in the semiconductor device, the number of power supply voltages applied from the outside can be reduced.

The structures and the like described in this embodiment above can be used in appropriate combination with the structure described in any of the other embodiments.

Embodiment 7

In this embodiment, a display module and electronic devices, each of which includes a semiconductor device of one embodiment of the present invention, will be described with reference to FIG. 37 to FIG. 40.

<Display Module>

Figure 37:
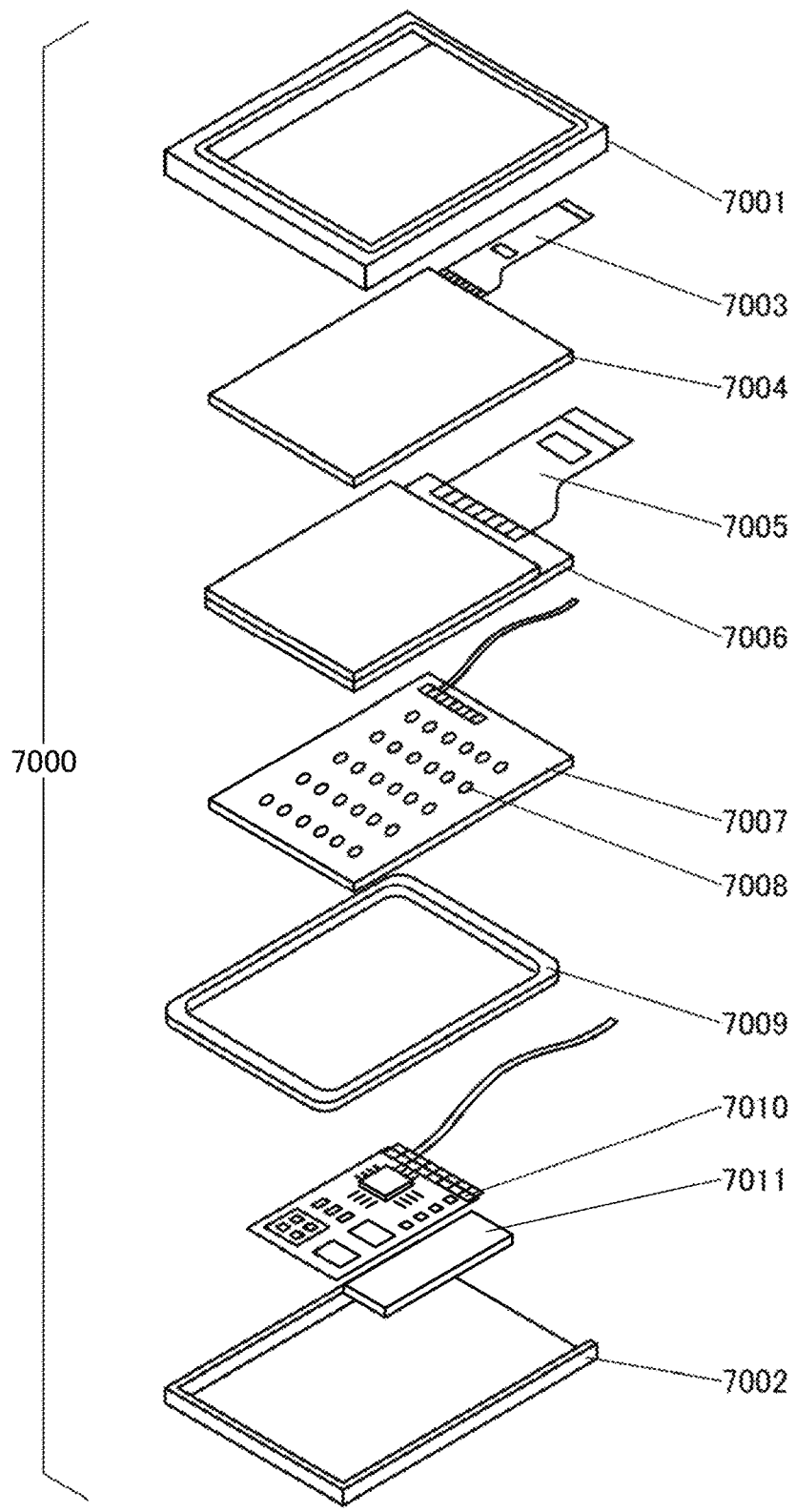
FIG. 37 illustrates a display module.

In a display module 7000 illustrated in FIG. 37, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

As the touch panel 7004, a resistive type or capacitive type touch panel which is placed to overlap with the display panel 7006 can be used. It is also possible to provide a touch panel function to a counter substrate (sealing substrate) of the display panel 7006. It is also possible to provide a photosensor in each pixel of the display panel 7006 to form an optical touch panel.

The backlight 7007 includes a light source 7008. Although a structure in which the light source 7008 is provided over the backlight 7007 is illustrated in FIG. 37, one embodiment is not limited to the structure. For example, a structure in which the light source 7008 is provided at an end portion of the backlight 7007 and a light diffusion plate is further provided may be employed. Note that a structure without the backlight 7007 may be employed in the case where a self-luminous light-emitting element such as an organic EL element is used or in the case where a reflective panel or the like is employed.

The frame 7009 has, in addition to a function of protecting the display panel 7006, a function of an electromagnetic shield for blocking electromagnetic waves generated by the operation of the printed board 7010. The frame 7009 may also have a function of a radiator plate.

The printed board 7010 includes a power supply circuit and a signal processing circuit for outputting a video signal and a clock signal. A power source for supplying power to the power supply circuit may be an external commercial power source or the separately provided battery 7011. The battery 7011 can be omitted in the case where a commercial power source is used.

The display module 7000 may be additionally provided with a member such as a polarizing plate, a retardation plate, or a prism sheet.

<Electronic Device 1>

Next, FIG. 38(A) to FIG. 38(E) each illustrate an example of electronic devices.

Figure 38A:
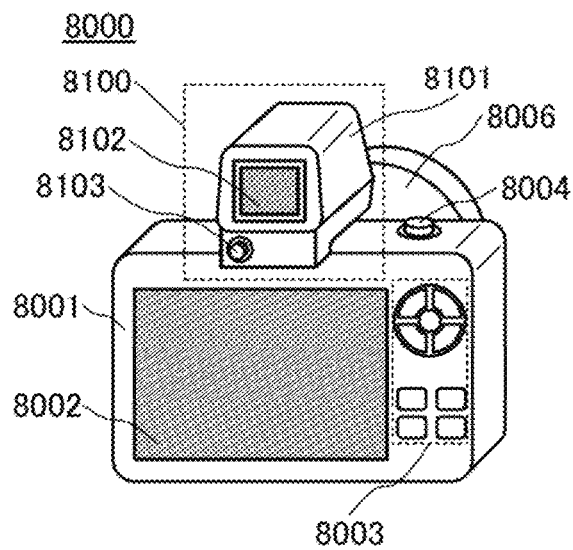
FIGS. 38A-38E illustrate electronic devices.

FIG. 38(A) is an external view of a camera 8000 in a state where a finder 8100 is attached.

The camera 8000 includes a housing 8001, a display portion 8002, an operation button 8003, a shutter button 8004, and the like. Furthermore, a detachable lens 8006 is attached to the camera 8000.

Although the camera 8000 has a structure where the lens 8006 can be detached from the housing 8001 for replacement, the lens 8006 and the housing may constitute one body.

Images can be taken with the camera 8000 at the press of the shutter button 8004. In addition, the display portion 8002 may have a function of a touch panel so that images can be taken at the touch on the display portion 8002.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 has a function of a power supply button. With the button 8103, display on the display portion 8102 can be switched between on and off.

A display device of one embodiment of the present invention can be used in the display portion 8002 of the camera 8000 and the display portion 8102 of the finder 8100.

Although in FIG. 38(A) the camera 8000 and the finder 8100 are separate electronic devices which are configured to be detachable from each other, the housing 8001 of the camera 8000 may include a finder having a display device.

Figure 38B:
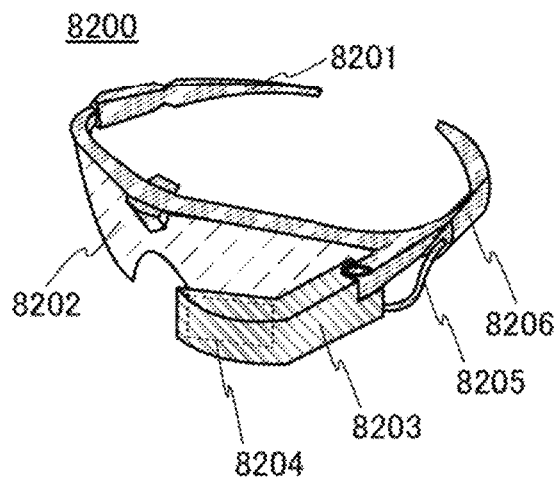

FIG. 38(B) is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

The cable 8205 supplies power from the battery 8206 to the main body 8203. The main body 8203 includes a wireless receiver or the like, and can display video data such as received image data on the display portion 8204. Furthermore, the movement of the eyeball and the eyelid of a user is captured by a camera in the main body 8203 and then coordinates of the viewpoint of the user are calculated based on the data, whereby the viewpoint of the user can be utilized as an input means.

The mounting portion 8201 may include a plurality of electrodes at the positions in contact with the user. The main body 8203 may have a function of sensing current flowing through the electrodes with the movement of the user's eyeball to recognize the viewpoint of the user. In addition, the main body 8203 may have a function of sensing current flowing through the electrodes to monitor the user's pulse. Furthermore, the mounting portion 8201 may include sensors such as a temperature sensor, a pressure sensor, or an acceleration sensor, and may have a function of displaying the user's biological information on the display portion 8204. In addition, the movement of the user's head or the like may be sensed so as to change an image displayed on the display portion 8204 in synchronization with the movement.

The display device of one embodiment of the present invention can be used in the display portion 8204.

Figure 38C:
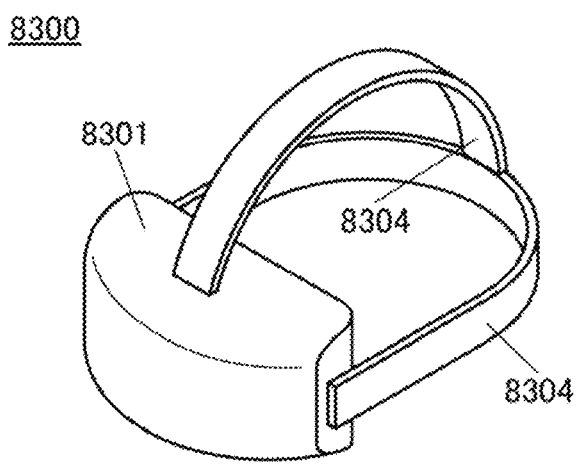
Figure 38D:
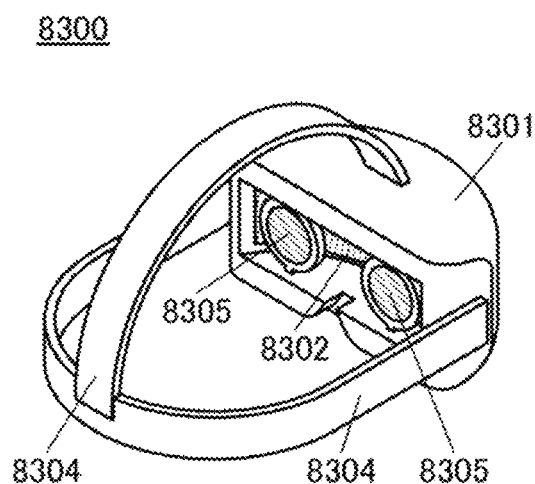

FIGS. 38(C), (D), and (E) are external views of a head-mounted display 8300.

The head-mounted display 8300 includes a housing 8301, a display portion 8302, band-like fixing means 8304, and a pair of lenses 8305.

A user can see display on the display portion 8302 through the lenses 8305. Note that it is favorable if the display portion 8302 is curved. When the display portion 8302 is curved, a user can feel high realistic sensation.

Figure 38E:
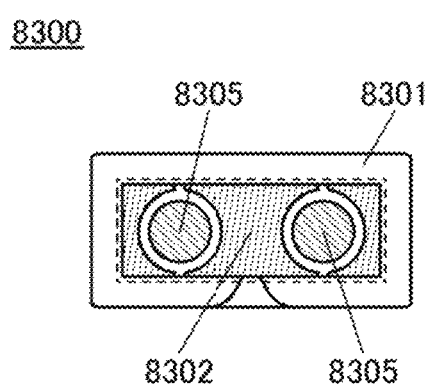

The display device of one embodiment of the present invention can be used in the display portion 8302. The display device including the semiconductor device of one embodiment of the present invention can have an extremely high resolution; thus, even when an image is magnified using the lenses 8305 as illustrated in FIG. 38(E), a more realistic image can be displayed without pixels being perceived by the user.

<Electronic Device 2>

Next, FIG. 39(A) to FIG. 39(G) each illustrate an example of electronic devices that are different from those illustrated in FIG. 38(A) to FIG. 38(E).

Electronic devices illustrated in FIG. 39(A) to FIG. 39(G) each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, or the like.

The electronic devices illustrated in FIG. 39(A) to FIG. 39(G) have a variety of functions. For example, they can have a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that the electronic devices illustrated in FIG. 39(A) to FIG. 39(G) can have are not limited thereto, and they can have a variety of functions. Furthermore, although not illustrated in FIG. 39(A) to FIG. 39(G), the electronic devices may each have a plurality of display portions. The electronic devices may be provided with a camera or the like, and may have a function of taking a still image, a function of taking a moving image, a function of storing the taken image in a memory medium (an external memory medium or a memory medium incorporated in the camera), a function of displaying the taken image on the display portion, or the like.

The electronic devices in FIG. 39(A) to FIG. 39(G) are described in detail below.

Figure 39A:
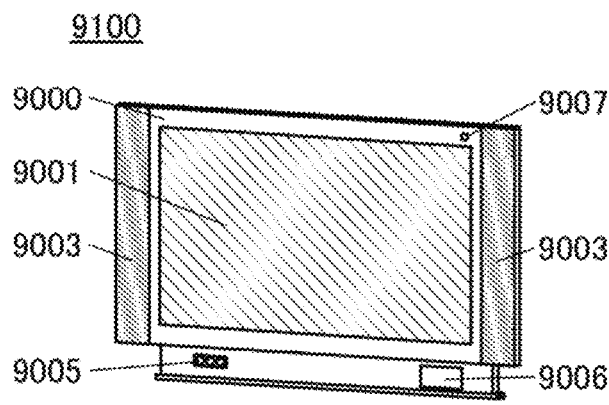
FIGS. 39A-39G illustrate electronic devices.

FIG. 39(A) is a perspective view illustrating a television device 9100. The television device 9100 can include the display portion 9001, the display portion 9001 having a large screen size of, for example, 50 inches or more, or 100 inches or more.

Figure 39D:
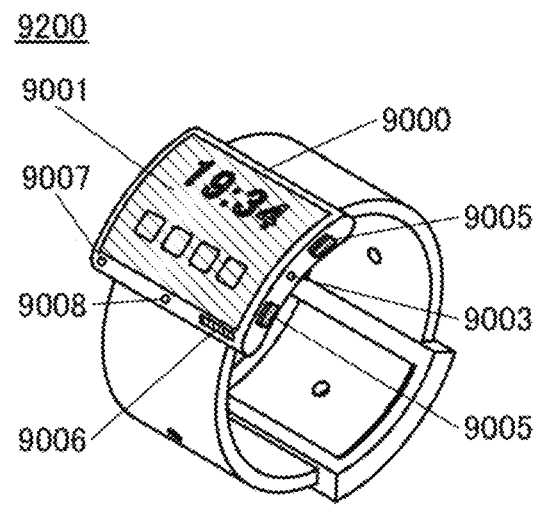
Figure 39B:
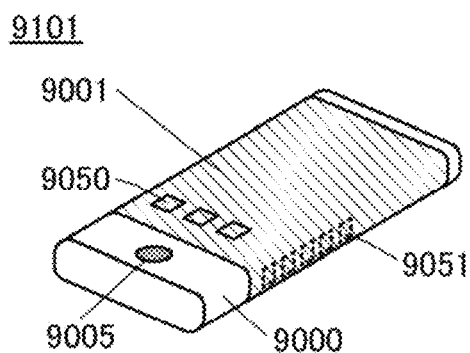

FIG. 39(B) is a perspective view of a portable information terminal 9101. The portable information terminal 9101 has a function of, for example, one or more selected from a telephone set, a notebook, and an information browsing system. Specifically, it can be used as a smartphone. Note that the portable information terminal 9101 may include the speaker 9003, the connection terminal 9006, the sensor 9007, or the like. Furthermore, the portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, SNS (social networking service), call, and the like; the title of an email, SNS, and the like; the sender of an email, SNS, and the like; the date; the time; remaining battery; and the reception strength of an antenna. Instead of the information 9051, the operation buttons 9050 or the like may be displayed on the position where the information 9051 is displayed.

Figure 39E:
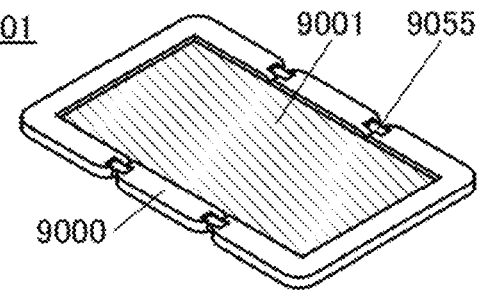
Figure 39C:
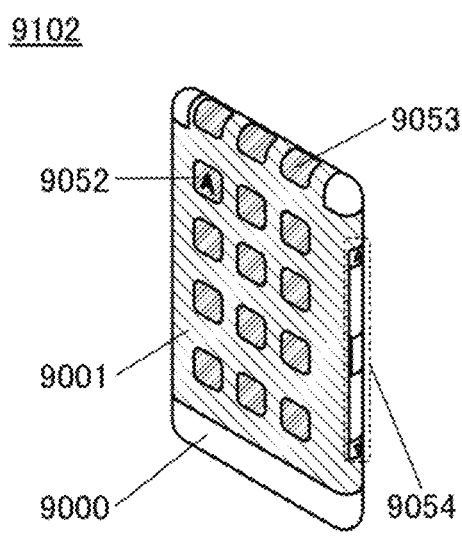

FIG. 39(C) is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 39(D) is a perspective view of a watch-type portable information terminal 9200. The portable information terminal 9200 is capable of executing a variety of applications such as mobile phone calls, e-mailing, viewing and editing texts, music reproduction, Internet communication, and computer games. Furthermore, the display surface of the display portion 9001 is bent, and images can be displayed on the bent display surface. Furthermore, the portable information terminal 9200 can employ near field communication conformable to a communication standard. For example, mutual communication between the portable information terminal 9200 and a headset capable of wireless communication enables hands-free calling. Furthermore, the portable information terminal 9200 includes the connection terminal 9006, and data can be directly exchanged with another information terminal via a connector. Power charging through the connection terminal 9006 is also possible. Note that the charging operation may be performed by wireless power feeding without using the connection terminal 9006.

Figure 39F:
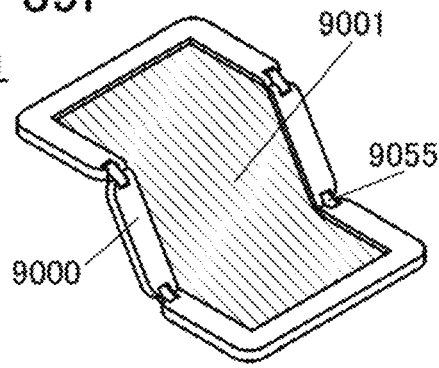
Figure 39G:
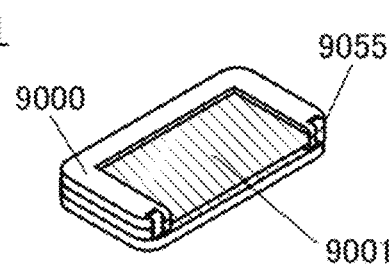

FIGS. 39(E), (F), and (G) are perspective views of a foldable portable information terminal 9201. FIG. 39(E) is a perspective view of the portable information terminal that is in the opened state, FIG. 39(F) is a perspective view of the portable information terminal that is shifted from the opened state to the folded state or from the folded state to the opened state, and FIG. 39(G) is a perspective view of the portable information terminal that is in the folded state. The portable information terminal 9201 is highly portable when folded; and when opened, its seamless large display region is highly browsable. The display portion 9001 of the portable information terminal 9201 is supported by three housings 9000 joined together by hinges 9055. By folding two housings 9000 with the hinges 9055 therebetween, the portable information terminal 9201 can be reversibly changed in shape from the opened state to the folded state. For example, the portable information terminal 9201 can be bent with a radius of curvature of greater than or equal to 1 mm and less than or equal to 150 mm.

Figure 40A:
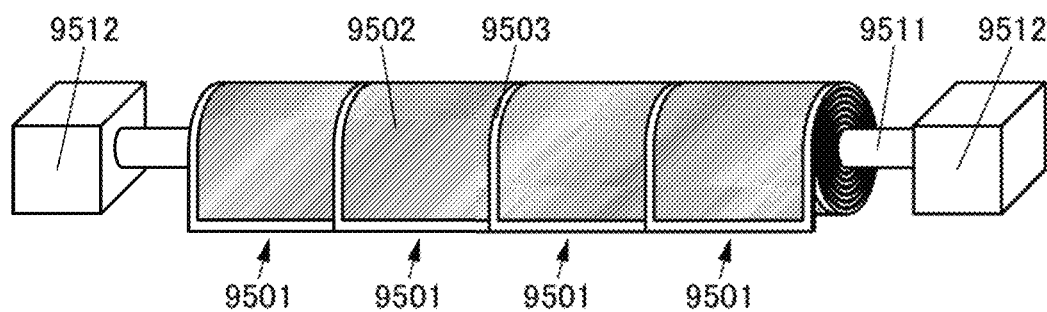
FIGS. 40A and 40B are perspective views illustrating a display device.
Figure 40B:
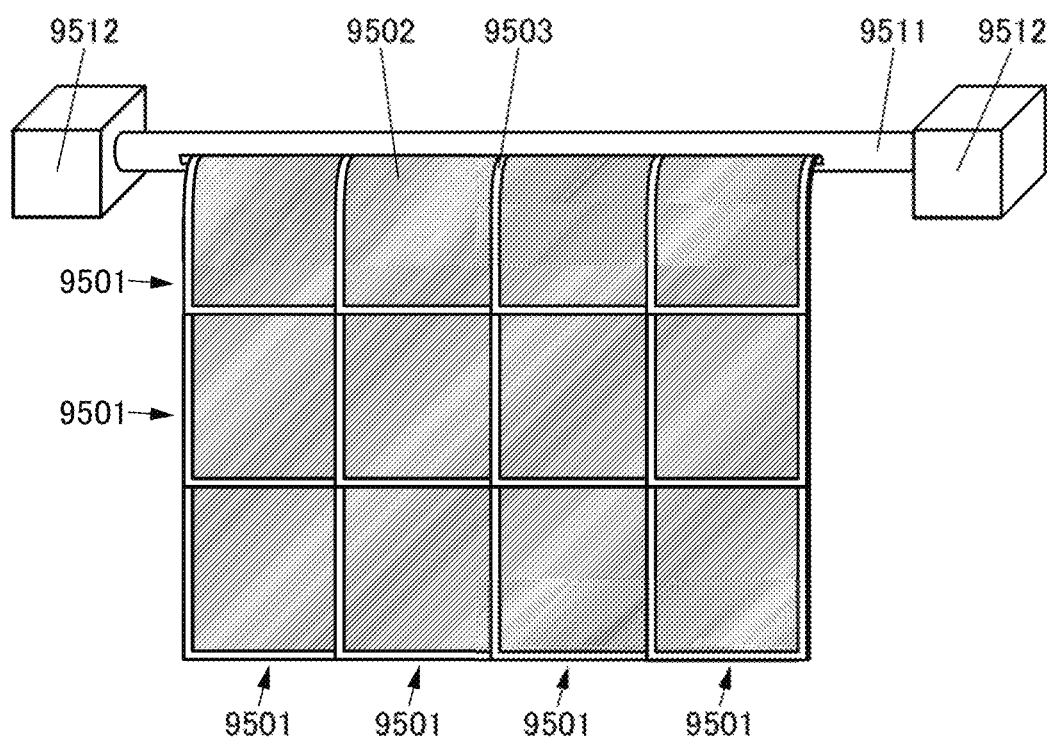

In addition, FIGS. 40(A) and (B) are perspective views of a display device including a plurality of display panels. Note that FIG. 40(A) is a perspective view of a state in which the plurality of display panels are wound, and FIG. 40(B) are a perspective view of a state in which the plurality of display panels are unwound.

A display device 9500 illustrated in FIGS. 40(A) and (B) includes a plurality of display panels 9501, a shaft portion 9511, and a bearing portion 9512. In addition, the plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the use of the plurality of display panels 9501. Furthermore, the display device is highly versatile because the display panels 9501 can be wound depending on its use.

Moreover, although a state in which the display regions 9502 are separated from each other in the adjacent display panels 9501 is illustrated in FIGS. 40(A) and (B), without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. However, the semiconductor device of one embodiment of the present invention can also be used for an electronic device that does not have a display portion.

The structure described in this embodiment can be used in appropriate combination with the structure described in any of the other embodiments.

Example 1

In this example, the measurement results of the sheet resistance and contact resistance of materials that can be used for a gate electrode of the transistor of one embodiment of the present invention will be described.

A method for fabricating the samples used in this example is described below. Thin films were formed, for Sample A1 and Sample A2, using materials that can be used as a second gate electrode, and the sheet resistance of the films was measured. In addition, stacked-layer films were formed, for Sample A3 to Sample A5, using materials that can be used as a first gate electrode (also referred to as bottom gate electrode or BGE) and materials that can be used as a second gate electrode (also referred to as top gate electrode or TGE), and the contact chain resistance of the stacked-layer films was measured. Note that the contact chain resistance in this specification and the like corresponds to the resistance value of an element in which 100 contact structures (contact holes) between conductive films are serially connected in a form of a chain (contact chain). The structures of Samples A1 to A5 are listed below.

TABLE 1

| Film Reference numeral | Substrate 102 | Oxide semi-conductor film 112 | Conductive film 114 |
| --- | --- | --- | --- |
| Sample A1 | Glass | IGZO(4, 2, 4.1) | W\Ti |
| Sample A2 | | | — |

TABLE 2

| Film Reference numeral | Sub-strate 102 | Conductive film 106 | Oxide semi-conductor film 112 | Conductive film 114 |
| --- | --- | --- | --- | --- |
| Sample A3 | Glass | Ti\Cu | — | W\Ti |
| Sample A4 | | | IGZO(4, 2, 4.1) | |
| Sample A5 | | | | — |

<Fabrication of Samples A1 to A5>

For Sample A1, an oxide semiconductor film corresponding to the oxide semiconductor film 112 was formed over a glass substrate. As the oxide semiconductor film, an oxide semiconductor film with a thickness of 10 nm was formed. Note that for forming the oxide semiconductor film, a sputtering apparatus was used, a metal oxide of In:Ga:Zn=4:2:4.1 [atomic ratio] was a sputtering target, and an AC power supply was used as the power supply to be applied to the sputtering target. Then, a conductive film that corresponds to the conductive film 114 was formed over the oxide semiconductor film. As the conductive film, a tungsten film with a thickness of 50 nm and a titanium film with a thickness of 100 nm were formed in this order using a sputtering apparatus.

For Sample A2, an oxide semiconductor film corresponding to the oxide semiconductor film 112 was formed over a glass substrate. As the oxide semiconductor film, an oxide semiconductor film with a thickness of 100 nm was formed. Note that for forming the oxide semiconductor film, a sputtering apparatus was used, a metal oxide of In:Ga:Zn=4:2:4.1 [atomic ratio] was a sputtering target, and an AC power supply was used as the power supply to be applied to the sputtering target.

For Sample A3, conductive films each corresponding to the conductive film 106 were formed over a glass substrate. As each of the conductive films, a titanium film with a thickness of 10 nm and a copper film with a thickness of 200 nm were formed in this order using a sputtering apparatus. Then, an insulating film was formed over the conductive films, and an oxide semiconductor film that corresponds to the oxide semiconductor film 112 was formed over the insulating film. As the oxide semiconductor film, an oxide semiconductor film with a thickness of 10 nm was formed. Note that for forming the oxide semiconductor film, a sputtering apparatus was used, a metal oxide of In:Ga:Zn=4:2:4.1 [atomic ratio] was a sputtering target, and an AC power supply was used as the power supply to be applied to the sputtering target. Then, openings (contact holes) each corresponding to the opening 143 were formed in the insulating film and oxide semiconductor film. Note that 100 holes, each of which is 2.5 μm in diameter, were formed as the openings (contact holes). Then, conductive films each corresponding to the conductive film 114 were formed over the insulating film and oxide semiconductor film having the openings. As each of the conductive films, a tungsten film with a thickness of 50 nm and a titanium film with a thickness of 100 nm were formed in this order using a sputtering apparatus. Sample A3 has a structure having a region where the conductive films each corresponding to the conductive film 106 and the conductive films each corresponding to the conductive film 114 are serially connected via the 100 openings (contact holes).

For Sample A4, conductive films each corresponding to the conductive film 106 were formed over a glass substrate. As each of the conductive films, a titanium film with a thickness of 10 nm and a copper film with a thickness of 200 nm were formed in this order using a sputtering apparatus. Then, an insulating film was formed over the conductive films, and openings (contact holes) each corresponding to the opening 143 were formed in the insulating film. Note that 100 holes, each of which is 2.5 μm in diameter, were formed as the openings (contact holes). Then, oxide semiconductor films each corresponding to the oxide semiconductor film 112 were formed over the insulating film having the openings. As the oxide semiconductor films, oxide semiconductor films with a thickness of 10 nm were formed. Note that for forming the oxide semiconductor films, a sputtering apparatus was used, a metal oxide of In:Ga:Zn=4:2:4.1 [atomic ratio] was a sputtering target, and an AC power supply was used as the power supply to be applied to the sputtering target. Then, conductive films each corresponding to the conductive film 114 were formed over the oxide semiconductor films. As each of the conductive films, a tungsten film with a thickness of 15 nm and a titanium film with a thickness of 100 nm were formed in this order using a sputtering apparatus. Sample A4 has a structure having a region where the conductive films each corresponding to the conductive film 106 and the oxide semiconductor films each corresponding to the oxide semiconductor film 112 are serially connected in the 100 openings (contact holes).

For Sample A5, conductive films each corresponding to the conductive film 106 were formed over a glass substrate. As each of the conductive films, a titanium film with a thickness of 10 nm and a copper film with a thickness of 200 nm were formed in this order using a sputtering apparatus. Then, an insulating film was formed over the conductive films, and openings (contact holes) each corresponding to the opening 143 were formed in the insulating film. Note that 100 holes, each of which is 2.5 μm in diameter, were formed as the openings (contact holes). Then, oxide semiconductor films each corresponding to the oxide semiconductor film 112 were formed over the insulating film having the openings. As the oxide semiconductor films, oxide semiconductor films with a thickness of 100 nm were formed. Note that for forming the oxide semiconductor films, a sputtering apparatus was used, a metal oxide of In:Ga:Zn=4:2:4.1 [atomic ratio] was a sputtering target, and an AC power supply was used as the power supply to be applied to the sputtering target. Sample A5 has a structure having a region where the conductive films each corresponding to the conductive film 106 and the conductive films each corresponding to the oxide semiconductor film 112 are serially connected in the 100 openings (contact holes).

<Measurement of Sheet Resistance and Contact Chain Resistance>

Figure 41:
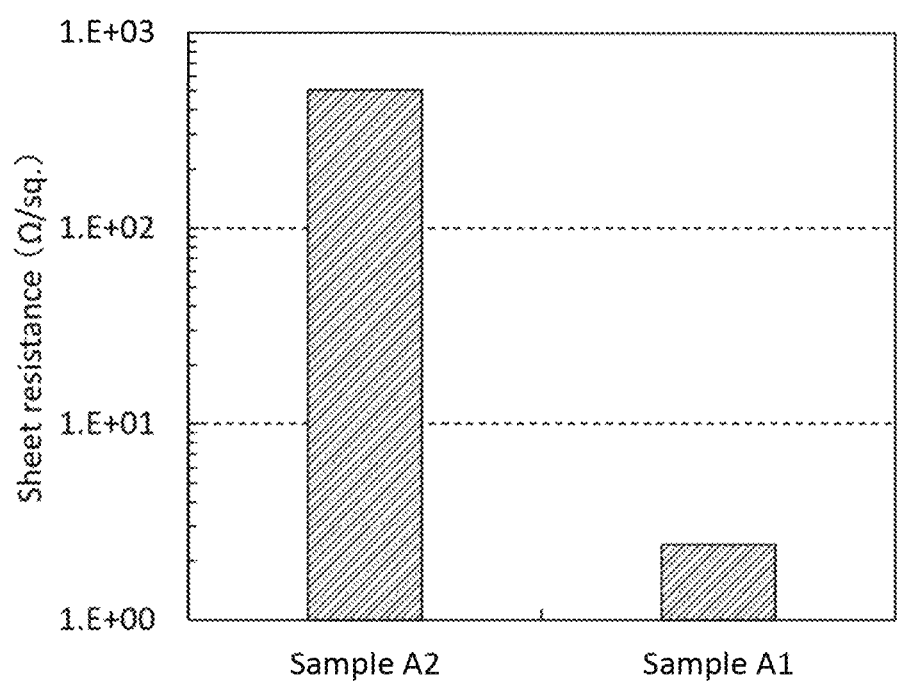
FIG. 41 illustrates sheet resistance measurement results of an example.

The sheet resistance of each of the fabricated Sample A1 and Sample A2 was measured. The measurement results are shown in FIG. 41. The sheet resistances of Sample A1 and Sample A2 were 2.41 Ω/sq. and 508 Ω/sq., respectively.

That is, Sample A1 has sheet resistance lower than that of Sample A2. In this manner, it was indicated that the use of a structure in which the oxide semiconductor film corresponding to the oxide semiconductor film 112 and the conductive film corresponding to the conductive film 114 are stacked as the second gate electrode can reduce the sheet resistance of the second gate electrode.

In addition, the contact chain resistance in each of the fabricated Samples A3 to A5 was measured. The measurement results are shown in FIG. 42. The contact chain resistances of Sample A3, Sample A4, and Sample A5 were $3.0 \times 10^2 \Omega$, $5.6 \times 10^7 \Omega$, and $1.9 \times 10^8 \Omega$, respectively.

That is, Sample A3 has contact chain resistance lower than that of Sample A4 and that of Sample A5. In this manner, it was indicated that when a region where the first gate electrode and the second gate electrode are in contact with each other has a structure having a region where the conductive film corresponding to the conductive film 106 and the conductive film corresponding to the conductive film 114 are in contact with each other, the contact chain resistance between the first gate electrode and the second gate electrode can be reduced.

The structure described in this example above can be used in appropriate combination with any of the other embodiments or examples.

Example 2

In this example, samples that correspond to transistors of one embodiment of the present invention were fabricated, the electrical characteristics of the transistors were measured, and the cross-sectional shapes were observed.

A method for fabricating the samples used in this example will be described below. In this example, Sample B1 that corresponds to the transistor 100B illustrated in FIGS. 3(A) and (B) was fabricated. In the description below, the same reference numerals are used for structures having functions similar to those in the transistor 100B illustrated in FIGS. 3(A) and (B).

Figure 43A:
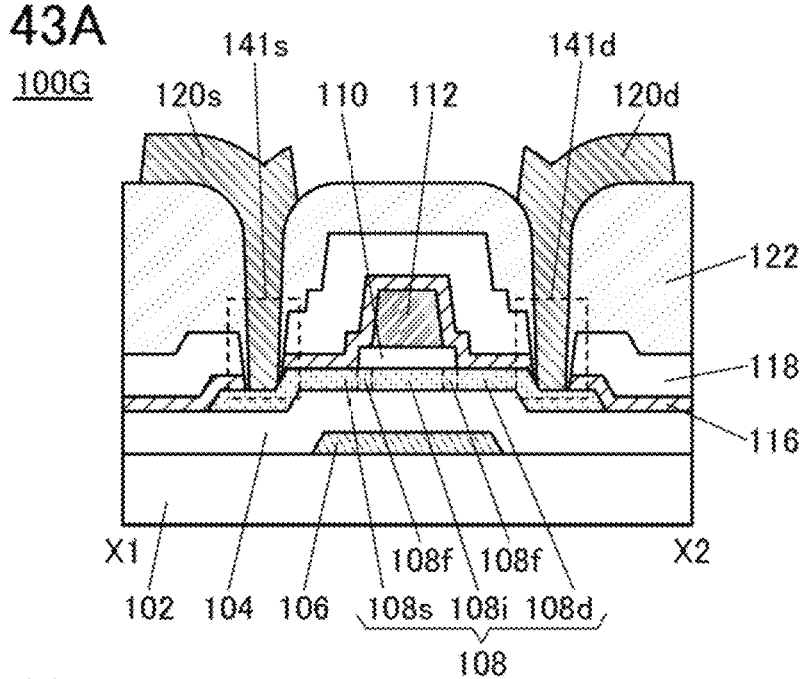
FIGS. 43A and 43B illustrate cross sections of a transistor of an example.
Figure 43B:
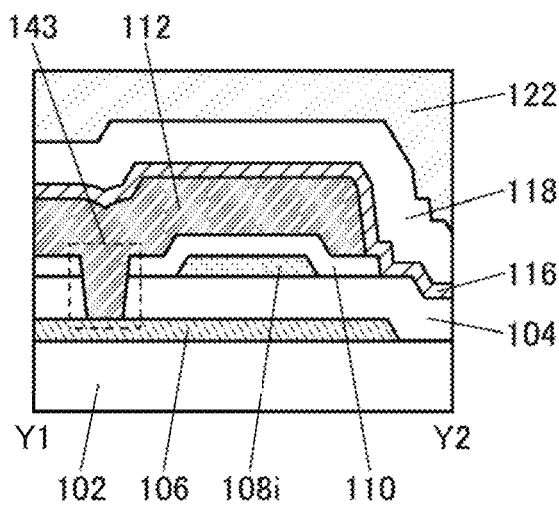

For comparison, as illustrated in FIGS. 43(A) and (B), Sample B2 that corresponds to a transistor 100G having a structure where the second gate electrode does not include the conductive film 114 was also fabricated. Note that, in the description of FIGS. 43(A) and (B), the same reference numerals are used for structures having functions similar to those in the transistor 100B illustrated in FIGS. 3(A) and (B).

<Fabrication Method of Transistor>

«Fabrication of Sample B1»

As the substrate 102 over which Sample B1 was to be fabricated, a glass substrate was used. The conductive film 106 was formed over the substrate 102. As the conductive film 10, a tantalum nitride film with a thickness of 10 nm and a copper film with a thickness of 100 nm were formed in this order using a sputtering apparatus.

Next, the insulating film 104 was formed over the substrate 102 and the conductive film 106. Note that in this example, as the insulating film 104, the insulating film 104_1, the insulating film 104_2, the insulating film 104_3, and the insulating film 104_4 were successively formed in this order using a PECVD apparatus in a vacuum. A silicon nitride film with a thickness of 50 nm was formed as the insulating film 104_1. A silicon nitride film with a thickness of 300 nm was formed as the insulating film 104_2. A silicon nitride film with a thickness of 50 nm was formed as the insulating film 104_3. A silicon oxynitride film with a thickness of 50 nm was formed as the insulating film 104_4.

Next, an oxide semiconductor film was formed over the insulating film 104, and the oxide semiconductor film was processed into an island shape, whereby the oxide semiconductor film 108 was formed. An oxide semiconductor film with a thickness of 40 nm was formed as the oxide semiconductor film 108. Note that for forming the oxide semiconductor film 108, a sputtering apparatus was used, a metal oxide of In:Ga:Zn=4:2:4.1 [atomic ratio] was a sputtering target, and an AC power supply was used as the power supply to be applied to the sputtering target. A wet etching method was used for processing of the oxide semiconductor film 108.

Next, an insulating film to be the insulating film 110 later was formed over the insulating film 104 and the oxide semiconductor film 108. As the insulating film, a silicon oxynitride film with a thickness of 30 nm, a silicon oxynitride film with a thickness of 100 nm, and a silicon oxynitride film with a thickness of 20 nm were successively formed using a PECVD apparatus in a vacuum.

Next, heat treatment was performed. The heat treatment was performed under a mixed gas atmosphere of nitrogen and oxygen, at 350° C. for one hour.

Next, an oxide semiconductor film to be the oxide semiconductor film 112 later was formed over the insulating film. An oxide semiconductor film with a thickness of 20 nm was formed as the oxide semiconductor film. Note that for forming the oxide semiconductor film, a sputtering apparatus was used, a metal oxide of In:Ga:Zn=5:1:7 [atomic ratio] was a sputtering target, and an AC power supply was used as the power supply to be applied to the sputtering target.

Then, a mask was formed over the oxide semiconductor film, and the opening 143 was formed, using the mask, in the oxide semiconductor film, the insulating film that is in contact with the lower side of the oxide semiconductor film, and the insulating film 104. Note that a dry etching apparatus was used for processing of the opening 143.

Next, a conductive film to be the conductive film 114 later was formed over the oxide semiconductor film to be the oxide semiconductor film 112 later. As the conductive film, a tungsten film with a thickness of 15 nm and a titanium film with a thickness of 100 nm were formed in this order using a sputtering apparatus.

Next, the formed conductive film and oxide semiconductor film were processed into an island shape, whereby the conductive film 114 and the oxide semiconductor film 112 were formed. Furthermore, following the formation of the conductive film 114 and the oxide semiconductor film 112, the insulating film that is in contact with the lower side of the oxide semiconductor film 112 was processed, whereby the insulating film 110 was formed.

Note that a wet etching method was used for processing of the conductive film 114 and the oxide semiconductor film 112, and a dry etching method was used for processing of the insulating film 110.

Next, an impurity element was added from above the insulating film 104, the oxide semiconductor film 108, the insulating film 110, the oxide semiconductor film 112, and the conductive film 114. A doping apparatus was used for the impurity element addition treatment, in which argon was used as the impurity element.

Next, the insulating film 116 was formed over the insulating film 104, the oxide semiconductor film 108, the insulating film 110, the oxide semiconductor film 112, and the conductive film 114. As the insulating film 116, a silicon nitride film with a thickness of 100 nm was formed using a PECVD apparatus.

Next, the insulating film 118 was formed over the insulating film 116. As the insulating film 118, a silicon oxynitride film with a thickness of 300 nm was formed using a PECVD apparatus.

Next, a mask was formed over the insulating film 118, and the openings 141a and 141b were formed, using the mask, in the insulating films 116 and 118. Note that a dry etching apparatus was used for processing of the openings 141a and 141b.

Next, the insulating film 122 was formed over the insulating film 118. A 1.5-μm-thick acrylic-based photosensitive resin film was used as the insulating film 122. Note that openings were provided in regions of the insulating film 122 that overlap with the openings 141a and 141b.

Next, a conductive film was formed over the insulating film 122 so as to fill the openings 141a and 141b, and the conductive film was processed into island shapes, whereby the conductive films 120s and 120d were formed.

As each of the conductive films 120s and 120d, a copper film containing manganese with a thickness of 50 nm and a copper film with a thickness of 100 nm were successively formed using a sputtering apparatus in a vacuum.

Through the above steps, Sample B1 that corresponds to the transistor 100B illustrated in FIGS. 3(A) and (B) was fabricated.

Note that in this example, the channel width W of Sample B1 that corresponds to the transistor 100B was 50 μm, while the channel width L was varied between 2.0 μm, 3.0 μm, and 6.0 μm. Note that as each type of transistor with a different channel width L, 20 transistors were formed over a substrate.

«Fabrication of Sample B2»

For Sample B2, in a similar manner to Sample B1, the conductive film 110, the insulating film 104, and the oxide semiconductor film 108 were formed over the substrate 102.

Next, an insulating film to be the insulating film 110 later was formed over the insulating film 104 and the oxide semiconductor film 108. As the insulating film, a silicon oxynitride film with a thickness of 30 nm, a silicon oxynitride film with a thickness of 100 nm, and a silicon oxynitride film with a thickness of 20 nm were successively formed using a PECVD apparatus in a vacuum.

Next, heat treatment was performed. The heat treatment was performed under a mixed gas atmosphere of nitrogen and oxygen, at 350° C. for one hour.

Then, a mask was formed over the insulating film, and the opening 143 was formed, using the mask, in the insulating film and the insulating film 104. Note that a dry etching apparatus was used for processing of the opening 143.

Next, an oxide semiconductor film to be the oxide semiconductor film 112 later was formed over the insulating film.

As the oxide semiconductor film, an oxide semiconductor film with a thickness of 100 nm was formed. Note that for forming the oxide semiconductor film, a sputtering apparatus was used, a metal oxide of In:Ga:Zn=5:1:7 [atomic ratio] was a sputtering target, and an AC power supply was used as the power supply to be applied to the sputtering target.

Next, the formed oxide semiconductor film was processed into an island shape, whereby the oxide semiconductor film 112 was formed. Furthermore, following the formation of the oxide semiconductor film 112, the insulating film that is in contact with the lower side of the oxide semiconductor film 112 was processed, whereby the insulating film 110 was formed.

Note that a wet etching method was used for processing of the oxide semiconductor film 112, and a dry etching method was used for processing of the insulating film 110.

Next, an impurity element was added from above the insulating film 104, the oxide semiconductor film 108, the insulating film 110, and the oxide semiconductor film 112. A doping apparatus was used for the impurity element addition treatment, in which argon was used as the impurity element.

Next, the insulating film 116 was formed over the insulating film 104, the oxide semiconductor film 108, the insulating film 110, and the oxide semiconductor film 112. As the insulating film 116, a silicon nitride film with a thickness of 100 nm was formed using a PECVD apparatus.

Next, the insulating film 118 was formed over the insulating film 116. As the insulating film 118, a silicon oxynitride film with a thickness of 300 nm was formed using a PECVD apparatus.

Next, a mask was formed over the insulating film 118, and the openings 141a and 141b were formed, using the mask, in the insulating films 116 and 118. Note that a dry etching apparatus was used for processing of the openings 141a and 141b.

Next, the insulating film 122 was formed over the insulating film 118. A 1.5-μm-thick acrylic-based photosensitive resin film was used as the insulating film 122. Note that openings were provided in regions of the insulating film 122 that overlap with the openings 141a and 141b.

Next, a conductive film was formed over the insulating film 122 so as to fill the openings 141a and 141b, and the conductive film was processed into island shapes, whereby the conductive films 120s and 120d were formed.

As each of the conductive films 120s and 120d, a copper film containing manganese with a thickness of 50 nm and a copper film with a thickness of 100 nm were successively formed using a sputtering apparatus in a vacuum.

Through the above steps, Sample B2 that corresponds to the transistor 100G illustrated in FIGS. 43(A) and (B) was fabricated.

Note that in this example, the channel width W of Sample B2 that corresponds to the transistor 100G was 50 μm, while the channel width L was varied between 2.0 μm, 3.0 μm, and 6.0 μm. Note that as each type of transistor with a different channel width L, 20 transistors were formed over a substrate.

<Evaluation of Electrical Characteristics of Transistors>

In FIG. 44 and FIG. 45, drain current-gate voltage (Id-Vg) characteristics of Samples B1 and B2 fabricated in this example are shown, respectively. Note that FIG. 44 corresponds to measurement results of Sample B1, and FIG. 45 corresponds to measurement results of Sample B2.

Figure 44A:
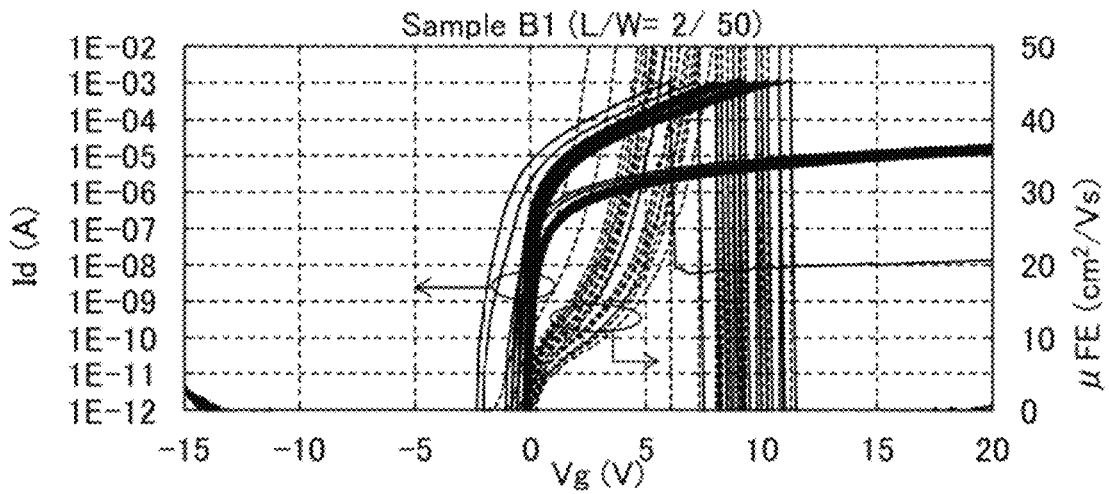
FIGS. 44A-44C illustrate Id-Vg characteristics of transistors of an example.
Figure 44B:
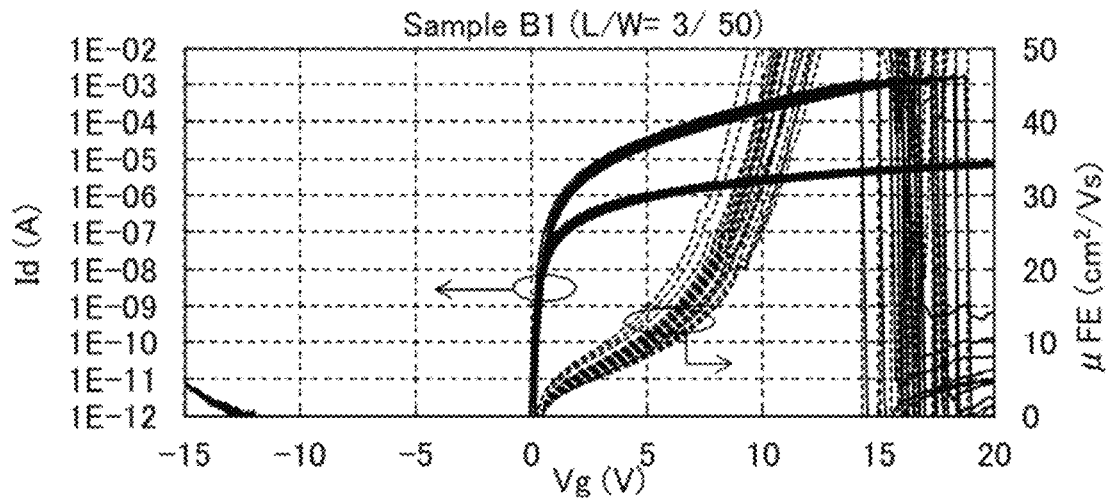
Figure 44C:
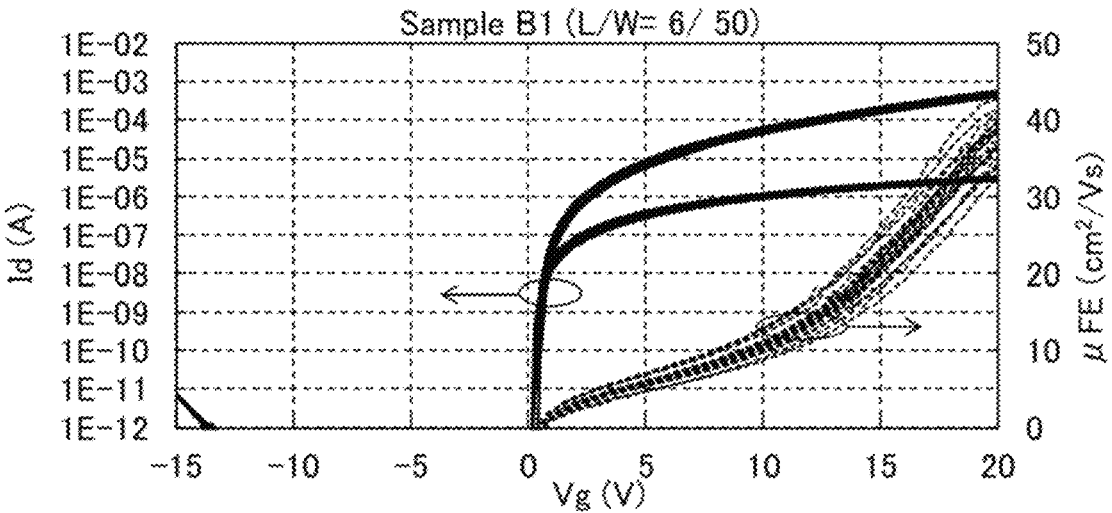
Figure 45A:
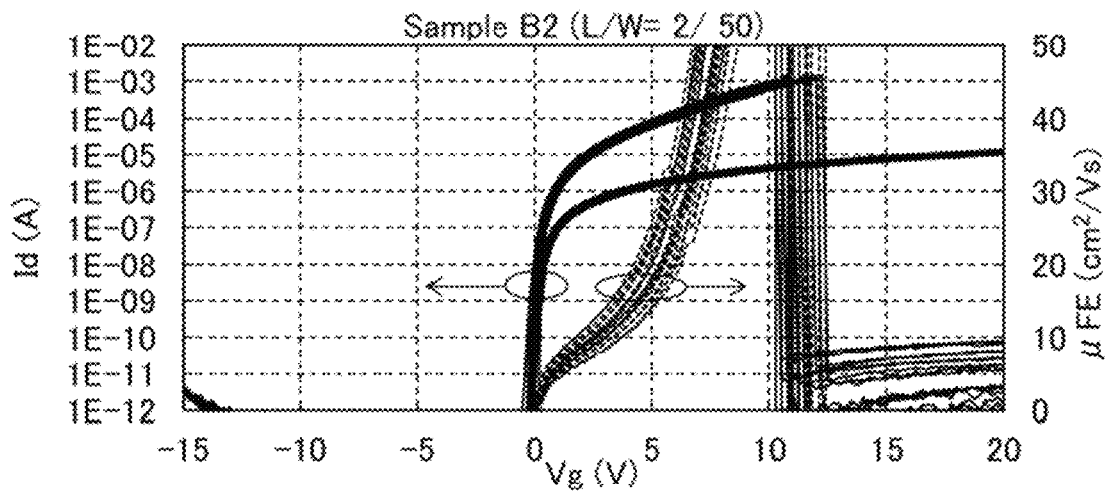
FIGS. 45A-45C illustrate Id-Vg characteristics of transistors of an example.
Figure 45B:
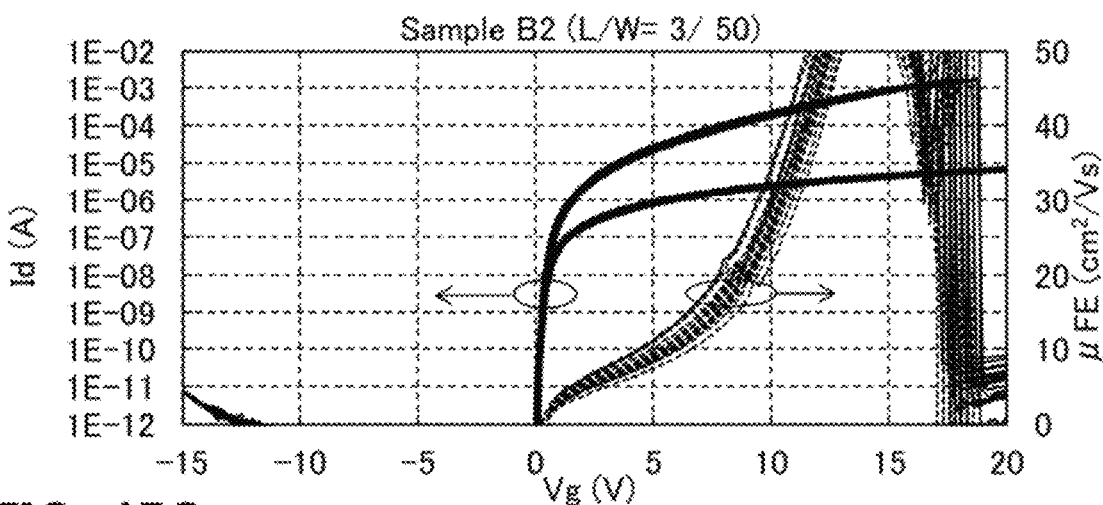
Figure 45C:
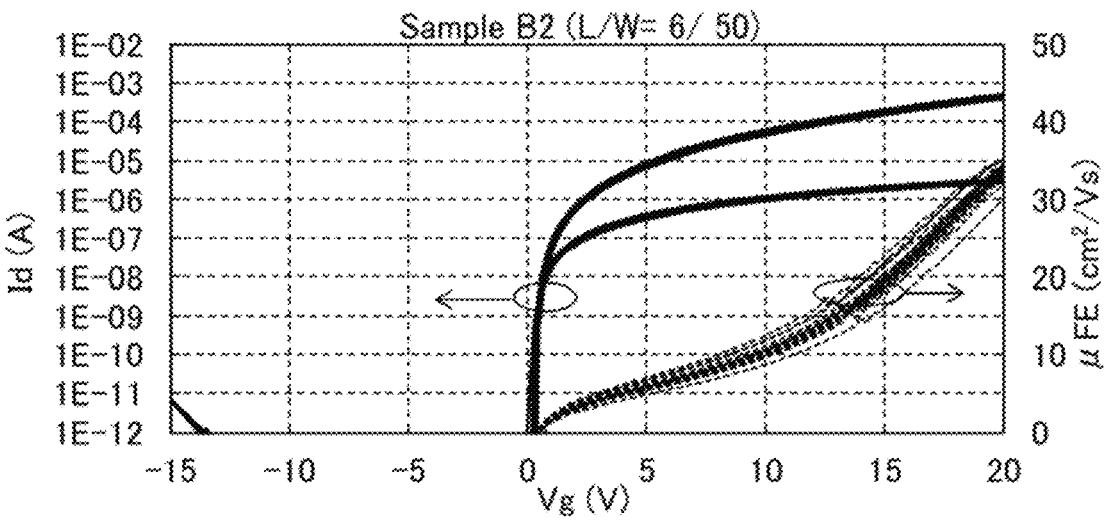

Furthermore, FIG. 44(A) and FIG. 45(A) are characteristics of the sample whose size is 50 μm in channel width and 2.0 μm in channel length; FIG. 44(B) and FIG. 45(B) are characteristics of the sample whose size is 50 μm in channel width and 3.0 μm in channel length; and FIG. 44(C) and FIG. 45(C) are characteristics of the sample whose size is 50 μm in channel width and 6.0 μm in channel length. In addition, in FIG. 44 and FIG. 45, the first vertical axis represents Id (A), the second vertical axis represents field-effect mobility ($\mu FE$ ($cm^2/Vs$)), and the horizontal axis represents Vg (V).

Note that, as the measurement conditions of the Id-Vg characteristics of the transistor, voltages of −15 V to +20 V in increments of 0.25 V were applied as a voltage applied to the conductive film 106 functioning as the first gate electrode of the transistor (hereinafter, the voltage is also referred to as gate voltage (Vg)) and a voltage applied to the oxide semiconductor film 112 and the conductive film 114 functioning as the second gate electrode also referred to as voltage (Vbg)). Furthermore, a voltage applied to the conductive film 120s functioning as a source electrode (hereinafter, the voltage is also referred to as a source voltage (Vs)) was 0 V (comm), and a voltage applied to the conductive film 120d functioning as a drain electrode (hereinafter, the voltage is also referred to as a drain voltage (Vd)) was 1 V or 10 V.

As shown in FIG. 44 and FIG. 45, it was indicated that the electrical characteristics of Sample B1 and Sample B2 fabricated in this example were favorable regardless of the channel length (L).

<Evaluation of Reliability Based on Gate BT Test>

Next, the reliability of the fabricated Sample B1 and Sample B2 whose size is 50 μm in channel width and 6.0 μm in channel length was evaluated. The reliability was evaluated by a gate BT (Bias Temperature) test in which stress voltage was applied to the gate electrodes. Note that the following four test methods were employed as the gate BT test.

«PBTS: Positive Bias Temperature Stress»

The gate voltage (Vg) was +30 V, the drain voltage (Vd) and the source voltage (Vs) were 0 V (COMMON), the stress temperature was 60° C., the stress application time was one hour, and the measurement environment was a dark environment. In other words, a source electrode and a drain electrode of the transistor were set at the same potential, and a potential different from that of the source and drain electrodes was applied to a gate electrode of the transistor for a certain time. In addition, the potential applied to the gate electrode was higher (applied more on the positive side) than the potential of the source electrode and the drain electrode.

«NBTS: Negative Bias Temperature Stress»

The gate voltage (Vg) was −30 V, the drain voltage (Vd) and the source voltage (Vs) were 0 V (COMMON), the stress temperature was 60° C., the stress application time was one hour, and the measurement environment was a dark environment. In other words, a source electrode and a drain electrode of the transistor were set at the same potential, and a potential different from that of the source and drain electrodes was applied to a gate electrode of the transistor for a certain time. In addition, the potential applied to the gate electrode was lower (applied more on the negative side) than the potential of the source electrode and the drain electrode.

«PBITS: Positive Bias Illumination Temperature Stress»

The gate voltage (Vg) was +30 V, the drain voltage (Vd) and the source voltage (Vs) were 0 V (COMMON), the stress temperature was 60° C., the stress application time was one hour, and the measurement environment was a photo environment (approximately 10000 1× with a white LED). In other words, a source electrode and a drain electrode of the transistor were set at the same potential, and a potential different from that of the source and drain electrodes was applied to a gate electrode of the transistor for a certain time. In addition, the potential applied to the gate electrode was higher (applied more on the positive side) than the potential of the source electrode and the drain electrode.

«NBITS: Negative Bias Illumination Temperature Stress»

The gate voltage (Vg) was −30 V, the drain voltage (Vd) and the source voltage (Vs) were 0 V (COMMON), the stress temperature was 60° C., the stress application time was one hour, and the measurement environment was a photo environment (approximately 10000 1x with a white LED). In other words, a source electrode and a drain electrode of the transistor were set at the same potential, and a potential different from that of the source and drain electrodes was applied to a gate electrode of the transistor for a certain time. In addition, the potential applied to the gate electrode was lower (applied more on the negative side) than the potential of the source electrode and the drain electrode.

Note that the gate BT test is one kind of accelerated test and can evaluate change in characteristics, caused by long-term usage, of transistors in a short time. In particular, the amount of change in threshold voltage (ΔVth) of a transistor between before and after the gate BT test is an important indicator for examining the reliability. The smaller the amount of change in threshold voltage (ΔVth) between before and after the gate BT test is, the higher the reliability is.

Note that ΔVth refers to the amount of change in threshold voltage (Vth), and corresponds to the value obtained from subtracting Vth before stress from Vth after the stress.

Figure 46:
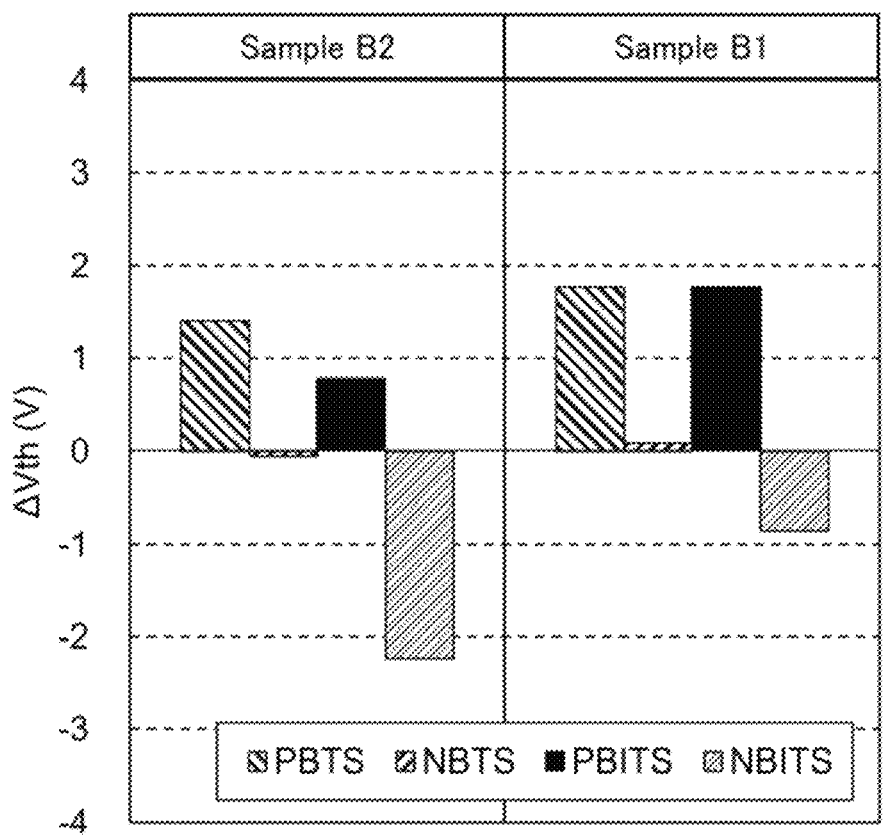
FIG. 46 illustrates reliability test results of transistors of an example.

The results of the gate BT test of Sample B1 and Sample B2 are shown in FIG. 46.

From the results in FIG. 46, it was found that a change in the NBITS test is smaller for Sample B1 than for Sample B2. This is because Sample B1 includes the conductive film 114 so that the channel region of the oxide semiconductor film 108 was prevented from being irradiated with light. Accordingly, a structure that includes the conductive film 114 as the second gate electrode is preferable.

<Examination of Electrical Characteristics of Transistor Under Light Irradiation>

Next, the electrical characteristics of the transistors of the fabricated Sample B1 and Sample B2 whose size is 6 μm in channel length and 50 μm in channel width were measured under light irradiation. As the electrical characteristics of the transistors, drain current (Id)-gate voltage (Vg) characteristics were measured. As the environment for measurement of the electrical characteristics under light irradiation, the stress temperature was 60° C. and the light irradiation was performed at approximately 10000 1x with the use of a white LED.

Figure 47A:
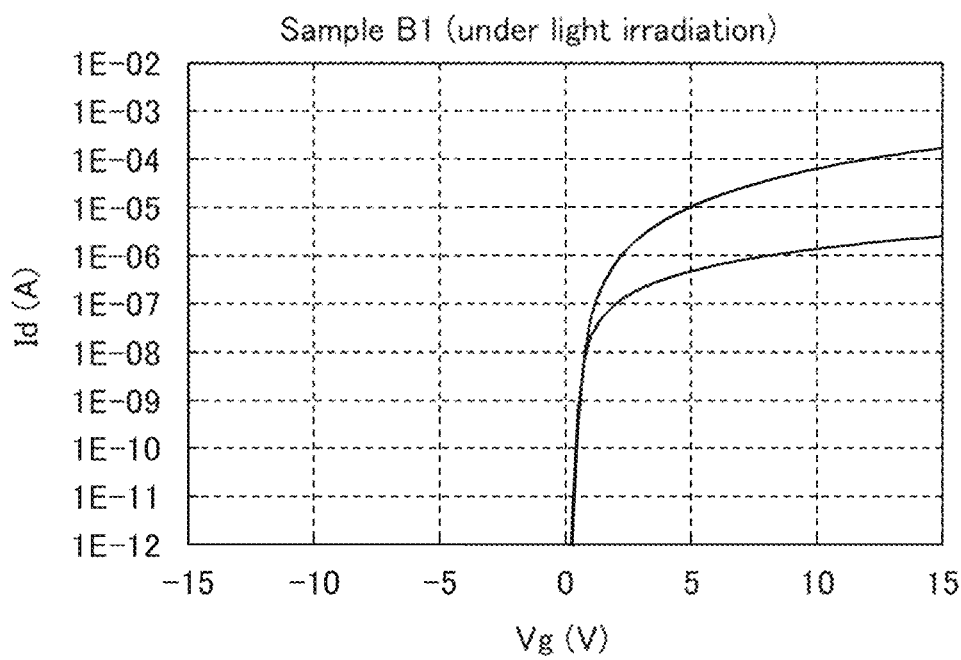
FIGS. 47A and 47B illustrate Id-Vg characteristics of a transistor under light irradiation of an example.
Figure 47B:
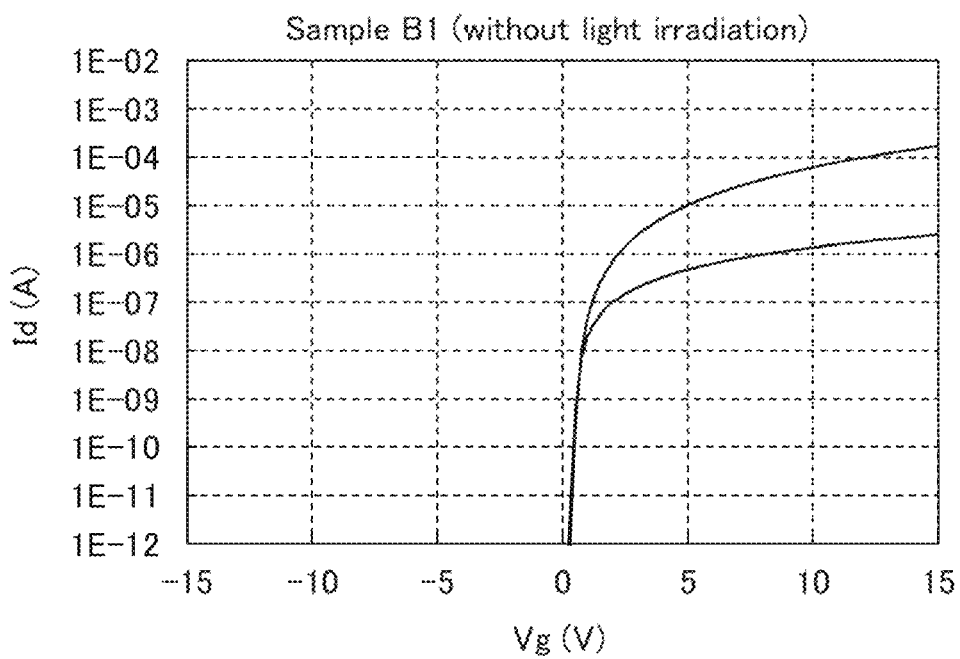
Figure 48A:
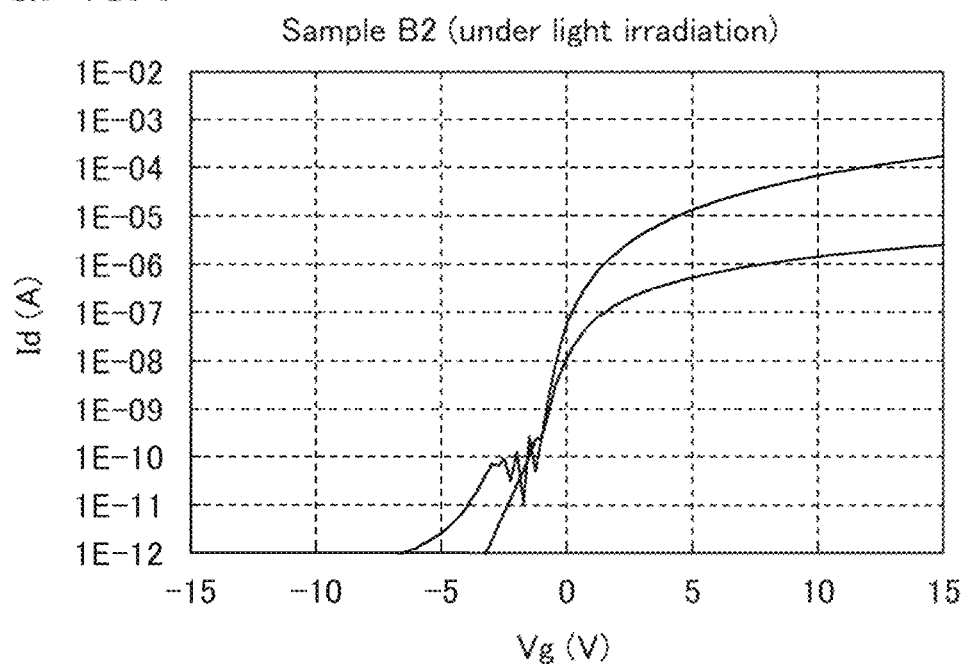
FIGS. 48A and 48B illustrate Id-Vg characteristics of a transistor under light irradiation of an example.
Figure 48B:
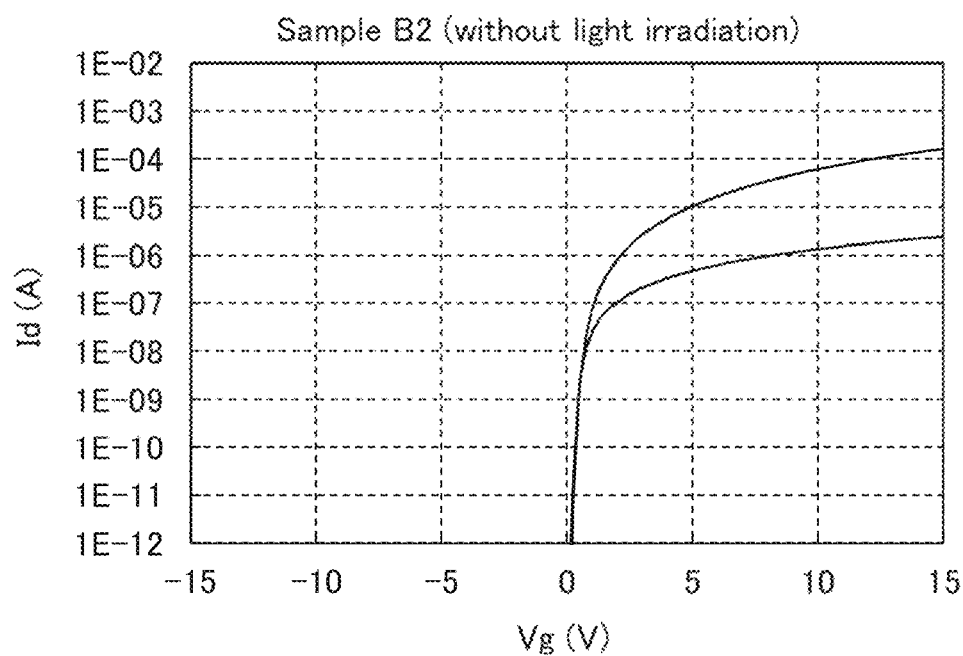

The electrical characteristics of the transistors of Sample B1 and Sample B2 are shown in FIG. 47 and FIG. 48. FIG. 47 and FIG. 48 show the results of applying gate voltages (Vg and Vbg) from −15 V to +15 V in increments of 0.25 V with the source electrode (Vs) being 0 V (comm) and the drain voltage (Vd) being 1 V and 10 V. Furthermore, in each of FIG. 47 and FIG. 48, the vertical axis represents the drain current (Id), and the horizontal axis represents the gate voltage (Vg). Furthermore, FIG. 47 is the measurement results for Sample B1 and FIG. 48 is the measurement results for Sample B2. In addition, FIG. 47(A) and FIG. 48(A) show the electrical characteristics of the transistors under light irradiation, and FIG. 47(B) and FIG. 48(B) show the electrical characteristics of the transistors without light irradiation.

According to the results of electrical characteristics shown in FIG. 47 and FIG. 48, the result in which the electrical characteristics of the transistor of Sample B2 under light irradiation were electrical characteristics with the threshold voltage being negative (also referred to as normally-on characteristics) was obtained. By contrast, the result in which the electrical characteristics of the transistor of Sample B1 were electrical characteristics with the threshold voltage being positive (also referred to as normally-off characteristics) even under light irradiation was obtained. That is, a structure that includes the conductive film 114 as the second gate electrode is preferable.

As described above, it can be said that the transistor of one embodiment of the present invention is a transistor with small change in electrical characteristics even under light irradiation and less power consumption.

<Cross-Sectional Observation of Transistor>

Figure 49A:
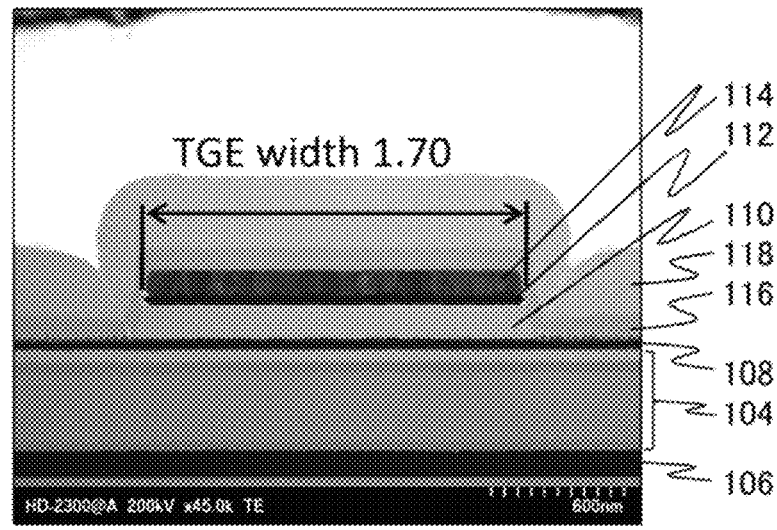
FIGS. 49A and 49B illustrate TEM images of transistors of an example.

Next, the cross section of the fabricated transistor whose size is 50 μm in channel width and 2.0 μm in channel length was observed. The results of the cross-sectional observation of the transistor are shown in FIGS. 49(A) and (B). Note that a transmission electron microscope (TEM: Transmission Electron Microscope) was used for the cross-sectional observation.

Figure 49B:
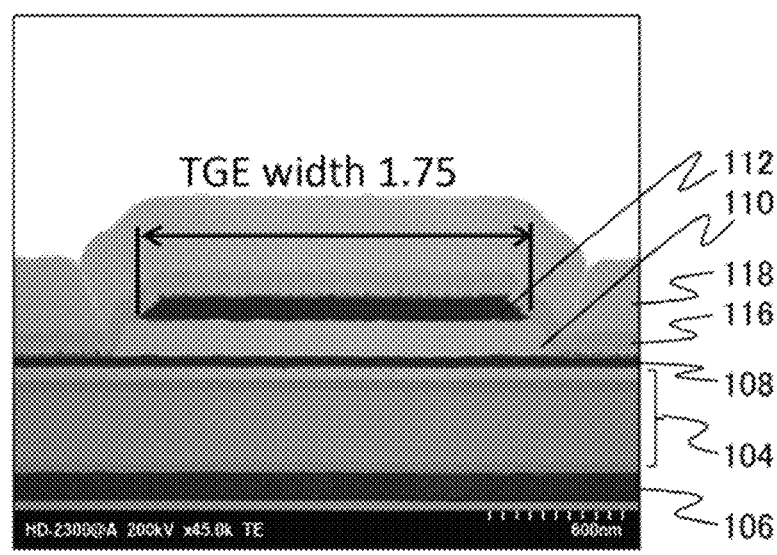

FIG. 49(A) is the cross section of Sample B1 and FIG. 49(B) is the cross section of Sample B2, each of which corresponds to the cross section in the direction of dashed-dotted line X1-X2 shown in FIG. 2(A). Note that common reference numerals are put for the elements corresponding to FIG. 3(A) or FIG. 43(A).

As shown in FIGS. 49(A) and (B), Samples B1 and B2 fabricated in this example had favorable cross-sectional shapes. Furthermore, the second gate electrode width (TGE width) of Sample B1 was 1.70 μm. Furthermore, the second gate electrode width (TGE width) of Sample B2 was 1.75 μm.

The structure described in this example above can be used in appropriate combination with the structures described in any of the other embodiments.

Example 3

In this example, the results of evaluating the amount of hydrogen and oxygen released from a conductive film that can be used for the second gate electrode of the transistor of one embodiment of the present invention will be described.

As a method for evaluating the amount of hydrogen and oxygen released from the conductive film that can be used for the second gate electrode, a thermal desorption spectrometry (TDS) was used. In the TDS analysis of the conductive film, the amount of hydrogen molecules released from the conductive film and the amount of oxygen molecules released from an insulating film under the conductive film were measured and evaluated.

First, in order to evaluate the amount of hydrogen released from the conductive film, the following Sample C1 to Sample C4 were fabricated.

<Fabrication of Samples C1 to C4>

For Sample C1, a tungsten film with a thickness of 30 nm was formed over a glass substrate using a sputtering apparatus.

For Sample C2, a titanium film with a thickness of 30 nm was formed over a glass substrate using a sputtering apparatus.

For Sample C3, a tantalum nitride film with a thickness of 30 nm was formed over a glass substrate using a sputtering apparatus.

For Sample C4, a titanium nitride film with a thickness of 30 nm was formed over a glass substrate using a sputtering apparatus.

<Evaluation 1 of Released Amount of Hydrogen by TDS Analysis>

In order to evaluate the amount of hydrogen molecules released from the fabricated Sample C1 to Sample C4, TDS analysis was conducted. The results of the TDS analysis are shown in FIGS. 50(A) to (D).

From the results of the TDS analysis shown in FIGS. 50(A) to (D), the amount of hydrogen molecules released from the various conductive films can be evaluated.

Figure 50A:
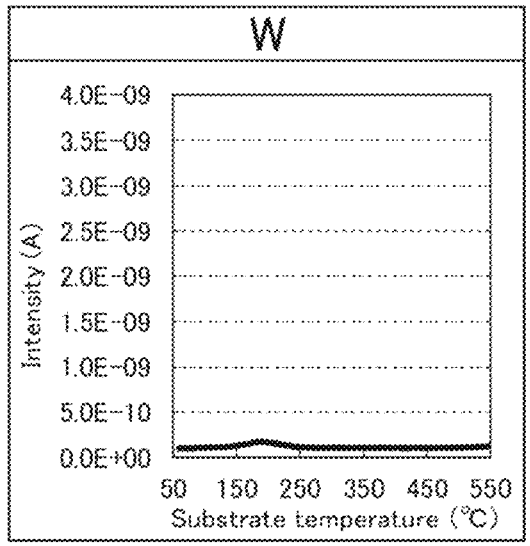
FIGS. 50A-50D illustrate TDS analysis results of an example.
Figure 50B:
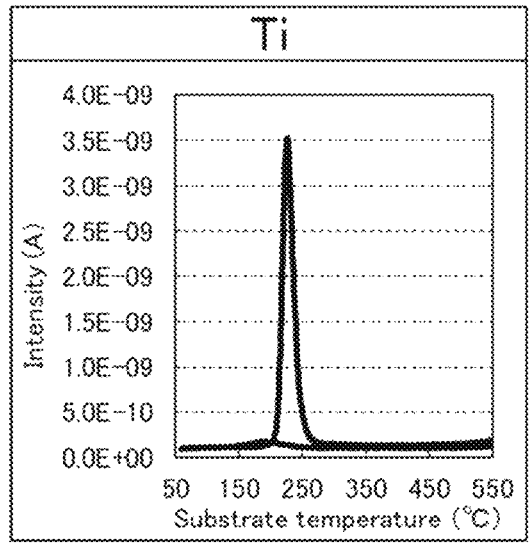
Figure 50C:
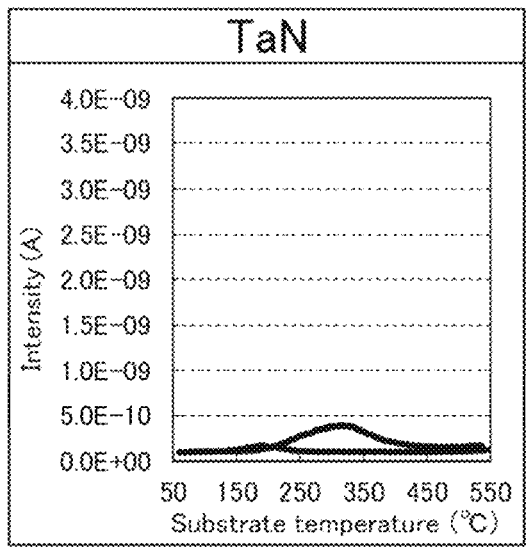
Figure 50D:
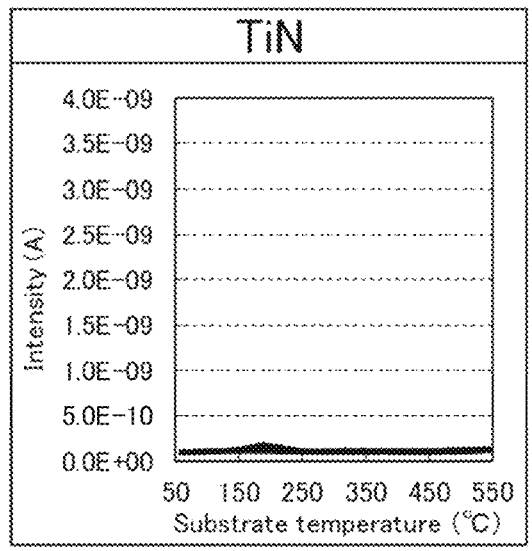

As shown in FIGS. 50(A), (C), and (D), release of hydrogen from the tungsten film, the tantalum nitride film, and the titanium nitride film was hardly observed. By contrast, as shown in FIG. 50(B), release of many hydrogen molecules from the titanium film was found. There is a possibility that excessive release of hydrogen causes an oxide semiconductor film in a channel region to have n-type conductivity. Thus, it can be said that tungsten, tantalum nitride, and titanium nitride are preferable as the materials used for the conductive film 114.

Next, in order to evaluate the amount of hydrogen passing through the conductive film, the following Sample C5 to Sample C9 were fabricated.

<Fabrication of Samples C5 to C9>

For Sample C5, a silicon nitride film with a thickness of 100 nm was formed over a glass substrate using a PECVD apparatus.

For Sample C6, a silicon nitride film with a thickness of 100 nm was formed over a glass substrate using a PECVD apparatus. Then, a tungsten film with a thickness of 30 nm was formed over the silicon nitride film using a sputtering apparatus.

For Sample C7, a silicon nitride film with a thickness of 100 nm was formed over a glass substrate using a PECVD apparatus. Then, a titanium film with a thickness of 30 nm was formed over the silicon nitride film using a sputtering apparatus.

For Sample C8, a silicon nitride film with a thickness of 100 nm was formed over a glass substrate using a PECVD apparatus. Then, a tantalum nitride film with a thickness of 30 nm was formed over the silicon nitride film using a sputtering apparatus.

For Sample C9, a silicon nitride film with a thickness of 100 nm was formed over a glass substrate using a PECVD apparatus. Then, a titanium nitride film with a thickness of 30 nm was formed over the silicon nitride film using a sputtering apparatus.

<Evaluation 2 of Released Amount of Hydrogen by TDS Analysis>

In order to evaluate the amount of hydrogen molecules released from the fabricated Samples C5 to C9, TDS analysis was conducted. The results of the TDS analysis are shown in FIGS. 51(A) to (D).

From the results of the TDS analysis shown in FIG. 51, the amount of hydrogen molecules released from the silicon nitride film under the varied conductive film can be evaluated. In other words, in the case where the amount of hydrogen molecules released from the silicon nitride film is small, the conductive film is found to be capable of blocking the hydrogen.

Figure 51A:
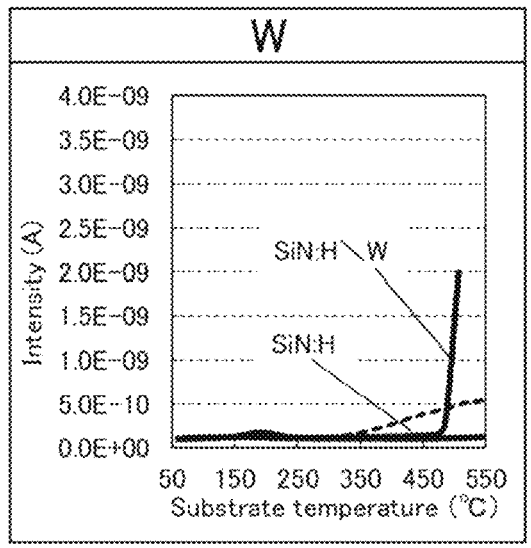
FIGS. 51A-51D illustrate TDS analysis results of an example.
Figure 51B:
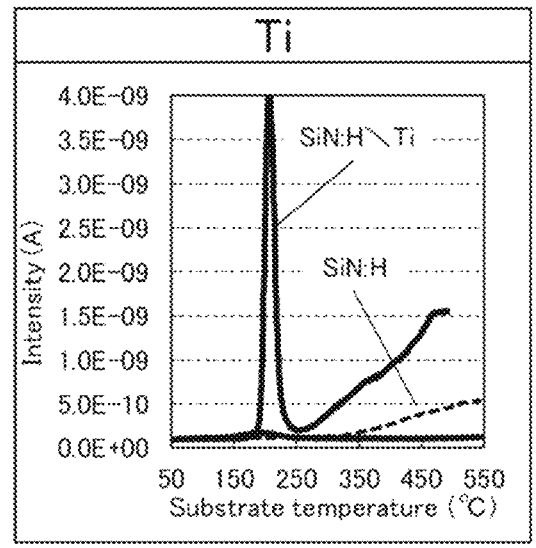
Figure 51C:
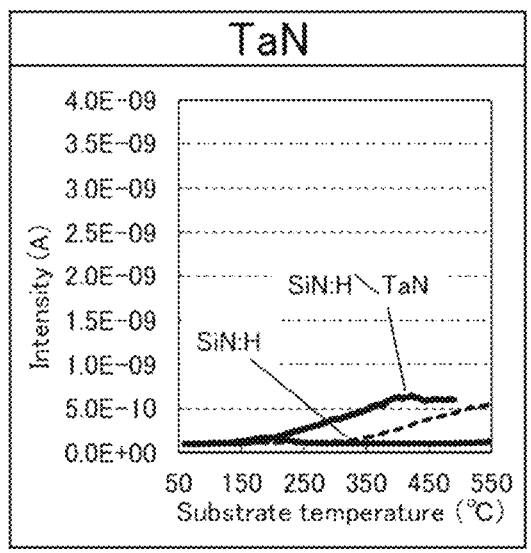
Figure 51D:
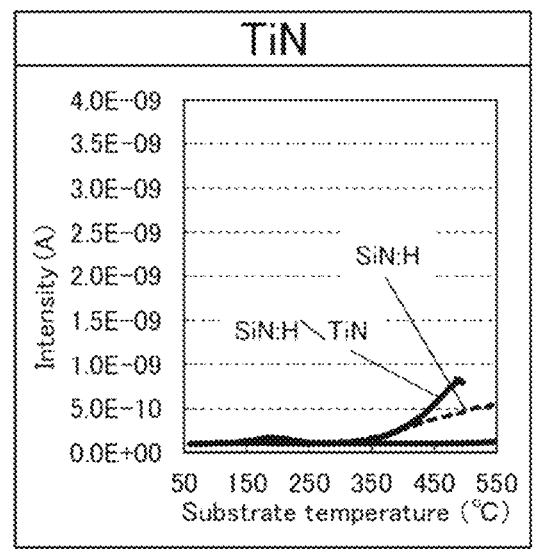

As shown in FIGS. 51(A) to (D), release of hydrogen molecules from Sample C5 (the silicon nitride film) was found at 350° C. or higher. By contrast, as shown in FIG. 51(A), release of hydrogen molecules from Sample C6 (the tungsten film over the silicon nitride film) was not found at 350° C. to 480° C. inclusive. In other words, it was indicated that the formation of a tungsten film over a silicon nitride film can block hydrogen molecules released from the silicon nitride. In addition, as shown in FIGS. 51(C) and (D), it was found that release of hydrogen molecules from Sample C8 (the tantalum nitride film over the silicon nitride film) and Sample C9 (the titanium nitride film over the silicon nitride film) is small in amount even at 350° C. or higher. In other words, it was indicated that the formation of a tantalum nitride film or a titanium nitride film over a silicon nitride film can block hydrogen molecules released from the silicon nitride. However, as shown in FIG. 51(B), release of many hydrogen molecules at 250° C. or higher, in addition to hydrogen release from the titanium film, from Sample C7 (the titanium film over the silicon nitride film) was found. In other words, it was indicated that the formation of a tungsten film, a tantalum nitride film, or a titanium nitride film over a silicon nitride film can block hydrogen molecules released from the silicon nitride. Accordingly, it can be said that tungsten, tantalum nitride, and titanium nitride are preferable as materials used for the conductive film 114.

Next, in order to evaluate the amount of oxygen absorbed by the conductive film, the following Samples C10 and C11-1 to Sample C14-2 were fabricated.

<Fabrication of Samples C10 and C11-1 to C14-2>

For Sample C10, a silicon nitride oxide film with a thickness of 100 nm was formed over a glass substrate using a PECVD apparatus.

For Sample C11-1, a silicon nitride oxide film with a thickness of 100 nm was formed over a glass substrate using a PECVD apparatus. Then, a tungsten film was formed over the silicon nitride oxide film using a sputtering apparatus. Then, after heat treatment at 250° C. for one hour was performed, the tungsten film was removed using a wet etching method to expose the silicon nitride oxide film.

For Sample C11-2, a silicon nitride oxide film with a thickness of 100 nm was formed over a glass substrate using a PECVD apparatus. Then, an oxide semiconductor film with a thickness of 10 nm was formed over the silicon nitride oxide film using a sputtering apparatus. For forming the oxide semiconductor film, a metal oxide of In:Ga:Zn=4:2:4.1 [atomic ratio] was a sputtering target, and an AC power supply was used as the power supply to be applied to the sputtering target. Then, a tungsten film was formed over the oxide semiconductor film using a sputtering apparatus. Then, after heat treatment at 250° C. for one hour was performed, the oxide semiconductor film and the tungsten film were removed using a wet etching method to expose the silicon nitride oxide film.

For Sample C12-1, a silicon nitride oxide film with a thickness of 100 nm was formed over a glass substrate using a PECVD apparatus. Then, a titanium film was formed over the silicon nitride oxide film using a sputtering apparatus. Then, after heat treatment at 250° C. for one hour was performed, the titanium film was removed using a wet etching method to expose the silicon nitride oxide film.

For Sample C12-2, a silicon nitride oxide film with a thickness of 100 nm was formed over a glass substrate using a PECVD apparatus. Then, an oxide semiconductor film with a thickness of 10 nm was formed over the silicon nitride oxide film using a sputtering apparatus. For forming the oxide semiconductor film, a metal oxide of In:Ga:Zn=4:2:4.1 [atomic ratio] was a sputtering target, and an AC power supply was used as the power supply to be applied to the sputtering target. Then, a titanium film was formed over the oxide semiconductor film using a sputtering apparatus. Then, after heat treatment at 250° C. for one hour was performed, the oxide semiconductor film and the titanium film were removed using a wet etching method to expose the silicon nitride oxide film.

For Sample C13-1, a silicon nitride oxide film with a thickness of 100 nm was formed over a glass substrate using a PECVD apparatus. Then, a tantalum nitride film was formed over the silicon nitride oxide film using a sputtering apparatus. Then, after heat treatment at 250° C. for one hour was performed, the tantalum nitride film was removed using a wet etching method to expose the silicon nitride oxide film.

For Sample C13-2, a silicon nitride oxide film with a thickness of 100 nm was formed over a glass substrate using a PECVD apparatus. Then, an oxide semiconductor film with a thickness of 10 nm was formed over the silicon nitride oxide film using a sputtering apparatus. For forming the oxide semiconductor film, a metal oxide of In:Ga:Zn=4:2:4.1 [atomic ratio] was a sputtering target, and an AC power supply was used as the power supply to be applied to the sputtering target. Then, a tantalum nitride film was formed over the oxide semiconductor film using a sputtering apparatus. Then, after heat treatment at 250° C. for one hour was performed, the oxide semiconductor film and the tantalum nitride film were removed using a wet etching method to expose the silicon nitride oxide film.

For Sample C14-1, a silicon nitride oxide film with a thickness of 100 nm was formed over a glass substrate using a PECVD apparatus. Then, a titanium nitride film was formed over the silicon nitride oxide film using a sputtering apparatus. Then, after heat treatment at 250° C. for one hour was performed, the titanium nitride film was removed using a wet etching method to expose the silicon nitride oxide film.

For Sample C14-2, a silicon nitride oxide film with a thickness of 100 nm was formed over a glass substrate using a PECVD apparatus. Then, an oxide semiconductor film with a thickness of 10 nm was formed over the silicon nitride oxide film using a sputtering apparatus. For forming the oxide semiconductor film, a metal oxide of In:Ga:Zn=4:2:4.1 [atomic ratio] was a sputtering target, and an AC power supply was used as the power supply to be applied to the sputtering target. Then, a titanium nitride film was formed over the oxide semiconductor film using a sputtering apparatus. Then, after heat treatment at 250° C. for one hour was performed, the oxide semiconductor film and the titanium nitride film were removed using a wet etching method to expose the silicon nitride oxide film.

<Evaluation of Released Amount of Oxygen by TDS Analysis>

In order to evaluate the amount of oxygen molecules released from the fabricated Sample C10 and Samples C11-1 to C14-2, TDS analysis was conducted. The results of the TDS analysis are shown in FIGS. 52(A) to (E).

From the results of the TDS analysis shown in FIG. 52, the amount of oxygen molecules released from the silicon nitride oxide film can be evaluated. In other words, in the case where the amount of oxygen molecules released from the silicon nitride oxide film is small, the conductive film is found to have absorbed oxygen contained in the silicon nitride oxide film.

Figure 52A:
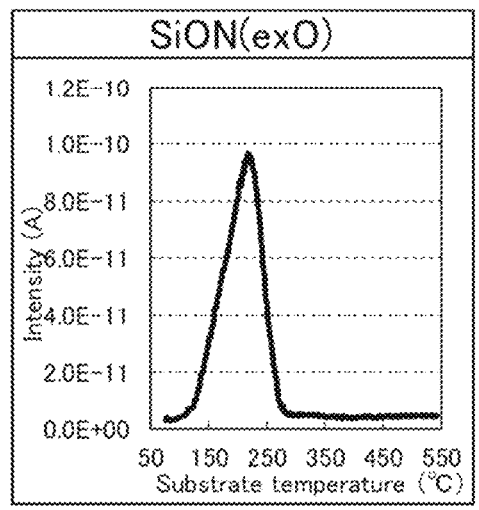
FIGS. 52A-52E illustrate TDS analysis results of an example.
Figure 52B:
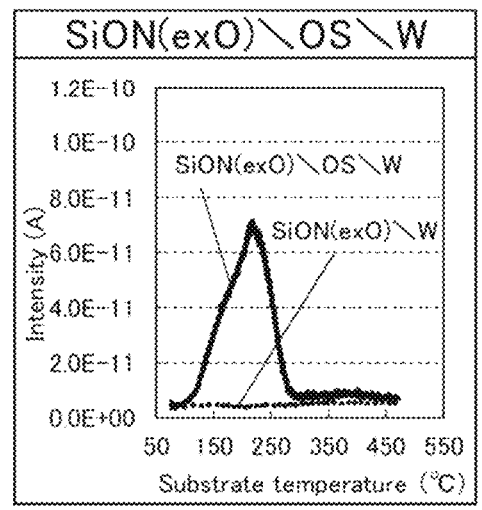
Figure 52C:
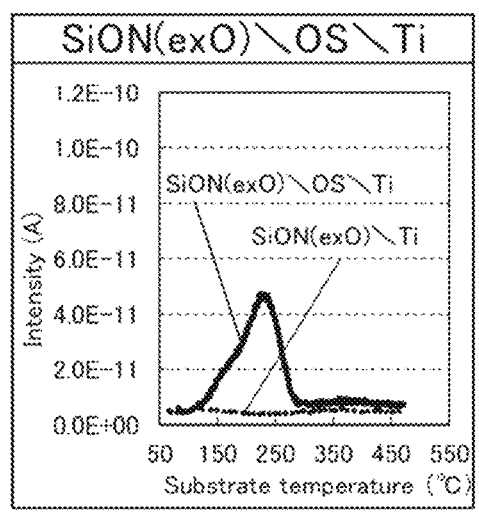
Figure 52D:
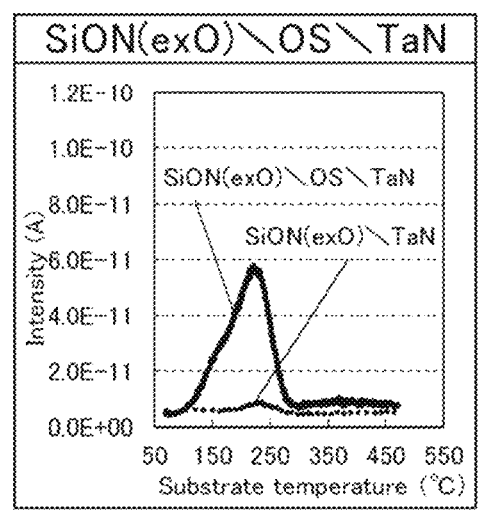
Figure 52E:
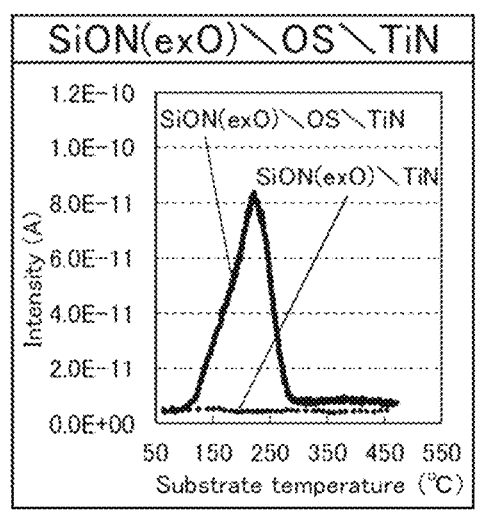

As shown in FIG. 52(A), release of oxygen molecules from Sample C10 (the silicon nitride oxide film) was found. In addition, as shown in FIGS. 52(B) to (E), release of oxygen molecules from the silicon nitride oxide film was also found, similarly to Sample C10, from Sample C11-2, Sample C12-2, Sample C13-2, and Sample C14-2 in each of which the varied conductive film was formed after the formation of the oxide semiconductor film over the silicon nitride oxide film. By contrast, oxygen molecules from the silicon nitride oxide film was hardly found from Sample C11-1, Sample C12-1, Sample C13-1, and Sample C14-1 in each of which the varied conductive film was formed directly over the silicon nitride oxide film.

In other words, it was indicated that forming an oxide semiconductor film over a silicon nitride oxide film and forming a conductive film over the oxide semiconductor film can inhibit the conductive film from absorbing oxygen contained in silicon nitride oxide.

When sufficiently containing oxygen, the insulating film 110 can supply oxygen to the oxide semiconductor film in the channel region and reduce oxygen vacancies in the channel region. In other words, an insulating film used as the insulating film 110 preferably releases a large amount of oxygen.

Thus, it can be said that a structure that includes an oxide semiconductor film and a conductive film is preferable as the second gate electrode formed over the insulating film 110.

The structure described in this example above can be used in appropriate combination with any of the other embodiments or examples.

Example 4

In this example, deposition damage to an insulating film at the time of depositing a conductive film that can be used as the second gate electrode of the transistor of one embodiment of the present invention was evaluated.

For evaluating deposition damage to an insulating film at the time of depositing a conductive film, electron spin resonance (Electron Spin Resonance, abbreviation: ESR) measurement was used.

A method for fabricating the samples used in this example is described below. In addition, the structures of Sample D1-1 to Sample D6-2 are listed below.

TABLE 3

| Film Reference numeral | Substrate 102 | Oxide semiconductor film 108 | Insulating film 110 | Oxide semiconductor film 112 | Conductive film 114 |
|---|---|---|---|---|---|
| Sample D1-1 | Quartz | IGZO (4, 2, 4.1) | SiON | — | — |
| Sample D1-2 | | | | IGZO (4, 2, 4.1) | — |
| Sample D2-1 | | | | — | W |
| Sample D2-2 | | | | IGZO (4, 2, 4.1) | W |
| Sample D3-1 | | | | — | Ti |
| Sample D3-2 | | | | IGZO (4,2,4.1) | Ti |
| Sample D4-1 | | | | — | TaN |
| Sample D4-2 | | | | IGZO (4, 2, 4.1) | TaN |
| Sample D5-1 | | | | — | TN |
| Sample D5-2 | | | | IGZO (4, 2, 4.1) | TN |
| Sample D6-1 | | | | — | Cu |
| Sample D6-2 | | | | IGZO (4, 2, 4.1) | Cu |

<Fabrication of Samples D1-1 to D6-2>

For Sample D1-1 and Sample D1-2, an oxide semiconductor film that corresponds to the oxide semiconductor film 108 was formed over a quartz substrate. As the oxide semiconductor film, an oxide semiconductor film with a thickness of 40 nm was formed. Note that for forming the oxide semiconductor film, a sputtering apparatus was used, a metal oxide of In:Ga:Zn=4:2:4.1 [atomic ratio] was a sputtering target, and an AC power supply was used as the power supply to be applied to the sputtering target. Then, an insulating film that corresponds to the insulating film 110 was formed over the oxide semiconductor film. As the insulating film, a silicon oxynitride film with a thickness of 100 nm was formed. Then, an oxide semiconductor film that corresponds to the oxide semiconductor film 112 was formed over the insulating film. As the oxide semiconductor film, an oxide semiconductor film with a thickness of 10 nm was formed. Note that for forming the oxide semiconductor film, a sputtering apparatus was used, a metal oxide of In:Ga:Zn=4:2:4.1 [atomic ratio] was a sputtering target, and an AC power supply was used as the power supply to be applied to the sputtering target. Through the above steps, Sample D1-2 was fabricated. In addition, Sample D1-1 was obtained by removing the deposited oxide semiconductor film that corresponds to the oxide semiconductor film 112 by a wet etching method.

Sample D2-1 and Sample D2-2 were fabricated by forming a conductive film that corresponds to the conductive film 114 over Sample D1-1 and Sample D1-2, respectively. As the conductive film, a tungsten film was formed using a sputtering apparatus.

Sample D3-1 and Sample D3-2 were fabricated by forming a conductive film that corresponds to the conductive film 114 over Sample D1-1 and Sample D1-2, respectively. As the conductive film, a titanium film was formed using a sputtering apparatus.

Sample D4-1 and Sample D4-2 were fabricated by forming a conductive film that corresponds to the conductive film 114 over Sample D1-1 and Sample D1-2, respectively. As the conductive film, a tantalum nitride film was formed using a sputtering apparatus.

Sample D5-1 and Sample D5-2 were fabricated by forming a conductive film that corresponds to the conductive film 114 over Sample D1-1 and Sample D1-2, respectively. As the conductive film, a titanium nitride film was formed using a sputtering apparatus.

Sample D6-1 and Sample D6-2 were fabricated by forming a conductive film that corresponds to the conductive film 114 over Sample D1-1 and Sample D1-2, respectively. As the conductive film, a copper film was formed using a sputtering apparatus.

<ESR Measurement>

The fabricated Samples D1-1 to D6-2 were subjected to ESR measurement. For the ESR measurement, the measurement temperature was 85 K, the high-frequency power (microwave power) of 8.92 GHz was 10 mW, and the direction of a magnetic field was parallel to the film surface of the fabricated sample. Note that the lower detection limit of the spin density of a signal attributable to $NO_x$ was $1.0 \times 10^{16}$ spins/cm$^3$. The smaller the number of spins is, the smaller the number of defects in the insulating film is.

Figure 53A:
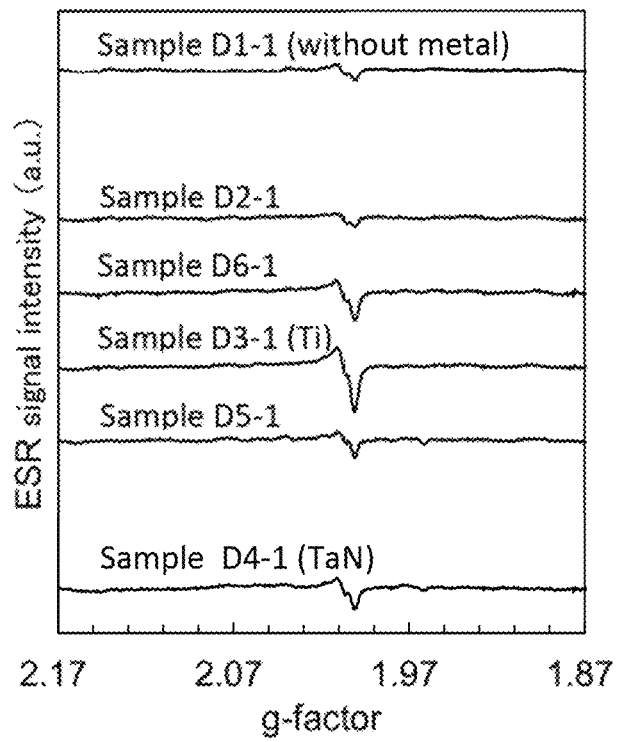
FIGS. 53A and 53B illustrate ESR measurement results of an example.
Figure 53B:
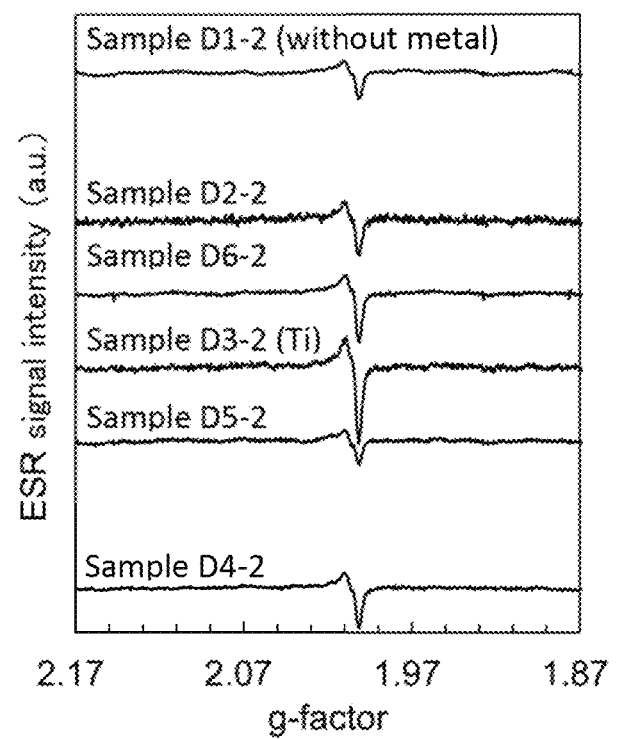

The measured ESR signals are shown in FIG. 53. Note that, in the case where the insulating film contains a nitride oxide ($NO_x$), a signal having characteristic three peaks that are attributable to $NO_x$ is sometimes observed. The signal having three peaks is observed with a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966. The first to third signals are attributable to $NO_x$ and understood to be a signal with a hyperfine structure arising from the nuclear spin of N. In addition, the signal attributable to $NO_x$ has anisotropic spin species and thus the waveform is asymmetrical.

Figure 54:
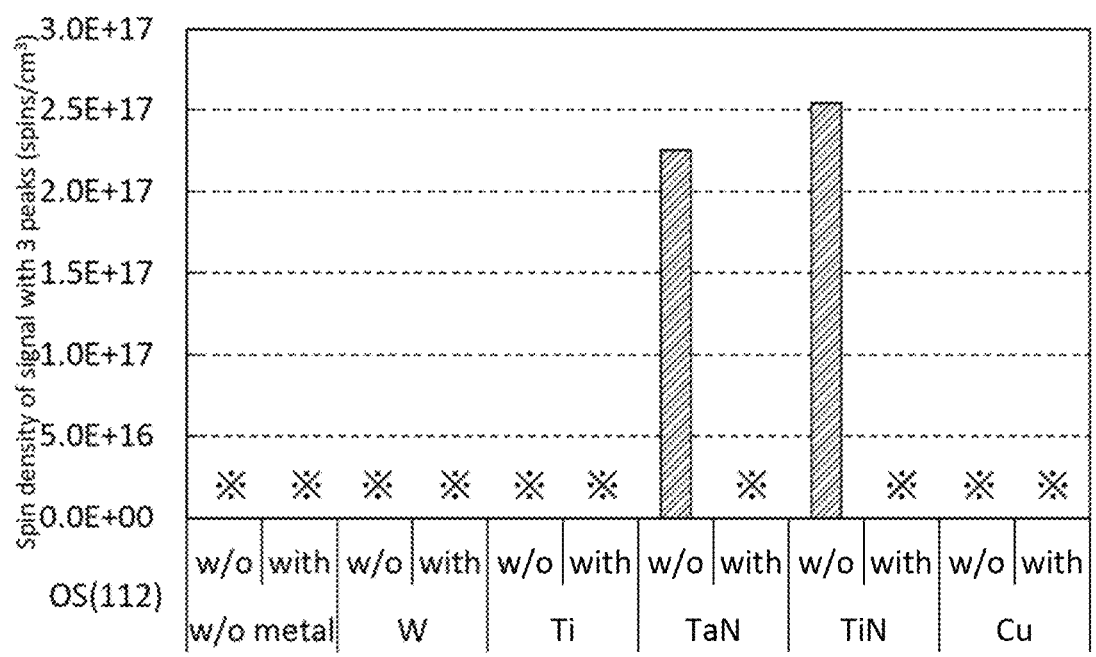
FIG. 54 illustrates measurement results of spin densities of three signals of an example.

The measurement results of the spin density of the signal having three peaks attributable to $NO_x$ for Sample D1-1 to Sample D6-2 are shown in FIG. 54. Note that shown here are the spin densities each obtained by converting the number of measured spins into that per unit volume.

It can be seen that Sample D4-1 and Sample D5-1, each of which contains no oxide that corresponds to the oxide semiconductor film 112 and contains tantalum nitride or titanium nitride as the conductive film, have a high spin density of the signal having three peaks and thus are insulating films with a large number of defects. This is probably because $NO_x$ was generated when the conductive film was formed by reactive sputtering using nitrogen. By contrast, for Samples D1-2, D2-2, D3-2, D4-2, D5-2, and D6-2, each of which contains oxide semiconductor that corresponds to the oxide semiconductor film 112, the spin densities of the signal attributable to $NO_x$ were low, being equal to or lower than the lower measurement limit.

The above indicates that the formation of the oxide semiconductor film that corresponds to the oxide semiconductor film 112 over the insulating film that corresponds to the insulating film 110 can suppress damage to the insulating film, which is generated at the time of forming the conductive film.

Accordingly, it can be said that a structure that includes the oxide semiconductor film 112 and the conductive film 114 as the second gate electrode is preferable.

The structure described in this example above can be used in appropriate combination with any of the other embodiments or examples.

Example 5

In this example, the results of evaluating the amount of hydrogen and oxygen released from a conductive film that can be used for the second gate electrode of the transistor of one embodiment of the present invention will be described.

As a method for evaluating the amount of hydrogen and oxygen released from the conductive film that can be used for the second gate electrode, a thermal desorption spectrometry (TDS) was used. In the TDS analysis of the conductive film, the amount of hydrogen molecules released from the conductive film and the amount of oxygen molecules released from an insulating film under the conductive film were measured and evaluated.

First, in order to evaluate the amount of hydrogen released from the conductive film, Sample E1 was fabricated.

<Fabrication of Sample E1>

For Sample E1, a copper film with a thickness of 50 nm was formed over a glass substrate using a sputtering apparatus.

<Evaluation 3 of Released Amount of Hydrogen by TDS Analysis>

In order to evaluate the amount of hydrogen molecules released from the fabricated Sample E1, TDS analysis was conducted. The result of the TDS analysis is shown in FIG. 55.

Figure 55:
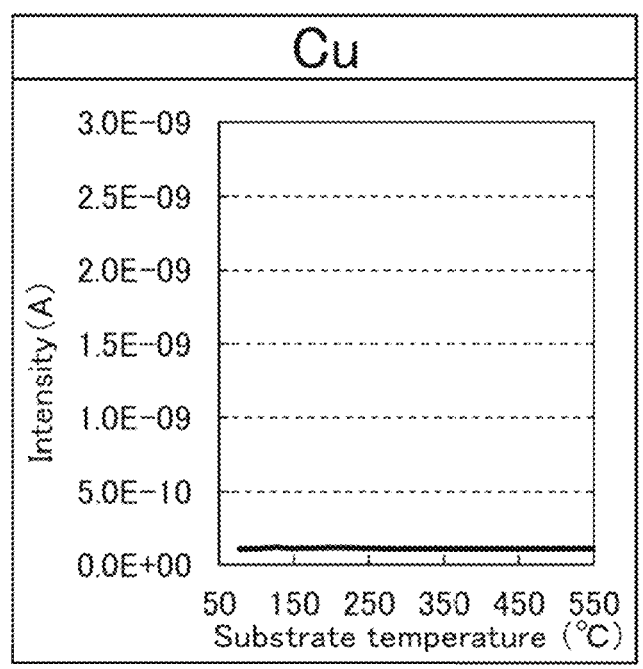
FIG. 55 illustrates the TDS analysis result of an example.

According to the results of the TDS analysis shown in FIG. 55, release of hydrogen from the copper film was hardly observed. There is a possibility that excessive release of hydrogen causes an oxide semiconductor film in a channel region to have n-type conductivity. Thus, it can be said that copper is preferable as the material used as the conductive film 114.

Next, in order to evaluate the amount of hydrogen passing through the conductive film, the following Sample E2 to Sample E6 were fabricated.

<Fabrication of Samples E2 to E6>

For Sample E2, a silicon nitride film with a thickness of 100 nm was formed over a glass substrate using a PECVD apparatus.

For Sample E3, a silicon nitride film with a thickness of 100 nm was formed over a glass substrate using a PECVD apparatus. Then, a copper film with a thickness of 100 nm was formed over the silicon nitride film using a sputtering apparatus.

For Sample E4, a silicon nitride film with a thickness of 100 nm was formed over a glass substrate using a PECVD apparatus. Then, a copper film with a thickness of 100 nm was formed over the silicon nitride film using a sputtering apparatus. Then, a titanium film with a thickness of 50 nm was formed over the copper film using a sputtering apparatus.

For Sample E5, a silicon nitride film with a thickness of 100 nm was formed over a glass substrate using a PECVD apparatus. Then, a copper film with a thickness of 100 nm was formed over the silicon nitride film using a sputtering apparatus. Then, a tungsten film with a thickness of 50 nm was formed over the copper film using a sputtering apparatus.

For Sample E6, a silicon nitride film with a thickness of 100 nm was formed over a glass substrate using a PECVD apparatus. Then, a copper film with a thickness of 100 nm was formed over the silicon nitride film using a sputtering apparatus. Then, a titanium nitride film with a thickness of 50 nm was formed over the copper film using a sputtering apparatus.

<Evaluation 4 of Released Amount of Hydrogen by TDS Analysis>

In order to evaluate the amount of hydrogen molecules released from the fabricated Samples E2 to E6, TDS analysis was conducted. The results of the TDS analysis are shown in FIG. 56 and FIG. 57.

Figure 56:
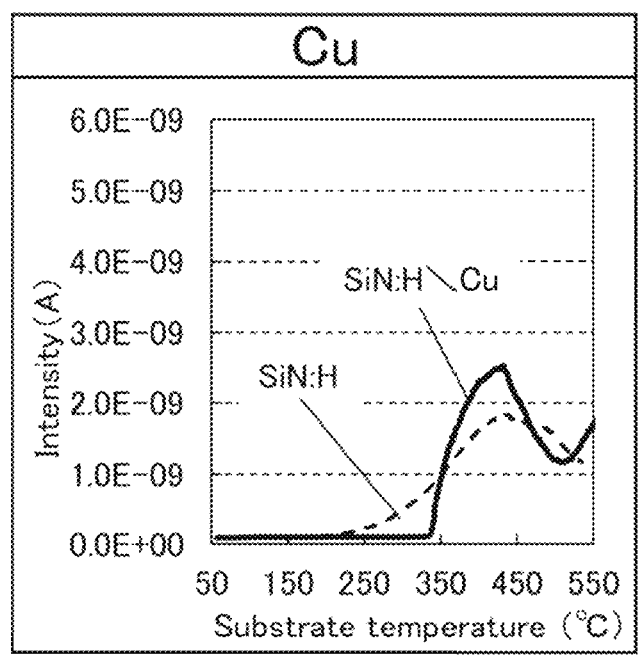
FIG. 56 illustrates TDS analysis results of an example.
Figure 57A:
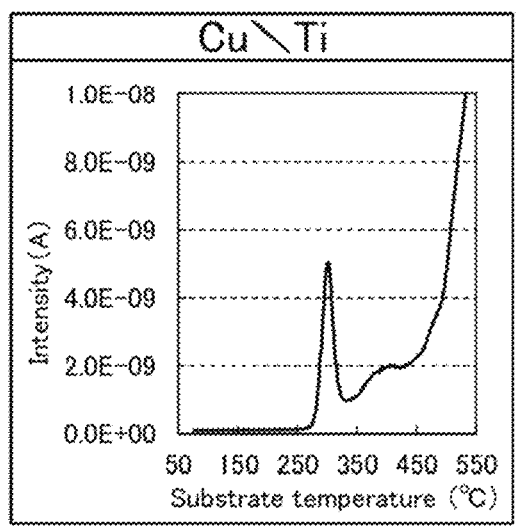
FIGS. 57A-57C illustrate TDS analysis results of an example.
Figure 57B:
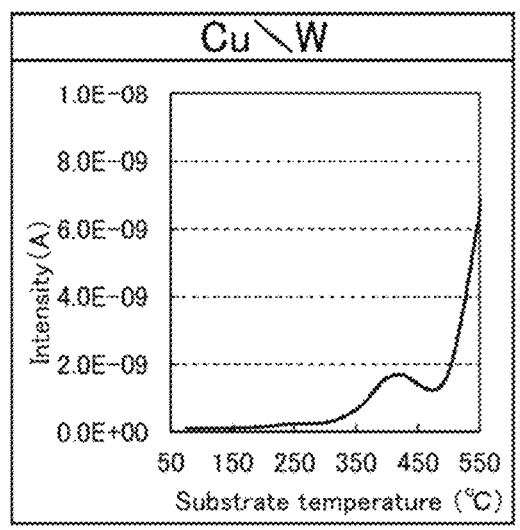
Figure 57C:
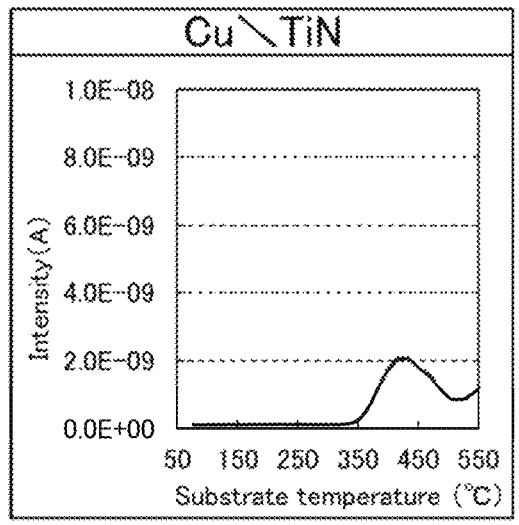

From the results of the TDS analysis shown in FIG. 56 and FIG. 57, the amount of hydrogen molecules released from the silicon nitride film under the varied conductive film can be evaluated. In other words, in the case where the amount of hydrogen molecules released from the silicon nitride film is small, the conductive film is found to be capable of blocking the hydrogen.

As shown in FIG. 56, release of hydrogen molecules from Sample E2 (the silicon nitride film) was found at 250° C. or higher. By contrast, release of hydrogen molecules from Sample E3 (the copper film over the silicon nitride film) was not found up to approximately 350° C. In other words, it was indicated that the formation of a copper film over a silicon nitride film can block hydrogen molecules released from the silicon nitride.

In addition, as shown in FIGS. 57(B) and (C), it was found that release of hydrogen molecules from Sample E5 (the copper film and the tungsten film over the silicon nitride film) and Sample E6 (the copper film and the titanium nitride film over the silicon nitride film) is small in amount up to approximately 350° C. In other words, it was indicated that the formation of a copper film over a silicon nitride film and the formation of a tungsten film or a titanium nitride film over the copper film can block hydrogen molecules released from the silicon nitride. However, as shown in FIG. 57(A), release of many hydrogen molecules at 250° C. or higher, in addition to hydrogen release from the titanium film, from Sample E4 (the copper film and the titanium film over the silicon nitride film) was found. In other words, it was indicated that the formation of a copper film, a tungsten film, and a titanium nitride film over a silicon nitride film can block hydrogen molecules released from the silicon nitride. Accordingly, it can be said that copper, tungsten, and titanium nitride are preferable as materials used for the conductive film 114.

The structure described in this example above can be used in appropriate combination with any of the other embodiments or examples.

Example 6

In this example, samples that correspond to transistors of one embodiment of the present invention were fabricated, the electrical characteristics of the transistors were measured, and the cross-sectional shapes were observed.

A method for fabricating the samples used in this example will be described below. In this example, Sample F1 and Sample F2 that correspond to the transistor 100B illustrated in FIGS. 3(A) and (B) were fabricated. In the description below, the same reference numerals are used for structures having functions similar to those in the transistor 100B illustrated in FIGS. 3(A) and (B).

Figure 58A:
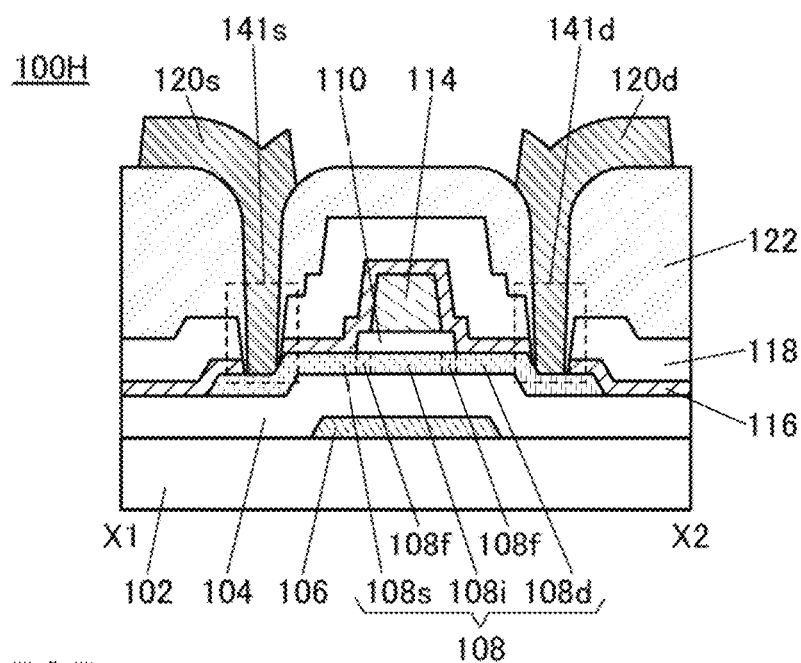
FIGS. 58A and 58B illustrate cross sections of a transistor of an example.
Figure 58B:
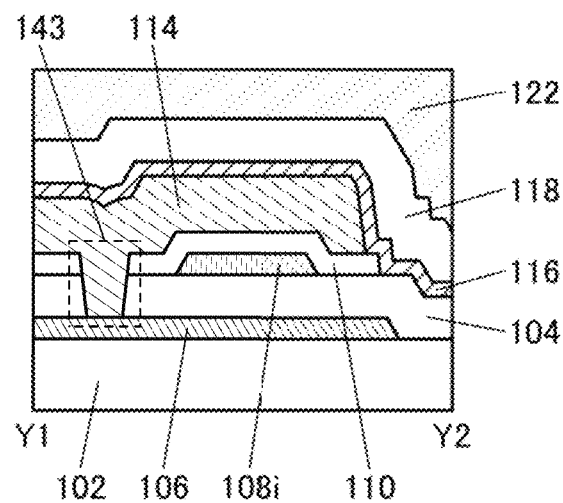
Figure 59A:
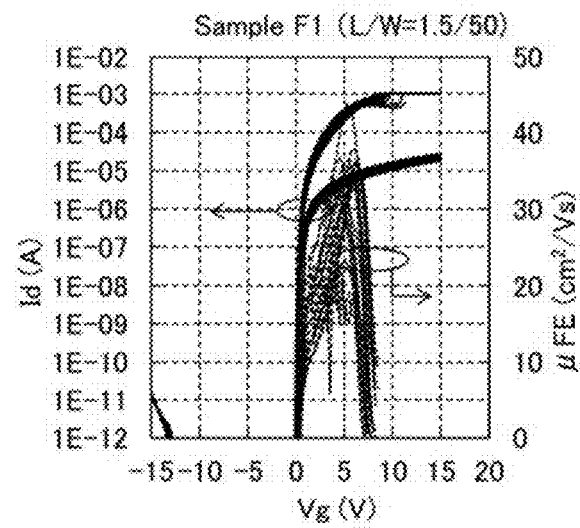
FIGS. 59A-59D illustrate Id-Vg characteristics of transistors of an example.
Figure 59B:
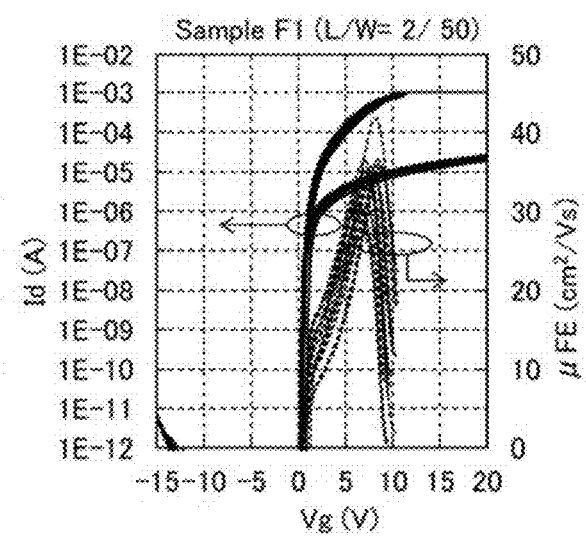
Figure 59C:
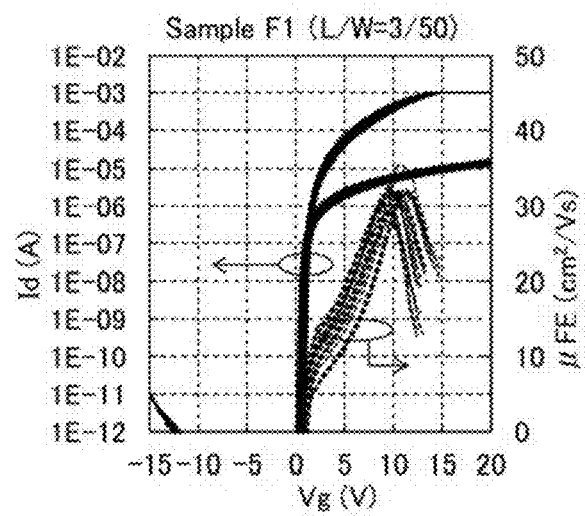
Figure 59D:
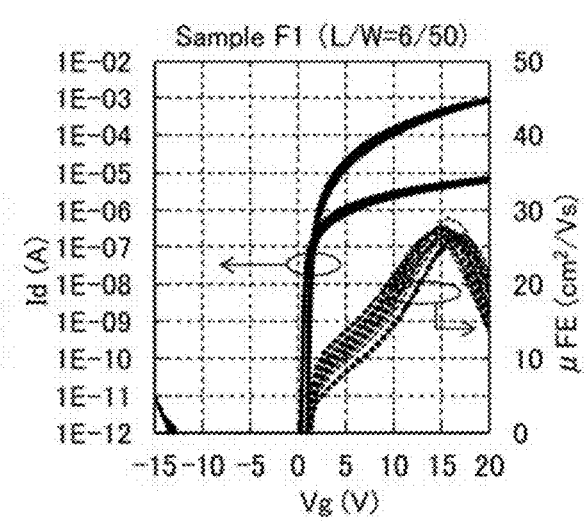
Figure 60A:
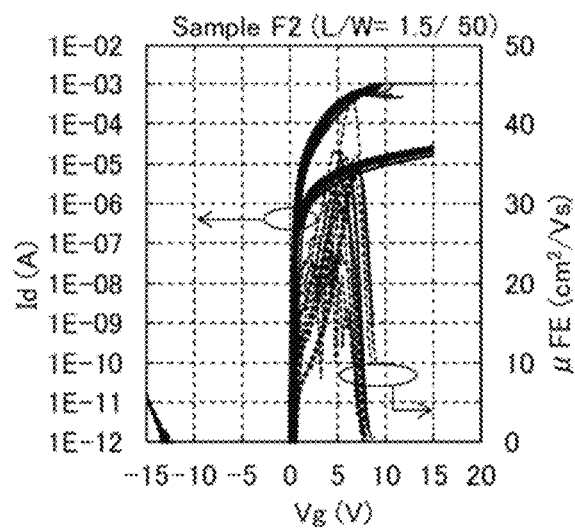
FIGS. 60A-60D illustrate Id-Vg characteristics of transistors of an example.
Figure 60B:
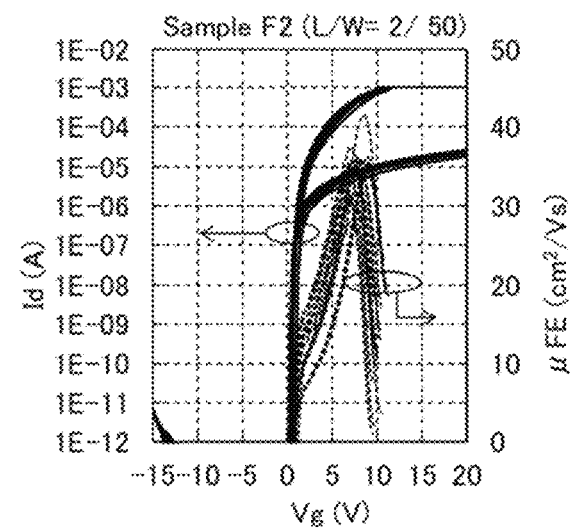
Figure 60C:
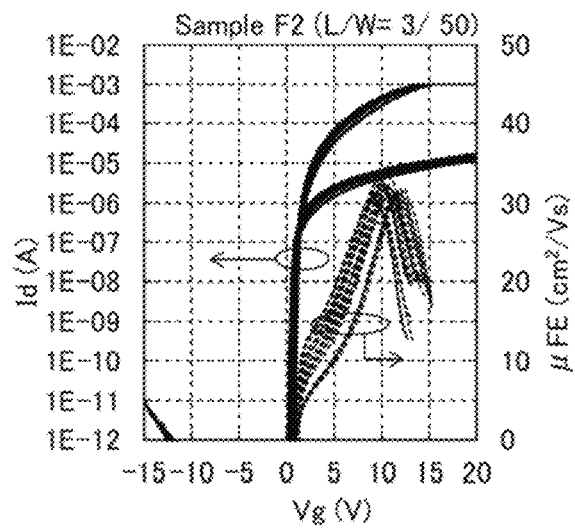
Figure 60D:
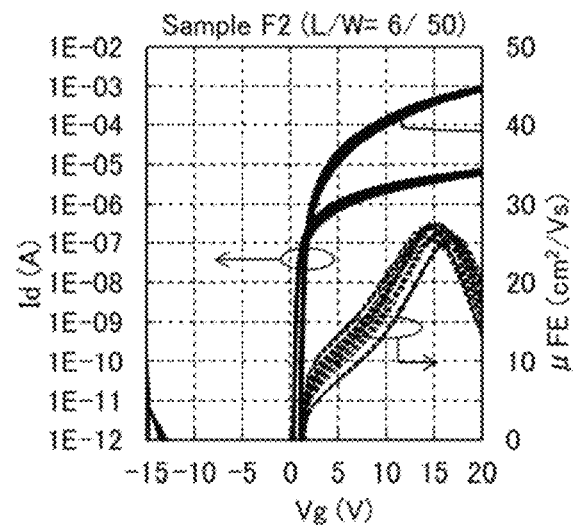
Figure 61A:
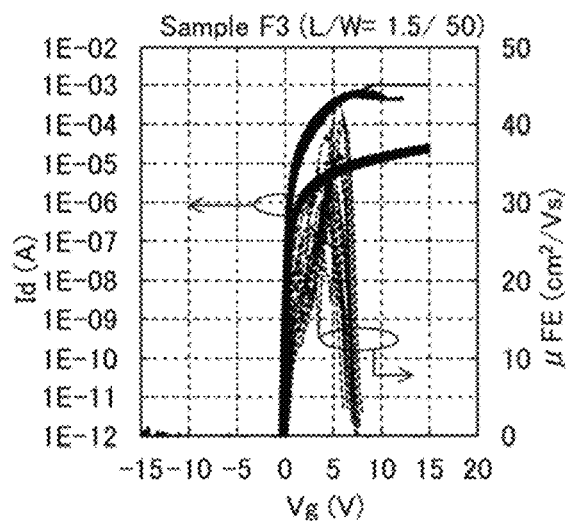
FIGS. 61A-61D illustrate Id-Vg characteristics of transistors of an example.
Figure 61B:
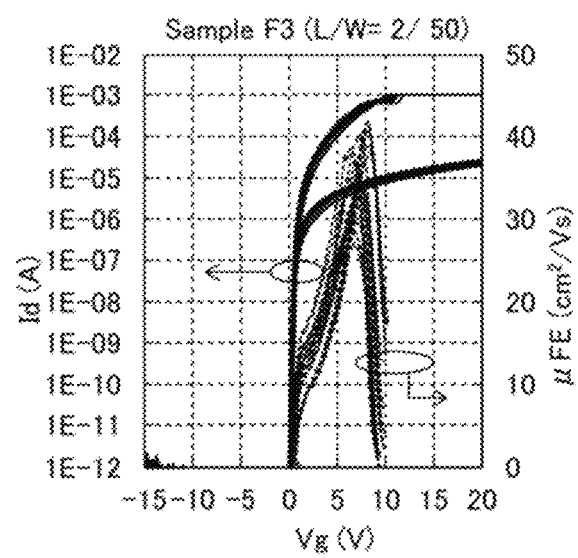
Figure 61C:
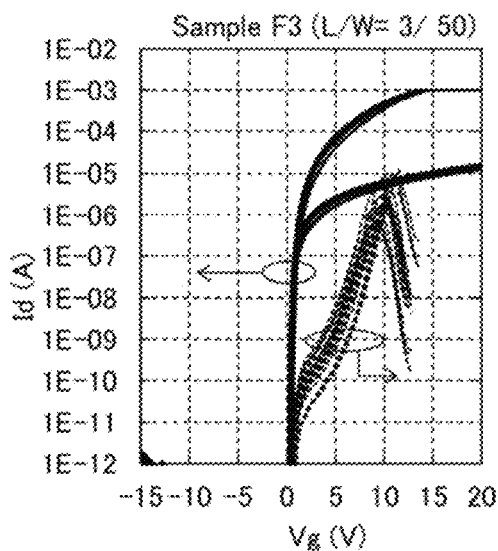
Figure 61D:
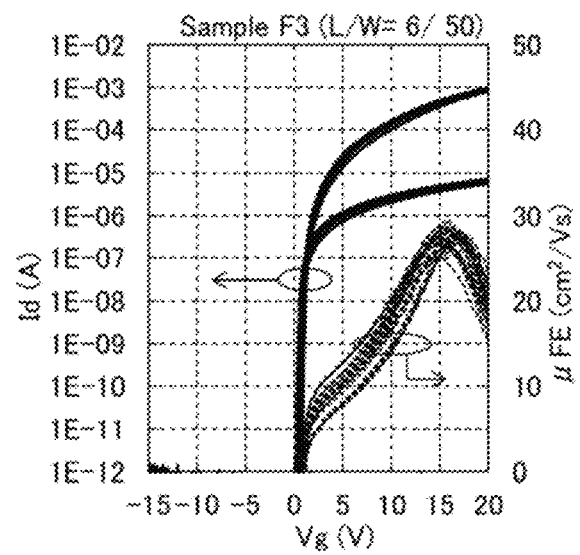
Figure 62A:
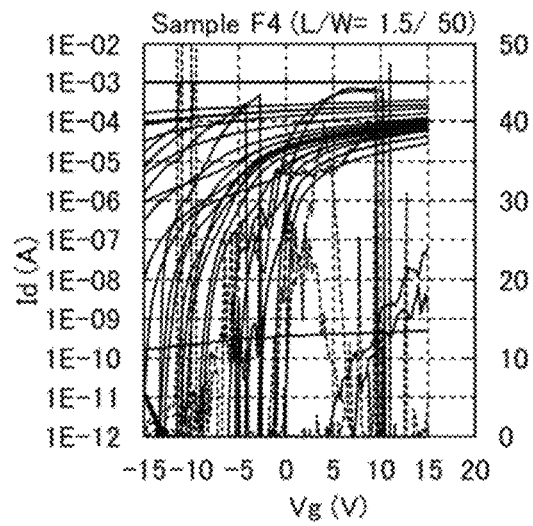
FIGS. 62A-62D illustrate Id-Vg characteristics of transistors of an example.
Figure 62B:
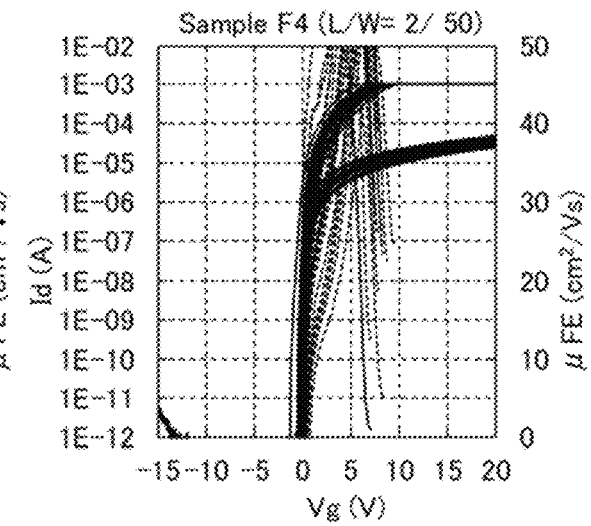
Figure 62C:
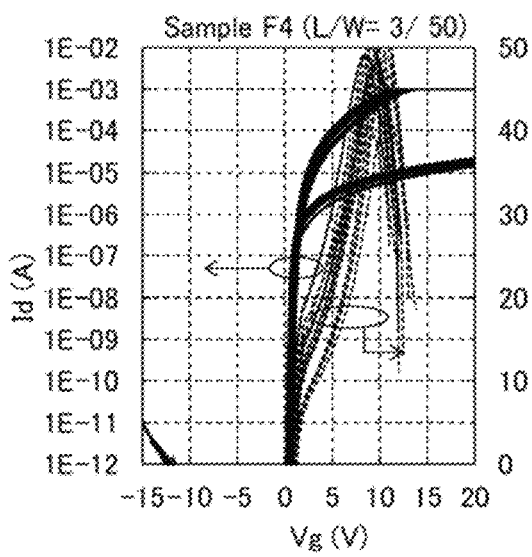
Figure 62D:
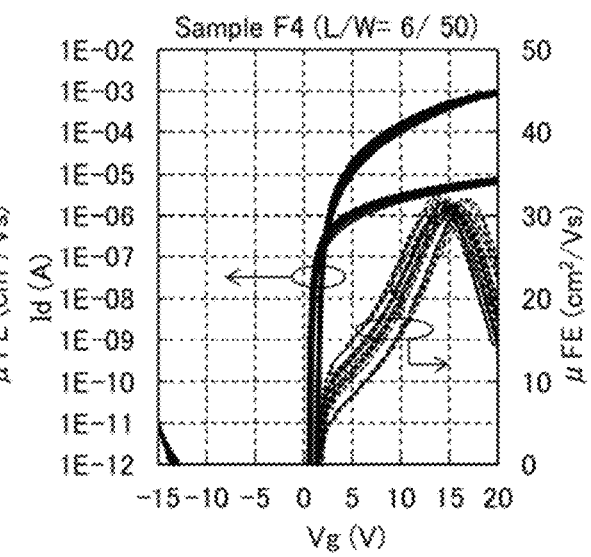
Figure 63A:
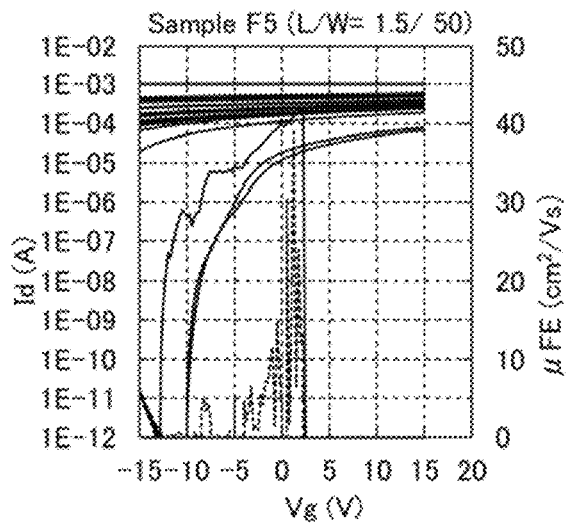
FIGS. 63A-63D illustrate Id-Vg characteristics of transistors of an example.
Figure 63B:
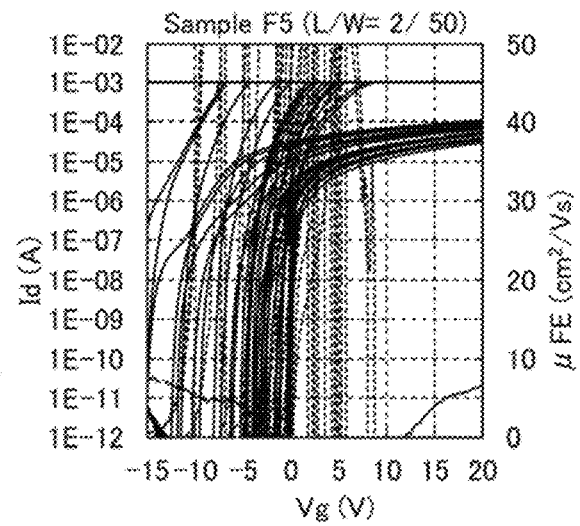
Figure 63C:
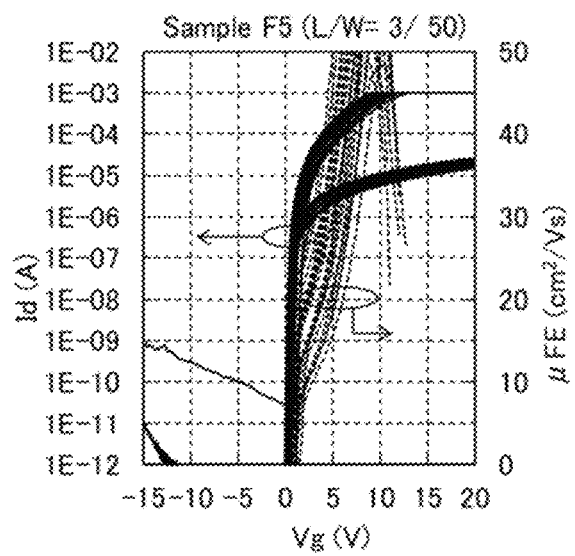
Figure 63D:
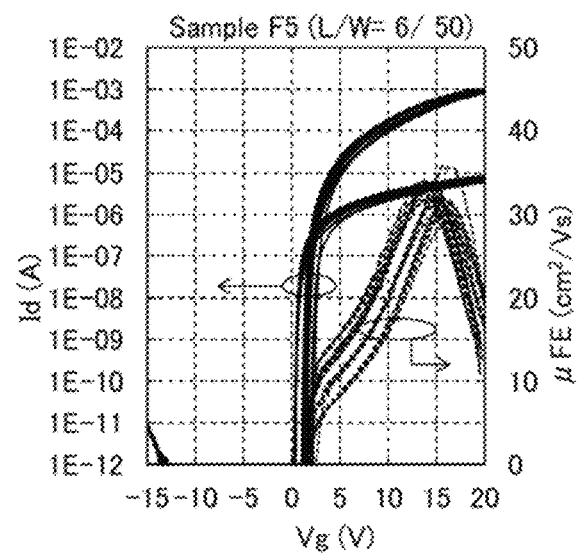

For comparison, Sample F3 that corresponds to the transistor 100G having a structure where the second gate electrode does not include the conductive film 114, as illustrated in FIGS. 43(A) and (B), and Sample F4 and Sample F5 that correspond to a transistor 100H having a structure where the second gate electrode does not include the oxide semiconductor film 112, as illustrated in FIGS. 58(A) and (B), were also fabricated. Note that, in the description of FIGS. 58(A) and (B), the same reference numerals are used for structures having functions similar to those in the transistor 100B illustrated in FIGS. 3(A) and (B).

<Fabrication Method of Transistor>

«Fabrication of Sample F»

As the substrate 102 over which Sample F1 was to be fabricated, a glass substrate was used. The conductive film 106 was formed over the substrate 102. As the conductive film 110, a titanium film with a thickness of 10 nm and a copper film with a thickness of 100 nm were formed in this order using a sputtering apparatus.

Next, the insulating film 104 was formed over the substrate 102 and the conductive film 106. Note that in this example, as the insulating film 104, the insulating film 104_1, the insulating film 104_2, the insulating film 104_3, and the insulating film 104_4 were successively formed in this order using a PECVD apparatus in a vacuum. A silicon nitride film with a thickness of 50 nm was formed as the insulating film 104_1. A silicon nitride film with a thickness of 300 nm was formed as the insulating film 104_2. A silicon nitride film with a thickness of 50 nm was formed as the insulating film 104_3. A silicon oxynitride film with a thickness of 50 nm was formed as the insulating film 104_4.

Next, an oxide semiconductor film was formed over the insulating film 104, and the oxide semiconductor film was processed into an island shape, whereby the oxide semiconductor film 108 was formed. An oxide semiconductor film with a thickness of 40 nm was formed as the oxide semiconductor film 108. Note that for forming the oxide semiconductor film 108, a sputtering apparatus was used, a metal oxide of In:Ga:Zn=4:2:4.1 [atomic ratio] was a sputtering target, and an AC power supply was used as the power supply to be applied to the sputtering target. A wet etching method was used for processing of the oxide semiconductor film 108.

Next, an insulating film to be the insulating film 110 later was formed over the insulating film 104 and the oxide semiconductor film 108. As the insulating film, a silicon oxynitride film with a thickness of 30 nm, a silicon oxynitride film with a thickness of 50 nm, and a silicon oxynitride film with a thickness of 20 nm were successively formed using a PECVD apparatus in a vacuum.

Next, heat treatment was performed. The heat treatment was performed under a mixed gas atmosphere of nitrogen and oxygen, at 350° C. for one hour.

Next, an oxide semiconductor film to be the oxide semiconductor film 112 later was formed over the insulating film. An oxide semiconductor film with a thickness of 10 nm was formed as the oxide semiconductor film. Note that for forming the oxide semiconductor film, a sputtering apparatus was used, a metal oxide of In:Ga:Zn=4:2:4.1 [atomic ratio] was a sputtering target, and an AC power supply was used as the power supply to be applied to the sputtering target.

Then, a mask was formed over the oxide semiconductor film, and the opening 143 was formed, using the mask, in the oxide semiconductor film, the insulating film that is in contact with the lower side of the oxide semiconductor film, and the insulating film 104. Note that a dry etching apparatus was used for processing of the opening 143.

Next, a conductive film to be the conductive film 114 later was formed over the oxide semiconductor film to be the oxide semiconductor film 112 later. As the conductive film, a titanium nitride film with a thickness of 50 nm and a copper film with a thickness of 100 nm were formed in this order using a sputtering apparatus.

Next, the formed conductive film and oxide semiconductor film were processed into an island shape, whereby the conductive film 114 and the oxide semiconductor film 112 were formed. Furthermore, following the formation of the conductive film 114 and the oxide semiconductor film 112, the insulating film that is in contact with the lower side of the oxide semiconductor film 112 was processed, whereby the insulating film 110 was formed.

Note that a wet etching method was used for processing of the conductive film 114 and the oxide semiconductor film 112, and a dry etching method was used for processing of the insulating film 110.

Next, an impurity element was added from above the insulating film 104, the oxide semiconductor film 108, the insulating film 110, the oxide semiconductor film 112, and the conductive film 114. A doping apparatus was used for the impurity element addition treatment, in which argon and nitrogen were used as the impurity elements.

Next, the insulating film 116 was formed over the insulating film 104, the oxide semiconductor film 108, the insulating film 110, the oxide semiconductor film 112, and the conductive film 114. As the insulating film 116, a silicon nitride film with a thickness of 100 nm was formed using a PECVD apparatus.

Next, the insulating film 118 was formed over the insulating film 116. As the insulating film 118, a silicon oxynitride film with a thickness of 300 nm was formed using a PECVD apparatus.

Next, a mask was formed over the insulating film 118, and the openings 141a and 141b were formed, using the mask, in the insulating films 116 and 118. Note that a dry etching apparatus was used for processing of the openings 141a and 141b.

Next, the insulating film 122 was formed over the insulating film 118. A 1.5-μm-thick acrylic-based photosensitive resin film was used as the insulating film 122. Note that openings were provided in regions of the insulating film 122 that overlap with the openings 141a and 141b.

Next, a conductive film was formed over the insulating film 122 so as to fill the openings 141a and 141b, and the conductive film was processed into island shapes, whereby the conductive films 120s and 120d were formed.

As each of the conductive films 120s and 120d, a titanium film with a thickness of 10 nm and a copper film with a thickness of 100 nm were successively formed using a sputtering apparatus in a vacuum.

Through the above steps, Sample F1 that corresponds to the transistor 100B illustrated in FIGS. 3(A) and (B) was fabricated.

Note that in this example, the channel width W of Sample F1 that corresponds to the transistor 100B was 50 μm, while the channel width L was varied between 1.5 μm, 2.0 μm, 3.0 μm, and 6.0 μm. Note that as each type of transistor with a different channel width L, 20 transistors were formed over a substrate.

«Fabrication of Sample F2»

Sample F2 is different from Sample F1 only in the material for forming the conductive film 114, and is similar to Sample F1 in the other steps.

As a conductive film to be the conductive film 114 of Sample $F_2$, a titanium film with a thickness of 10 nm and a copper film with a thickness of 100 nm were formed in this order using a sputtering apparatus.

Note that in this example, the channel width W of Sample F2 that corresponds to the transistor 100B was 50 μm, while the channel width L was varied between 1.5 μm, 2.0 μm, 3.0 μm, and 6.0 μm. Note that as each type of transistor with a different channel width L, 20 transistors were formed over a substrate.

«Fabrication of Sample F3»

For Sample F3, in a similar manner to Sample F1, the conductive film 110, the insulating film 104, and the oxide semiconductor film 108 were formed over the substrate 102.

Next, an insulating film to be the insulating film 110 later was formed over the insulating film 104 and the oxide semiconductor film 108. As the insulating film, a silicon oxynitride film with a thickness of 30 nm, a silicon oxynitride film with a thickness of 50 nm, and a silicon oxynitride film with a thickness of 20 nm were successively formed using a PECVD apparatus in a vacuum.

Next, heat treatment was performed. The heat treatment was performed under a mixed gas atmosphere of nitrogen and oxygen, at 350° C. for one hour.

Then, a mask was formed over the insulating film, and the opening 143 was formed, using the mask, in the insulating film and the insulating film 104. Note that a dry etching apparatus was used for processing of the opening 143.

Next, an oxide semiconductor film to be the oxide semiconductor film 112 later was formed over the insulating film. As the oxide semiconductor film, an oxide semiconductor film with a thickness of 100 nm was formed. Note that for forming the oxide semiconductor film, a sputtering apparatus was used, a metal oxide of In:Ga:Zn=4:2:4.1 [atomic ratio] was a sputtering target, and an AC power supply was used as the power supply to be applied to the sputtering target.

Next, the formed oxide semiconductor film was processed into an island shape, whereby the oxide semiconductor film 112 was formed. Furthermore, following the formation of the oxide semiconductor film 112, the insulating film that is in contact with the lower side of the oxide semiconductor film 112 was processed, whereby the insulating film 110 was formed.

Note that a wet etching method was used for processing of the oxide semiconductor film 112, and a dry etching method was used for processing of the insulating film 110.

Next, an impurity element was added from above the insulating film 104, the oxide semiconductor film 108, the insulating film 110, and the oxide semiconductor film 112. A doping apparatus was used for the impurity element addition treatment, in which argon and nitrogen were used as the impurity elements.

Next, the insulating film 116 was formed over the insulating film 104, the oxide semiconductor film 108, the insulating film 110, and the oxide semiconductor film 112. As the insulating film 116, a silicon nitride film with a thickness of 100 nm was formed using a PECVD apparatus.

Next, the insulating film 118 was formed over the insulating film 116. As the insulating film 118, a silicon oxynitride film with a thickness of 300 nm was formed using a PECVD apparatus.

Next, a mask was formed over the insulating film 118, and the openings 141a and 141b were formed, using the mask, in the insulating films 116 and 118. Note that a dry etching apparatus was used for processing of the openings 141a and 141b.

Next, the insulating film 122 was formed over the insulating film 118. A 1.5-μm-thick acrylic-based photosensitive resin film was used as the insulating film 122. Note that openings were provided in regions of the insulating film 122 that overlap with the openings 141a and 141b.

Next, a conductive film was formed over the insulating film 122 so as to fill the openings 141a and 141b, and the conductive film was processed into island shapes, whereby the conductive films 120s and 120d were formed.

As the conductive films 120s and 120d, a titanium film with a thickness of 10 nm and a copper film with a thickness of 100 nm were successively formed using a sputtering apparatus in a vacuum.

Through the above steps, Sample F3 that corresponds to the transistor 100G illustrated in FIGS. 43(A) and (B) was fabricated.

Note that in this example, the channel width W of Sample F3 that corresponds to the transistor 100G was 50 μm, while the channel width L was varied between 1.5 μm, 2.0 μm, 3.0 μm, and 6.0 μm. Note that as each type of transistor with a different channel width L, 20 transistors were formed over a substrate.

«Fabrication of Sample F4»

For Sample F4, in a similar manner to Sample F1, the conductive film 110, the insulating film 104, and the oxide semiconductor film 108 were formed over the substrate 102.

Next, an insulating film to be the insulating film 110 later was formed over the insulating film 104 and the oxide semiconductor film 108. As the insulating film, a silicon oxynitride film with a thickness of 30 nm, a silicon oxynitride film with a thickness of 50 nm, and a silicon oxynitride film with a thickness of 20 nm were successively formed using a PECVD apparatus in a vacuum.

Next, heat treatment was performed. The heat treatment was performed under a mixed gas atmosphere of nitrogen and oxygen, at 350° C. for one hour.

Then, a mask was formed over the insulating film, and the opening 143 was formed, using the mask, in the insulating film and the insulating film 104. Note that a dry etching apparatus was used for processing of the opening 143.

Next, a conductive film to be the conductive film 114 later was formed over the insulating film. As the conductive film, a titanium nitride film with a thickness of 50 nm and a copper film with a thickness of 100 nm were formed in this order using a sputtering apparatus.

Next, the formed conductive film was processed into an island shape, whereby the conductive film 114 was formed. Furthermore, following the formation of the conductive film 114, the insulating film that is in contact with the lower side of the conductive film 114 was processed, whereby the insulating film 110 was formed.

Note that a wet etching method was used for processing of the conductive film 114, and a dry etching method was used for processing of the insulating film 110.

Next, an impurity element was added from above the insulating film 104, the oxide semiconductor film 108, the insulating film 110, and the conductive film 114. A doping apparatus was used for the impurity element addition treatment, in which argon and nitrogen were used as the impurity elements.

Next, the insulating film 116 was formed over the insulating film 104, the oxide semiconductor film 108, the insulating film 110, and the conductive film 114. As the insulating film 116, a silicon nitride film with a thickness of 100 nm was formed using a PECVD apparatus.

Next, the insulating film 118 was formed over the insulating film 116. As the insulating film 118, a silicon oxynitride film with a thickness of 300 nm was formed using a PECVD apparatus.

Next, a mask was formed over the insulating film 118, and the openings 141a and 141b were formed, using the mask, in the insulating films 116 and 118. Note that a dry etching apparatus was used for processing of the openings 141a and 141b.

Next, the insulating film 122 was formed over the insulating film 118. A 1.5-μm-thick acrylic-based photosensitive resin film was used as the insulating film 122. Note that openings were provided in regions of the insulating film 122 that overlap with the openings 141a and 141b.

Next, a conductive film was formed over the insulating film 122 so as to fill the openings 141a and 141b, and the conductive film was processed into island shapes, whereby the conductive films 120s and 120d were formed.

As the conductive films 120s and 120d, a titanium film with a thickness of 10 nm and a copper film with a thickness of 100 nm were successively formed using a sputtering apparatus in a vacuum.

Through the above steps, Sample F4 that corresponds to the transistor 100H illustrated in FIGS. 58(A) and (B) was fabricated.

Note that in this example, the channel width W of Sample F4 that corresponds to the transistor 100H was 50 μm, while the channel width L was varied between 1.5 μm, 2.0 μm, 3.0 μm, and 6.0 μm. Note that as each type of transistor with a different channel width L, 20 transistors were formed over a substrate.

«Fabrication of Sample F5»

Sample F5 is different from Sample F3 only in the material for forming the conductive film 114, and is similar to Sample F4 in the other steps.

As a conductive film to be the conductive film 114 of Sample F5, a titanium film with a thickness of 10 nm and a copper film with a thickness of 100 nm were formed in this order using a sputtering apparatus.

Note that in this example, the channel width W of Sample F5 that corresponds to the transistor 100H was 50 μm, while the channel width L was varied between 1.5 μm, 2.0 μm, 3.0 μm, and 6.0 μm. Note that as each type of transistor with a different channel width L, 20 transistors were formed over a substrate.

<Evaluation of Electrical Characteristics of Transistors>

In FIG. 59 to FIG. 63, drain current-gate voltage (Id-Vg) characteristics of Samples F1 to F5 fabricated in this example are shown, respectively. Note that FIG. 59 corresponds to measurement results of Sample F1, FIG. 60 corresponds to measurement results of Sample F2, FIG. 61 corresponds to measurement results of Sample F3, FIG. 62 corresponds to measurement results of Sample F4, and FIG. 63 corresponds to measurement results of Sample F5.

Furthermore, FIG. 59(A), FIG. 60(A), FIG. 61(A), FIG. 62(A), and FIG. 63(A) are characteristics of the samples whose size is 50 μm in channel width and 1.5 μm in channel length; FIG. 59(B), FIG. 60(B), FIG. 61(B), FIG. 62(B), and FIG. 63(B) are characteristics of the samples whose size is 50 μm in channel width and 2.0 μm in channel length; FIG. 59(C), FIG. 60(C), FIG. 61(C), FIG. 62(C), and FIG. 63(C) are characteristics of the samples whose size is 50 μm in channel width and 3.0 μm in channel length; and FIG. 59(D), FIG. 60(D), FIG. 61(D), FIG. 62(D), and FIG. 63(D) are characteristics of the samples whose size is 50 μm in channel width and 6.0 μm in channel length. In addition, in FIG. 59 to FIG. 63, the first vertical axis represents Id (A), the second vertical axis represents field-effect mobility (μFE ($cm^2$/Vs)), and the horizontal axis represents Vg (V).

Note that, as the measurement conditions of the Id-Vg characteristics of the transistor, voltages of −15 V to +20 V in increments of 0.25 V were applied as a voltage applied to the conductive film 106 functioning as the first gate electrode of the transistor (hereinafter, the voltage is also referred to as gate voltage (Vg)) and a voltage applied to the oxide semiconductor film 112 and the conductive film 114 functioning as the second gate electrode also referred to as voltage (Vbg)). Furthermore, a voltage applied to the conductive film 120s functioning as a source electrode (hereinafter, the voltage is also referred to as a source voltage (Vs)) was 0 V (comm), and a voltage applied to the conductive film 120d functioning as a drain electrode (hereinafter, the voltage is also referred to as a drain voltage (Vd)) was 1 V or 10 V.

As shown in FIG. 59 to FIG. 63, it was indicated that the electrical characteristics of Sample F1 to Sample F3 fabricated in this example were favorable regardless of the channel length (L). By contrast, the results were obtained in which Sample 4 and Sample F5 with small channel lengths of 1.5 μm and 2 μm have electrical characteristics with large variation and the threshold voltage being negative (also referred to as normally-on characteristics). Accordingly, it can be said that the structure of one embodiment of the present invention, which includes the oxide semiconductor film 112 as the second gate electrode, is preferable.

<Evaluation of Reliability Based on Gate BT Test>

Next, the reliability of the fabricated Sample F1 to Sample F3 whose size is 50 μm in channel width and 3.0 μm in channel length was evaluated. The reliability was evaluated by a gate BT (Bias Temperature) test in which stress voltage was applied to the gate electrodes. Note that the following four test methods were employed as the gate BT test.

«PBTS: Positive Bias Temperature Stress»

The gate voltage (Vg) was +20 V, the drain voltage (Vd) and the source voltage (Vs) were 0 V (COMMON), the stress temperature was 60° C., the stress application time was one hour, and the measurement environment was a dark environment. In other words, a source electrode and a drain electrode of the transistor were set at the same potential, and a potential different from that of the source and drain electrodes was applied to a gate electrode of the transistor for a certain time. In addition, the potential applied to the gate electrode was higher (applied more on the positive side) than the potential of the source electrode and the drain electrode.

«NBTS: Negative Bias Temperature Stress»

The gate voltage (Vg) was −20 V, the drain voltage (Vd) and the source voltage (Vs) were 0 V (COMMON), the stress temperature was 60° C., the stress application time was one hour, and the measurement environment was a dark environment. In other words, a source electrode and a drain electrode of the transistor were set at the same potential, and a potential different from that of the source and drain electrodes was applied to a gate electrode of the transistor for a certain time. In addition, the potential applied to the gate electrode was lower (applied more on the negative side) than the potential of the source electrode and the drain electrode.

«PBITS: Positive Bias Illumination Temperature Stress»

The gate voltage (Vg) was +20 V, the drain voltage (Vd) and the source voltage (Vs) were 0 V (COMMON), the stress temperature was 60° C., the stress application time was one hour, and the measurement environment was a photo environment (approximately 10000 1× with a white LED). In other words, a source electrode and a drain electrode of the transistor were set at the same potential, and a potential different from that of the source and drain electrodes was applied to a gate electrode of the transistor for a certain time. In addition, the potential applied to the gate electrode was higher (applied more on the positive side) than the potential of the source electrode and the drain electrode.

«NBITS: Negative Bias Illumination Temperature Stress»

The gate voltage (Vg) was −20 V, the drain voltage (Vd) and the source voltage (Vs) were 0 V (COMMON), the stress temperature was 60° C., the stress application time was one hour, and the measurement environment was a photo environment (approximately 10000 1× with a white LED). In other words, a source electrode and a drain electrode of the transistor were set at the same potential, and a potential different from that of the source and drain electrodes was applied to a gate electrode of the transistor for a certain time. In addition, the potential applied to the gate electrode was lower (applied more on the negative side) than the potential of the source electrode and the drain electrode.

Note that the gate BT test is one kind of accelerated test and can evaluate change in characteristics, caused by long-term usage, of transistors in a short time. In particular, the amount of change in threshold voltage (ΔVth) of a transistor between before and after the gate BT test is an important indicator for examining the reliability. The smaller the amount of change in threshold voltage (ΔVth) between before and after the gate BT test is, the higher the reliability is.

Note that ΔVth refers to the amount of change in threshold voltage (Vth), and corresponds to the value obtained from subtracting Vth before stress from Vth after the stress.

Figure 64:
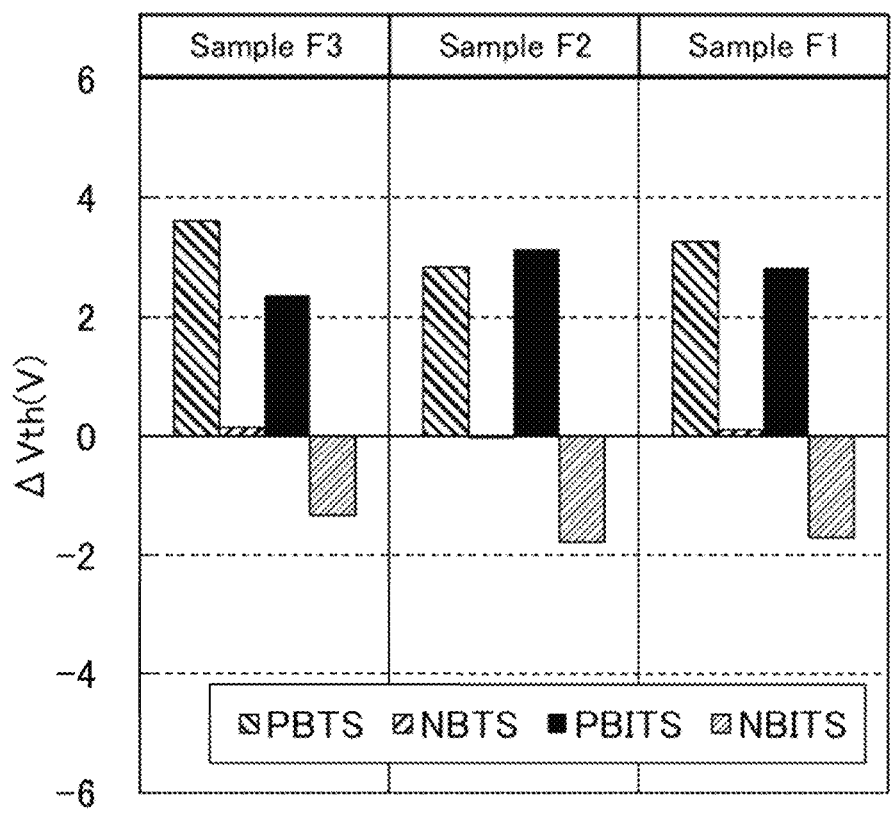
FIG. 64 illustrates reliability test results of transistors of an example.

The results of the gate BT test of Sample F1 to Sample F3 are shown in FIG. 64.

From the results in FIG. 64, it was found that a change in the varied gate BT test is small for Sample F1 to Sample F3.

<Examination of Electrical Characteristics of Transistor Under Light Irradiation>

Next, the electrical characteristics of the transistors of the fabricated Sample F1 to Sample F3 whose size is 3 μm in channel length and 50 μm in channel width were measured under light irradiation. As the electrical characteristics of the transistors, drain current (Id)-gate voltage (Vg) characteristics were measured. The light irradiation was performed at approximately 10000 lx with the use of a white LED.

Figure 65A:
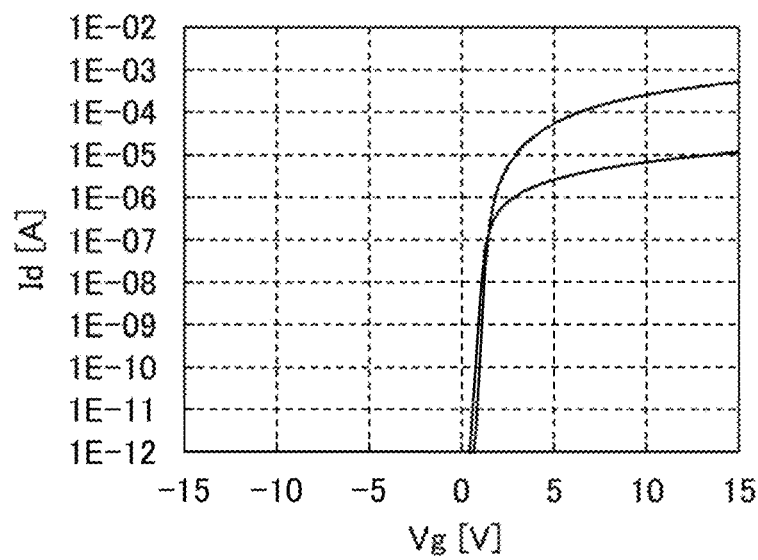
FIGS. 65A and 65B illustrate Id-Vg characteristics of a transistor under light irradiation of an example.
Figure 65B:
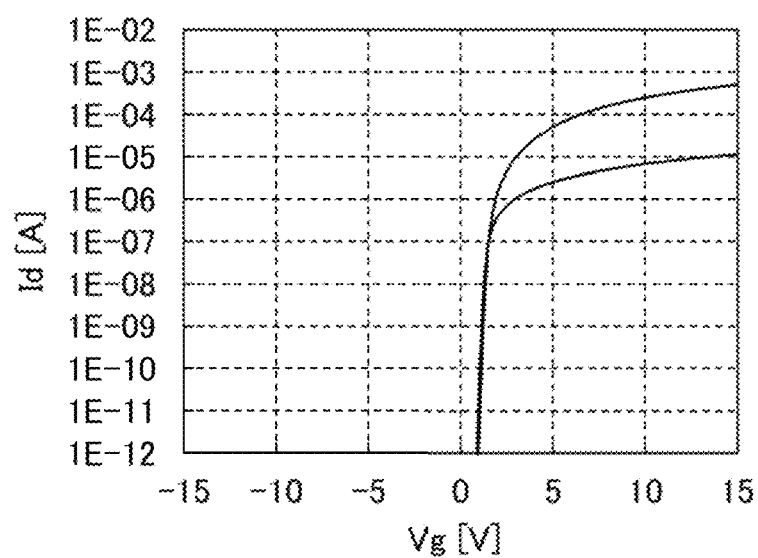
Figure 66A:
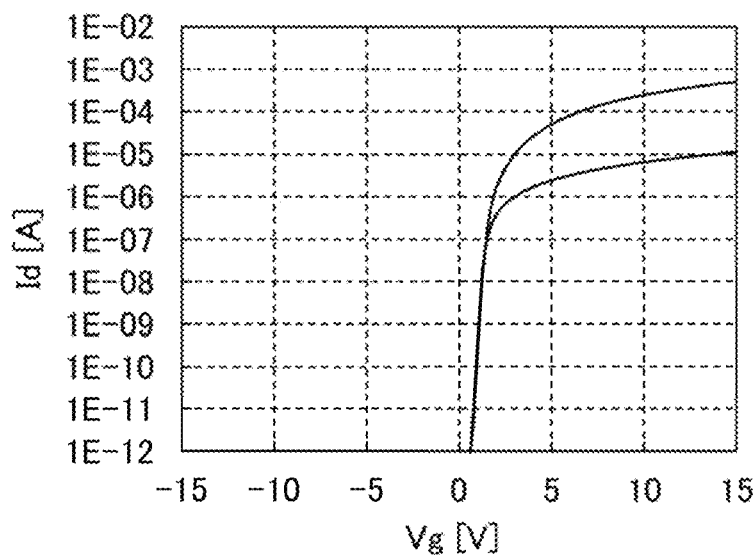
FIGS. 66A and 66B illustrate Id-Vg characteristics of a transistor under light irradiation of an example.
Figure 66B:
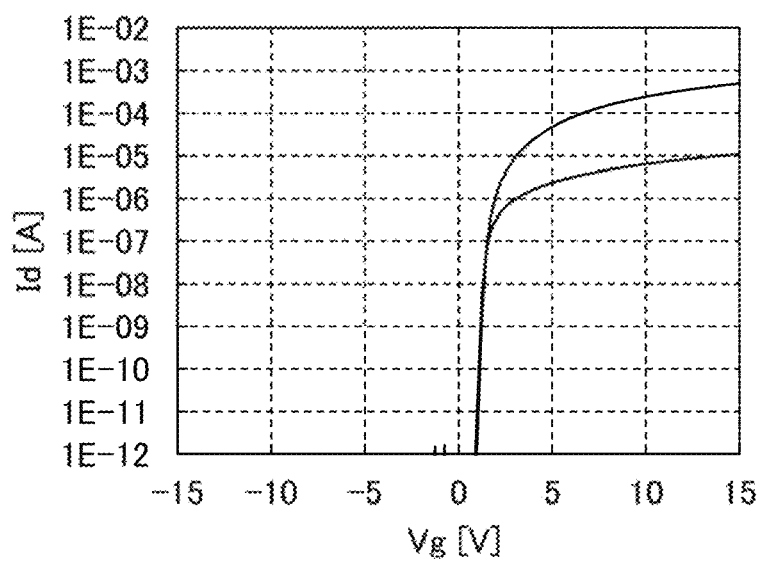
Figure 67A:
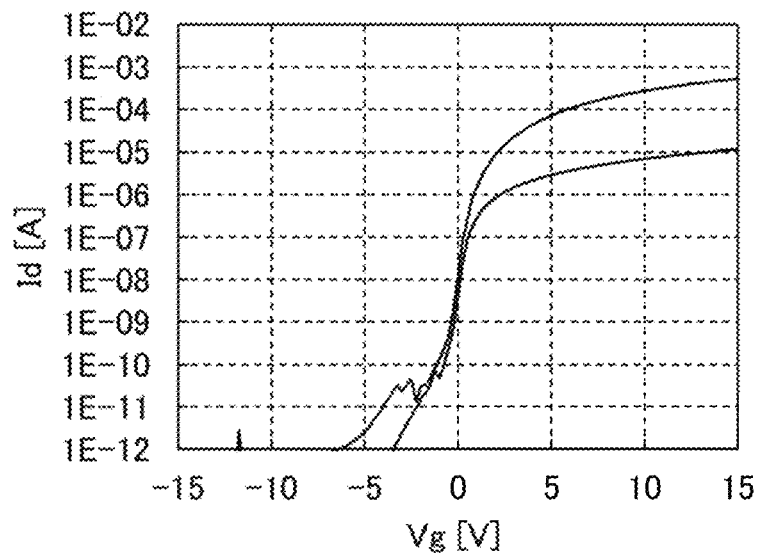
FIGS. 67A and 67B illustrate Id-Vg characteristics of a transistor under light irradiation of an example.
Figure 67B:
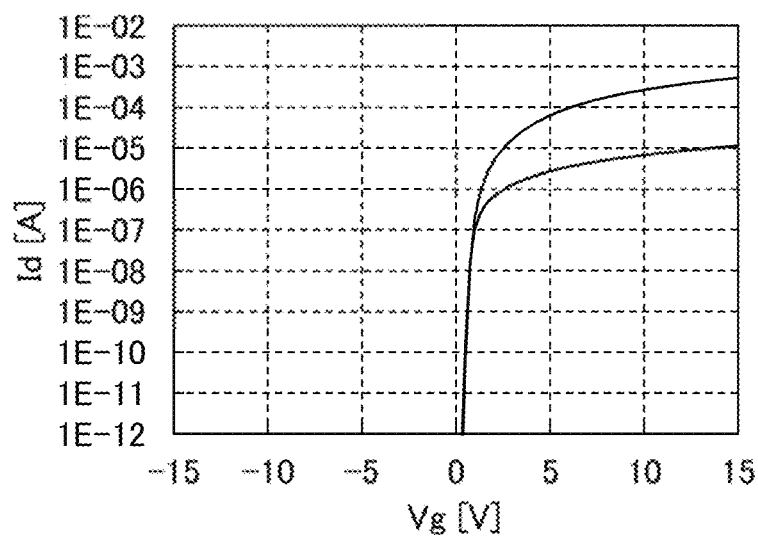

The electrical characteristics of the transistors of Sample F1 to Sample F3 are shown in FIG. 65 and FIG. 67. FIG. 65 to FIG. 67 show the results of applying gate voltages (Vg and Vbg) from −15 V to +15 V in increments of 0.25 V with the source electrode (Vs) being 0 V (comm) and the drain voltage (Vd) being 1 V and 10 V. Furthermore, in each of FIG. 65 to FIG. 67, the vertical axis represents the drain current (Id), and the horizontal axis represents the gate voltage (Vg). FIG. 65 is the measurement results for Sample F1, FIG. 66 is the measurement results for Sample $F_2$, and FIG. 67 is the measurement results for Sample F3. In addition, FIG. 65(A), FIG. 66(A), and FIG. 67(A) show the electrical characteristics of the transistors under light irradiation, and FIG. 65(B), FIG. 66(B), and FIG. 67(B) show the electrical characteristics of the transistors without light irradiation.

As shown in FIG. 67, the result in which the electrical characteristics of the transistor of Sample F3 under light irradiation were electrical characteristics with the threshold voltage being negative (also referred to as normally-on characteristics) was obtained. By contrast, as shown in FIG. 65 and FIG. 66, the results in which the electrical characteristics of the transistors of Samples F1 and F2 were electrical characteristics with the threshold voltage being positive (also referred to as normally-off characteristics) even under light irradiation were obtained. That is, the structure of one embodiment of the present invention that includes the oxide semiconductor film 112 and the conductive film 114 is preferable as the second gate electrode.

As described above, it can be said that the transistor of one embodiment of the present invention is a transistor with small change in electrical characteristics even under light irradiation and less power consumption.

The structure described in this example above can be used in appropriate combination with the structure described in any of the other embodiments or any of the other examples.

REFERENCE NUMERALS 100 transistor
100A transistor
100B transistor
100C transistor
100D transistor
100E transistor
100F transistor
100G transistor
100H transistor
102 substrate
104 insulating film
104_1 insulating film
104_2 insulating film
104_3 insulating film
104_4 insulating film
106 conductive film
107 oxide semiconductor film
108 oxide semiconductor film
108_1 oxide semiconductor film
108_2 oxide semiconductor film
108_3 oxide semiconductor film
108d drain region
108f region
108i channel region
108s source region
110 insulating film
110_0 insulating film
112 oxide semiconductor film
112_0 oxide semiconductor film
114 conductive film
114_0 conductive film
116 insulating film
118 insulating film
120 conductive film
120d conductive film
120s conductive film
122 insulating film
140 mask
141a opening
141b opening
141d opening
141s opening
143 opening
145 impurity element
147 hollow region
501 pixel circuit
502 pixel portion
504 driver circuit portion
504a gate driver
504b source driver
506 protection circuit
507 terminal portion
550 transistor
552 transistor
554 transistor
560 capacitor
562 capacitor
570 liquid crystal element
572 light-emitting element
664 electrode
665 electrode
667 electrode
700 display device
701 substrate
702 pixel portion
704 source driver circuit portion
705 substrate
706 gate driver circuit portion
708 FPC terminal portion
710 signal line
711 wiring portion
712 sealant
716 FPC
730 insulating film
732 sealing film
734 insulating film
736 coloring film
738 light-shielding film
750 transistor
752 transistor
760 connection electrode
770 planarization insulating film
772 conductive film
773 insulating film
774 conductive film
775 liquid crystal element
776 liquid crystal layer
778 structure body
780 anisotropic conductive film
782 light-emitting element
784 conductive film
786 EL layer
788 conductive film 790 capacitor
791 touch panel
792 insulating film
793 electrode
794 electrode
795 insulating film
796 electrode
797 insulating film
800 inverter
810 OS transistor
820 OS transistor
831 signal waveform
832 signal waveform
840 dashed line
841 solid line
850 OS transistor
860 CMOS inverter
900 semiconductor device
901 power supply circuit
902 circuit
903 voltage generation circuit
903A voltage generation circuit
903B voltage generation circuit
903C voltage generation circuit
904 circuit
905 voltage generation circuit
906 circuit
911 transistor
912 transistor
912A transistor
912B transistor
921 control circuit
922 transistor
7000 display module
7001 upper cover
7002 lower cover
7003 FPC
7004 touch panel
7005 FPC
7006 display panel
7007 backlight
7008 light source
7009 frame
7010 printed board
7011 battery
8000 camera
8001 housing
8002 display portion
8003 operation button
8004 shutter button
8006 lens
8100 finder
8101 housing
8102 display portion
8103 button
8200 head mounted display
8201 mounting portion
8202 lens
8203 main body
8204 display portion
8205 cable
8206 battery
8300 head mounted display
8301 housing
8302 display portion
8304 fixing means
8305 lens
9000 housing
9001 display portion
9003 speaker
9005 operation key
9006 connection terminal
9007 sensor
9008 microphone
9050 operation button
9051 information
9052 information
9053 information
9054 information
9055 hinge
9100 television device
9101 portable information terminal
9102 portable information terminal
9200 portable information terminal
9201 portable information terminal
9500 display device
9501 display panel
9502 display region
9503 region
9511 shaft portion
9512 bearing portion

The invention claimed is:

1. A semiconductor device comprising:
a first conductive film;
a first insulating film over the first conductive film;
a first semiconductor film, having a region overlapping with the first conductive film, over the first insulating film;
a second insulating film having a region in contact with a top surface of the first semiconductor film;
a second conductive film, having a region overlapping with the first semiconductor film, over the second insulating film;
a third insulating film comprising silicon nitride and having a region in contact with a top surface of the second conductive film, a region in contact with a side surface of the second conductive film, and a region in contact with a top surface of the second insulating film;
a fourth insulating film comprising silicon oxide and having a region in contact with a top surface of the third insulating film;
a fifth insulating film comprising an organic material and having a region in contact with a top surface of the fourth insulating film;
a third conductive film and a fourth conductive film over the fifth insulating film;
a pixel electrode of a liquid crystal element electrically connected to the fourth conductive film; and
a common electrode overlapping with the pixel electrode and the third conductive film,
wherein the first semiconductor film comprises a channel formation region of a transistor,
wherein the second conductive film is configured to function as a gate electrode of the transistor,
wherein the third conductive film is configured to function as one of a source electrode and a drain electrode of the transistor,
wherein the fourth conductive film is configured to function as the other of the source electrode and the drain electrode of the transistor,
wherein the third insulating film and the fourth insulating film comprise a first opening and a third opening,
wherein the fifth insulating film comprises a second opening overlapping with the first opening, wherein in a cross-sectional view, an upper edge of the first opening is not aligned with a lower edge of the second opening, wherein a diameter of the second opening at the lower edge of the second opening is larger than a diameter of the first opening at the upper edge of the first opening, wherein the third conductive film has a region in contact with a top surface of the fifth insulating film and a region in contact with the top surface of the first semiconductor film in a region where the first opening and the second opening overlap with each other, wherein a spacer overlaps with the first semiconductor film with the third conductive film provided therebetween, wherein the first semiconductor film is in contact with the fourth conductive film in the third opening, and wherein the pixel electrode overlaps with the third opening.

2. A semiconductor device comprising:
a first conductive film;
a first insulating film over the first conductive film;
a first semiconductor film, having a region overlapping with the first conductive film, over the first insulating film;
a second insulating film having a region in contact with a top surface of the first semiconductor film;
a second conductive film, having a region overlapping with the first semiconductor film, over the second insulating film;
a third insulating film comprising silicon nitride and having a region in contact with a top surface of the second conductive film, a region in contact with a side surface of the second conductive film, and a region in contact with a top surface of the second insulating film;
a fourth insulating film comprising silicon oxide and having a region in contact with a top surface of the third insulating film;
a fifth insulating film comprising an organic material and having a region in contact with a top surface of the fourth insulating film;
a third conductive film and a fourth conductive film over the fifth insulating film;
a pixel electrode of a liquid crystal element electrically connected to the fourth conductive film; and
a common electrode overlapping with the pixel electrode and the third conductive film, wherein the first semiconductor film comprises a channel formation region of a transistor, wherein the second conductive film is configured to function as a gate electrode of the transistor, wherein the third conductive film is configured to function as one of a source electrode and a drain electrode of the transistor, wherein the fourth conductive film is configured to function as the other of the source electrode and the drain electrode of the transistor, wherein the third insulating film and the fourth insulating film comprise a first opening and a third opening, wherein the fifth insulating film comprises a second opening overlapping with the first opening, wherein in a cross-sectional view, an upper edge of the first opening is not aligned with a lower edge of the second opening, wherein a diameter of the second opening at the lower edge of the second opening is larger than a diameter of the first opening at the upper edge of the first opening, wherein the third conductive film has a region in contact with a top surface of the fifth insulating film and a region in contact with the top surface of the first semiconductor film in a region where the first opening and the second opening overlap with each other, wherein the channel formation region of the transistor comprises silicon, wherein a spacer overlaps with the first semiconductor film with the third conductive film provided therebetween, wherein the first semiconductor film is in contact with the fourth conductive film in the third opening, and wherein the pixel electrode overlaps with the third opening.

3. A display device comprising:
a first conductive film;
a first insulating film over the first conductive film;
a first semiconductor film, having a region overlapping with the first conductive film, over the first insulating film;
a second insulating film having a region in contact with a top surface of the first semiconductor film;
a second conductive film, having a region overlapping with the first semiconductor film, over the second insulating film;
a third insulating film comprising silicon nitride and having a region in contact with a top surface of the second conductive film, a region in contact with a side surface of the second conductive film, and a region in contact with a top surface of the second insulating film;
a fourth insulating film comprising silicon oxide and having a region in contact with a top surface of the third insulating film;
a fifth insulating film comprising an organic material and having a region in contact with a top surface of the fourth insulating film;
a third conductive film and a fourth consecutive film over the fifth insulating film;
a pixel electrode electrically connected to one of the third conductive film and the fourth conductive film; and
a common electrode having a region overlapping with the pixel electrode with a sixth insulating film provided therebetween, wherein the first semiconductor film comprises a channel formation region of a transistor, wherein the second conductive film is configured to function as a gate electrode of the transistor, wherein the one of the third conductive film and the fourth conductive film is configured to function as one of a source electrode and a drain electrode of the transistor, wherein the third insulating film and the fourth insulating film comprise a first opening, wherein the fifth insulating film comprises a second opening overlapping with the first opening, wherein in a cross-sectional view, an upper edge of the first opening is not aligned with a lower edge of the second opening, wherein a diameter of the second opening at the lower edge of the second opening is larger than a diameter of the first opening at the upper edge of the first opening, wherein the diameter of the first opening at the upper edge of the first opening is larger than a diameter of the first opening at a lower edge of the first opening, wherein the other of the third conductive film and the fourth conductive film has a region in contact with a top surface of the fifth insulating film and a region in contact with the top surface of the first semiconductor film in a region where the first opening and the second opening overlap with each other, wherein a spacer overlaps with the first semiconductor film with the other of the third conductive film and the fourth conductive film provided therebetween, wherein the common electrode has a region overlapping with the channel formation region of the transistor, and wherein the channel formation region of the transistor comprises silicon.

* * * * *